(12) United States Patent
Yamazaki et al.

(10) Patent No.: US 11,211,461 B2
(45) Date of Patent: Dec. 28, 2021

(54) SEMICONDUCTOR DEVICE AND MEMORY DEVICE

(71) Applicant: Semiconductor Energy Laboratory Co., Ltd., Kanagawa-ken (JP)

(72) Inventors: Shunpei Yamazaki, Tokyo (JP); Daisuke Yamaguchi, Kanagawa (JP); Shinobu Kawaguchi, Kanagawa (JP); Yoshihiro Komatsu, Kanagawa (JP); Toshikazu Ohno, Kanagawa (JP); Yasumasa Yamane, Kanagawa (JP); Tomosato Kanagawa, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 16/693,974

(22) Filed: Nov. 25, 2019

(65) Prior Publication Data

US 2020/0212185 A1 Jul. 2, 2020

(30) Foreign Application Priority Data

Dec. 28, 2018 (JP) .............................. JP2018-248150
Jan. 25, 2019 (JP) .............................. JP2019-011158

(51) Int. Cl.
*H01L 29/26* (2006.01)
*H01L 27/108* (2006.01)

(52) U.S. Cl.
CPC ........ *H01L 29/26* (2013.01); *H01L 27/10808* (2013.01); *H01L 27/10855* (2013.01); *H01L 27/10873* (2013.01)

(58) Field of Classification Search
CPC ............. H01L 27/108; H01L 27/10808; H01L 27/10855; H01L 27/10873; H01L 27/1156;
(Continued)

(56) References Cited

U.S. PATENT DOCUMENTS 8,455,868 B2 6/2013 Yamazaki et al.
8,547,771 B2 10/2013 Koyama
(Continued)

FOREIGN PATENT DOCUMENTS

JP 2011-151383 A 8/2011
JP 2012-257187 A 12/2012
WO WO 2019/025912 A1 2/2019

OTHER PUBLICATIONS

Kunitake, H. et al., "High Thermal Tolerance of 25-nm c-axis Aligned Crystalline In—Ga—Zn Oxide FET," IEDM 18: Technical Digest of International Electron Devices Meeting, Dec. 1, 2018, pp. 312-315.

*Primary Examiner* — Mohammed Shamsuzzaman
(74) *Attorney, Agent, or Firm* — Husch Blackwell LLP

(57) ABSTRACT

A semiconductor device having favorable electrical characteristics is provided. The semiconductor device includes an oxide semiconductor, a first insulator in contact with the oxide semiconductor, and a second insulator in contact with the first insulator. The first insulator includes excess oxygen. The second insulator has a function of trapping or fixing hydrogen. Hydrogen in the oxide semiconductor is bonded to the excess oxygen. The hydrogen bonded to the excess oxygen passes through the first insulator and is trapped or fixed in the second insulator. The excess oxygen bonded to the hydrogen remains in the first insulator as the excess oxygen.

5 Claims, 59 Drawing Sheets

(58) Field of Classification Search
CPC .............. H01L 29/26; H01L 29/66969; H01L 29/7869
See application file for complete search history.

(56) References Cited

U.S. PATENT DOCUMENTS

| | | |
|---|---|---|
| 8,995,174 B2 | 3/2015 | Koyama |
| 9,349,735 B2 | 5/2016 | Yamazaki et al. |
| 9,991,265 B2 | 6/2018 | Yamazaki et al. |
| 2015/0372009 A1* | 12/2015 | Yamazaki ........... H01L 29/7869 257/43 |
| 2018/0286864 A1 | 10/2018 | Yamazaki et al. |
| 2018/0375498 A1 | 12/2018 | Koyama |
| 2019/0139783 A1* | 5/2019 | Yamazaki ........... H01L 21/0234 |
| 2020/0335630 A1* | 10/2020 | Iida ..................... H01L 27/1225 |

\* cited by examiner

FIG. 9A
FIG. 9C
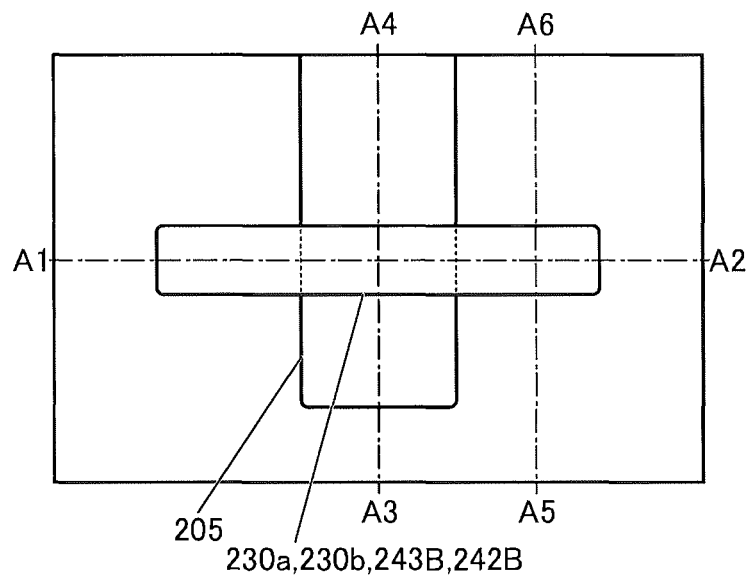
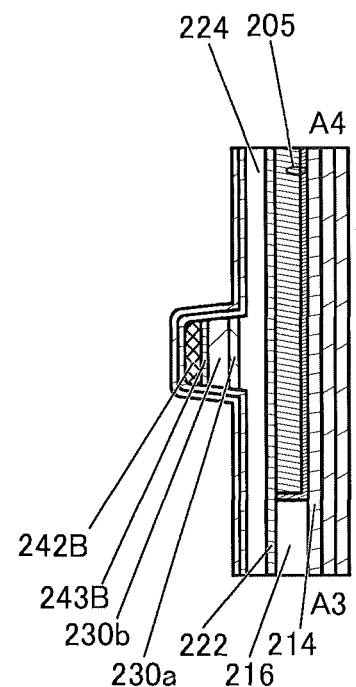
FIG. 9B
FIG. 9D
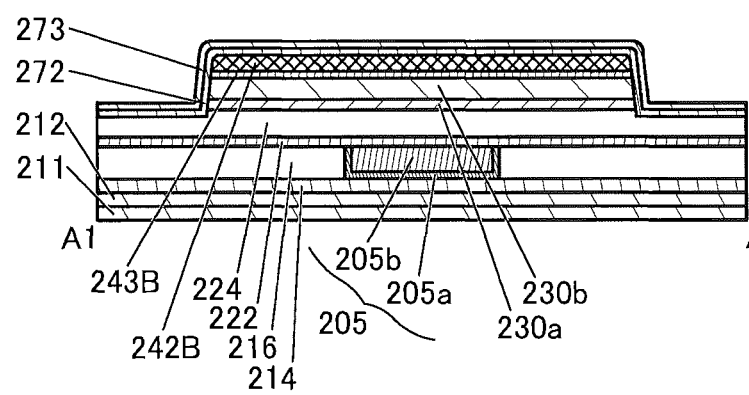
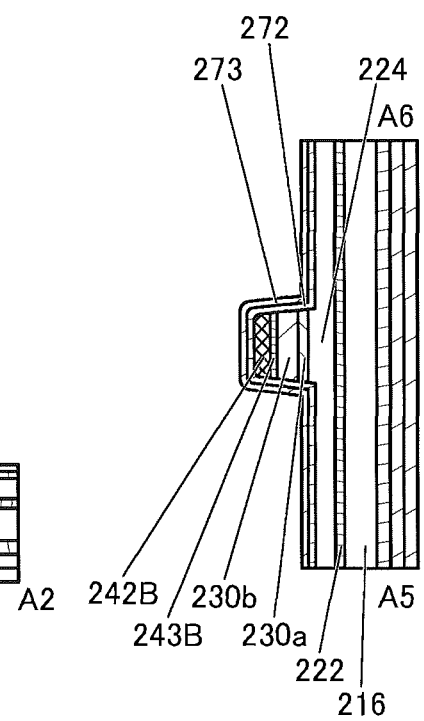

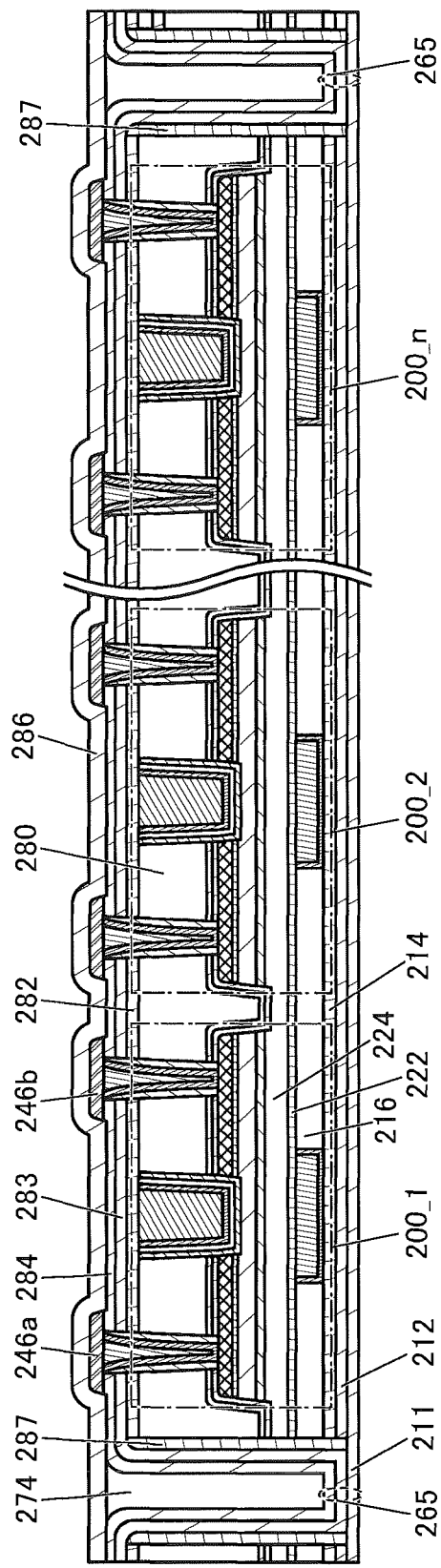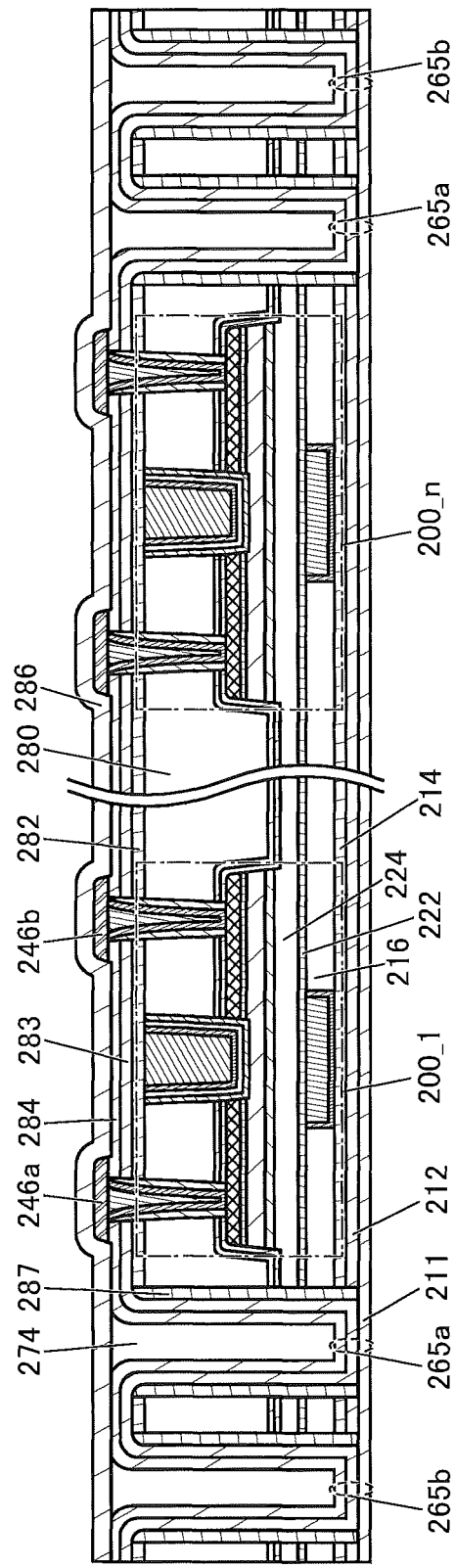

FIG. 31A
| Amorphous | Crystalline | Crystal |
|---|---|---|
| completely amorphous | ·CAAC<br>·nc<br>·CAC | ·single crystal<br>·poly crystal |
FIG. 31B
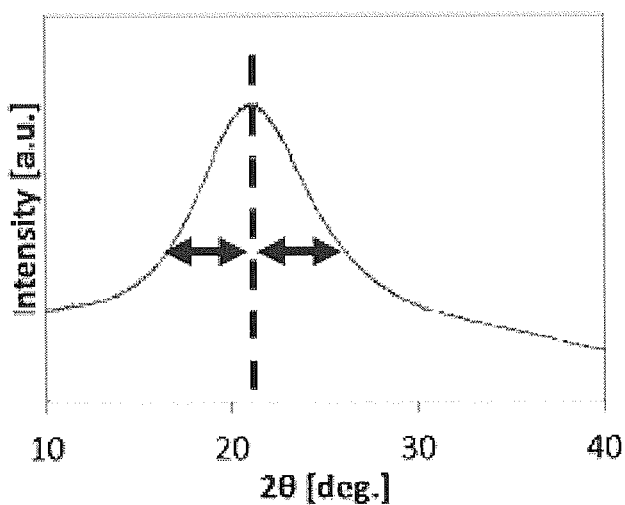
FIG. 31C
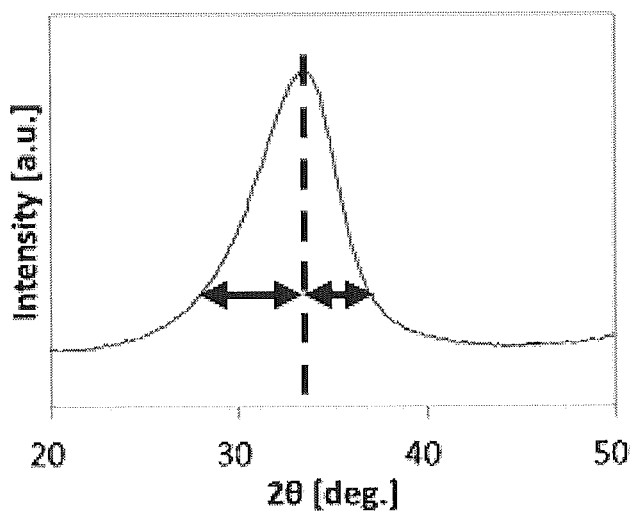

FIG. 49A
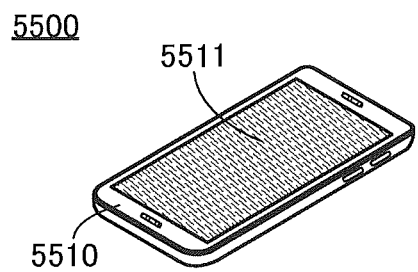
FIG. 49B
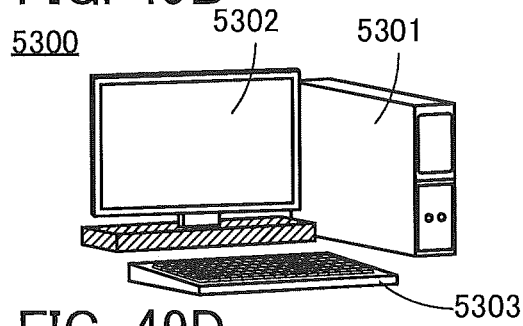
FIG. 49C
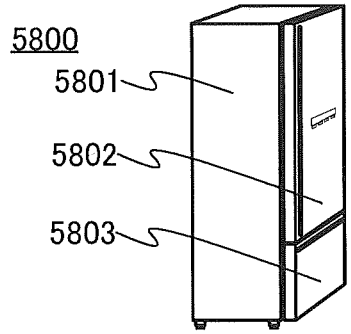
FIG. 49D
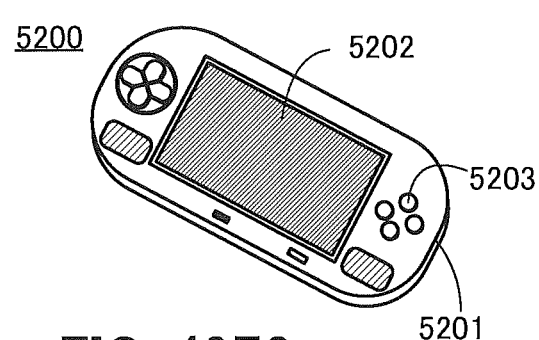
FIG. 49E1
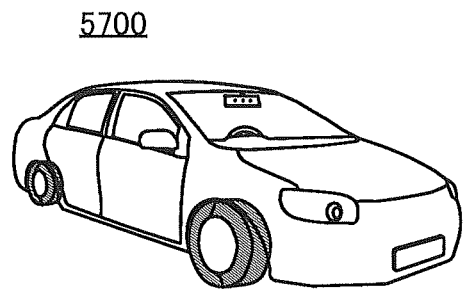
FIG. 49E2
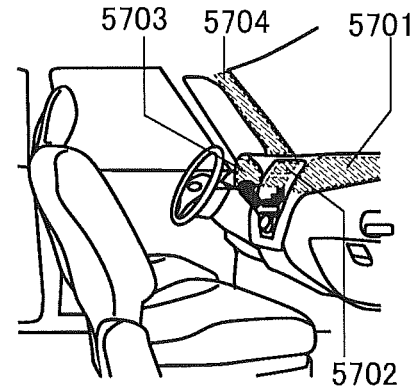
FIG. 49F
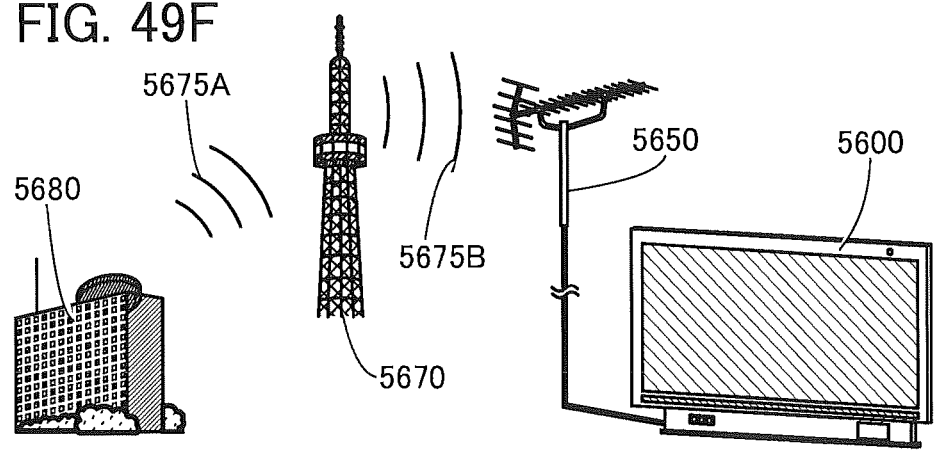

FIG. 51

| | |
|---|---|
| | 928 |
| | 926 |
| | 924 |
| | 922 |
| | 920 |

FIG. 56

| | |
|---|---|
| | 939 |
| | 938 |
| | 936 |
| | 934 |
| | 932 |
| | 930 |

SEMICONDUCTOR DEVICE AND MEMORY DEVICE

BACKGROUND OF THE INVENTION

1. Field of the Invention

One embodiment of the present invention relates to a semiconductor device and a manufacturing method thereof. Another embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a storage device are each an embodiment of a semiconductor device. A display device (e.g., a liquid crystal display device and a light-emitting display device), a projection device, a lighting device, an electro-optical device, a power storage device, a storage device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. Furthermore, one embodiment of the present invention relates to a process, a machine, manufacture, or a composition of matter.

2. Description of the Related Art

In recent years, semiconductor devices have been developed to be used mainly for an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is applied to a wide range of electronic devices such as an integrated circuit (IC) or an image display device (also simply referred to as a display device). A silicon-based semiconductor material is widely known as a material for a semiconductor thin film applicable to the transistor; in addition, an oxide semiconductor has attracted attention as another material.

It is known that a transistor including an oxide semiconductor has an extremely low leakage current in an off state. For example, a low-power-consumption CPU utilizing a characteristic of low leakage current of the transistor including an oxide semiconductor has been disclosed (see Patent Document 1). Furthermore, a storage device that can retain stored data for a long time by utilizing a characteristic of a low leakage current of the transistor including an oxide semiconductor has been disclosed, for example (see Patent Document 2).

Furthermore, in recent years, demand for an integrated circuit with higher density has risen with reductions in the size and weight of electronic devices. In addition, the productivity of a semiconductor device including an integrated circuit is required to be improved.

REFERENCE

Patent Document

[Patent Document 1] Japanese Published Patent Application No. 2012-257187
[Patent Document 2] Japanese Published Patent Application No. 2011-151383

SUMMARY OF THE INVENTION

An object of one embodiment of the present invention is to provide a semiconductor device having favorable electrical characteristics. Another object of one embodiment of the present invention is to provide a semiconductor device with normally-off electrical characteristics. Another object of one embodiment of the present invention is to provide a highly reliable semiconductor device. Another object of one embodiment of the present invention is to provide a semiconductor device with a high on-state current. Another object of one embodiment of the present invention is to provide a semiconductor device with high frequency characteristics. Another object of one embodiment of the present invention is to provide a semiconductor device that can be miniaturized or highly integrated. Another object of one embodiment of the present invention is to provide a semiconductor device that can be manufactured with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a semiconductor device with low power consumption. Another object of one embodiment of the present invention is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device that includes an oxide semiconductor, a first insulator in contact with the oxide semiconductor, and a second insulator in contact with the first insulator. The first insulator includes excess oxygen. The second insulator has a function of trapping or fixing hydrogen. Hydrogen in the oxide semiconductor is bonded to the excess oxygen. The hydrogen bonded to the excess oxygen passes through the first insulator and is trapped or fixed in the second insulator. The excess oxygen bonded to the hydrogen remains in the first insulator as the excess oxygen.

One embodiment of the present invention is a semiconductor device that includes an oxide semiconductor, a first insulator in contact with the oxide semiconductor, a second insulator in contact with the first insulator, and a third insulator in contact with the second insulator. The first insulator includes excess oxygen. The second insulator has a function of trapping or fixing hydrogen. The third insulator has a barrier property against hydrogen. Hydrogen in the oxide semiconductor is bonded to the excess oxygen. The hydrogen bonded to the excess oxygen passes through the first insulator and is trapped or fixed in the second insulator. The excess oxygen bonded to the hydrogen remains in the first insulator as the excess oxygen.

The above-described third insulator may contain silicon nitride.

The above-described second insulator may contain aluminum oxide.

The above-described aluminum oxide may be deposited by a sputtering method.

The above-described oxide semiconductor may be In—Ga—Zn oxide.

One embodiment of the present invention is a memory device that includes the above-described semiconductor device and a capacitor device.

One embodiment of the present invention can provide a semiconductor device having favorable electrical characteristics. One embodiment of the present invention can provide a semiconductor device with normally-off electrical characteristics. One embodiment of the present invention can provide a highly reliable semiconductor device. One embodiment of the present invention can provide a semiconductor device with a high on-state current. One embodiment of the present invention can provide a semiconductor device with high frequency characteristics. One embodiment of the present invention can provide a semiconductor device that can be miniaturized or highly integrated. One embodiment of the present invention can provide a semiconductor device that can be manufactured with high productivity.

A semiconductor device capable of retaining data for a long time can be provided. A semiconductor device capable of high-speed data writing can be provided. A semiconductor device with high design flexibility can be provided. A semiconductor device with low power consumption can be provided. A novel semiconductor device can be provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF THE DRAWINGS

FIG. 9A is a top view illustrating a manufacturing method of a semiconductor device and FIGS. 9B to 9D are cross-sectional views illustrating the manufacturing method of the semiconductor device.

FIGS. 24A and 24B are cross-sectional views of semiconductor devices.

FIG. 31A explains classification of IGZO crystal structures, FIG. 31B explains an XRD spectrum of quartz glass, and FIG. 31C explains an XRD spectrum of Crystalline IGZO.

FIGS. 49A, 49B, 49C, 49D, 49E1, 49E2, and 49F illustrate electronic devices.

FIG. 51 is a schematic view of a sample.

FIG. 56 is a schematic view of a sample.

DETAILED DESCRIPTION OF THE INVENTION

Figure 1:
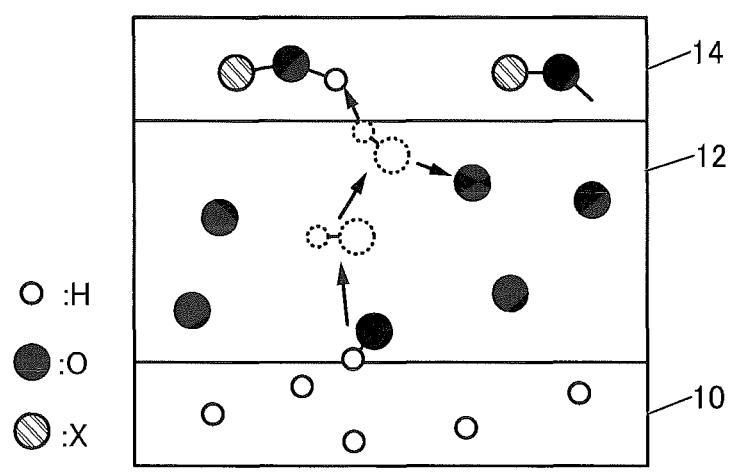
FIG. 1 is a cross-sectional view of a stacked-layer structure.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views illustrating ideal examples, and embodiments of the present invention are not limited to shapes or values shown in the drawings. For example, in the actual manufacturing process, a layer, a resist mask, or the like might be unintentionally reduced in size by treatment such as etching, which is not illustrated in some cases for easy understanding. In the drawings, the same portions or portions having similar functions are denoted by the same reference numerals in different drawings, and explanation thereof will not be repeated in some cases. Furthermore, the same hatching pattern is applied to portions having similar functions, and the portions are not denoted by reference numerals in some cases.

Especially in a top view (also referred to as a "plan view"), a perspective view, or the like, some components might not be illustrated for easy understanding of the invention. In addition, some hidden lines and the like might not be shown.

Note that the ordinal numbers such as "first," "second," and the like in this specification and the like are used for convenience and do not denote the order of steps or the stacking order of layers. Therefore, for example, description can be made even when "first" is replaced with "second" or "third," as appropriate. In addition, the ordinal numbers in this specification and the like are not necessarily the same as those which specify one embodiment of the present invention.

In this specification and the like, terms for describing arrangement, such as "over," "above," "under," and "below," are used for convenience in describing a positional relation between components with reference to drawings. Furthermore, the positional relationship between components is changed as appropriate depending on the direction in which each component is described. Thus, the positional relationship is not limited to that described with a term used in this specification, and description can be made appropriately depending on the situation.

For example, in this specification and the like, an explicit description "X and Y are connected" means that X and Y are electrically connected, X and Y are functionally connected, and X and Y are directly connected. Accordingly, without limitation to a predetermined connection relation, for example, a connection relation shown in drawings or text, another connection relation is regarded as being disclosed in the drawings or the text.

Here, X and Y each denote an object (e.g., a device, an element, a circuit, a wiring, an electrode, a terminal, a conductive film, or a layer).

Furthermore, functions of a source and a drain might be switched when a transistor of opposite polarity is employed or the direction of current flow is changed in circuit operation, for example. Therefore, the terms "source" and "drain" can be switched in some cases in this specification and the like.

Note that in this specification and the like, depending on transistor structures, a channel width in a region (a channel formation region) where a channel is actually formed (hereinafter referred to as an "effective channel width") is different from a channel width shown in a top view of a transistor (hereinafter referred to as an "apparent channel width") in some cases. For example, in a transistor having a gate covering the side surface of a semiconductor, an effective channel width is greater than an apparent channel width, and its influence cannot be ignored in some cases. For example, in a miniaturized transistor having a gate covering the side surface of a semiconductor, the proportion of a channel formation region formed in the side surface of a semiconductor is sometimes increased. In that case, an effective channel width is greater than an apparent channel width.

In such a case, an effective channel width is difficult to measure in some cases. For example, to estimate an effective channel width from a design value, it is necessary to assume that the shape of a semiconductor is known as an assumption condition. Accordingly, in the case where the shape of a semiconductor is not known accurately, it is difficult to measure an effective channel width accurately.

In this specification, the simple term "channel width" denotes an apparent channel width in some cases. In other cases, the simple term "channel width" denotes an effective channel width in this specification. Note that the values of a channel length, a channel width, an effective channel width, an apparent channel width, and the like can be determined by analyzing a cross-sectional TEM image and the like.

Note that an impurity in a semiconductor refers to, for example, elements other than the main components of a semiconductor. For example, an element with a concentration lower than 0.1 atomic % can be regarded as an impurity. When an impurity is contained, the density of states (DOS) in a semiconductor may be increased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. For an oxide semiconductor, water also serves as an impurity in some cases. For an oxide semiconductor, entry of impurities may lead to formation of oxygen vacancies, for example. Furthermore, when the semiconductor is silicon, examples of an impurity which changes the characteristics of the semiconductor include oxygen, Group 1 elements except hydrogen, Group 2 elements, Group 13 elements, and Group 15 elements.

In this specification and the like, silicon oxynitride contains more oxygen than nitrogen. Silicon nitride oxide contains more nitrogen than oxygen.

In addition, in this specification and the like, the term "insulator" can be replaced with the term "insulating film" or "insulating layer." Moreover, the term "conductor" can be replaced with the term "conductive film" or "conductive layer." Furthermore, the term "semiconductor" can be replaced with the term "semiconductor film" or "semiconductor layer."

In this specification and the like, the term "parallel" indicates that the angle formed between two straight lines is greater than or equal to −10° and less than or equal to 10°. Thus, the case where the angle is greater than or equal to −5° and less than or equal to 5° is also included. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°. Thus, the case where the angle is greater than or equal to 85° and less than or equal to 95° is also included. The term "substantially perpendicular" indicates that the angle formed between two straight lines is greater than or equal to 60° and less than or equal to 120°.

Note that in this specification, a barrier film refers to a film having a function of inhibiting the passage of oxygen and impurities such as water or hydrogen. The barrier film that has conductivity may be referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is referred to as an oxide semiconductor in some cases. In other words, an OS FET or an OS transistor is a transistor including an oxide or an oxide semiconductor.

In this specification and the like, the term "normally off" means that current per micrometer of channel width flowing in a transistor when potential is not applied to a gate or the gate is supplied with a ground potential is lower than or equal to $1 \times 10^{-20}$ A at room temperature, lower than or equal to $1 \times 10^{-18}$ A at 85° C., or lower than or equal to $1 \times 10^{-16}$ A at 125° C.

Embodiment 1

An example of a semiconductor device including a transistor 200 of one embodiment of the present invention and a manufacturing method thereof will be described below.

Structure Example 1 of Semiconductor Device

FIGS. 4A to 4D are a top view and cross-sectional views of the transistor 200 of one embodiment of the present invention and the periphery of the transistor 200.

Figure 4A:
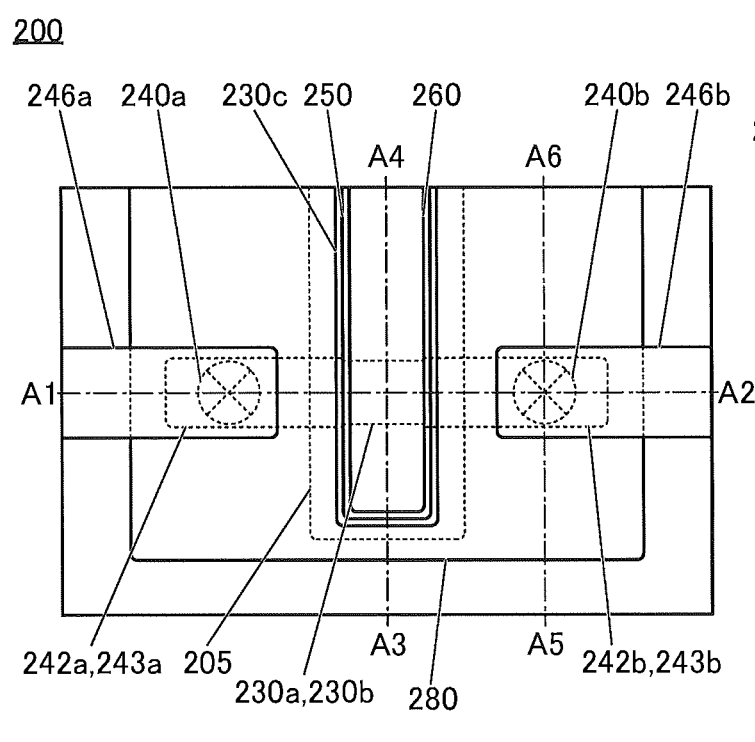
FIG. 4A is a top view of a semiconductor device and FIGS. 4B to 4D are cross-sectional views of the semiconductor device.
Figure 4C:
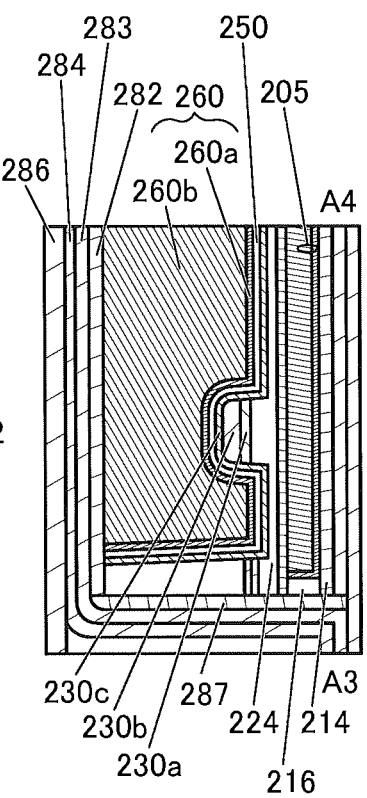
Figure 4B:
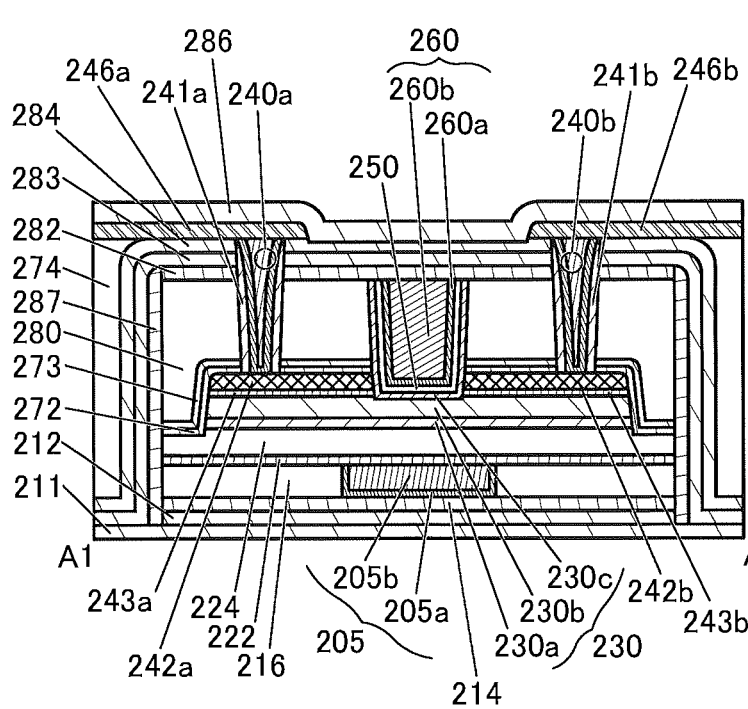
Figure 4D:
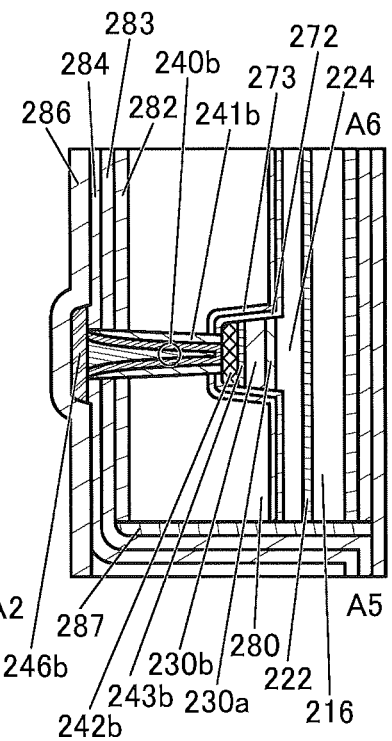

FIG. 4A is a top view of the semiconductor device including the transistor 200. FIGS. 4B and 4C are cross-sectional views of the semiconductor device. FIG. 4B is a cross-sectional view taken along dashed-dotted line A1-A2 in FIG. 4A, which corresponds to a cross-sectional view in the channel length direction of the transistor 200. FIG. 4C is a cross-sectional view taken along dashed-dotted line A3-A4 in FIG. 4A, which corresponds to a cross-sectional view in the channel width direction of the transistor 200. Furthermore, FIG. 4D is a cross-sectional view taken along dashed-dotted line A5-A6 in FIG. 4A. Note that for simplification of the drawing, some components are not illustrated in the top view in FIG. 4A.

Here, in the transistor 200, a semiconductor which includes a region where a channel is formed (hereinafter also referred to as a channel formation region) is preferably formed using a metal oxide functioning as an oxide semiconductor (hereinafter also referred to as an oxide semiconductor).

As the oxide semiconductor, for example, a metal oxide such as an In-M-Zn oxide (the element M is one or more of aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. As the oxide semiconductor, an In—Ga oxide or an In—Zn oxide may be used.

The transistor 200 including an oxide semiconductor in its channel formation region has an extremely low leakage current in the off state; thus, a semiconductor device with low power consumption can be provided. An oxide semiconductor can be deposited by a sputtering method or the like and thus can be used in the transistor 200 included in a highly integrated semiconductor device.

In contrast, a transistor including an oxide semiconductor easily has normally-on characteristics (characteristics such that a channel exists without voltage application to a gate electrode and a current flows in a transistor) owing to an impurity and an oxygen vacancy in the oxide semiconductor that affect the electrical characteristics.

In view of this, an oxide semiconductor with a reduced impurity concentration and a reduced density of defect states is preferably used. Note that in this specification and the like, a state with a low impurity concentration and a low density of defect states is referred to as a highly purified intrinsic or substantially highly purified intrinsic state.

Accordingly, the impurity concentration in the oxide semiconductor is preferably reduced as much as possible. Examples of impurities contained in the oxide semiconductor include hydrogen, nitrogen, alkali metal, alkaline earth metal, iron, nickel, and silicon.

Specifically, hydrogen as an impurity which is contained in the oxide semiconductor might form an oxygen vacancy (also referred to as Vo) in the oxide semiconductor. In some cases, a defect that is an oxygen vacancy into which hydrogen enters (hereinafter sometimes referred to as VoH) generates an electron serving as a carrier. In other cases, reaction between part of hydrogen and oxygen bonded to a metal atom generates an electron serving as a carrier.

Thus, a transistor including an oxide semiconductor with a high hydrogen content is likely to be normally on. Hydrogen in the oxide semiconductor is easily transferred by a stress such as heat or an electric field; thus, a high hydrogen content in the oxide semiconductor might reduce the reliability of the transistor.

Therefore, it is preferable that a transistor use a highly purified intrinsic oxide semiconductor in which oxygen vacancies and impurities such as hydrogen are reduced.

In view of the above, the transistor 200 is preferably sealed using a material that inhibits diffusion of impurities (hereinafter also referred to as an impurity barrier material) in order to inhibit entry of impurities from the outside.

Note that in this specification, a barrier property means a function of inhibiting diffusion of a targeted substance (or low permeability). Alternatively, a barrier property means a function of trapping and fixing (or gettering) a targeted substance.

Examples of a material that has a function of inhibiting diffusion of hydrogen and oxygen include aluminum oxide, hafnium oxide, gallium oxide, indium gallium zinc oxide, silicon nitride, and silicon nitride oxide. It is particularly preferable to use silicon nitride or silicon nitride oxide as a sealing material because of their high barrier properties against hydrogen.

Examples of a material having a function of trapping and fixing hydrogen include metal oxides such as aluminum oxide, hafnium oxide, gallium oxide, and indium gallium zinc oxide.

Here, a structure body for sealing the transistor 200 can be a single layer or a stacked-layer structure of two or more layers. In particular, the structure body for sealing the transistor 200 preferably has a stacked-layer structure or further preferably has a nested structure.

The case where the structure body for sealing the transistor 200 has a two-layer structure will be specifically described. The structure body for sealing the transistor 200 includes a first structure body that is close to the transistor 200 and a second structure body that is provided outside the first structure body. In other words, the transistor 200 and the second structure body are provided with the first structure body positioned therebetween.

In the above-described structure, the first structure body is preferably formed using a material having a function of trapping and fixing hydrogen. The second structure body is preferably formed using a material having a function of inhibiting diffusion of hydrogen and oxygen.

When a material having a function of trapping and fixing hydrogen is used on the side close to the transistor 200, hydrogen in the transistor 200 or hydrogen in an interlayer film provided between the first structure body and the transistor 200 is trapped and fixed in the first structure body and accordingly, the hydrogen concentration in the transistor 200 can be reduced.

Specifically, it is preferable to use aluminum oxide. In particular, low-crystallinity or amorphous aluminum oxide sometimes traps and fixes a larger amount of hydrogen than high-crystallinity aluminum oxide. Low-crystallinity or amorphous aluminum oxide has a property of diffusing hydrogen by heat treatment. That is, in the case where low-crystallinity or amorphous aluminum oxide is placed between a region with a high hydrogen concentration and a region with a low hydrogen concentration and heat treatment is performed, the hydrogen in the region with a low hydrogen concentration diffuses to the region with a high hydrogen concentration through the aluminum oxide.

Therefore, in the case where low-crystallinity or amorphous aluminum oxide is used as the first structure body, heat treatment is preferably performed after the transistor 200 is sealed with the first structure body. This heat treatment causes outward diffusion of hydrogen in the transistor 200 through an interlayer film and the aluminum oxide, whereby the hydrogen concentration in the transistor 200 and that in the aluminum oxide can be reduced. In other words, the absolute amount of hydrogen present in the semiconductor device can be reduced.

Meanwhile, the second structure body seals the transistor 200 with the first structure body positioned therebetween. Thus, the second structure body inhibits hydrogen that diffuses from the outside of the second structure body, from diffusing to a portion located inward from the second structure body (to the transistor 200 side). That is, the first structure body can efficiently trap and fix hydrogen present in a structure provided inward from the second structure body.

In the above structure, specifically, a metal oxide such as aluminum oxide can be used for the first structure body and a nitride such as silicon nitride can be used for the second structure body. More specifically, an aluminum oxide film is preferably provided between the transistor 200 and a silicon nitride film.

Furthermore, by appropriately setting deposition conditions for the material used for the structure bodies, their hydrogen concentrations can be reduced.

In general, a film formed by a CVD method has more favorable coverage than a film formed by a sputtering method. On the other hand, many compound gases used for a CVD method contain hydrogen and a film formed by a CVD method has higher hydrogen content than a film formed by a sputtering method.

Accordingly, it is preferable to use a film with a reduced hydrogen concentration (specifically, a film formed by a sputtering method) as a film which is close to the transistor 200, for example. Meanwhile, in the case where a film that has favorable coverage as well as a relatively high hydrogen concentration (specifically, a film formed by a CVD method) is used as a film for inhibiting impurity diffusion, it is preferable that a film having a function of trapping and fixing hydrogen and a reduced hydrogen concentration be provided between the transistor 200 and the film that has favorable coverage as well as a relatively high hydrogen concentration.

In other words, a film with a relatively low hydrogen concentration is preferably used as the film which is close to the transistor 200. In contrast, a film with a relatively high hydrogen concentration is preferably provided apart from the transistor 200.

When the above structure is employed and specifically, the transistor 200 is sealed with a silicon nitride film formed by a CVD method, an aluminum oxide film formed by a sputtering method is preferably provided between the transistor 200 and the silicon nitride film formed by a CVD method. It is further preferable that a silicon nitride film formed by a sputtering method be provided between the silicon nitride film formed by a CVD method and the aluminum oxide film formed by a sputtering method.

Note that in the case where a CVD method is employed for film formation, a compound gas containing no hydrogen atom or having a low hydrogen atom content may be used for the film formation to reduce the hydrogen concentration of the formed film.

A specific structure for sealing the transistor 200 is described below with reference to FIGS. 4A to 4D.

The semiconductor device of one embodiment of the present invention includes an insulator 211 over a substrate (not shown), an insulator 212 over the insulator 211, an insulator 214 over the insulator 212, the transistor 200 over the insulator 214, an insulator 280 over the transistor 200, an insulator 282 over the insulator 280, an insulator 287 covering a side surface of the insulator 280, an insulator 283 covering the insulator 282 and the insulator 287, an insulator 284 over the insulator 283, and an insulator 274 provided in contact with the insulator 284.

Note that the insulator 211, the insulator 212, the insulator 214, the insulator 280, the insulator 282, the insulator 287, the insulator 283, the insulator 284, and the insulator 274 function as interlayer films.

Here, in the case where a structure body including an excess oxygen region is provided in the vicinity of the oxide semiconductor, the excess oxygen of the structure body including the excess oxygen region can compensate for oxygen vacancies generated in the oxide semiconductor when diffusing thereto.

In this specification, oxygen that is released by heating is referred to as excess oxygen in some cases. Oxygen in excess of that in the stoichiometric composition is referred to as excess oxygen in other cases. A region where oxygen exists in excess of that in the stoichiometric composition may be referred to as an excess oxygen region.

Here, excess oxygen of an insulator might affect diffusion of hydrogen in the oxide semiconductor that is in contact with the insulator. Specific description is made with reference to FIG. 1. The structure body illustrated in FIG. 1 includes an oxide semiconductor 10 containing hydrogen, an insulator 12 that is in contact with the oxide semiconductor 10 and that contains excess oxygen, and a metal oxide 14 that is in contact with the insulator 12. Note that a metal atom included in the metal oxide 14 is a metal atom X.

The hydrogen existing in the oxide semiconductor 10 diffuses to another structure body through the insulator 12 that is in contact with the oxide semiconductor 10. The hydrogen in the oxide semiconductor 10 diffuses through the insulator 12 by reacting with the excess oxygen in the insulator 12 to have an OH bond. The hydrogen atom having the OH bond reacts with the oxygen atom bonded to the metal atom X in the metal oxide 14 in reaching the metal oxide 14, and is trapped or fixed in the metal oxide 14. The oxygen atom of the excess oxygen that has had the OH bond probably remains as the excess oxygen in the insulator 12. That is, the excess oxygen in the insulator 12 highly probably acts as a bridge in the hydrogen diffusion.

Note that in FIGS. 4A to 4D, the above-described oxide semiconductor 10 corresponds to an oxide 230c, and the insulator 12 corresponds to the insulator 280. Thus, the insulator 280 in contact with the oxide 230c preferably releases oxygen by heating.

As the insulator including an excess oxygen region, specifically, an oxide that releases part of oxygen by heating is preferably used. The oxide that releases part of oxygen by heating is an oxide in which the amount of released oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 400° C.

Specifically, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen, can be used. In particular, silicon oxide and silicon oxynitride, which have thermal stability, are preferable.

Thus, the insulator 280 preferably includes silicon oxide, silicon oxynitride, silicon nitride oxide, silicon oxide to which fluorine is added, silicon oxide to which carbon is added, silicon oxide to which carbon and nitrogen are added, porous silicon oxide, or the like.

In particular, silicon oxide and silicon oxynitride, which have thermal stability, are preferably used for the insulator 280. A material such as silicon oxide, silicon oxynitride, or porous silicon oxide is preferably used, in which case a region including oxygen that is released by heating can be easily formed. The insulator 280 may have a stacked-layer structure of the above materials, such as a stacked-layer structure of silicon oxide deposited by a sputtering method and silicon oxynitride deposited thereover by a CVD method. Silicon nitride may be stacked over the silicon oxynitride.

In order to provide the excess oxygen region in the insulator 280, oxygen (at least including any of oxygen radicals, oxygen atoms, and oxygen ions) is introduced into the insulator 280, so that a region containing excess oxygen is formed.

Specifically, a method for stacking metal oxides over the insulator 280 using a sputtering apparatus is given as an example of the oxygen introduction treatment. For example, by forming the insulator 282 in an oxygen gas atmosphere using a sputtering apparatus, oxygen can be introduced into the insulator 280 while the insulator 282 is formed.

It is particularly preferable that silicon oxynitride and aluminum oxide be used as the insulator 280 and the insulator 282, respectively. When an aluminum oxide film is formed over a silicon oxynitride film by a sputtering method, an excess oxygen region can be formed in silicon oxynitride, which is the object to be formed.

The concentration of impurities such as water or hydrogen in the insulator 280 is preferably lowered.

Here, diffusion behavior of excess oxygen, hydrogen, and a hydroxyl group in the insulator 280 in the case where the insulator 280 in contact with the oxide 230 was formed using silicon oxide was specifically examined by quantum molecular dynamics calculation.

<Calculation Model and Calculation Method>

First, calculation was conducted using a model of an amorphous $SiO_2$ structure (a-$SiO_2$ structure model) as a reference, the reference model to which one OH group was added, and the reference model to which one H atom and one O atom were added.

Figure 2A:
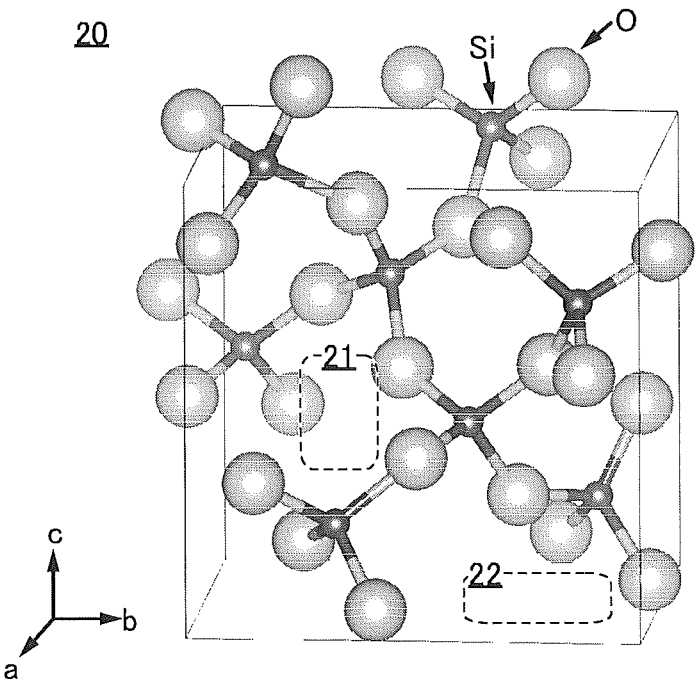
FIGS. 2A and 2B illustrate a diffusion model in an insulator.

Specifically, an a-$SiO_2$ structure model 20 in FIG. 2A, which includes a plurality of gap regions, was used as a reference crystal model. Note that the model 20 includes 24 atoms.

Figure 2B:
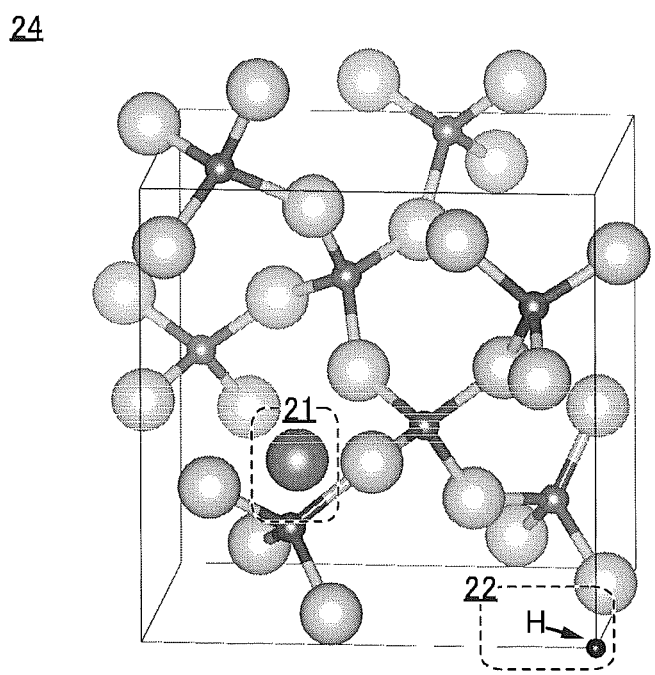

In a model 24 illustrated in FIG. 2B, which assumes that an H atom corresponding to an impurity and an O atom corresponding to excess oxygen exist in the model 20, one O atom and one H atom are respectively placed in a gap region 21 and a gap region 22 of the model 20. In a model 26 illustrated in FIG. 3A, which assumes that an OH group corresponding to an impurity exists in the model 20, one OH group is placed in the gap region 21 of the model 20.

The specific calculation is as follows. A first principle electronic state calculation package, Vienna Ab initio Simulation Package (VASP), was used for the atomic relaxation calculation. The calculation conditions are listed in the table below.

TABLE 1

| | |
|---|---|
| Calculation program | VASP |
| Basis function | Plane wave |
| Functional | GGA-PBE |
| Pseudo potential | PAW |
| Cut-off energy | 500 eV |
| Electron count | Neutral |
| k-point grid | 1 × 1 × 1 |

With the process temperature taken into account, calculation was conducted at a temperature of 700 K (approximately 400° C.) for 150 ps.

<Diffusion Behavior>

In the model 24 illustrated in FIG. 2B, immediately after the calculation started, the O atom corresponding to excess oxygen was bonded to the H atom corresponding to an impurity to be a hydroxyl group (OH group), and started to diffuse in the amorphous $SiO_2$ structure. That is, observed behavior of the generated OH group was such that it diffused in the amorphous $SiO_2$ structure and moved back and forth between a plurality of gap regions.

Figure 3A:
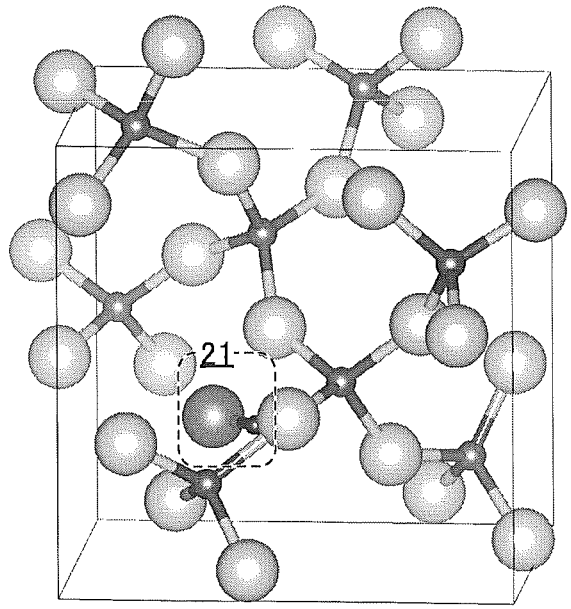
FIGS. 3A and 3B illustrate a diffusion model in an insulator.

Furthermore, in the model 26 illustrated in FIG. 3A, observed behavior of an OH group was such that it diffused in an amorphous $SiO_2$ structure and moved back and forth between a plurality of gap regions.

Figure 3B:
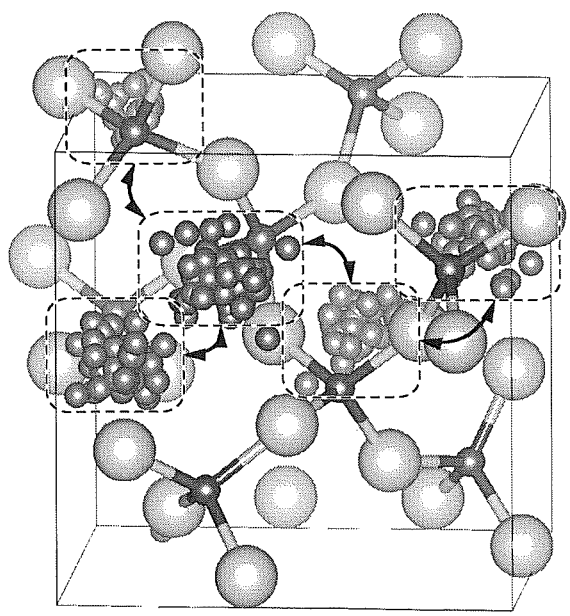

FIG. 3B is a schematic view that visualizes the diffusion behavior between 0 ps and 50 ps. Note that FIG. 3B shows a locus of a center coordinate between an O atom and an H atom of an OH group. Note that the amorphous $SiO_2$ structure is shown as being fixed as the initial structure. As shown in FIG. 3B, diffusion of an OH group throughout a plurality of gap regions (regions surrounded by dotted lines in the drawing) was observed.

Accordingly, the hydrogen existing in the oxide semiconductor 10 diffuses to another structure body through the insulator 12 that is in contact with the oxide semiconductor 10. It is confirmed that the hydrogen in the oxide semiconductor 10 diffuses through the insulator 12 by reacting with the excess oxygen in the insulator 12 to have an OH bond.

When the insulator 211, the insulator 212, the insulator 214, the insulator 282, the insulator 287, the insulator 283, and the insulator 284 are formed using a material with a barrier property against impurities, the oxide semiconductor of the transistor 200 can remain highly purified intrinsic.

Specifically, the insulator 214, the insulator 287, and the insulator 282 form a structure for sealing the transistor 200 and the insulator 280 (hereinafter also referred to as a sealing structure). For example, the insulator 214 is provided below the transistor 200, and the insulator 282 is provided above the transistor 200 as illustrated in FIGS. 4A to 4D. In addition, the insulator 287 like a sidewall is provided at a side surface of the transistor 200. A lower end portion of the insulator 287 like a sidewall is in contact with an end portion of the insulator 214, and an upper end portion of the insulator 287 is in contact with an end portion of the insulator 282.

It is preferable that the insulator 287 and the insulator 214 be reliably in contact with each other. Thus, to obtain a region where the insulator 214 and the insulator 287 are reliably in contact with each other, the insulator 287 is preferably provided to be in contact with a side surface of the insulator 212 which is provided below the insulator 214.

Accordingly, a structure in which the transistor 200 is surrounded by the insulator 214, the insulator 287, and the insulator 282 is formed.

Here, the insulator 214, the insulator 287, and the insulator 282 are formed using the same material. Preferably, the insulator 214, the insulator 287, and the insulator 282 are formed by a method using the same conditions. When the insulator 214, the insulator 287, and the insulator 282 having the same film property are in contact with each other, a sealing structure with high hermeticity can be formed.

In addition, the insulator 214, the insulator 287, and the insulator 282 are preferably formed using a material having a function of trapping and fixing hydrogen. Specifically, it is possible to use a metal oxide such as aluminum oxide, hafnium oxide, gallium oxide, or indium gallium zinc oxide.

The insulator 214, the insulator 287, and the insulator 282 that form the sealing structure are provided in contact with the transistor 200 or the insulator 280. Therefore, trapping and fixing of hydrogen that enters the transistor 200 or the insulator 280 can reduce the hydrogen concentration of the oxide semiconductor of the transistor 200.

The insulator 214, the insulator 287, and the insulator 282, which form the structure sealing the transistor 200, are surrounded by a sealing structure formed by the insulator 211, the insulator 212, and the insulator 283.

For example, as illustrated in FIGS. 4A to 4D, the insulator 211 and the insulator 212 are provided below the insulator 214, and the insulator 283 is provided to cover the insulator 287 and the insulator 282. Furthermore, the insulator 211 and the insulator 283 form the second sealing structure by being in contact with each other outside the structure for sealing the transistor 200 that is formed by the insulator 214, the insulator 287, and the insulator 282.

Here, the insulator 211, the insulator 212, and the insulator 283 are preferably formed using a material having a function of inhibiting diffusion of hydrogen and oxygen. It is particularly preferable to use silicon nitride or silicon nitride oxide as a sealing material because they have a high barrier property against hydrogen.

It is preferable that the insulator 284 with high coverage be provided above the insulator 283 that covers the transistor 200. Note that the insulator 284 is preferably formed using the same material as those for the insulator 211, the insulator 212, and the insulator 283.

When the insulator 212 and the insulator 283 are formed by a sputtering method, for example, the sealing structure can be formed of the films having relatively low hydrogen concentrations.

On the other hand, films that are formed by a sputtering method have relatively low coverage. In view of this, the insulator 211 and the insulator 284 are formed by a CVD method or the like which enables high coverage, whereby higher hermeticity can be achieved.

Accordingly, the insulator 212 and the insulator 283 preferably have lower hydrogen concentration than the insulator 211 and the insulator 284.

Note that preferably, the insulator 211, the insulator 212, the insulator 214, the insulator 282, the insulator 287, the insulator 283, and the insulator 284 may be formed using a material with a barrier property against oxygen. When the above sealing structure has a barrier property against oxygen, excess oxygen of the insulator 280 can be inhibited from diffusing outward and can be efficiently supplied to the transistor 200.

The semiconductor device of one embodiment of the present invention also includes a conductor 240 (a conductor 240a and a conductor 240b) electrically connected to the transistor 200 and functioning as a plug. Note that an insulator 241 (an insulator 241a and an insulator 241b) is provided in contact with a side surface of the conductor 240 functioning as a plug. A conductor 246 (a conductor 246a and a conductor 246b) electrically connected to the conductor 240 and functioning as a wiring is provided over the insulator 284 and the conductor 240. An insulator 286 is provided over the conductor 246 and the insulator 274.

Here, the insulator 241 (the insulator 241a or the insulator 241b) is provided in contact with an inner wall of an opening that is provided in an insulator 272, an insulator 273, the insulator 280, the insulator 282, the insulator 283, and the insulator 284. A first conductor of the conductor 240 (the conductor 240a or the conductor 240b) is provided in contact with a side surface of the insulator 241, and a second conductor of the conductor 240 is provided on the inner side.

Note that top surfaces of the conductor 240 and the insulator 284 can be substantially level with each other. Although the first conductor and the second conductor of the conductor 240 are stacked in the drawing, the present invention is not limited thereto. For example, the conductor 240 may have a single-layer structure or a stacked-layer structure of three or more layers.

The conductors 240a and 240b are each preferably formed using a conductive material containing tungsten, copper, or aluminum as its main component. The conductors 240a and 240b may have a stacked-layer structure. Note that the conductors 240a and 240b each have a circular shape in the top view in FIG. 4A; however, the shapes of the conductors are not limited thereto. For example, in the top view, the conductors 240a and 240b may each have an almost circular shape such as an elliptical shape, a polygonal shape such as a quadrangular shape, or a polygonal shape such as a quadrangular shape with rounded corners.

The conductor 240 having a stacked-layer structure is preferably formed using a conductive material having a function of inhibiting penetration of oxygen and impurities such as water and hydrogen. For example, tantalum, tantalum nitride, titanium, titanium nitride, ruthenium, or ruthenium oxide is preferably used. The conductive material having a function of inhibiting penetration of oxygen and impurities such as water and hydrogen may have a single-layer structure or a stacked-layer structure. With the use of the conductive material, entry of impurities such as water and hydrogen diffused from the insulator 280 or the like into the oxide 230 through the conductors 240a and 240b can be further suppressed. Furthermore, oxygen added to the insulator 280 can be prevented from being absorbed by the conductors 240a and 240b.

An insulator such as silicon nitride, aluminum oxide, or silicon nitride oxide may be used as the insulators 241a and 241b, for example. The insulators 241a and 241b are provided in contact with the insulators 274, 283, 282, 280, 273, and 272 and thus can inhibit entry of impurities such as water and hydrogen from the insulator 280 or the like into the oxide 230 through the conductors 240a and 240b. In particular, silicon nitride is suitable because of its high hydrogen blocking property. Furthermore, oxygen contained in the insulator 280 can be prevented from being absorbed by the conductors 240a and 240b.

The conductor 246 (the conductors 246a and 246b) functioning as a wiring may be provided in contact with the top surfaces of the conductors 240a and 240b. The conductor 246 is preferably formed using a conductive material containing tungsten, copper, or aluminum as its main component. The conductor 246 may have a stacked-layer structure, such as a stacked layer of any of the above conductive materials and titanium or titanium nitride. Note that the conductor 246 may be embedded in an opening provided in an insulator.

[Transistor 200]

As illustrated in FIGS. 4A to 4D, the transistor 200 includes an insulator 216, a conductor 205 (a conductor 205a and a conductor 205b), an insulator 222, an insulator 224, the oxide 230 (an oxide 230a, an oxide 230b, and the oxide 230c), a conductor 242 (a conductor 242a and a conductor 242b), an oxide 243 (an oxide 243a and an oxide 243b), the insulator 272, the insulator 273, an insulator 250, and a conductor 260 (a conductor 260a and a conductor 260b).

In the transistor 200, the conductor 260 functions as a first gate of the transistor and the conductor 205 functions as a second gate of the transistor. The conductor 242a and the conductor 242b serve as a source electrode and a drain electrode.

The oxide 230 functions as a semiconductor including a channel formation region.

The insulator 250 functions as a first gate insulator, and the insulator 222 and the insulator 224 function as a second gate insulator.

In the transistor 200 illustrated in FIGS. 4A to 4D, the conductor 260 is formed in a self-aligned manner in an opening portion provided in the interlayer films including the insulator 280, with the insulator 250 positioned between the conductor 260 and the interlayer films.

In other words, the conductor 260 is formed to fill the opening provided in the interlayer films including the insulator 280, with the insulator 250 positioned between the conductor 260 and the interlayer films; therefore, alignment of the conductor 260 in the region between the conductor 242a and the conductor 242b is not needed.

The oxide 230c is preferably provided in the opening that is provided in the interlayer films including the insulator 280. Thus, the insulator 250 and the conductor 260 include a region that overlaps with a stacked-layer structure of the oxide 230b and the oxide 230a with the oxide 230c positioned therebetween. When this structure is employed, the oxide 230c and the insulator 250 can be sequentially formed and thus, the interface between the oxide 230 and the insulator 250 can be kept clean. Accordingly, the influence of interface scattering on carrier conduction is small, and the transistor 200 can have a high on-state current and high frequency characteristics.

In the transistor 200 illustrated in FIGS. 4A to 4D, a bottom surface and a side surface of the conductor 260 are in contact with the insulator 250. Furthermore, a bottom surface and a side surface of the insulator 250 are in contact with the oxide 230c.

In addition, the insulator 282 and the oxide 230c are in direct contact with each other in the transistor 200 as illustrated in FIGS. 4B, 4C, and 4D. Owing to this structure, diffusion of oxygen contained in the insulator 280 to the conductor 260 can be inhibited.

Therefore, oxygen contained in the insulator 280 can be efficiently supplied to the oxide 230a and the oxide 230b through the oxide 230c, which can reduce oxygen vacancies in the oxide 230a and the oxide 230b and improve the electrical characteristics and reliability of the transistor 200.

The structure of the semiconductor device including the transistor 200 of one embodiment of the present invention will be described in detail below.

In the transistor 200, the oxide 230 (the oxide 230a, the oxide 230b, and the oxide 230c), which includes a channel formation region, is preferably formed using a metal oxide functioning as an oxide semiconductor (hereinafter also referred to as an oxide semiconductor).

For example, the metal oxide functioning as an oxide semiconductor preferably has an energy gap of 2 eV or more, further preferably 2.5 eV or more. With the use of a metal oxide having a wide energy gap, leakage current in a non-conduction state (off-state current) of the transistor 200 can be extremely small. With the use of such a transistor, a semiconductor device with low power consumption can be provided.

Specifically, as the oxide 230, a metal oxide such as an In-M-Zn oxide (the element M is one or more of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Alternatively, an In oxide, an In-M oxide, an In—Zn oxide, or an M-Zn oxide may be used as the oxide 230.

As illustrated in FIGS. 4A to 4D, the oxide 230 preferably includes the oxide 230a over the insulator 224, the oxide 230b over the oxide 230a, and the oxide 230c that is over the oxide 230b and at least partly in contact with the top surface of the oxide 230b. Note that the side surface of the oxide 230c is preferably in contact with the oxides 243a and 243b, the conductors 242a and 242b, and the insulators 272, 273, and 280.

That is, the oxide 230 includes the oxide 230a, the oxide 230b over the oxide 230a, and the oxide 230c over the oxide 230b. When the oxide 230a is provided below the oxide 230b, impurities can be inhibited from diffusing into the oxide 230b from the components formed below the oxide 230a. When the oxide 230c is provided over the oxide 230b, impurities can be inhibited from diffusing into the oxide 230b from the components formed above the oxide 230c.

The transistor 200 has a structure in which the three oxides 230a, 230b, and 230c are stacked in a channel formation region and its vicinity; however, the present invention is not limited to this structure. For example, the transistor 200 may include a single layer of the oxide 230b, a two-layer stack of the oxide 230b and the oxide 230a or 230c, or a four or more-layer stack. For example, the transistor 200 may include a four-layer stack including the oxide 230c with a two-layer structure.

The oxide 230 preferably has a stacked-layer structure of oxide layers which differ in the atomic ratio of metal elements. Specifically, the atomic ratio of the element M to constituent elements in the metal oxide used as the oxide 230a is preferably greater than that in the metal oxide used as the oxide 230b. Moreover, the atomic ratio of the element M to In in the metal oxide used as the oxide 230a is preferably greater than that in the metal oxide used as the oxide 230b. Moreover, the atomic ratio of In to the element M in the metal oxide used as the oxide 230b is preferably greater than that in the metal oxide used as the oxide 230a. The oxide 230c can be formed using a metal oxide which can be used as the oxide 230a or 230b.

Specifically, as the oxide 230a, a metal oxide having an atomic ratio of In:Ga:Zn=1:3:4 or a neighborhood thereof or a metal oxide having an atomic ratio of In:Ga:Zn=1:1:0.5 or a neighborhood thereof can be used. As the oxide 230b, a metal oxide having an atomic ratio of In:Ga:Zn=4:2:3 or a neighborhood thereof or a metal oxide having an atomic ratio of In:Ga:Zn=1:1:1 or a neighborhood thereof can be used. As the oxide 230c, a metal oxide having an atomic ratio of In:Ga:Zn=1:3:4 or a neighborhood thereof, a metal oxide having an atomic ratio of In:Ga:Zn=4:2:3 or a neighborhood thereof, a metal oxide having an atomic ratio of In:Ga:Zn=5:1:3 or a neighborhood thereof, a metal oxide having an atomic ratio of In:Ga:Zn=10:1:3 or a neighborhood thereof, a metal oxide having an atomic ratio of Ga:Zn=2:1 or a neighborhood thereof, or a metal oxide having an atomic ratio of Ga:Zn=2:5 or a neighborhood thereof can be used. Furthermore, specific examples of the oxide 230c having a stacked-layer structure include a stacked-layer structure of a layer having an atomic ratio of In:Ga:Zn=4:2:3 or a neighborhood thereof and a layer having an atomic ratio of In:Ga:Zn=1:3:4 or a neighborhood thereof; a stacked-layer structure of a layer having an atomic ratio of In:Ga:Zn=4:2:3 or a neighborhood thereof and a layer having an atomic ratio of In:Ga:Zn=5:1:3 or a neighborhood thereof; a stacked-layer structure of a layer having an atomic ratio of Ga:Zn=2:1 or a neighborhood thereof and a layer having an atomic ratio of In:Ga:Zn=4:2:3 or a neighborhood thereof; a stacked-layer structure of a layer having an atomic ratio of Ga:Zn=2:5 or a neighborhood thereof and a layer having an atomic ratio of In:Ga:Zn=4:2:3 or a neighborhood thereof; and a stacked-layer structure of a gallium oxide layer and a layer having an atomic ratio of In:Ga:Zn=4:2:3 or a neighborhood thereof. Note that "the neighborhood of an atomic ratio" includes atomic ratios in a range of ±30% of the desired atomic ratio.

The oxide 230b may have crystallinity. For example, it is preferable to use a c-axis-aligned crystalline oxide semiconductor (CAAC-OS) described later. An oxide having crystallinity, such as a CAAC-OS, has a dense structure with small amounts of impurities and defects (e.g., oxygen vacancies) and high crystallinity. Accordingly, extraction of oxygen from the oxide 230b by the source electrode or the drain electrode can be suppressed. This inhibits extraction of oxygen from the oxide 230b even when heat treatment is performed; hence, the transistor 200 is stable with respect to high temperatures in the manufacturing process (i.e., thermal budget).

The conductor 205 is positioned to be overlapped by the oxide 230 and the conductor 260. The conductor 205 is preferably provided to be embedded in the insulator 216.

Here, the conductor 260 functions as a first gate (also referred to as a top gate) in some cases. The conductor 205 functions as a second gate (also referred to as a bottom gate) in some cases.

In the case where the conductor 205 functions as a gate electrode, by changing a potential applied to the conductor 205 independently of a potential applied to the conductor 260, the threshold voltage (Vth) of the transistor 200 can be controlled. In particular, by applying a negative potential to the conductor 205, Vth of the transistor 200 can be higher, and its off-state current can be reduced. Thus, a drain current at the time when a potential applied to the conductor 260 is 0 V can be smaller in the case where a negative potential is applied to the conductor 205 than in the case where the negative potential is not applied to the conductor 205.

As illustrated in FIG. 4A, the conductor 205 is preferably larger than the region of the oxide 230 not overlapping with the conductor 242a and the conductor 242b. It is particularly preferred that the conductor 205 extend beyond an end portion of the oxide 230 that intersects with the channel width direction, as illustrated in FIG. 4C. That is, the conductor 205 and the conductor 260 preferably overlap with each other with the insulator positioned therebetween, in a region beyond the side surface of the oxide 230 in the channel width direction. The large-sized conductor 205 can sometimes relieve local charging (also referred to as charge buildup) in treatment using plasma after the formation of the conductor 205 in the manufacturing process. However, one embodiment of the present invention is not limited thereto. The conductor 205 overlaps with at least the oxide 230 positioned between the conductors 242a and 242b.

When the bottom surface of the insulator 224 is used as a reference, the bottom surface of the conductor 260 in a region not overlapping with the oxides 230a and 230b is preferably positioned below the bottom surface of the oxide 230b.

As illustrated in the drawing, when the conductor 260 functioning as a gate covers side and top surfaces of the oxide 230b in the channel formation region with the oxide 230c and the insulator 250 therebetween, the electric field generated from the conductor 260 is likely to affect the entire channel formation region formed in the oxide 230b. Accordingly, the transistor 200 can have a higher on-state current and higher frequency characteristics. In this specification, such a transistor structure in which the channel formation region is electrically surrounded by the electric fields of a first gate and a second gate is referred to as surrounded channel (s-channel) structure.

The conductor 205a preferably inhibits penetration of oxygen and impurities such as water and hydrogen. For example, the conductor 205a can be formed using titanium, titanium nitride, tantalum, or tantalum nitride. The conductor 205b is preferably formed using a conductive material containing tungsten, copper, or aluminum as its main component. The conductor 205 has a two-layer structure in the drawing but may have a multilayer structure of three or more layers.

Note that the oxide semiconductor, the insulator or conductor positioned below the oxide semiconductor, and the insulator or conductor positioned over the oxide semiconductor are preferably successively formed without exposure to the air, in which case a substantially highly purified intrinsic oxide semiconductor film with a reduced concentration of impurities (in particular, hydrogen and water) can be formed.

At least one of the insulators 222, 272, and 273 preferably functions as a barrier insulating film that inhibits entry of impurities such as water and hydrogen into the transistor 200 from the substrate side or from above the transistor 200. Therefore, at least one of the insulators 222, 272, and 273 is preferably formed using an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, $NO$, and $NO_2$), and a copper atom, that is, an insulating material through which the above impurities are less likely to pass. Alternatively, it is preferable to use an insulating material having a function of inhibiting diffusion of oxygen (e.g., at least one of oxygen atoms, oxygen molecules, and the like), that is, an insulating material through which the above oxygen is less likely to pass.

For example, it is preferable that silicon nitride, silicon nitride oxide, or the like be used for the insulator 273 and aluminum oxide, hafnium oxide, or the like be used for the insulator 272.

Accordingly, it is possible to inhibit diffusion of impurities such as water and hydrogen to the transistor 200 side from the substrate side through the insulator 222. It is also possible to inhibit diffusion of oxygen contained in the insulator 224 and the like to the substrate side through the insulator 222.

Impurities such as water and hydrogen can be inhibited from diffusing to the transistor 200 side from the insulator 280 and the like, which are provided with the insulator 272 and the insulator 273 therebetween. In this manner, the transistor 200 is preferably surrounded by the insulator 272 and the insulator 273 that have a function of inhibiting diffusion of oxygen and impurities such as water and hydrogen.

The insulators 222 and 224 each function as a gate insulator.

Here, it is preferable that the insulator 224 in contact with the oxide 230 release oxygen by heating. In this specification, oxygen that is released by heating is referred to as excess oxygen in some cases. For example, silicon oxide, silicon oxynitride, or the like may be used for the insulator 224 as appropriate. When such an insulator containing oxygen is provided in contact with the oxide 230, oxygen vacancies in the oxide 230 can be reduced, leading to an improvement in reliability of the transistor 200.

Specifically, the insulator 224 is preferably formed using an oxide material that releases part of oxygen by heating. An oxide that releases oxygen by heating is an oxide in which the amount of released oxygen molecules is greater than or equal to $1.0 \times 10^{18}$ molecules/cm$^3$, preferably greater than or equal to $1.0\times10^{19}$ molecules/cm$^3$, further preferably greater than or equal to $2.0\times10^{19}$ molecules/cm$^3$ or greater than or equal to $3.0\times10^{20}$ molecules/cm$^3$ in thermal desorption spectroscopy (TDS) analysis. In the TDS analysis, the film surface temperature is preferably higher than or equal to 100° C. and lower than or equal to 700° C., or higher than or equal to 100° C. and lower than or equal to 400° C.

The insulator 222 preferably functions as a barrier insulating film that inhibits entry of impurities such as water and hydrogen into the transistor 200 from the substrate side. For example, the insulator 222 preferably has a lower hydrogen permeability than the insulator 224. When the insulator 224, the oxide 230, and the like are surrounded by the insulators 222 and 283, entry of impurities such as water and hydrogen into the transistor 200 from the outside can be inhibited.

Furthermore, the insulator 222 preferably has a function of inhibiting diffusion of oxygen (e.g., at least one of oxygen atoms, oxygen molecules, and the like). That is, it is preferable that the above oxygen be less likely to pass through the insulator 222. For example, the insulator 222 preferably has a lower oxygen permeability than the insulator 224. The insulator 222 preferably has a function of inhibiting diffusion of oxygen or impurities, in which case diffusion of oxygen contained in the oxide 230 into a layer under the insulator 222 can be reduced. Furthermore, the conductor 205 can be inhibited from reacting with oxygen in the insulator 224 or the oxide 230.

As the insulator 222, an insulator containing an oxide of one or both of aluminum and hafnium that is an insulating material is preferably used. For the insulator containing an oxide of one or both of aluminum and hafnium, aluminum oxide, hafnium oxide, an oxide containing aluminum and hafnium (hafnium aluminate), or the like is preferably used. The insulator 222 formed of such a material functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

The insulator 222 may have a single-layer structure or a stacked-layer structure using an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST). With miniaturization and high integration of a transistor, a problem such as generation of leakage current may arise because of a thin gate insulator. When a high-k material is used for an insulator functioning as the gate insulator, a gate potential at the time of operating the transistor can be reduced while the physical thickness of the gate insulator is kept.

Note that the insulators 222 and 224 may each have a stacked-layer structure of two or more layers. In that case, the stacked layers are not necessarily formed of the same material and may be formed of different materials.

The oxide 243 (the oxides 243a and 243b) may be provided between the oxide 230b and the conductor 242 (the conductors 242a and 242b) functioning as a source electrode and a drain electrode. The conductor 242 and the oxide 230 are not in contact with each other, so that the conductor 242 can be inhibited from absorbing oxygen from the oxide 230. That is, preventing the oxidation of the conductor 242 can inhibit a decrease in the conductivity of the conductor 242. Accordingly, the oxide 243 preferably has a function of inhibiting the oxidation of the conductor 242.

Thus, the oxide 243 preferably has a function of inhibiting penetration of oxygen. The oxide 243 having a function of inhibiting penetration of oxygen is preferably provided between the oxide 230b and the conductor 242 functioning as the source electrode and the drain electrode, in which case the electric resistance between the conductor 242 and the oxide 230b can be reduced. Such a structure improves the electrical characteristics and reliability of the transistor 200.

A metal oxide including an element M may be used for the oxide 243. Specifically, the element M is preferably aluminum, gallium, yttrium, or tin. The concentration of the element M in the oxide 243 is preferably higher than that in the oxide 230b. Alternatively, gallium oxide may be used for the oxide 243. Further alternatively, a metal oxide such as In-M-Zn oxide may be used for the oxide 243. Specifically, the atomic ratio of the element M to In in the metal oxide used for the oxide 243 is preferably higher than that in the metal oxide used for the oxide 230b. The thickness of the oxide 243 ranges preferably from 0.5 nm to 5 nm, further preferably from 1 nm to 3 nm. The oxide 243 preferably has crystallinity. With the oxide 243 having crystallinity, release of oxygen in the oxide 230 can be favorably inhibited. When the oxide 243 has a hexagonal crystal structure, for example, release of oxygen in the oxide 230 can sometimes be inhibited.

Note that the oxide 243 is not necessarily provided. In that case, contact between the conductor 242 (the conductor 242a and the conductor 242b) and the oxide 230 may make oxygen in the oxide 230 diffuse into the conductor 242, resulting in oxidation of the conductor 242. It is highly probable that oxidation of the conductor 242 lowers the conductivity of the conductor 242. Note that the expression "oxygen in the oxide 230 diffuses into the conductor 242" can be replaced with the expression "the conductor 242 absorbs oxygen in the oxide 230".

When oxygen in the oxide 230 is diffused into the conductor 242 (the conductors 242a and 242b), a layer might be formed between the oxide 230b and each of the conductors 242a and 242b. The layer contains a larger amount of oxygen than the conductor 242 and thus presumably has an insulating property. In that case, a three-layer structure of the conductor 242, the layer, and the oxide 230b can be regarded as a three-layer structure of a metal, an insulator, and a semiconductor and is sometimes referred to as a metal-insulator-semiconductor (MIS) structure or a diode-connected structure mainly with an MIS structure.

The layer is not necessarily formed between the conductor 242 and the oxide 230b; for example, the layer may be formed between the conductor 242 and the oxide 230c or between the conductor 242 and each of the oxides 230b and 230c.

The conductor 242 (the conductors 242a and 242b) functioning as the source electrode and the drain electrode is provided over the oxide 243. The thickness of the conductor 242 is greater than or equal to 1 nm and less than or equal to 50 nm, preferably greater than or equal to 2 nm and less than or equal to 25 nm, for example.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

It is preferable that the insulator 272 be provided in contact with the top surface of the conductor 242 and function as a barrier layer. Such a structure can inhibit the conductor 242 from absorbing excess oxygen in the insulator 280. Furthermore, inhibiting the oxidation of the conductor 242 can suppress an increase in the contact resistance between the transistor 200 and the wiring. Accordingly, the transistor 200 can have excellent electrical characteristics and reliability.

Thus, the insulator 272 preferably has a function of inhibiting oxygen diffusion. For example, it is preferable that the insulator 272 be more likely to inhibit diffusion of oxygen than the insulator 280. For example, an insulator containing an oxide of one or both of aluminum and hafnium is preferably formed as the insulator 272. For another example, an insulator containing aluminum nitride may be used as the insulator 272.

As illustrated in FIGS. 4B and 4D, the insulator 272 is in contact with the side surface and part of the top surface of the conductor 242b. In addition, the insulator 272 is in contact with the side surface and part of the top surface of the conductor 242a. The insulator 273 is provided over the insulator 272. Such a structure can inhibit the conductor 242 from absorbing oxygen added to the insulator 280, for example.

The insulator 250 functions as a gate insulator. The insulator 250 is preferably in contact with a top surface of the oxide 230c. The insulator 250 can be formed using silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Silicon oxide and silicon oxynitride, which have thermal stability, are particularly preferable.

Like the insulator 224, the insulator 250 is preferably formed using an insulator from which oxygen is released by heating. When the insulator from which oxygen is released by heating is provided as the insulator 250 to be in contact with the top surface of the oxide 230c, oxygen can be effectively supplied to the channel formation region of the oxide 230b. Furthermore, as in the insulator 224, the concentration of impurities such as water and hydrogen in the insulator 250 is preferably lowered. The thickness of the insulator 250 is preferably greater than or equal to 1 nm and less than or equal to 20 nm.

A metal oxide may be provided between the insulator 250 and the conductor 260. The metal oxide preferably prevents oxygen diffusion from the insulator 250 into the conductor 260. Providing the metal oxide that inhibits oxygen diffusion inhibits diffusion of oxygen from the insulator 250 to the conductor 260. That is, the reduction in the amount of oxygen supplied to the oxide 230 can be inhibited. Moreover, oxidation of the conductor 260 due to oxygen in the insulator 250 can be inhibited.

The metal oxide functions as part of the gate insulator in some cases. For that reason, when silicon oxide, silicon oxynitride, or the like is used for the insulator 250, the metal oxide is preferably a high-k material with a high dielectric constant. The gate insulator having a stacked-layer structure of the insulator 250 and the metal oxide can be thermally stable and have a high dielectric constant. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one or more of hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, for example, aluminum oxide, hafnium oxide, or an oxide containing aluminum and hafnium (hafnium aluminate).

The metal oxide functions as part of the gate in some cases. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate, a conductive material containing oxygen and a metal element contained in a metal oxide in which a channel is formed. A conductive material containing any of the above metal elements and nitrogen may also be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may also be used. With the use of such a material, hydrogen contained in the metal oxide in which a channel is formed can be captured in some cases. Alternatively, hydrogen entering from an external insulator or the like can be captured in some cases.

Although FIGS. 4A to 4D show that the conductor 260 has a two-layer structure, the conductor 260 may have a single-layer structure or a stacked-layer structure of three or more layers.

The conductor 260a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductor 260a is preferably formed using a conductive material having a function of inhibiting diffusion of oxygen (e.g., at least one of oxygen atoms, oxygen molecules, and the like).

When the conductor 260a has a function of inhibiting diffusion of oxygen, the conductivity of the conductor 260b can be prevented from being lowered because of oxidization of the conductor 260b due to oxygen in the insulator 250. As a conductive material having a function of inhibiting oxygen diffusion, tantalum, tantalum nitride, ruthenium, or ruthenium oxide is preferably used, for example.

Furthermore, the conductor 260b is preferably formed using a conductive material including tungsten, copper, or aluminum as its main component. The conductor 260 also functions as a wiring and thus is preferably a conductor having high conductivity. For example, a conductive material containing tungsten, copper, or aluminum as its main component can be used. The conductor 260b may have a stacked-layer structure, for example, a stacked-layer structure of titanium or titanium nitride and the above conductive material.

Modification Example 1 of Semiconductor Device

An example of a semiconductor device including the transistor 200 of one embodiment of the present invention will be described below with reference to FIGS. 5A to 5D.

Figure 5A:
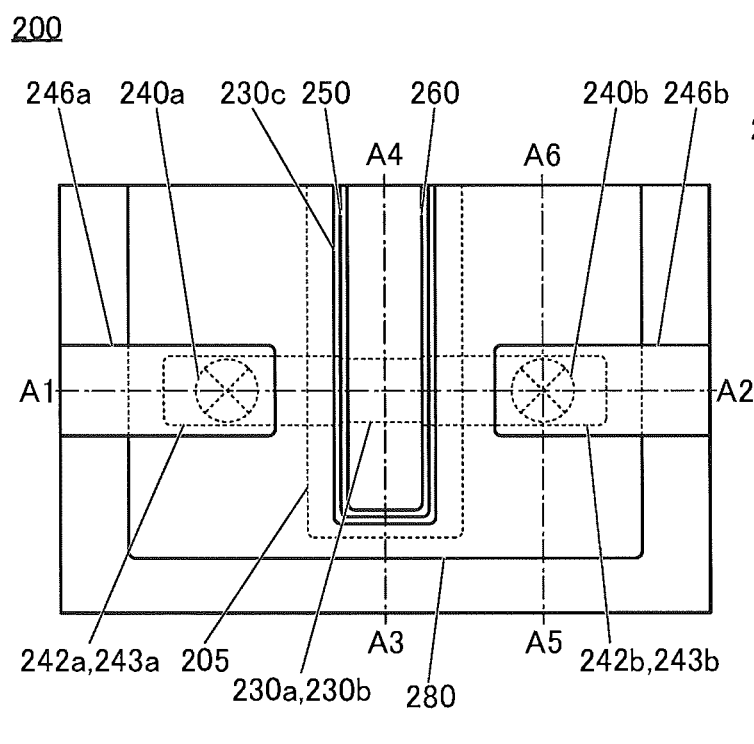
FIG. 5A is a top view of a semiconductor device and FIGS. 5B to 5D are cross-sectional views of the semiconductor device.
Figure 5C:
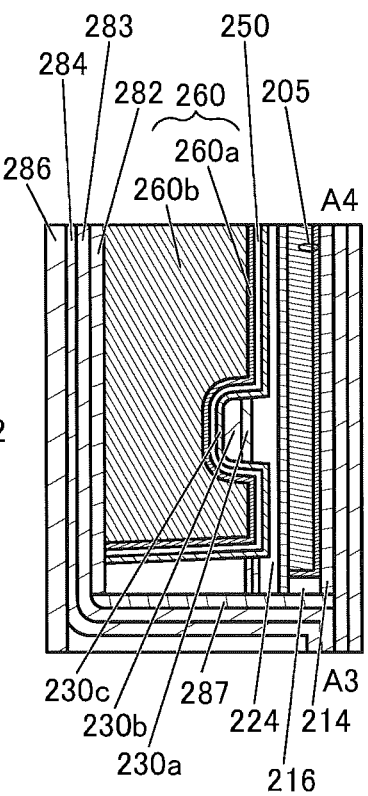
Figure 5B:
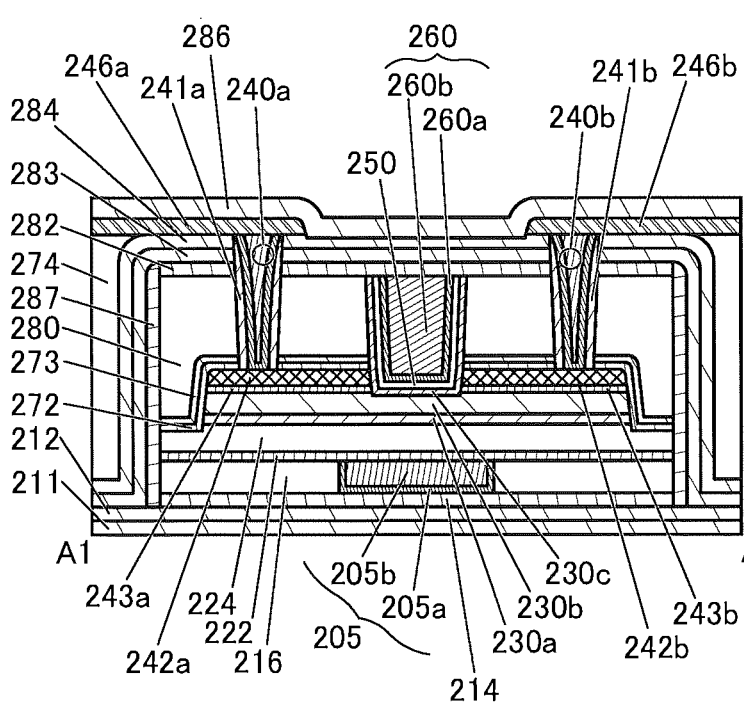
Figure 5D:
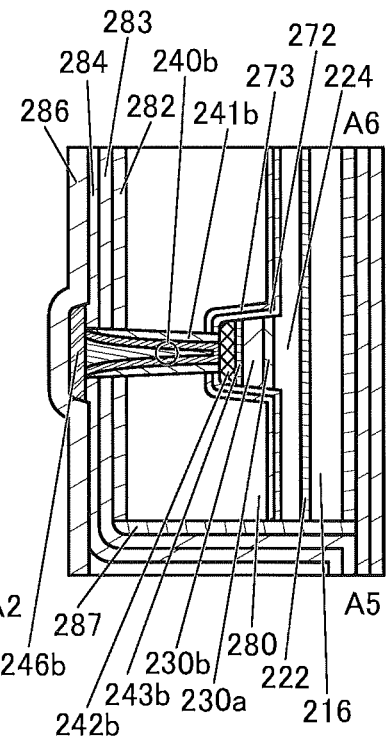

Here, FIG. 5A is a top view. FIG. 5B is a cross-sectional view taken along dashed-dotted line A1-A2 in FIG. 5A. FIG. 5C is a cross-sectional view taken along dashed-dotted line A3-A4 in FIG. 5A. FIG. 5D is a cross-sectional view taken along dashed-dotted line A5-A6 in FIG. 5A. Note that in the top view in FIG. 5A, some components are not illustrated for simplification of the drawing.

The semiconductor device illustrated in FIGS. 5A to 5D is different from the semiconductor device illustrated in FIGS. 4A to 4D in that the insulator 212 and the insulator 283 are in contact with each other. Specifically, the insulator 212 is preferably provided to extend below the insulator 273. The thickness of the insulator 212 in a region overlapping with the transistor 200 is sometimes larger than the thickness of the insulator 212 in a region in contact with the insulator 283.

Modification Example 2 of Semiconductor Device

An example of a semiconductor device including the transistor 200 of one embodiment of the present invention will be described below with reference to FIGS. 6A to 6D.

Figure 6A:
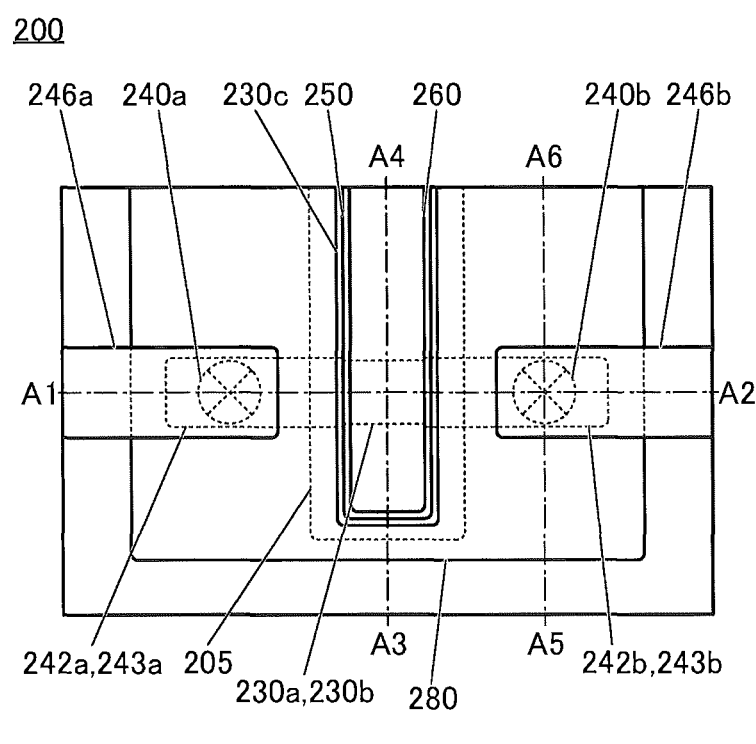
FIG. 6A is a top view of a semiconductor device and FIGS. 6B to 6D are cross-sectional views of the semiconductor device.
Figure 6B:
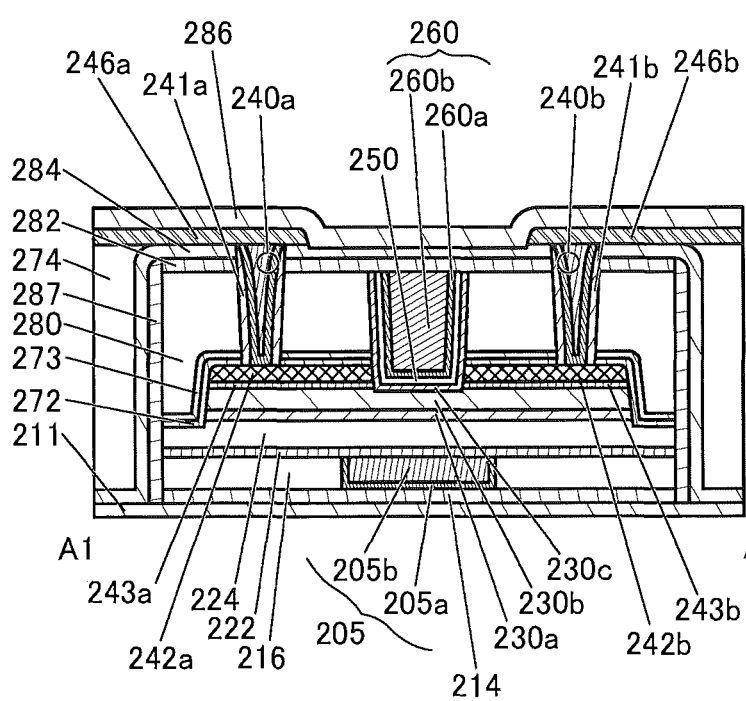
Figure 6C:
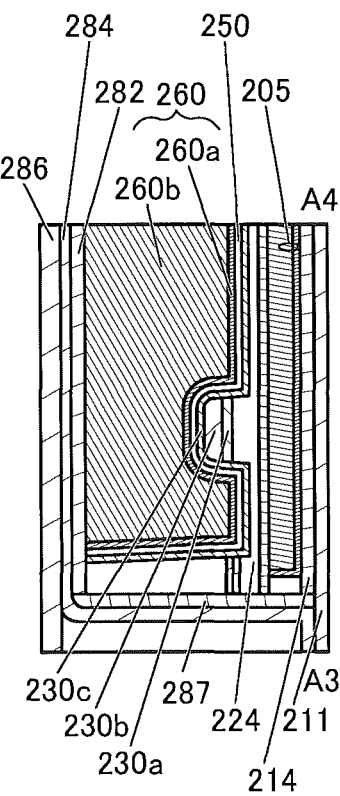
Figure 6D:
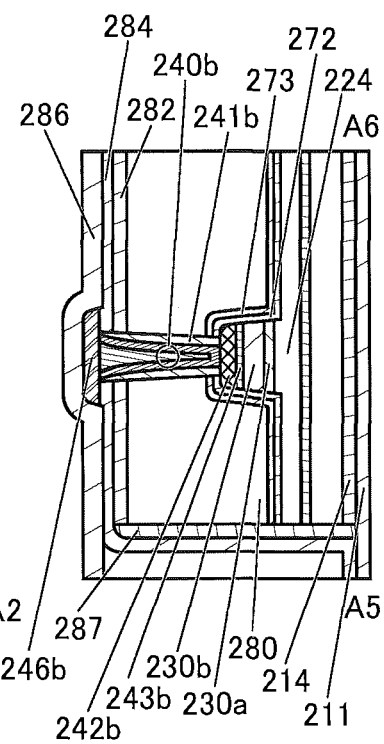
Figure 7A:
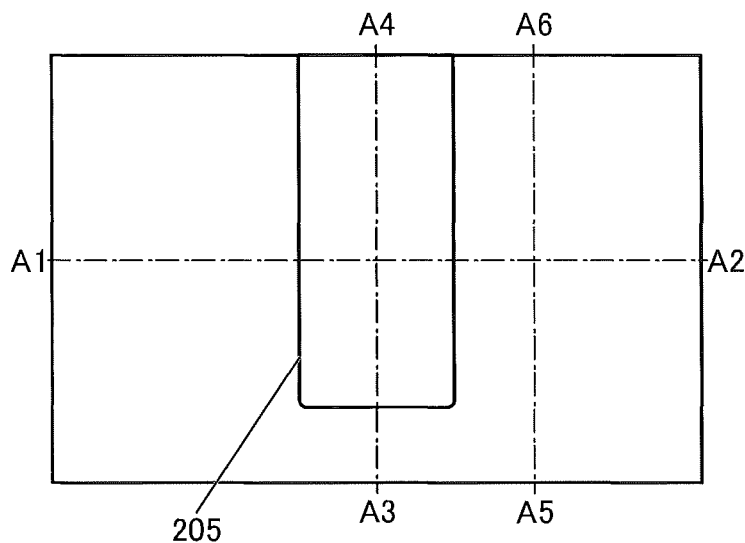
FIG. 7A is a top view illustrating a manufacturing method of a semiconductor device and FIGS. 7B to 7D are cross-sectional views illustrating the manufacturing method of the semiconductor device.
Figure 7C:
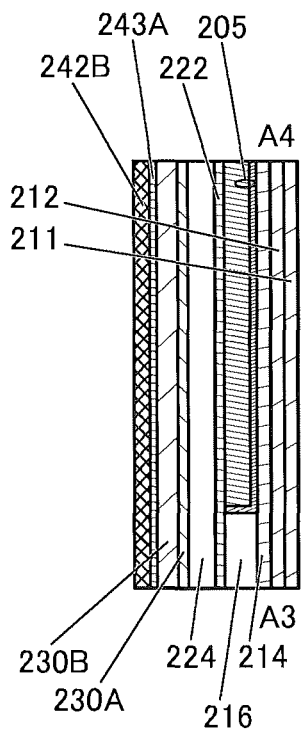
Figure 7B:
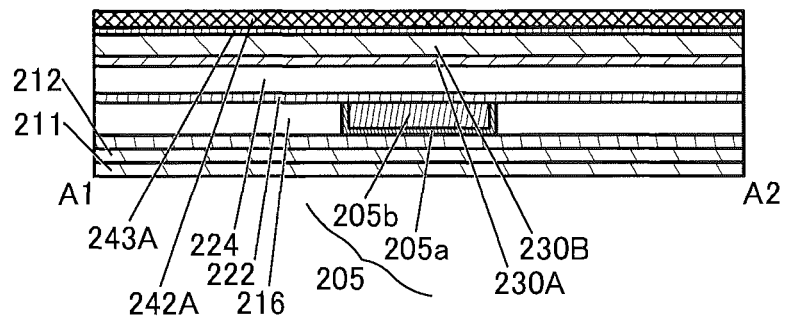
Figure 7D:
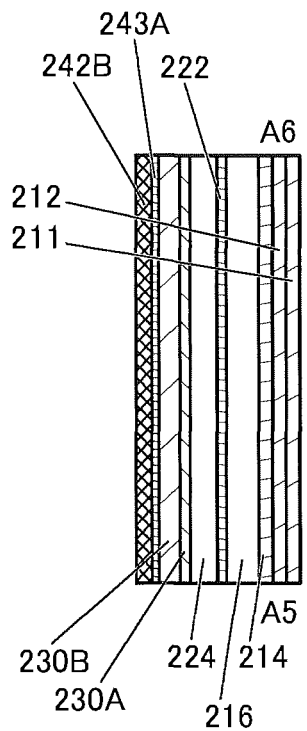
Figure 8A:
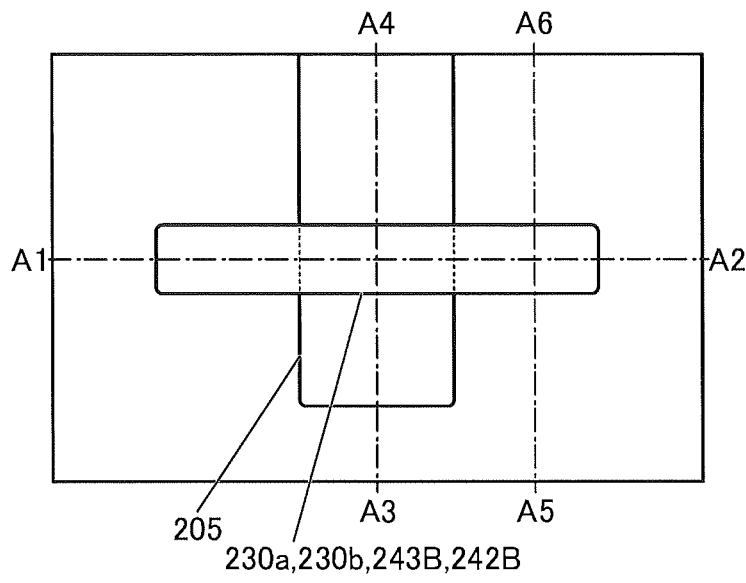
FIG. 8A is a top view illustrating a manufacturing method of a semiconductor device and FIGS. 8B to 8D are cross-sectional views illustrating the manufacturing method of the semiconductor device.
Figure 8C:
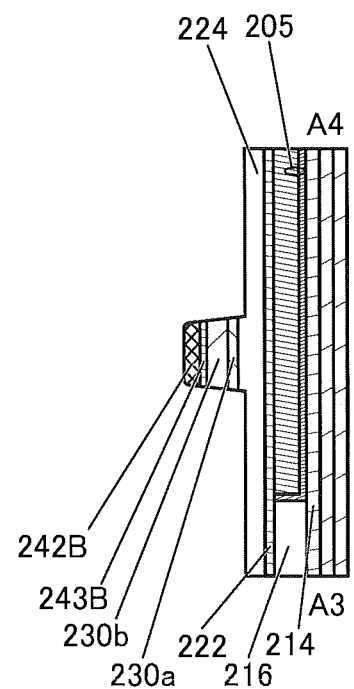
Figure 8B:
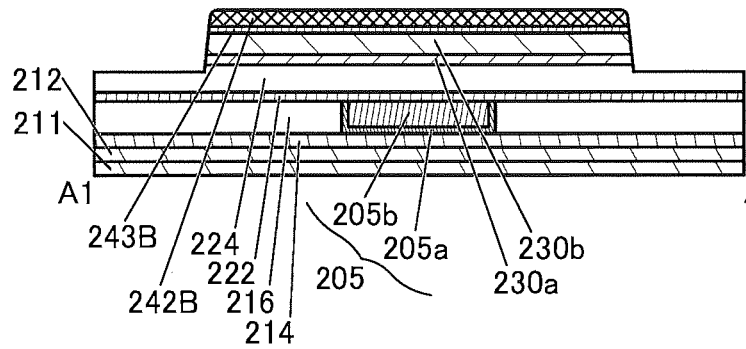
Figure 8D:
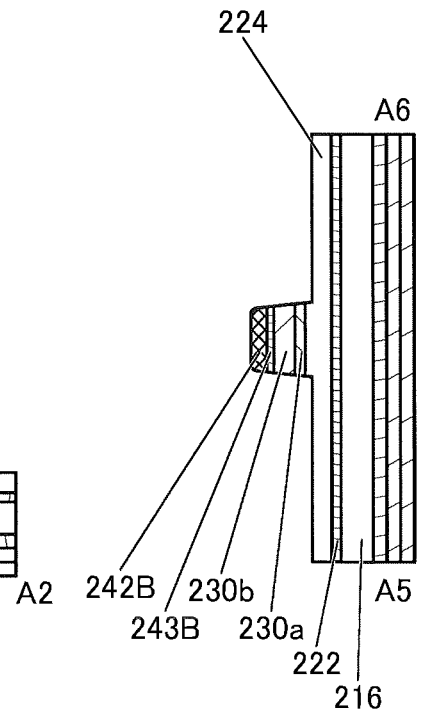
Figure 10A:
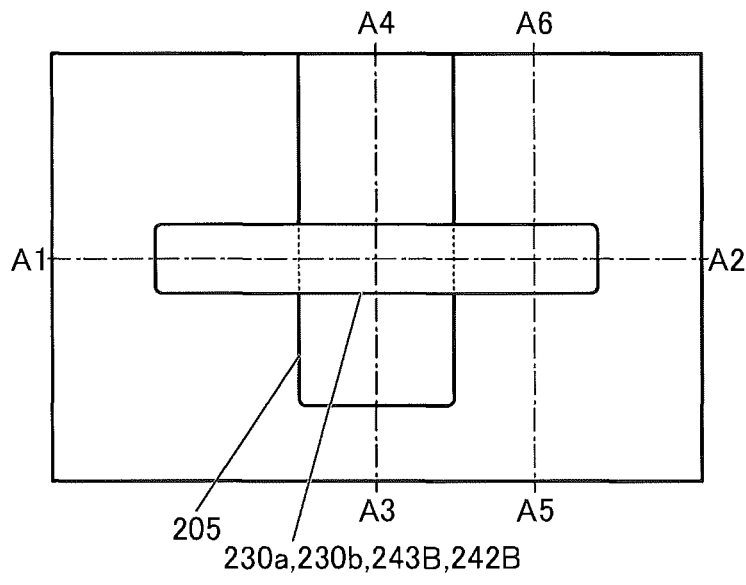
FIG. 10A is a top view illustrating a manufacturing method of a semiconductor device and FIGS. 10B to 10D are cross-sectional views illustrating the manufacturing method of the semiconductor device.
Figure 10C:
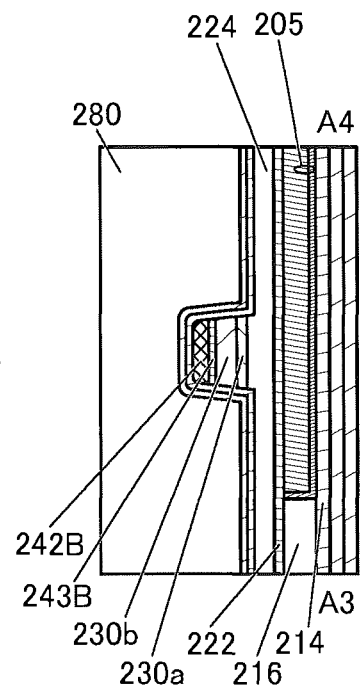
Figure 10B:
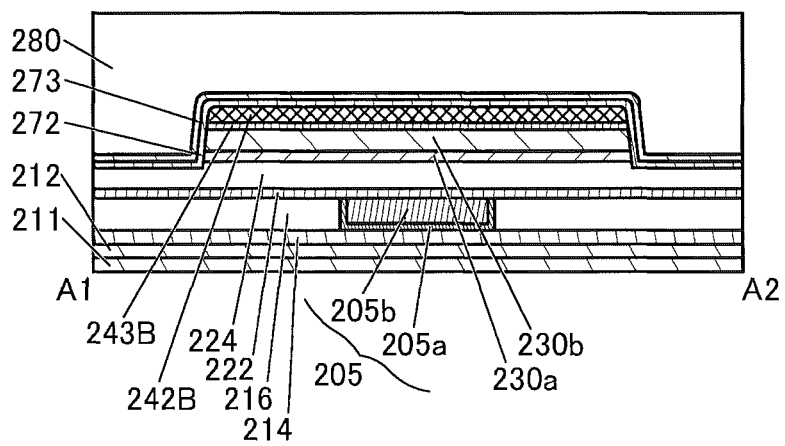
Figure 10D:
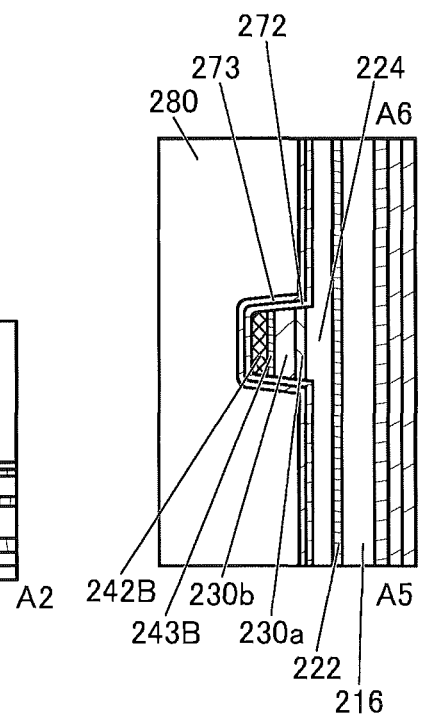
Figure 11A:
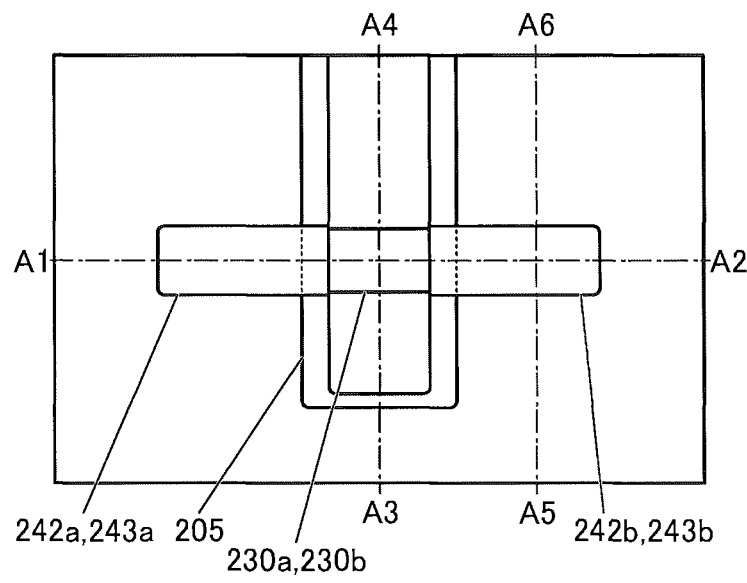
FIG. 11A is a top view illustrating a manufacturing method of a semiconductor device and FIGS. 11B to 11D are cross-sectional views illustrating the manufacturing method of the semiconductor device.
Figure 11C:
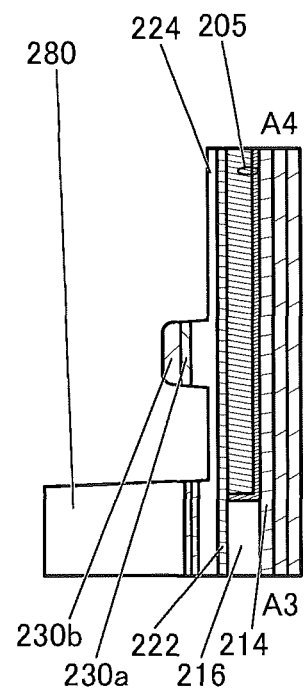
Figure 11B:
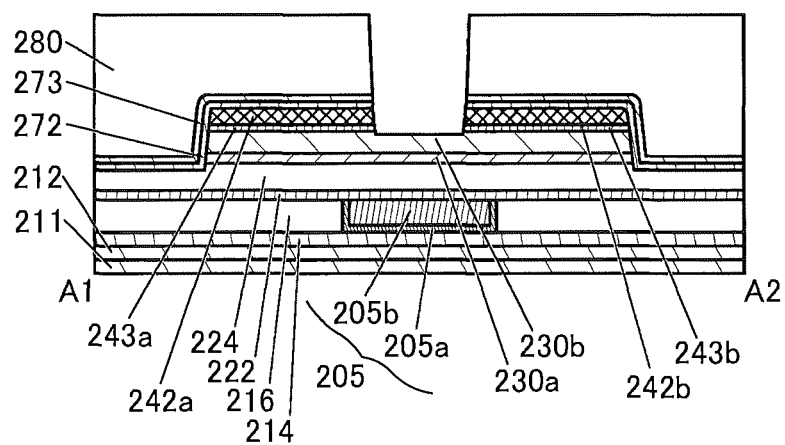
Figure 11D:
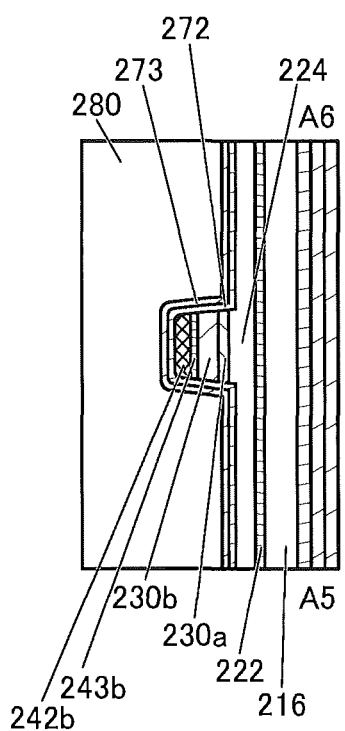
Figure 12A:
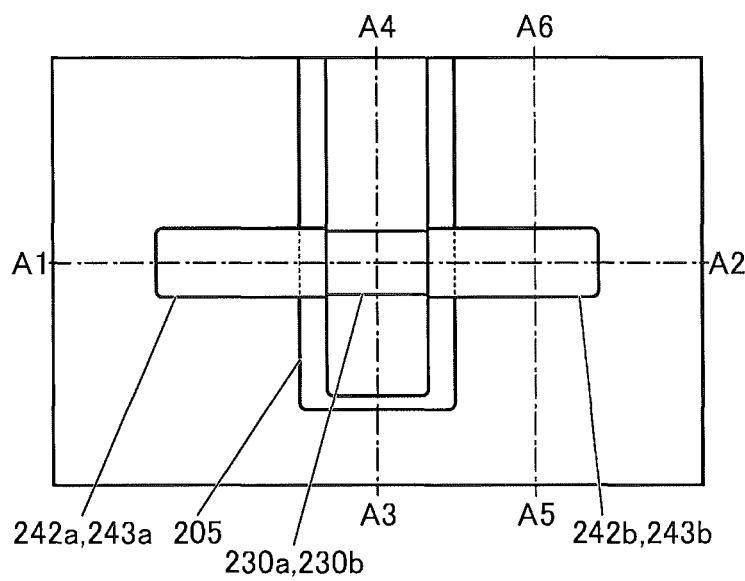
FIG. 12A is a top view illustrating a manufacturing method of a semiconductor device and FIGS. 12B to 12D are cross-sectional views illustrating the manufacturing method of the semiconductor device.
Figure 12C:
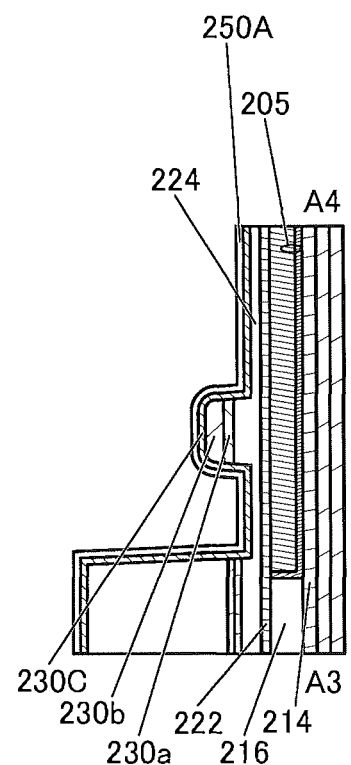
Figure 12B:
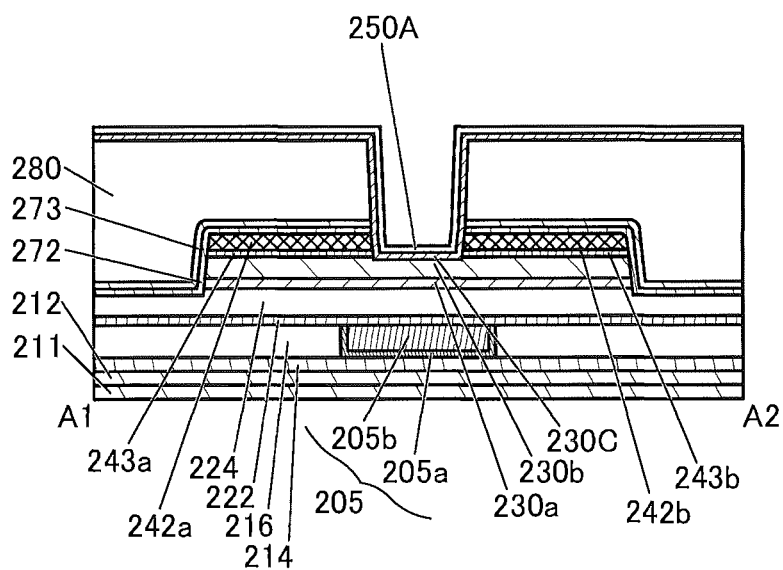
Figure 12D:
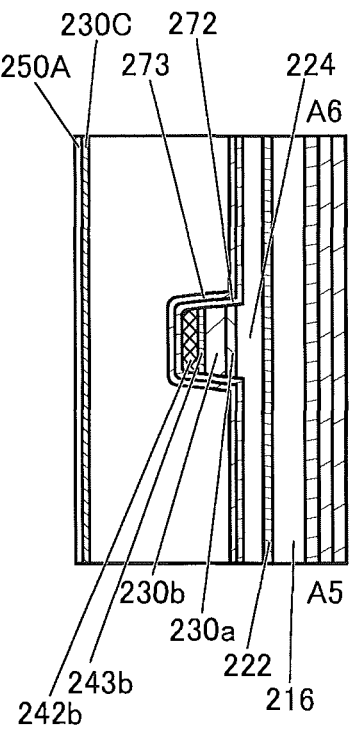
Figure 13A:
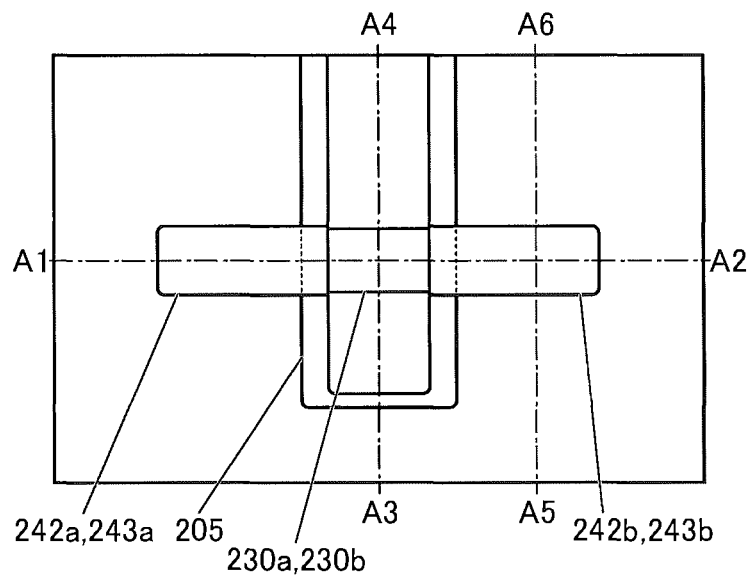
FIG. 13A is a top view illustrating a manufacturing method of a semiconductor device and FIGS. 13B to 13D are cross-sectional views illustrating the manufacturing method of the semiconductor device.
Figure 13C:
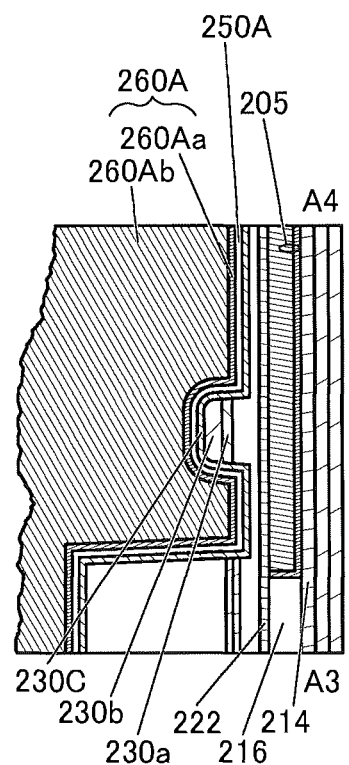
Figure 13B:
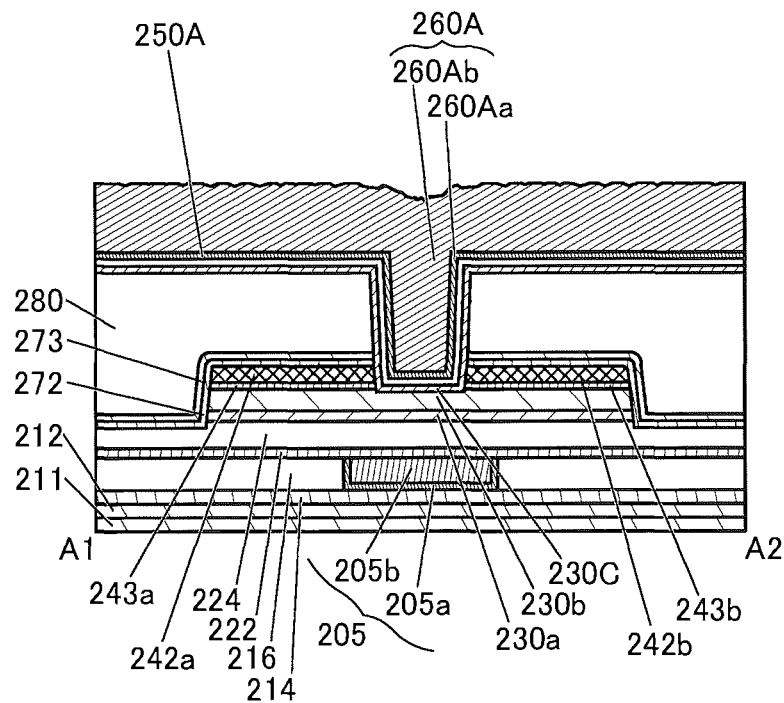
Figure 13D:
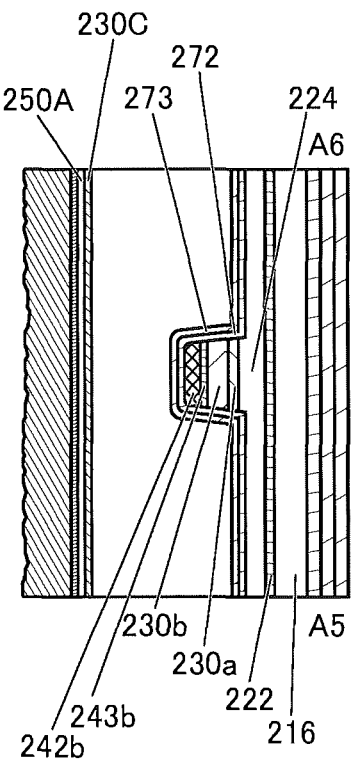
Figure 14A:
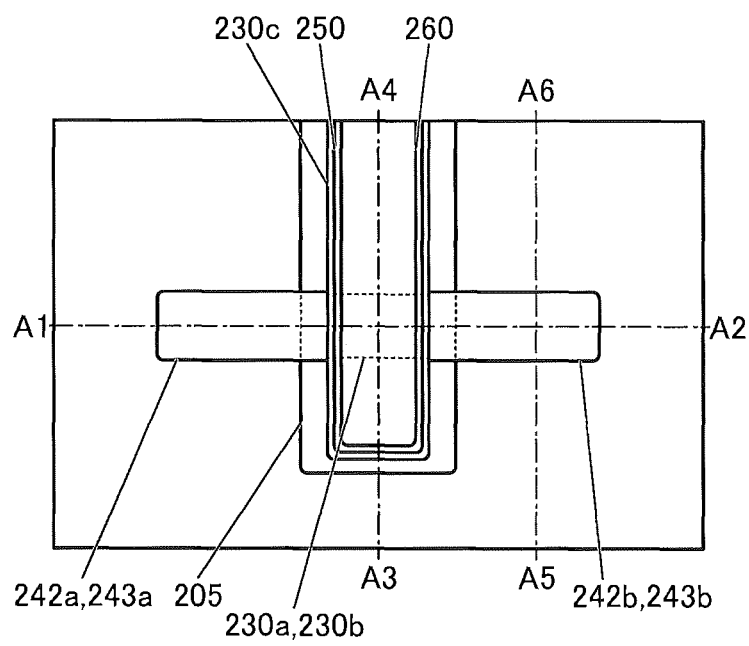
FIG. 14A is a top view illustrating a manufacturing method of a semiconductor device and FIGS. 14B to 14D are cross-sectional views illustrating the manufacturing method of the semiconductor device.
Figure 14C:
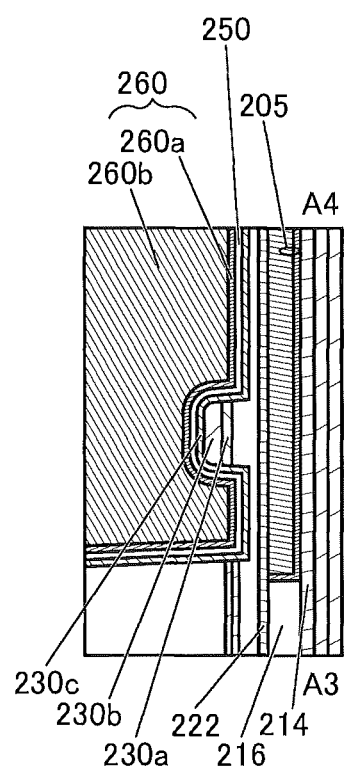
Figure 14B:
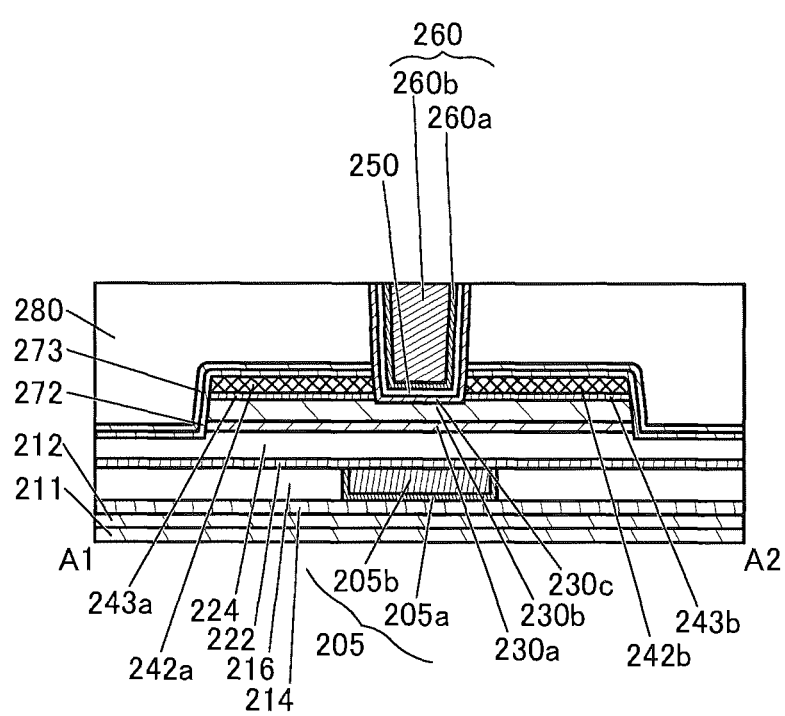
Figure 14D:
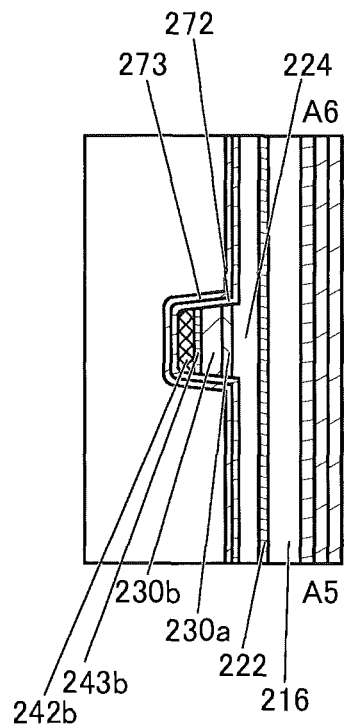

Here, FIG. 6A is a top view. FIG. 6B is a cross-sectional view taken along dashed-dotted line A1-A2 in FIG. 6A. FIG. 6C is a cross-sectional view taken along dashed-dotted line A3-A4 in FIG. 6A. FIG. 6D is a cross-sectional view taken along dashed-dotted line A5-A6 in FIG. 6A. Note that in the top view in FIG. 6A, some components are not illustrated for simplification of the drawing.

For example, as illustrated in FIGS. 6A to 6D, the insulator 212 and the insulator 284 are not necessarily provided in the case where the insulator 211 and the insulator 284 are formed by a CVD method using a compound gas containing no hydrogen atom or having a low hydrogen atom content.

For example, the insulator 211, the insulator 212, the insulator 283, and the insulator 284 can be formed by a CVD method using a compound gas containing no hydrogen atom or having a low hydrogen atom content. In other words, hydrogen that enters the channel formation region of the oxide semiconductor may be reduced by reducing the hydrogen concentration in the insulator 211, the insulator 212, the insulator 283, and the insulator 284.

For example, a gas containing a molecule including a silicon atom is mainly used as a deposition gas in formation of a film containing a silicon atom such as a silicon nitride film. In order to reduce the hydrogen concentration of the film to be formed, the molecule containing a silicon atom preferably contains as few hydrogen atoms as possible; further preferably, the molecule containing a silicon atom contains no hydrogen atom. Needless to say, a deposition gas other than the gas that contains a molecule containing a silicon atom also preferably contains as few hydrogen atoms as possible; further preferably, the deposition gas contains no hydrogen atom.

In the case where the molecule containing a silicon atom is expressed as $Si_x$—$R_y$, a functional group R can be at least one of an isocyanate group (—N=C=O), a cyanate group (—O—C≡N), a cyano group (—C≡N), a diazo group (=$N_2$), an azide group (—$N_3$), a nitroso group (—NO), and a nitro group (—$NO_2$). For example, $1 \leq x \leq 3$ and $1 \leq y \leq 8$ are satisfied. Examples of such a molecule containing a silicon atom include tetraisocyanatosilane, tetracyanatosilane, tetracyanosilane, hexaisocyanatosilane, and octaisocyanatosilane. The examples here each show the molecule in which functional groups of the same kind are bonded to the silicon atom; however, this embodiment is not limited to these examples. Different kinds of functional groups may be bonded to the silicon atom.

Alternatively, the functional group R may be, for example, halogen (Cl, Br, I, or F). For example, $1 \leq x \leq 2$ and $1 \leq y \leq 6$ are satisfied. Examples of such a molecule containing a silicon atom include tetrachlorosilane ($SiCl_4$) and hexachlorodisilane ($Si_2Cl_6$). Although an example of using chlorine as the functional group is described here, halogen other than chlorine, such as bromine, iodine, or fluorine, may be used as the functional group. In addition, different kinds of halogen may be bonded to the silicon atom.

The insulators 211, 212, 283, and 284 are formed by a chemical vapor deposition (CVD) method using a gas that contains the molecule containing a silicon atom. A CVD method, with a relatively high deposition rate, is suitable for forming an insulator having a large thickness.

As the CVD method, a plasma enhanced CVD (PECVD) method using plasma or a thermal CVD (TCVD) method using heat is preferably used. In the case of a thermal CVD method, an atmospheric pressure CVD (APCVD) method, in which deposition is performed under the atmospheric pressure, or a low pressure CVD (LPCVD) method, in which deposition is performed under pressure lower than the atmospheric pressure, may be used.

When the insulators 211, 212, 283, and 284 are formed by a CVD method, an oxidizer is preferably used. As an oxidizer, it is preferable to use a gas that does not contain a hydrogen atom, such as $O_2$, $O_3$, NO, $NO_2$, $N_2O$, $N_2O_3$, $N_2O_4$, $N_2O_5$, CO, or $CO_2$.

The insulators 211, 212, 283, and 284 may be formed by an atomic layer deposition (ALD) method. In an ALD method, a first source gas for reaction (hereinafter, referred to as a precursor or a metal precursor) and a second source gas for reaction (hereinafter, referred to as a reactant or a non-metal precursor) are alternately introduced into a chamber, and then the source gas introduction is repeated.

In an ALD method, deposition is performed while the source gases are switched, so that one atomic layer can be deposited at a time using self-controllability of atoms. Thus, an ALD method enables deposition of an extremely thin film, deposition on a component with a high aspect ratio, deposition of a film with few defects such as pinholes, deposition with excellent coverage, and the like. For this reason, an ALD method is suitable for not only formation of the insulator 211, the insulator 212, the insulator 283, and the insulator 284 but also formation of the insulator 250 and the insulator 224 of the transistor 200.

As an ALD method, a thermal ALD method, in which reaction between a precursor and a reactant is performed using only thermal energy, or a plasma-enhanced ALD (PEALD) method, in which a plasma-enhanced reactant is used, may be employed.

In the case of an ALD method, the gas that contains the molecule containing a silicon atom is used as a precursor, and the oxidizer is used as a reactant. Thus, the amount of hydrogen that enters the insulators 216, 274, 280, 224, and 250 can be significantly reduced.

Note that examples of the molecule containing a silicon atom and not containing a hydrogen atom are described above; however, this embodiment is not limited to these examples. In the molecule containing a silicon atom, some of the functional groups bonded to a silicon atom may be replaced with hydrogen atoms. Note that the number of hydrogen atoms in the molecule containing a silicon atom is preferably smaller than that of hydrogen atoms in silane ($SiH_4$). That is, the molecule containing a silicon atom preferably contains three or less hydrogen atoms per silicon atom. It is further preferable that the gas that contains the molecule containing a silicon atom contain three or less hydrogen atoms per silicon atom.

As described above, at least one of the insulators 211, 212, 283, and 284 is formed by a deposition method using a gas in which the number of hydrogen atoms is reduced or hydrogen atoms are removed, whereby the amount of hydrogen in the insulators can be reduced.

Thus, the transistor 200 and the insulator 280 are sealed doubly by a first sealing structure that uses a material trapping or fixing an impurity such as hydrogen and a second sealing structure that uses a material inhibiting diffusion of an impurity such as hydrogen, whereby the hydrogen concentration in the sealed region can be reduced and moreover, entry of hydrogen from the outside can be reduced by the insulator 283 and the insulator 212.

<<Metal Oxide>>

As the oxide 230, a metal oxide functioning as an oxide semiconductor is preferably used. A metal oxide that can be used as the oxide 230 according to the present invention is described below.

The metal oxide contains preferably at least indium or zinc and particularly preferably indium and zinc. In addition, aluminum, gallium, yttrium, tin, or the like is preferably contained. Furthermore, one or more elements selected from boron, titanium, iron, nickel, germanium, zirconium, molybdenum, lanthanum, cerium, neodymium, hafnium, tantalum, tungsten, magnesium, and the like may be contained.

Here, the case where the metal oxide is In-M-Zn oxide that contains indium, an element M, and zinc is considered. The element M is aluminum, gallium, yttrium, or tin. Other elements that can be used as the element M include boron, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also referred to as a metal oxide in some cases. Moreover, a metal oxide containing nitrogen may be referred to as a metal oxynitride.

[Composition of Metal Oxide]

The compositions of a cloud-aligned composite oxide semiconductor (CAC-OS) and a c-axis-aligned crystalline oxide semiconductor (CAAC-OS) which are metal oxides applicable to a transistor disclosed in one embodiment of the present invention will be described.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the aforementioned conducting function and the insulating regions have the aforementioned insulating function. In some cases, the conductive regions and the insulating regions in the material are separated at the nanoparticle level. In some cases, the conductive regions and the insulating regions are unevenly distributed in the material. The conductive regions are sometimes observed to be coupled in a cloud-like manner with their boundaries blurred.

In the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC metal oxide is used in a channel formation region of a transistor, high current drive capability in the on state of the transistor, that is, high on-state current and high field-effect mobility, can be obtained.

In other words, the CAC-OS or the CAC metal oxide can be referred to as a matrix composite or a metal matrix composite.

[Structure of Metal Oxide]

Oxide semiconductors are classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

Oxide semiconductors might be classified in a manner different from the above-described one when classified in terms of the crystal structure. Here, classification of the crystal structures of an oxide semiconductor is described with reference to FIG. 31A. FIG. 31A shows classification of the crystal structures of an oxide semiconductor, typically IGZO (a metal oxide containing In, Ga, and Zn).

As shown in FIG. 31A, IGZO is roughly classified into "Amorphous", "Crystalline", and "Crystal". "Amorphous" includes "completely amorphous". "Crystalline" includes "c-axis aligned crystalline (CAAC)", "nanocrystalline (nc)", and "cloud-aligned composite (CAC)". "Crystal" includes "single crystal" and "poly crystal".

Note that the structures in the thick frame in FIG. 31A belong to "New crystalline phase". These structures are in the boundary region between "Amorphous" and "Crystal". In other words, these structures are completely different from "Amorphous" and "Crystalline", which are energetically unstable.

Note that the crystal structure of a film or a substrate can be evaluated using an X-ray diffraction (XRD) image. FIGS. 31B and 31C show XRD spectra of quartz glass and IGZO having a crystal structure classified into "Crystalline" (which is also referred to as Crystalline IGZO). FIG. 31B shows the XRD spectrum of the quartz glass and FIG. 31C shows that of Crystalline IGZO. Note that Crystalline IGZO of FIG. 31C has an atomic ratio of In:Ga:Zn=4:2:3. Crystalline IGZO of FIG. 31C has a thickness of 500 nm.

As indicated by arrows in FIG. 31B, the XRD spectrum of the quartz glass shows a substantially symmetrical peak. In contrast, as indicated by arrows in FIG. 31C, the XRD spectrum of Crystalline IGZO shows an asymmetrical peak. The asymmetrical peak of the XRD spectrum clearly shows the existence of a crystal. In other words, the measurement object (here, Crystalline IGZO) cannot be said to be "Amorphous" unless its XRD spectrum peak is bilaterally symmetrical.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that it is difficult to observe a clear crystal grain boundary (also referred to as a grain boundary) even in the vicinity of distortion in the CAAC-OS. That is, a lattice arrangement is distorted and thus formation of a grain boundary is inhibited. This is because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter an In layer) and a layer containing the element M, zinc, and oxygen (hereinafter an (M, Zn) layer) are stacked. Note that indium and the element M can be replaced with each other, and when the element M of the (M, Zn) layer is replaced with indium, the layer can be referred to as an (In, M, Zn) layer. When indium of the In layer is replaced with the element M, the layer can be referred to as an (In, M) layer.

The CAAC-OS is a metal oxide with high crystallinity. By contrast, in the CAAC-OS, a reduction in electron mobility due to a grain boundary is less likely to occur because it is difficult to observe a clear grain boundary. Entry of impurities, formation of defects, or the like might decrease the crystallinity of a metal oxide. This means that the CAAC-OS is a metal oxide having small amounts of impurities and defects (e.g., oxygen vacancies). Thus, a metal oxide including the CAAC-OS is physically stable. Accordingly, the metal oxide including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method.

Note that In—Ga—Zn oxide (hereinafter IGZO) that is a metal oxide containing indium, gallium, and zinc has a stable structure in some cases by being formed of the above-described nanocrystals. In particular, IGZO crystals tend not to grow in the air and thus, a stable structure is obtained when IGZO is formed of smaller crystals (e.g., the above-described nanocrystals) rather than larger crystals (here, crystals with a size of several millimeters or several centimeters).

The a-like OS is a metal oxide having a structure between those of the nc-OS and the amorphous oxide semiconductor. The a-like OS has a void or a low-density region. That is, the a-like OS has low crystallinity as compared with the nc-OS and the CAAC-OS.

An oxide semiconductor (metal oxide) can have any of various structures that show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Impurities]

Here, the influence of impurities in the metal oxide is described.

Entry of impurities into the oxide semiconductor forms defect states or oxygen vacancies in some cases. Thus, when impurities enter a channel formation region of the oxide semiconductor, the electrical characteristics of a transistor using the oxide semiconductor tend to vary and its reliability is degraded in some cases. Moreover, if the channel formation region includes oxygen vacancies, the transistor tends to have normally-on characteristics.

The above-described defect states may include a trap state. Charge trapped by a trap state in the metal oxide takes a long time to be released and may behave like fixed charge. Thus, a transistor including the metal oxide having a high density of trap states in the channel formation region has unstable electrical characteristics in some cases.

If impurities exist in the channel formation region of the oxide semiconductor, the crystallinity of the channel formation region may decrease, and the crystallinity of an oxide in contact with the channel formation region may decrease. Low crystallinity of the channel formation region tends to result in deterioration in stability or reliability of the transistor. Moreover, if the crystallinity of the oxide in contact with the channel formation region is low, an interface state may be formed and the stability or reliability of the transistor may deteriorate.

Therefore, the reduction in concentration of impurities in and around the channel formation region of the oxide semiconductor is effective in improving the stability or reliability of the transistor. Examples of impurities include hydrogen, nitrogen, alkali metal, alkaline earth metal, iron, nickel, and silicon.

Specifically, the concentration of the above impurities obtained by SIMS is lower than or equal to $1 \times 10^{18}$ atoms/cm$^3$, preferably lower than or equal to $2 \times 10^{16}$ atoms/cm$^3$ in and around the channel formation region of the oxide semiconductor.

Alternatively, the concentration of the above impurities obtained by element analysis using EDX is lower than or equal to 1.0 at. % in and around the channel formation region of the oxide semiconductor. When an oxide containing the element M is used as the oxide semiconductor, the concentration ratio of the impurities to the element M is lower than 0.10, preferably lower than 0.05 in and around the channel formation region of the oxide semiconductor. Here, the concentration of the element M used in the calculation of the concentration ratio may be a concentration in a region whose concentration of the impurities is calculated or may be a concentration in the oxide semiconductor.

A metal oxide with a low impurity concentration has a low density of defect states and thus has a low density of trap states in some cases.

In the case where hydrogen enters an oxygen vacancy in the metal oxide, the oxygen vacancy and the hydrogen are bonded to each other to form VoH in some cases. The VoH serves as a donor and an electron that is a carrier is generated in some cases. In other cases, bonding of part of hydrogen to oxygen bonded to a metal atom generates an electron serving as a carrier.

Thus, a transistor including an oxide semiconductor with a high hydrogen content is likely to be normally on. Hydrogen in the oxide semiconductor is easily transferred by a stress such as heat or an electric field; thus, a high hydrogen content in the oxide semiconductor might reduce the reliability of the transistor.

Accordingly, the amount of VoH in the oxide semiconductor is preferably reduced as much as possible so that the oxide semiconductor becomes a highly purified intrinsic or substantially highly purified intrinsic oxide semiconductor. In order to obtain such an oxide semiconductor with a sufficiently small amount of VoH, it is important to remove impurities such as moisture and hydrogen in the oxide semiconductor (this treatment is sometimes referred to as dehydration or dehydrogenation treatment) and supply oxygen to the oxide semiconductor to fill oxygen vacancies (this treatment is sometimes referred to as oxygen adding treatment). When an oxide semiconductor with sufficiently small amounts of VoH and impurities is used for a channel formation region of a transistor, the transistor can have stable electrical characteristics.

An oxide semiconductor with a low carrier concentration is preferably used for the transistor. In order to reduce the carrier concentration of the oxide semiconductor, the concentration of impurities in the oxide semiconductor is reduced so that the density of defect states can be reduced. In this specification and the like, a state with a low concentration of impurities and a low density of defect states is referred to as a highly purified intrinsic or substantially highly purified intrinsic state. Examples of impurities contained in the oxide semiconductor include hydrogen, nitrogen, alkali metal, alkaline earth metal, iron, nickel, and silicon.

Specifically, hydrogen contained in an oxide semiconductor reacts with oxygen bonded to a metal atom to be water, and thus sometimes causes an oxygen vacancy in the oxide semiconductor. If the channel formation region in the oxide semiconductor includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates an electron serving as a carrier. Thus, a transistor including an oxide semiconductor that contains a large amount of hydrogen is likely to have normally-on characteristics.

Note that a defect that is an oxygen vacancy into which hydrogen enters (VoH) can serve as donors of the oxide semiconductor; however, it is difficult to quantitatively evaluate the defects. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

The carrier concentration of the oxide semiconductor in the channel formation region is preferably lower than or equal to $1\times10^{18}$ cm$^3$, further preferably lower than $1\times10^{17}$ cm$^3$, still further preferably lower than $1\times10^{16}$ cm$^{-3}$, yet further preferably lower than $1\times10^{13}$ cm$^3$, and yet still further preferably lower than $1\times10^{12}$ cm$^3$. Note that the lower limit of the carrier concentration of the oxide semiconductor in the channel formation region is not particularly limited and can be, for example, $1\times10^{-9}$ cm$^3$.

One embodiment of the present invention can provide a highly reliable semiconductor device. One embodiment of the present invention can provide a semiconductor device with favorable electrical characteristics. One embodiment of the present invention can provide a semiconductor device with a high on-state current. One embodiment of the present invention can provide a miniaturized or highly integrated semiconductor device. One embodiment of the present invention can provide a semiconductor device with low power consumption.

<<Other Semiconductor Materials>>

A semiconductor material that can be used for the oxide 230 is not limited to the above metal oxides. A semiconductor material having a band gap (a semiconductor material that is not a zero-gap semiconductor) may be used for the oxide 230. For example, a single element semiconductor such as silicon, a compound semiconductor such as gallium arsenide, or a layered material functioning as a semiconductor (also referred to as an atomic layer material, a two-dimensional material, or the like) is preferably used as the semiconductor material. The layered material functioning as a semiconductor is particularly suitable as the semiconductor material.

Note that in this specification and the like, the layered material generally refers to a group of materials having a layered crystal structure. The layered crystal structure refers to a structure in which layers formed by a covalent bond or an ionic bond are stacked with a bond that is weaker than the covalent bond or the ionic bond, such as a van der Waals force. The layered material has high electrical conductivity in a monolayer, that is, high two-dimensional electrical conductivity. With the use of a material functioning as a semiconductor and having high two-dimensional electrical conductivity in a channel formation region, a transistor with a high on-state current can be provided.

Examples of the layered material include graphene, silicene, and chalcogenide. Chalcogenide is a compound containing chalcogen. Chalcogen is a general term of Group 16 elements such as oxygen, sulfur, selenium, tellurium, polonium, and livermorium. Examples of chalcogenide include chalcogenide of transition metals and chalcogenide of Group 13 elements.

Chalcogenide of transition metals that functions as a semiconductor is preferably used as the oxide 230, for example. Specific examples of chalcogenide of transition metals that can be used as the oxide 230 include molybdenum sulfide (typically, $MoS_2$), molybdenum selenide (typically, $MoSe_2$), molybdenum telluride (typically, $MoTe_2$), tungsten sulfide (typically, $WS_2$), tungsten selenide (typically, $WSe_2$), tungsten telluride (typically, $WTe_2$), hafnium sulfide (typically, $HfS_2$), hafnium selenide (typically, $HfSe_2$), zirconium sulfide (typically, $ZrS_2$), and zirconium selenide (typically, $ZrSe_2$).

<Method for Manufacturing Semiconductor Device>

Next, a method for manufacturing a semiconductor device including the transistor 200 of the present invention that is illustrated in FIGS. 4A to 4D is described with reference to FIGS. 7A to 7D to FIGS. 23A to 23D. FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, FIG. 19A, FIG. 20A, FIG. 21A, FIG. 22A, and FIG. 23A are top views. FIG. 7B, FIG. 8B, FIG. 9B, FIG. 10B, FIG. 11B, FIG. 12B, FIG. 13B, FIG. 14B, FIG. 15B, FIG. 16B, FIG. 17B, FIG. 18B, FIG. 19B, FIG. 20B, FIG. 21B, FIG. 22B, and FIG. 23B are cross-sectional views taken along the dashed-dotted lines A1-A2 in FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, FIG. 19A, FIG. 20A, FIG. 21A, FIG. 22A, and FIG. 23A, which correspond to cross-sectional views in the channel length direction of the transistor 200. FIG. 7C, FIG. 8C, FIG. 9C, FIG. 10C, FIG. 11C, FIG. 12C, FIG. 13C, FIG. 14C, FIG. 15C, FIG. 16C, FIG. 17C, FIG. 18C, FIG. 19C, FIG. 20C, FIG. 21C, FIG. 22C, and FIG. 23C are cross-sectional views taken along the dashed-dotted lines A3-A4 in FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, FIG. 19A, FIG. 20A, FIG. 21A, FIG. 22A, and FIG. 23A, which correspond to cross-sectional views in the channel width direction of the transistor 200. FIG. 7D, FIG. 8D, FIG. 9D, FIG. 10D, FIG. 11D, FIG. 12D, FIG. 13D, FIG. 14D, FIG. 15D, FIG. 16D, FIG. 17D, FIG. 18D, FIG. 19D, FIG. 20D, FIG. 21D, FIG. 22D, and FIG. 23D are cross-sectional views taken along the dashed-dotted lines A5-A6 in FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, FIG. 19A, FIG. 20A, FIG. 21A, FIG. 22A, and FIG. 23A. Note that in the top views of FIG. 7A, FIG. 8A, FIG. 9A, FIG. 10A, FIG. 11A, FIG. 12A, FIG. 13A, FIG. 14A, FIG. 15A, FIG. 16A, FIG. 17A, FIG. 18A, FIG. 19A, FIG. 20A, FIG. 21A, FIG. 22A, and FIG. 23A, some components are not illustrated for simplification of the drawings.

First, a substrate (not illustrated) is prepared, and the insulator 211 is formed over the substrate. The insulator 211 can be formed by a sputtering method, a chemical vapor deposition (CVD) method, a molecular beam epitaxy (MBE) method, a pulsed laser deposition (PLD) method, an ALD method, or the like.

Note that CVD methods can be classified into a plasma enhanced CVD (PECVD) method using plasma, a thermal CVD method using heat, a photo CVD method using light, and the like. Moreover, the CVD methods can be classified into a metal CVD method and a metal organic CVD method according to a source gas. In addition, according to the pressure in deposition, CVD methods can be classified into an atmospheric pressure CVD method, in which deposition is performed under the atmospheric pressure, and a low pressure CVD (LPCVD) method, in which deposition is performed under pressure lower than the atmospheric pressure.

A PECVD method enables a high-quality film to be obtained at a relatively low temperature. A thermal CVD method does not use plasma and thus causes less plasma damage to an object. For example, a wiring, an electrode, an element (e.g., a transistor or a capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. Furthermore, a film with few defects can be obtained by a thermal CVD method because plasma damage during film formation is not caused.

As an ALD method, a thermal ALD method, in which reaction between a precursor and a reactant is performed using only thermal energy, a plasma-enhanced ALD (PEALD) method, in which a plasma-enhanced reactant is used, or the like can be used.

In an ALD method, one atomic layer can be deposited at a time using self-controllability of atoms. Hence, an ALD method has various advantages such as deposition of an extremely thin film, deposition on a component with a large aspect ratio, deposition of a film with a small number of defects such as pinholes, deposition with excellent coverage, and low-temperature deposition. The use of plasma in a PEALD method is sometimes preferable because deposition at a lower temperature is possible. Note that a precursor used in an ALD method sometimes contains impurities such as carbon. Thus, a film formed by an ALD method may contain impurities such as carbon in a larger amount than a film formed by another deposition method. Note that impurities can be quantified by X-ray photoelectron spectroscopy (XPS).

Unlike in the film formation method in which particles ejected from a target or the like are deposited, a film is formed by reaction at a surface of an object in a CVD method and an ALD method. Thus, a CVD method and an ALD method can provide good step coverage, almost regardless of the shape of an object. In particular, an ALD method enables excellent step coverage and excellent thickness uniformity and can be suitably used to cover a surface of an opening portion with a high aspect ratio, for example. Note that an ALD method has a relatively low deposition rate; hence, in some cases, an ALD method is preferably combined with another film formation method with a high deposition rate, such as a CVD method.

When a CVD method or an ALD method is employed, the composition of a film to be formed can be controlled with the flow rate ratio of the source gases. For example, in a CVD method or an ALD method, a film with a certain composition can be formed by adjusting the flow rate ratio of the source gases. Moreover, in a CVD method or an ALD method, by changing the flow rate ratio of the source gases during the film formation, a film whose composition is continuously changed can be formed. In the case where a film is formed while the flow rate ratio of the source gases is changed, as compared to the case where a film is formed using a plurality of deposition chambers, the time taken for the deposition can be shortened because the time taken for transfer and pressure adjustment is omitted. Consequently, semiconductor devices can be manufactured with high productivity in some cases.

In this embodiment, as the insulator 211, silicon nitride is deposited by a CVD method. Next, the insulator 212 is formed over the insulator 211. The insulator 212 can be formed by a sputtering method, a CVD method, an MBE method, a PLD method, an ALD method, or the like. In this embodiment, silicon nitride is deposited as the insulator 212 by a sputtering method.

Then, a film to be the insulator 214 is formed over the insulator 212. The film to be the insulator 214 can be formed by a sputtering method, a CVD method, an MBE method, a PLD method, an ALD method, or the like. In this embodiment, aluminum oxide is used as the film to be the insulator 214.

Even when a metal that is easily diffused, such as copper, is used for a conductor (not illustrated) under the insulator 211, the use of an insulator through which copper is less likely to pass, such as silicon nitride, as the insulators 211 and 212 and the provision of the film to be the insulator 214 over the insulator 212 can inhibit diffusion of the metal into a layer over the insulator 212 through the insulators 211 and 212. The use of an insulator through which impurities such as water and hydrogen are less likely to pass, such as silicon nitride, can inhibit diffusion of impurities such as water and hydrogen from a layer under the insulator 211.

It is preferable that the hydrogen concentration of the insulator 212 be lower than that of the insulator 211, and the hydrogen concentration of the film to be the insulator 214 be lower than that of the insulator 212. The insulator 212 formed using silicon nitride by a sputtering method can have lower hydrogen concentration than the insulator 211 formed using silicon nitride by a CVD method. The film to be the insulator 214 formed using aluminum oxide can have lower hydrogen concentration than the insulator 212.

The transistor 200 is formed over the film to be the insulator 214 in a later step. It is preferable that a film near the transistor 200 have a relatively low hydrogen concentration and a film with a relatively high hydrogen concentration be away from the transistor 200.

Next, a film to be the insulator 216 is formed over the film to be the insulator 214. The film to be the insulator 216 can be formed by a sputtering method, a CVD method, an MBE method, a PLD method, an ALD method, or the like. In this embodiment, silicon oxide or silicon oxynitride is used as the film to be the insulator 216. The film to be the insulator 216 is preferably formed by a deposition method using the gas in which the number of hydrogen atoms is reduced or hydrogen atoms are removed. Thus, the hydrogen concentration of the film to be the insulator 216 can be reduced.

Then, an opening reaching the film to be the insulator 214 is formed in the film to be the insulator 216. Examples of the opening include a groove and a slit. A region where an opening is formed may be referred to as an opening portion. The opening may be formed by wet etching; however, dry etching is preferable for microfabrication. The film to be the insulator 214 is preferably an insulator that functions as an etching stopper film when a groove is formed by etching of the film to be the insulator 216. For example, in the case where a silicon oxide film or a silicon oxynitride film is used as the film to be the insulator 216 in which the groove is to be formed, the film to be the insulator 214 is preferably a silicon nitride film, an aluminum oxide film, or a hafnium oxide film.

After the formation of the opening, a conductive film to be the conductor 205a is formed. The conductive film preferably contains a conductor that has a function of inhibiting the passage of oxygen. For example, tantalum nitride, tungsten nitride, or titanium nitride can be used. Alternatively, a stacked-layer film of the conductor and tantalum, tungsten, titanium, molybdenum, aluminum, copper, or a molybdenum-tungsten alloy can be used. The conductive film to be the conductor 205a can be formed by a sputtering method, a CVD method, an MBE method, a PLD method, an ALD method, or the like.

In this embodiment, the conductive film to be the conductor 205a has a multilayer structure. First, tantalum nitride is deposited by a sputtering method, and titanium nitride is stacked over the tantalum nitride. Even when a metal that is easily diffused, such as copper, is used for a conductive film to be the conductor 205b described later, the use of such metal nitride for a layer under the conductor 205b can inhibit diffusion of the metal to the outside from the conductor 205a.

Next, the conductive film to be the conductor 205b is formed. This conductive film can be formed by a plating method, a sputtering method, a CVD method, an MBE method, a PLD method, an ALD method, or the like. In this embodiment, as the conductive film to be the conductor 205b, a low-resistant conductive material such as copper is deposited.

Next, by chemical mechanical polishing (CMP) treatment, the conductive film to be the conductor 205a and the conductive film to be the conductor 205b are partly removed so that the film to be the insulator 216 is exposed. As a result, the conductors 205a and 205b remain only in the opening portion. In this way, the conductor 205 with a flat top surface can be formed. Note that the film to be the insulator 216 is partly removed by the CMP treatment in some cases (see FIGS. 7A to 7D).

Although the conductor 205 is embedded in the opening of the film to be the insulator 216 in the above description, this embodiment is not limited to this structure. For example, the surface of the conductor 205 may be exposed in the following manner: the conductor 205 is formed over the film to be the insulator 214, the film to be the insulator 216 is formed over the conductor 205, and the film to be the insulator 216 is subjected to the CMP treatment so that the film to be the insulator 216 is partly removed.

Then, the insulator 222 is formed over the film to be the insulator 216 and the conductor 205. An insulator containing an oxide of one or both of aluminum and hafnium is preferably formed as the insulator 222. As the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, diffusion of hydrogen and water contained in a structure body provided around the transistor 200 into the transistor 200 through the insulator 222 is inhibited, and accordingly oxygen vacancies are less likely to be generated in the oxide 230.

The insulator 222 can be formed by a sputtering method, a CVD method, an MBE method, a PLD method, an ALD method, or the like.

Then, the insulator 224 is formed over the insulator 222. The insulator 224 can be formed by a sputtering method, a CVD method, an MBE method, a PLD method, an ALD method, or the like. In this embodiment, silicon oxide or silicon oxynitride is used for the insulator 224. The insulator 224 is preferably formed by a deposition method using the gas in which the number of hydrogen atoms is reduced or hydrogen atoms removed. Thus, the hydrogen concentration of the insulator 224 can be reduced. The hydrogen concentration of the insulator 224 is preferably reduced because the insulator 224 is in contact with the oxide 230a in a later step.

Subsequently, heat treatment is preferably performed. The heat treatment is performed at a temperature higher than or equal to 250° C. and lower than or equal to 650° C., preferably higher than or equal to 300° C. and lower than or equal to 500° C., and further preferably higher than or equal to 320° C. and lower than or equal to 450° C. The heat treatment is performed in a nitrogen atmosphere, an inert gas atmosphere, or an atmosphere containing an oxidizing gas at higher than or equal to 10 ppm, higher than or equal to 1%, or higher than or equal to 10%. The heat treatment may be performed under a reduced pressure. Alternatively, the heat treatment may be performed in such a manner that heat treatment is performed in nitrogen or an inert gas atmosphere, and then another heat treatment is performed in an atmosphere containing an oxidizing gas at higher than or equal to 10 ppm, higher than or equal to 1%, or higher than or equal to 10% in order to compensate for released oxygen.

In this embodiment, treatment is performed at 400° C. in a nitrogen atmosphere for one hour, and another treatment is successively performed at 400° C. in an oxygen atmosphere for one hour. By the heat treatment, impurities such as water and hydrogen included in the insulator 224 can be removed.

The heat treatment may be performed after the insulator 222 is formed. For the heat treatment, the above-described heat treatment conditions can be employed.

Here, in order to form an excess-oxygen region in the insulator 224, plasma treatment using oxygen may be performed under a reduced pressure. The plasma treatment using oxygen is preferably performed with an apparatus including a power source for generating high-density plasma using microwaves, for example. Alternatively, the apparatus may include a power source for applying a high-frequency wave such as RF to the substrate side. The use of high-density plasma enables high-density oxygen radicals to be generated, and application of the RF to the substrate side allows oxygen radicals generated by the high-density plasma to be efficiently introduced into the insulator 224. Furthermore, after plasma treatment using an inert gas with the apparatus, plasma treatment using oxygen may be performed in order to compensate for released oxygen. Note that impurities such as water and hydrogen contained in the insulator 224 can be removed by selecting the conditions of the plasma treatment appropriately. In that case, the heat treatment is not always necessary.

Here, aluminum oxide may be deposited over the insulator 224 by a sputtering method, for example, and then subjected to CMP treatment until the insulator 224 is exposed. The CMP treatment can planarize and smooth the surface of the insulator 224. When the CMP treatment is performed while the aluminum oxide is placed over the insulator 224, it is easy to detect the endpoint of the CMP treatment. Part of the insulator 224 may be polished by the CMP treatment so that the thickness of the insulator 224 may be reduced; the thickness of the insulator 224 is adjusted at the time of the formation of the insulator 224. Planarizing and smoothing the surface of the insulator 224 can sometimes prevent deterioration of the coverage with an oxide deposited later and a decrease in yield of the semiconductor device. Moreover, it is preferable to deposit aluminum oxide over the insulator 224 by a sputtering method, in which case oxygen can be added to the insulator 224.

Next, an oxide film 230A and an oxide film 230B are formed in this order over the insulator 224 (see FIGS. 7A to 7D). It is preferable to form the above oxide films successively without exposure to the air. When the oxide films 230A and 230B are formed without exposure to the air, impurities or moisture from the air can be prevented from being attached to the oxide films 230A and 230B, so that the interface between the oxide films 230A and 230B and the vicinity of the interface can be kept clean.

The oxide films 230A and 230B can be formed by a sputtering method, a CVD method, an MBE method, a PLD method, an ALD method, or the like.

When the oxide films 230A and 230B are formed by a sputtering method, for example, oxygen or a mixed gas of oxygen and a rare gas is used as a sputtering gas. An increase in the proportion of oxygen in the sputtering gas can increase the amount of excess oxygen contained in the oxide film to be formed. Moreover, when the oxide films are formed by a sputtering method, a target of In-M-Zn oxide mentioned above can be used.

In particular, in the formation of the oxide film 230A, part of oxygen contained in the sputtering gas is supplied to the insulator 224 in some cases. Therefore, the proportion of oxygen in the sputtering gas for formation of the oxide film 230A is preferably 70% or higher, further preferably 80% or higher, still further preferably 100%.

In the case where the oxide film 230B is formed by a sputtering method, when the proportion of oxygen contained in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor in a channel formation region can have relatively high field-effect mobility. Further, when the formation is performed while the substrate is being heated, the crystallinity of the oxide film can be improved. However, one embodiment of the present invention is not limited thereto. In the case where the oxide film 230B is formed by a sputtering method and the proportion of oxygen contained in the sputtering gas is higher than 30% and lower than or equal to 100%, preferably higher than or equal to 70% and lower than or equal to 100%, an oxygen-excess oxide semiconductor is formed. A transistor including an oxygen-excess oxide semiconductor in a channel formation region can have relatively high reliability.

In this embodiment, the oxide film 230A is formed by a sputtering method using a target with an atomic ratio of In:Ga:Zn=1:1:0.5 (2:2:1) or In:Ga:Zn=1:3:4. The oxide film 230B is formed by a sputtering method using a target with an atomic ratio of In:Ga:Zn=4:2:4.1 or In:Ga:Zn=1:1:1. Note that each of the oxide films is preferably formed by appropriate selection of deposition conditions and the atomic ratio to have characteristics required for the oxide 230.

Next, heat treatment may be performed. For the heat treatment, the above-described heat treatment conditions can be employed. By the heat treatment, impurities such as water and hydrogen in the oxide films 230A and 230B can be removed, for example. In this embodiment, treatment is performed at 400° C. in a nitrogen atmosphere for one hour, and another treatment is successively performed at 400° C. in an oxygen atmosphere for one hour.

Next, an oxide film 243A is formed over the oxide film 230B (see FIGS. 7A to 7D). The oxide film 243A can be formed by a sputtering method, a CVD method, an MBE method, a PLD method, an ALD method, or the like. The atomic ratio of Ga to In in the oxide film 243A is preferably greater than that in the oxide film 230B. In this embodiment, the oxide film 243A is formed by a sputtering method using a target with an atomic ratio of In:Ga:Zn=1:3:4.

Next, a conductive film 242A is formed over the oxide film 243A (see FIGS. 7A to 7D). The conductive film 242A can be formed by a sputtering method, a CVD method, an MBE method, a PLD method, an ALD method, or the like.

Next, the oxide film 230A, the oxide film 230B, the oxide film 243A, and the conductive film 242A are processed into an island shape by a lithography method, so that the oxide 230a, the oxide 230b, an oxide layer 243B, and a conductor layer 242B are formed (see FIGS. 8A to 8D). Here, the oxide 230a, the oxide 230b, the oxide layer 243B, and the conductor layer 242B are formed to at least partly overlap with the conductor 205. The processing can be performed by a dry etching method or a wet etching method. A dry etching method is suitable for microfabrication. Note that in this step, the thickness of the insulator 224 in a region not overlapping with the oxide 230a is reduced in some cases.

In the lithography method, first, a resist is exposed to light through a mask. Next, a region exposed to light is removed or left using a developing solution, so that a resist mask is formed. Then, etching is conducted with the resist mask, whereby a conductor, a semiconductor, an insulator, or the like can be processed into a desired shape. The resist mask is formed, for example, by exposing the resist to KrF excimer laser light, ArF excimer laser light, or extreme ultraviolet (EUV) light. A liquid immersion technique may be employed in which a portion between a substrate and a projection lens is filled with a liquid (e.g., water) to perform light exposure. An electron beam or an ion beam may be used instead of the above-mentioned light. Note that a mask is not necessary in the case of using an electron beam or an ion beam. To remove the resist mask, dry etching treatment such as ashing or wet etching treatment can be used. Alternatively, wet etching treatment can be performed after dry etching treatment, or dry etching treatment can be performed after wet etching treatment.

A hard mask formed of an insulator or a conductor may be used instead of the resist mask. In the case of using a hard mask, a hard mask with a desired shape can be formed in the following manner an insulating film or a conductive film that is the material of the hard mask is formed over the conductive film 242A, a resist mask is formed thereover, and then the hard mask material is etched. The etching of the conductive film 242A and the like may be performed after or without removal of the resist mask. In the latter case, the resist mask sometimes disappears during the etching. The hard mask may be removed by etching after the etching of the conductive film 242A and the like. The hard mask does not need to be removed when the hard mask material does not affect the following process or can be utilized in the following process.

As a dry etching apparatus, a capacitively coupled plasma (CCP) etching apparatus including parallel plate electrodes can be used. The capacitively coupled plasma etching apparatus including parallel plate electrodes may have a structure in which high-frequency power is applied to one of the parallel plate electrodes. Alternatively, different high-frequency powers may be applied to one of the parallel plate electrodes. Further alternatively, high-frequency powers with the same frequency may be applied to the parallel plate electrodes. Still further alternatively, high-frequency powers with different frequencies may be applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

It is preferable that the side surfaces of the oxide 230a, the oxide 230b, the oxide layer 243B, and the conductor layer 242B be substantially perpendicular to the top surface of the insulator 222. When the side surfaces of the oxide 230a, the oxide 230b, the oxide layer 243B, and the conductor layer 242B are substantially perpendicular to the top surface of the insulator 222, a plurality of the transistors 200 can be provided in a smaller area and at a higher density. However, without being limited thereto, the angle formed between the side surfaces of the oxide 230a, the oxide 230b, the oxide layer 243B, and the conductor layer 242B and the top surface of the insulator 222 may be an acute angle.

Then, the insulator 272 is formed over the insulator 224, the oxide 230a, the oxide 230b, the oxide layer 243B, and the conductor layer 242B (see FIGS. 9A to 9D). The insulator 272 can be formed by a sputtering method, a CVD method, an MBE method, a PLD method, an ALD method, or the like. In this embodiment, aluminum oxide is deposited as the insulator 272 by a sputtering method. When aluminum oxide is deposited by a sputtering method, oxygen can be supplied to the insulator 224.

Then, the insulator 273 is formed over the insulator 272. The insulator 273 can be formed by a sputtering method, a CVD method, an MBE method, a PLD method, an ALD method, or the like. In this embodiment, silicon nitride is deposited as the insulator 273 by a sputtering method (see FIGS. 9A to 9D).

Next, an insulating film to be the insulator 280 is formed. The insulating film to be the insulator 280 can be formed by a sputtering method, a CVD method, an MBE method, a PLD method, an ALD method, or the like. For example, as the insulator 280, a silicon oxide film is formed by a sputtering method and another silicon oxide film is formed thereover by a PEALD method or a thermal ALD method. The insulating film to be the insulator 280 is preferably formed by a deposition method using the gas in which the number of hydrogen atoms is reduced or hydrogen atoms are removed. Thus, the hydrogen concentration of the insulator 280 can be reduced.

Next, the insulating film to be the insulator 280 is subjected to CMP treatment, so that the insulator 280 having a flat top surface is formed (see FIGS. 10A to 10D). Note that as in the insulator 224, aluminum oxide may be deposited over the insulator 280 by a sputtering method, for example, and then subjected to CMP treatment until the insulator 280 is exposed.

Next, the insulator 280, the insulator 273, the insulator 272, the conductor layer 242B, and the oxide layer 243B are partly processed to form an opening reaching the oxide 230b (see FIGS. 11A to 11D). The opening is preferably formed to overlap with the conductor 205. The conductor 242a, the conductor 242b, the oxide 243a, and the oxide 243b are formed by the formation of the opening.

The insulator 280, the insulator 273, the insulator 272, the oxide layer 243B, and the conductor layer 242B can be partly processed by a dry etching method or a wet etching method. A dry etching method is suitable for microfabrication. The processing may be performed under different conditions. For example, part of the insulator 280 may be processed by a dry etching method, part of the insulator 273 may be processed by a wet etching method, part of the insulator 272 may be processed by a dry etching method, and part of the oxide layer 243B and part of the conductor layer 242B may be processed by a dry etching method.

In some cases, the treatment such as dry etching causes the attachment or diffusion of impurities due to an etching gas or the like to a surface or an inside of the oxide 230a, the oxide 230b, or the like. Examples of the impurities include fluorine and chlorine.

In order to remove the impurities, cleaning is performed. Examples of the cleaning method include wet cleaning using a cleaning solution or the like, plasma treatment using plasma, cleaning by heat treatment, and any of these cleaning methods may be used in an appropriate combination.

The wet cleaning may be performed using an aqueous solution in which oxalic acid, phosphoric acid, ammonia water, hydrofluoric acid, or the like is diluted with carbonated water or pure water. Alternatively, ultrasonic cleaning using pure water or carbonated water may be performed.

Through the processing such as dry etching or the cleaning treatment, a region of the oxide 230b that does not overlap with the oxides 243a and 243b is sometimes thinner than regions of the oxide 230b that overlap with the oxides 243a and 243b (see FIGS. 11A to 11D).

After the etching or the cleaning treatment, heat treatment may be performed. The heat treatment is performed at a temperature higher than or equal to 100° C. and lower than or equal to 450° C., preferably higher than or equal to 350° C. and lower than or equal to 400° C., for example. The heat treatment is performed in a nitrogen gas atmosphere, an inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxides 230a and 230b to reduce the amount of oxygen vacancies Vo. The heat treatment may be performed under a reduced pressure. Alternatively, the heat treatment may be performed in an oxygen atmosphere, and then another heat treatment may be successively performed in a nitrogen atmosphere without exposure to the air.

Next, an oxide film 230C is formed (see FIGS. 12A to 12D). The heat treatment may be performed before the oxide film 230C is formed. It is preferable that the heat treatment be performed under a reduced pressure and the oxide film 230C be successively formed without exposure to the air. The heat treatment is preferably performed in an oxygen-containing atmosphere. Such treatment can remove moisture and hydrogen adsorbed on the surface of the oxide 230b or the like and can reduce the moisture concentration and the hydrogen concentration of the oxides 230a and 230b. The temperature of the heat treatment is preferably higher than or equal to 100° C. and lower than or equal to 400° C., further preferably higher than or equal to 150° C. and lower than or equal to 350° C. In this embodiment, the heat treatment is performed at 200° C. under a reduced pressure.

Note that the oxide film 230C is preferably provided at least partly in contact with the top surface of the oxide 230b and the side surfaces of the oxide 243, the conductor 242, the insulator 272, the insulator 273, and the insulator 280. When the conductor 242 is surrounded by the oxide 243, the insulator 272, the insulator 273, and the oxide film 230C, a decrease in the conductivity of the conductor 242 due to oxidation in a later step can be inhibited.

The oxide film 230C can be formed by a sputtering method, a CVD method, an MBE method, a PLD method, an ALD method, or the like. The atomic ratio of Ga to In in the oxide film 230C is preferably greater than that in the oxide film 230B. In this embodiment, the oxide film 230C is formed using a target having an atomic ratio of In:Ga:Zn=1:3:4 by a sputtering method.

Note that the oxide film 230C may have a stacked-layer structure. For example, the oxide film 230C may be formed by a sputtering method using a target with an atomic ratio of In:Ga:Zn=4:2:4.1 and successively using a target with an atomic ratio of In:Ga:Zn=1:3:4.

Part of oxygen contained in the sputtering gas is sometimes supplied to the oxides 230a and 230b during the formation of the oxide film 230C. Alternatively, in the formation of the oxide film 230C, part of oxygen contained in the sputtering gas is supplied to the insulator 280 in some cases. Therefore, the proportion of oxygen in the sputtering gas for formation of the oxide film 230C is preferably 70% or higher, further preferably 80% or higher, still further preferably 100%.

Next, heat treatment may be performed. The heat treatment may be performed under a reduced pressure, and an insulating film 250A may be successively formed without exposure to the air. By such treatment, moisture and hydrogen adsorbed on the surface of the oxide film 230C and the like can be removed, and the moisture concentration and the hydrogen concentration in the oxides 230a and 230b and the oxide film 230C can be reduced. The temperature of the heat treatment ranges preferably from 100° C. to 400° C. In this embodiment, the temperature of the heat treatment is 200° C.

Next, the insulating film 250A is formed over the oxide film 230C (see FIGS. 12A to 12D). The insulating film 250A can be formed by a sputtering method, a CVD method, an MBE method, a PLD method, an ALD method, or the like. The insulating film 250A is preferably formed by a deposition method using the gas in which the number of hydrogen atoms is reduced or hydrogen atoms are removed. Thus, the hydrogen concentration of the insulating film 250A can be reduced. The hydrogen concentration of the insulating film 250A is preferably reduced because the insulating film 250A becomes the insulator 250 that is in contact with the oxide 230c in a later step.

Next, irradiation with a high-frequency wave such as a microwave or RF may be performed. The irradiated high-frequency wave such as a microwave or RF enters the insulator 280, the oxide 230b, and the oxide 230a and removes hydrogen therein. In particular, in the oxides 230a and 230b, a reaction in which a bond of VoH is cut and the oxides 230a and 230b are dehydrogenated. Part of hydrogen generated at this time is removed from the oxide 230 and the insulator 280 in some cases. In other cases, part of hydrogen is gettered by the conductor 242. In this manner, irradiation with a high-frequency wave such as a microwave or RF can reduce the hydrogen concentration of the insulator 280, the oxide 230b, and the oxide 230a.

Alternatively, an oxygen gas may be made into plasma with a high-frequency wave such as a microwave or RF to form oxygen radicals. That is, the insulator 280, the oxide 230b, and the oxide 230a may be subjected to plasma treatment in an oxygen-containing atmosphere. Hereinafter, such treatment is sometimes referred to as oxygen plasma treatment. The formed oxygen radicals can supply oxygen to the insulator 280, the oxide 230b, and the oxide 230a. In the case where the insulator 280, the oxide 230b, and the oxide 230a are subjected to plasma treatment in an oxygen-containing atmosphere, the oxide 230 may be less likely to be irradiated with a high-frequency wave such as a microwave or RF.

Note that oxygen plasma treatment is preferably performed with a microwave processing apparatus including a power source for generating high-density plasma using microwaves, for example. The microwave processing apparatus may include a power source for applying RF to the substrate side. The use of high-density plasma enables high-density oxygen radicals to be generated. Furthermore, application of RF to the substrate side allows oxygen ions generated by the high-density plasma to be efficiently introduced into the insulator 280 and the oxide 230. The oxygen plasma treatment is preferably performed under a reduced pressure, and the pressure is set to 60 Pa or higher, preferably 133 Pa or higher, further preferably 200 Pa or higher, still further preferably 400 Pa or higher. The oxygen flow rate ($O_2/O_2+Ar$) is lower than or equal to 50%, preferably higher than or equal to 10% and lower than or equal to 30%. The treatment is performed at approximately 400° C., for example. After the oxygen plasma treatment, heat treatment may be successively performed without exposure to the air.

Next, a conductive film 260A (a conductive film 260Aa and a conductive film 260Ab) is formed (see FIGS. 13A to 13D). The conductive films 260Aa and 260Ab can be formed by a sputtering method, a CVD method, an MBE method, a PLD method, an ALD method, or the like. A CVD method is preferably used, for example. In this embodiment, the conductive film 260Aa is formed by an ALD method, and the conductive film 260Ab is formed by a CVD method.

Then, the oxide film 230C, the insulating film 250A, the conductive film 260Aa, and the conductive film 260Ab are polished by CMP treatment until the insulator 280 is exposed, whereby the oxide 230c, the insulator 250, and the conductor 260 (the conductor 260a and the conductor 260b) are formed (see FIGS. 14A to 14D).

Subsequently, heat treatment may be performed. In this embodiment, the heat treatment is performed at 400° C. in a nitrogen atmosphere for one hour. The heat treatment can reduce the moisture concentration and the hydrogen concentration in the insulator 250 and the insulator 280. After the heat treatment, the insulator 282 may be successively formed without exposure to the air.

Next, the insulator 282 is formed over the conductor 260, the oxide 230c, the insulator 250, and the insulator 280. The insulator 282 can be formed by a sputtering method, a CVD method, an MBE method, a PLD method, an ALD method, or the like (see FIGS. 15A to 15D).

As the insulator 282, aluminum oxide is preferably deposited by a sputtering method, for example. During the formation of the insulator 282 by a sputtering method in an oxygen-containing atmosphere, oxygen can be added to the insulator 280. At this time, the insulator 282 is preferably formed while the substrate is being heated. The insulator 282 is preferably formed in contact with the top surface of the conductor 260, in which case oxygen contained in the insulator 280 can be inhibited from being absorbed by the conductor 260 in heat treatment performed later.

Before formation of the insulator 282, a step may be repeated one or more times in which a metal oxide is formed by a sputtering method in an oxygen-containing atmosphere and then removed. Through the step, excess oxygen can be supplied to the insulator 280. In addition, through repetition of this step, the amount of excess oxygen contained in the insulator 280 can be appropriately adjusted.

Figure 15A:
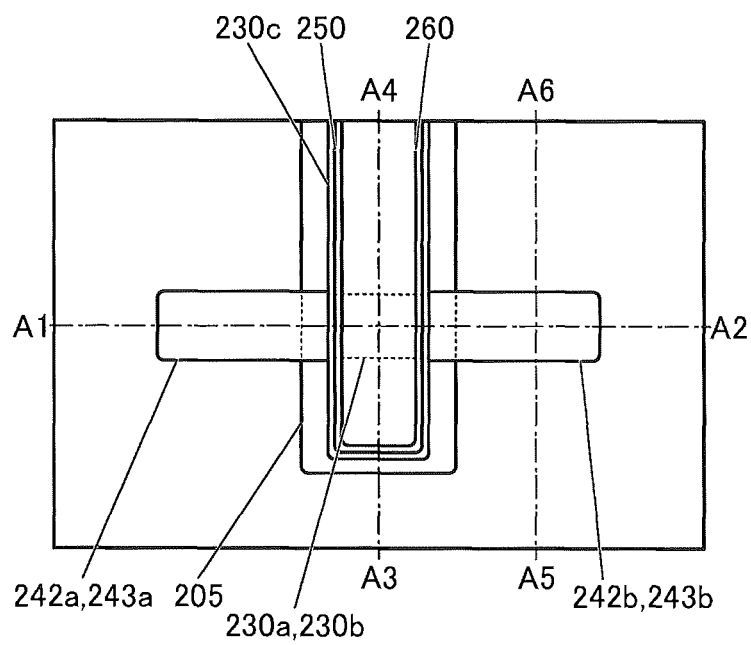
FIG. 15A is a top view illustrating a manufacturing method of a semiconductor device and FIGS. 15B to 15D are cross-sectional views illustrating the manufacturing method of the semiconductor device.
Figure 15C:
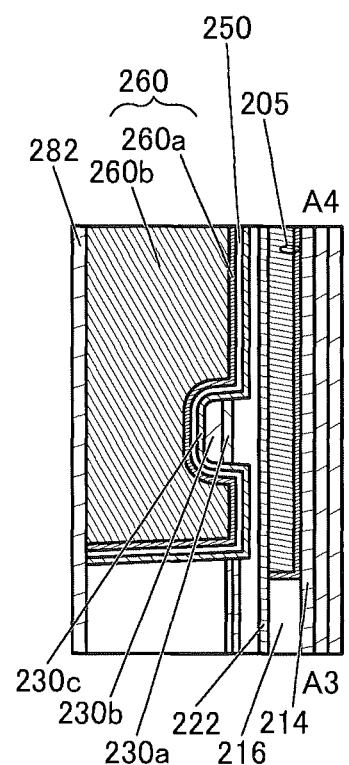
Figure 15B:
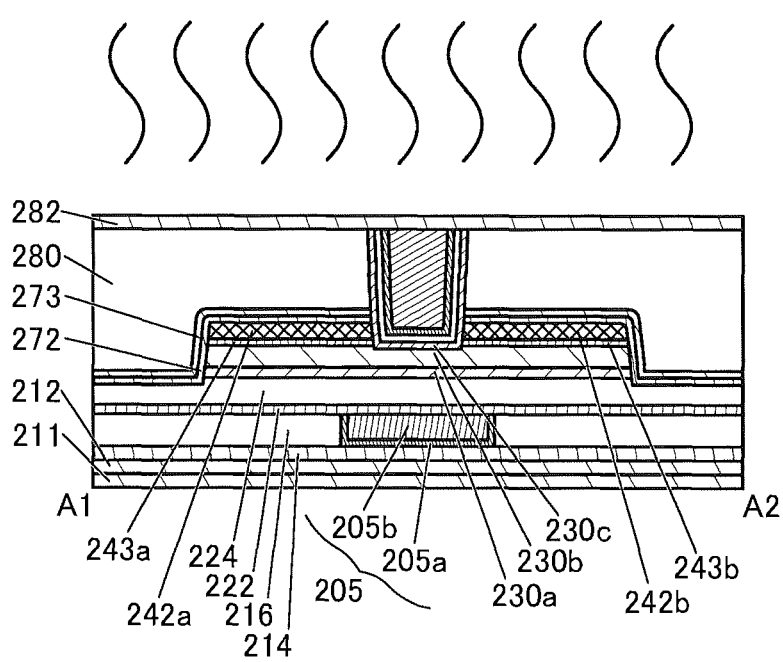
Figure 15D:
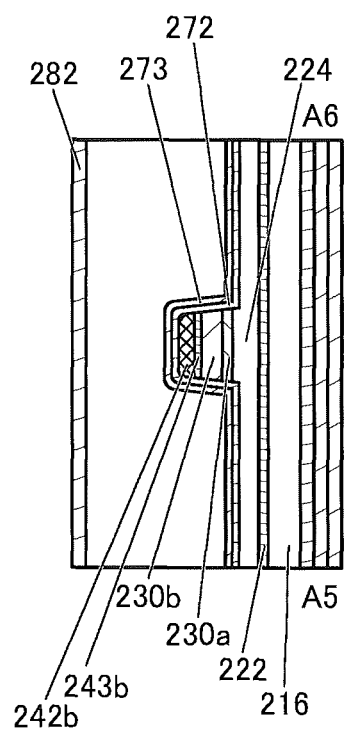
Figure 16A:
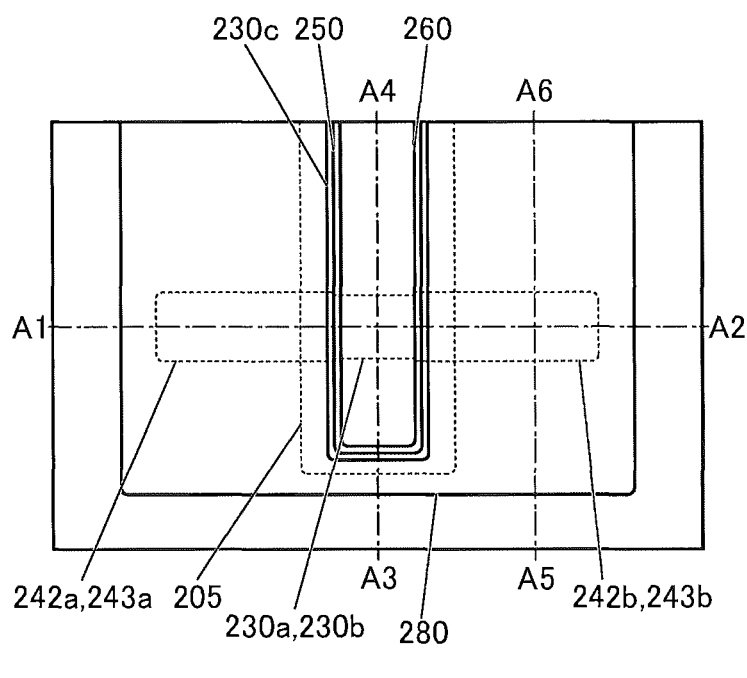
FIG. 16A is a top view illustrating a manufacturing method of a semiconductor device and FIGS. 16B to 16D are cross-sectional views illustrating the manufacturing method of the semiconductor device.
Figure 16C:
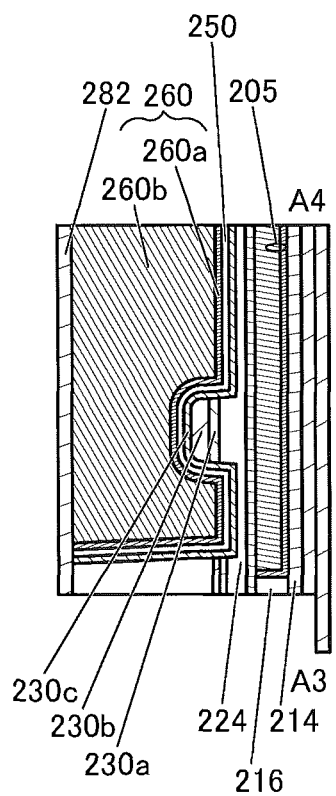
Figure 16B:
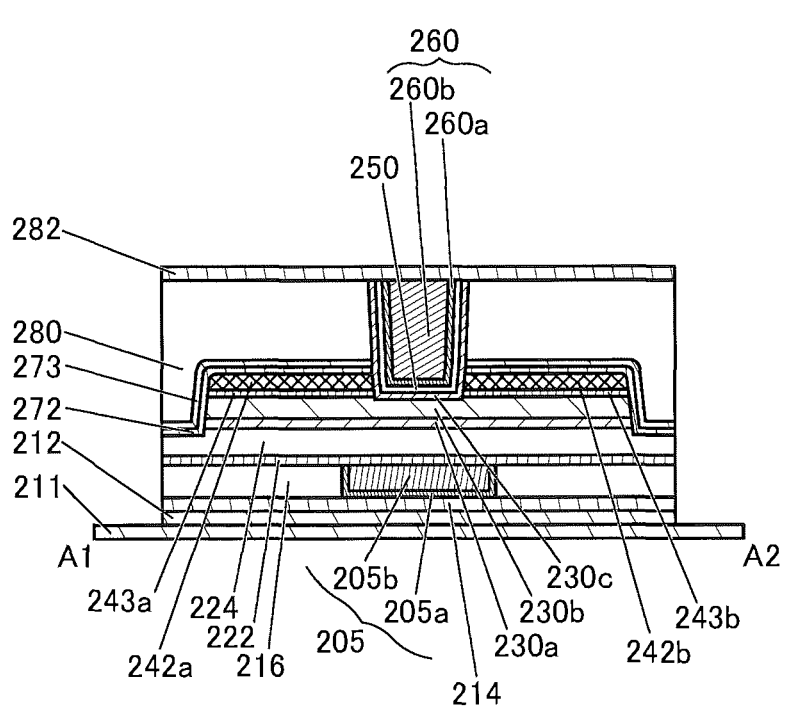
Figure 16D:
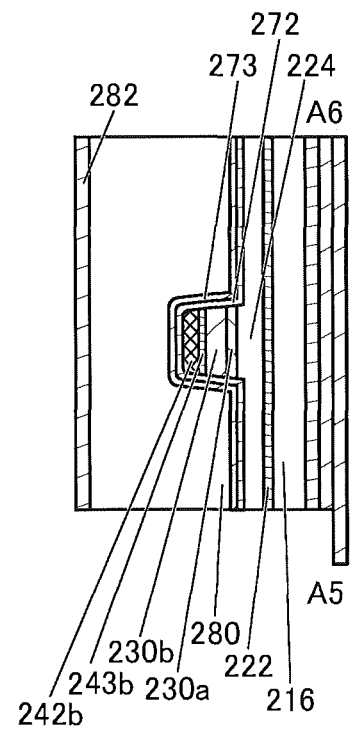
Figure 17A:
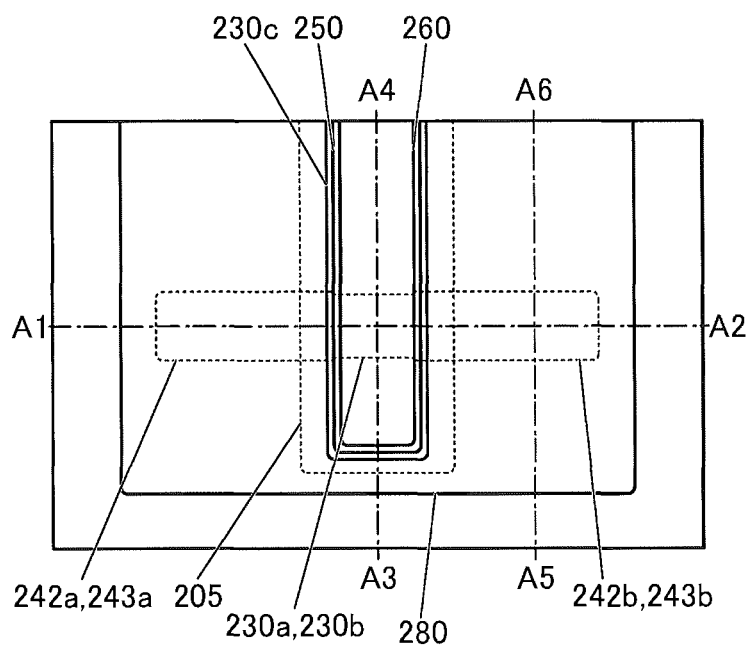
FIG. 17A is a top view illustrating a manufacturing method of a semiconductor device and FIGS. 17B to 17D are cross-sectional views illustrating the manufacturing method of the semiconductor device.
Figure 17C:
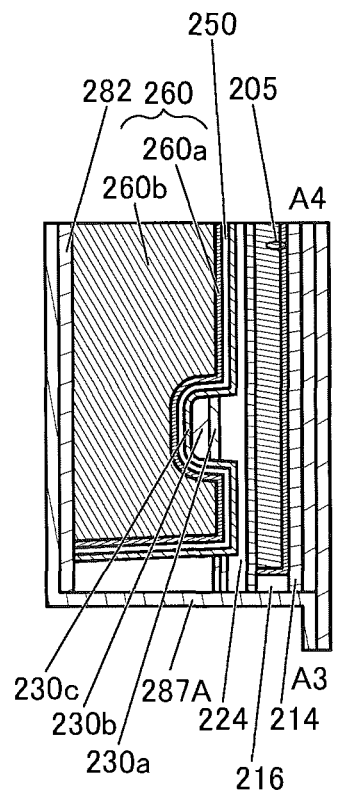
Figure 17B:
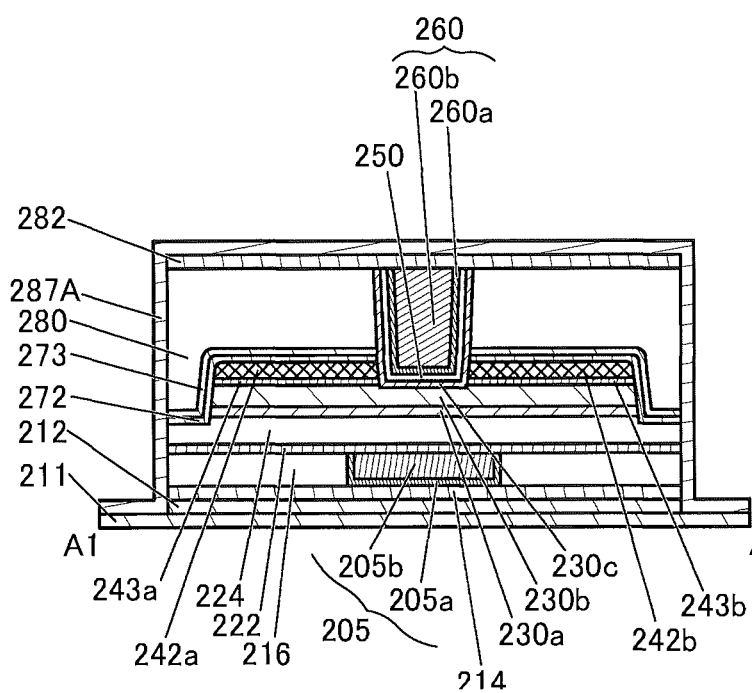
Figure 17D:
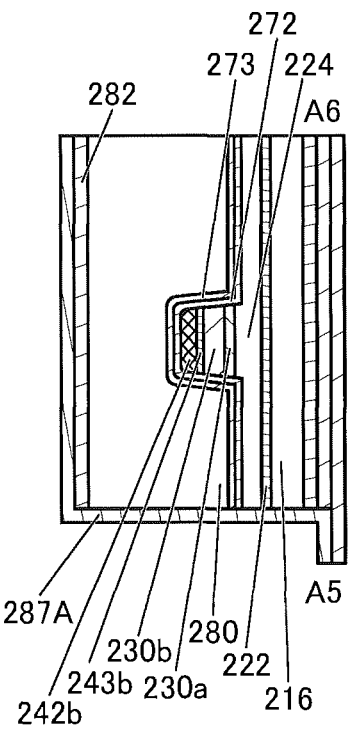

Heat treatment is preferably performed after the insulator 282 is formed (note that curves in FIG. 15B represent the heat treatment). Specifically, the heat treatment is performed at a temperature higher than or equal to 350° C., preferably higher than or equal to 400° C. in an oxygen-containing atmosphere, a nitrogen-containing atmosphere, or a mixed atmosphere of oxygen and nitrogen. The duration of the heat treatment is longer than or equal to one hour, preferably longer than or equal to four hours, further preferably longer than or equal to eight hours.

The heat treatment allows hydrogen in the oxide 230 to diffuse outward through the insulator 280 and the insulator 282. In other words, hydrogen in the transistor 200 diffuses outward through the insulator 280 and the insulator 282, whereby the hydrogen concentration in the transistor 200 and the insulator 282 can be reduced. In other words, the absolute amount of hydrogen present in the semiconductor device can be reduced.

Next, part of the insulator 282, part of the insulator 280, part of the insulator 273, part of the insulator 272, part of the insulator 224, part of the insulator 222, part of the film to be the insulator 216, part of the film to be the insulator 214, and part of the insulator 212 are processed to form the insulator 216 and the insulator 214, and an opening reaching the insulator 211 is formed (see FIGS. 16A to 16D). The opening is formed to surround the transistor 200 in some cases. In other cases, the opening is formed to surround a plurality of the transistors 200. Accordingly, the side surfaces of the insulators 282, 280, 273, 272, 224, 222, 216, 214, and 212 are partly exposed in the opening.

The insulators 282, 280, 273, 272, 224, 222, and 212, the film to be the insulator 216, and the film to be the insulator 214 can be partly processed by a dry etching method or a wet etching method. A dry etching method is suitable for microfabrication. The processing may be performed under different conditions.

In that case, the insulator 280 or the like may be irradiated with a high-frequency wave such as a microwave or RF. The irradiated high-frequency wave such as a microwave or RF enters the insulator 280, the oxide 230b, the oxide 230a, and the like and can sometimes remove hydrogen therein. For example, in the oxides 230a and 230b, a reaction in which a bond of VoH is cut and the oxides 230a and 230b are dehydrogenated. Part of hydrogen generated at this time is removed from the oxide 230 and the insulator 280 in some cases. In other cases, part of hydrogen is gettered by the conductor 242.

Next, an insulator 287A is formed to cover the insulator 282, the insulator 280, the insulator 273, the insulator 272, the insulator 224, the insulator 222, the insulator 216, the insulator 214, and the insulator 212 (see FIGS. 17A to 17D). The insulator 287A is preferably formed under conditions similar to those for the insulator 282. For example, the insulator 287A can be formed by a sputtering method, a CVD method, an MBE method, a PLD method, an ALD method, or the like.

Specifically, as the insulator 287A, aluminum oxide is preferably deposited by a sputtering method, for example. When the insulator 287A is formed in an atmosphere containing oxygen by a sputtering method, oxygen can be added to the insulator 280 during the formation. At this time, the insulator 287A is preferably formed while the substrate is being heated. Since the insulator 282 is formed in contact with the top surface of the conductor 260, oxygen of the insulator 280 can be inhibited from being absorbed by the conductor 260 during the treatment for the formation of the insulator 287A.

Subsequently, anisotropic etching treatment is performed on the insulator 287A, whereby the insulator 287 is formed at side surfaces of the insulator 282, the insulator 280, the insulator 273, the insulator 272, the insulator 224, the insulator 222, the insulator 216, the insulator 214, and the insulator 212 (see FIGS. 18A to 18D).

Here, a side end portion of the insulator 282 and the upper end portion of the insulator 287 are in contact with each other, and a side end portion of the insulator 214 and the lower end portion of the insulator 287 are in contact with each other, whereby the structure for sealing the transistor 200 and the insulator 280 can be formed.

Dry etching is preferably performed as the anisotropic etching. In this manner, the insulating film in a region on a plane substantially parallel to the substrate surface can be removed, so that the insulator 287 can be formed in a self-aligned manner.

Figure 18A:
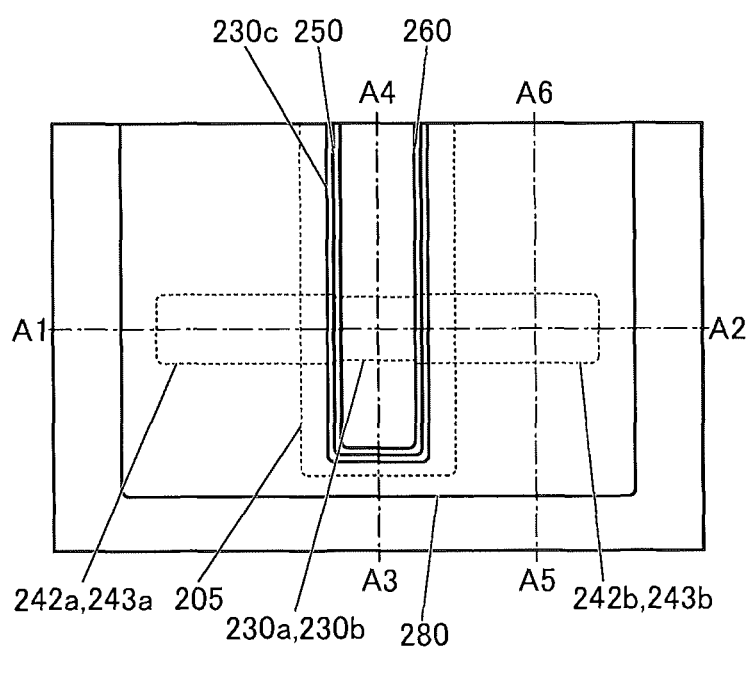
FIG. 18A is a top view illustrating a manufacturing method of a semiconductor device and FIGS. 18B to 18D are cross-sectional views illustrating the manufacturing method of the semiconductor device.
Figure 18C:
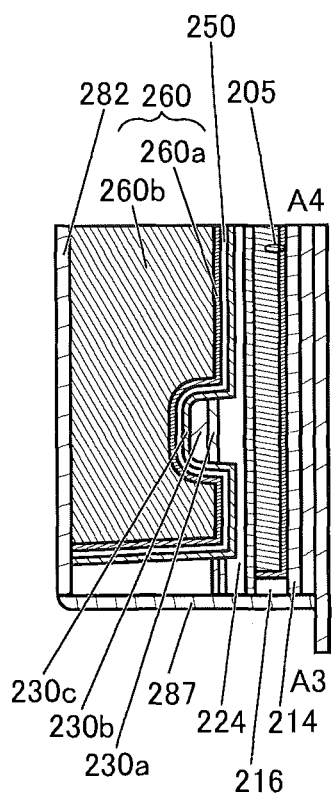
Figure 18B:
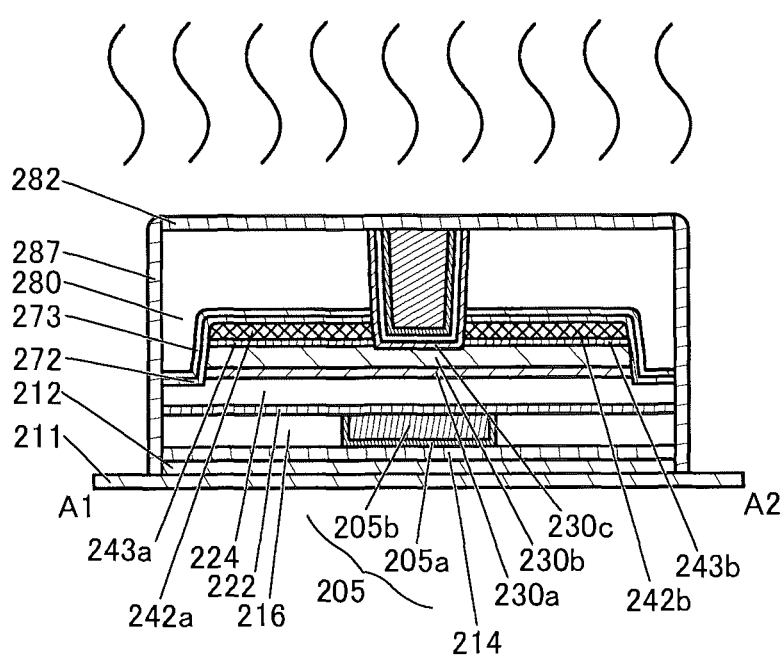
Figure 18D:
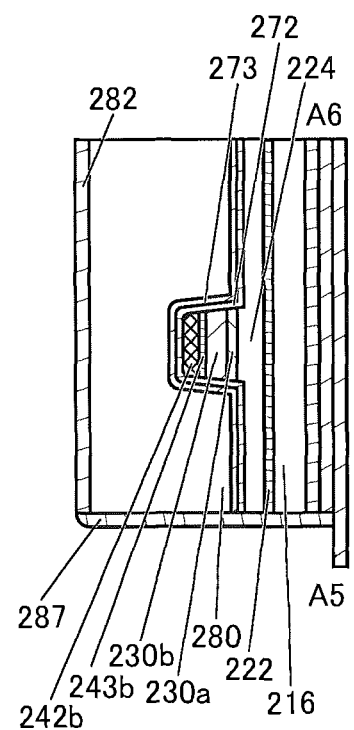
Figure 19A:
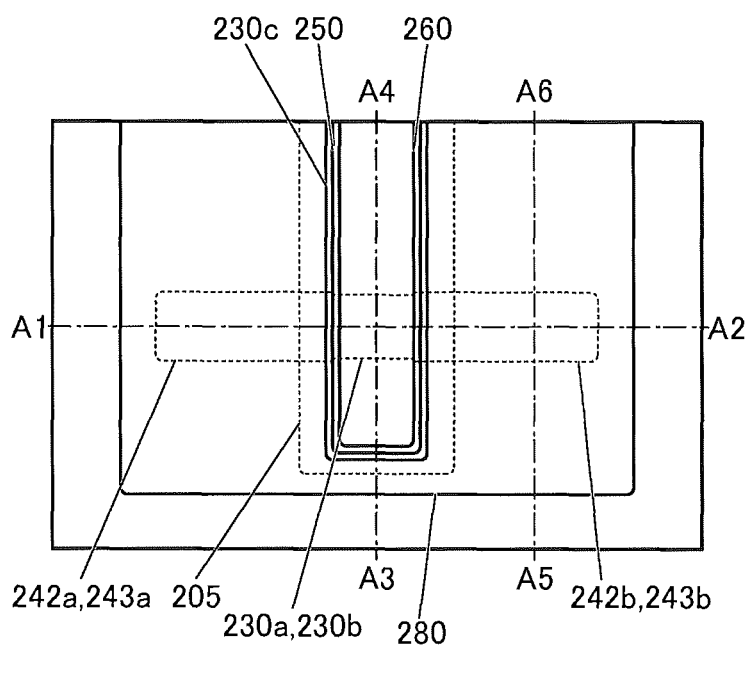
FIG. 19A is a top view illustrating a manufacturing method of a semiconductor device and FIGS. 19B to 19D are cross-sectional views illustrating the manufacturing method of the semiconductor device.
Figure 19C:
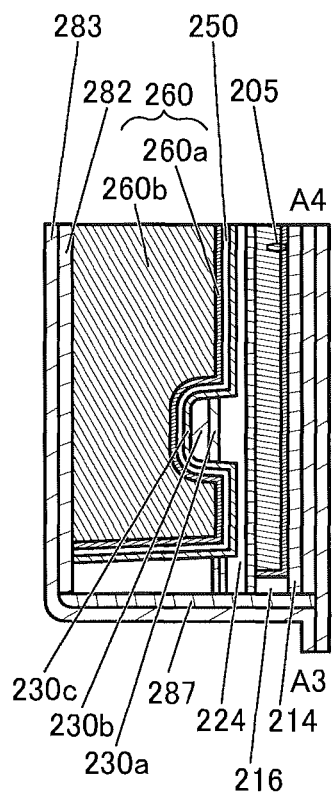
Figure 19B:
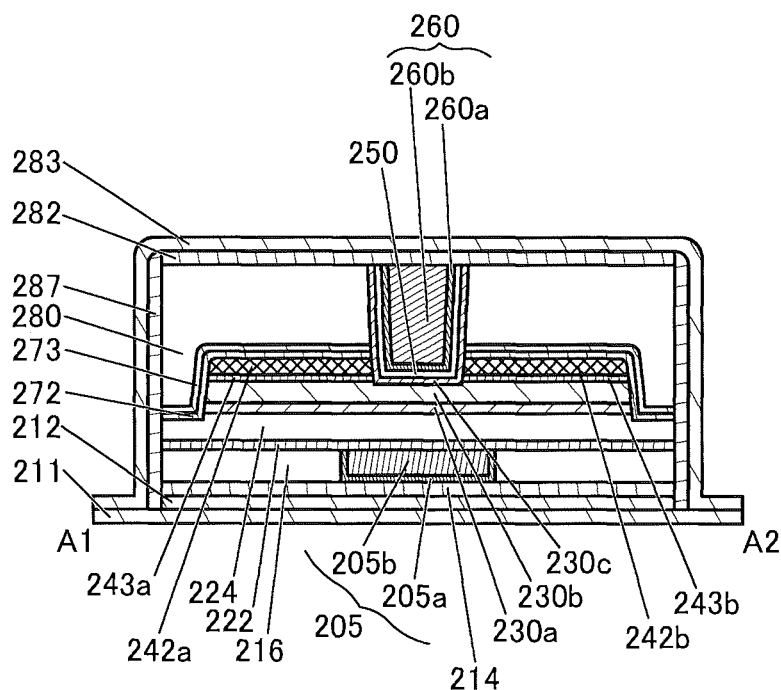
Figure 19D:
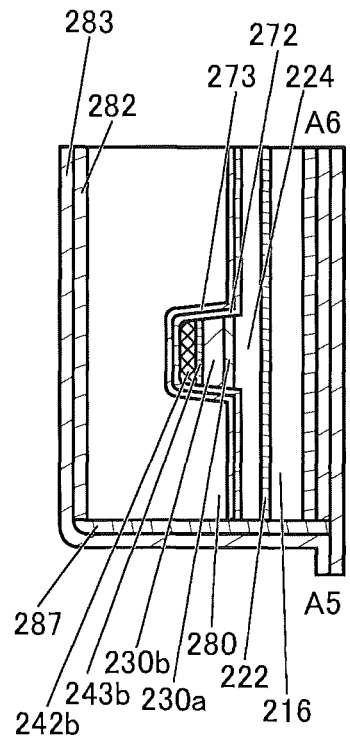
Figure 20A:
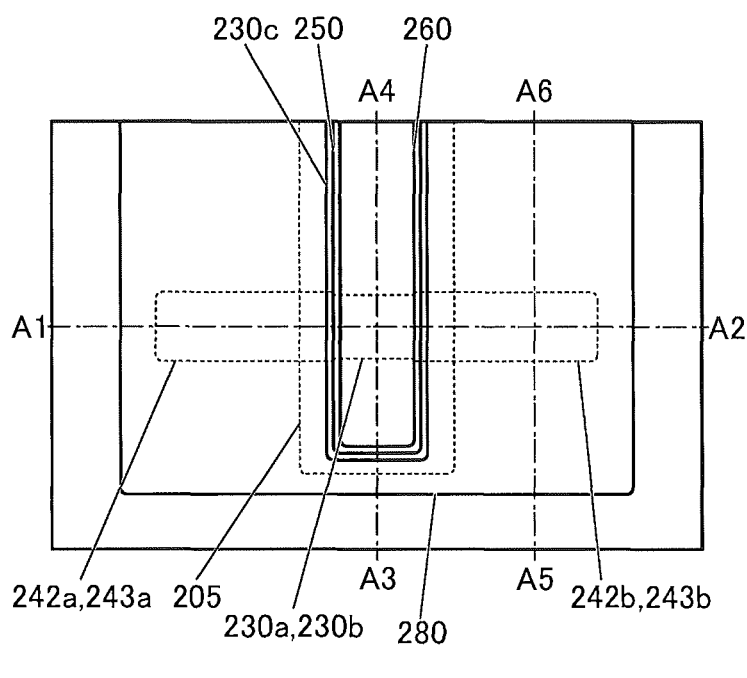
FIG. 20A is a top view illustrating a manufacturing method of a semiconductor device and FIGS. 20B to 20D are cross-sectional views illustrating the manufacturing method of the semiconductor device.
Figure 20C:
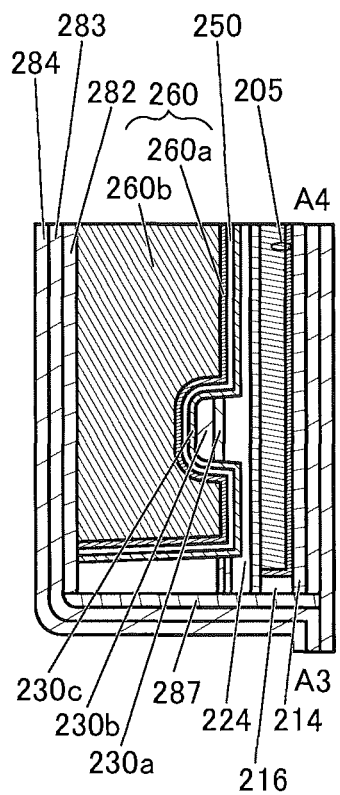
Figure 20B:
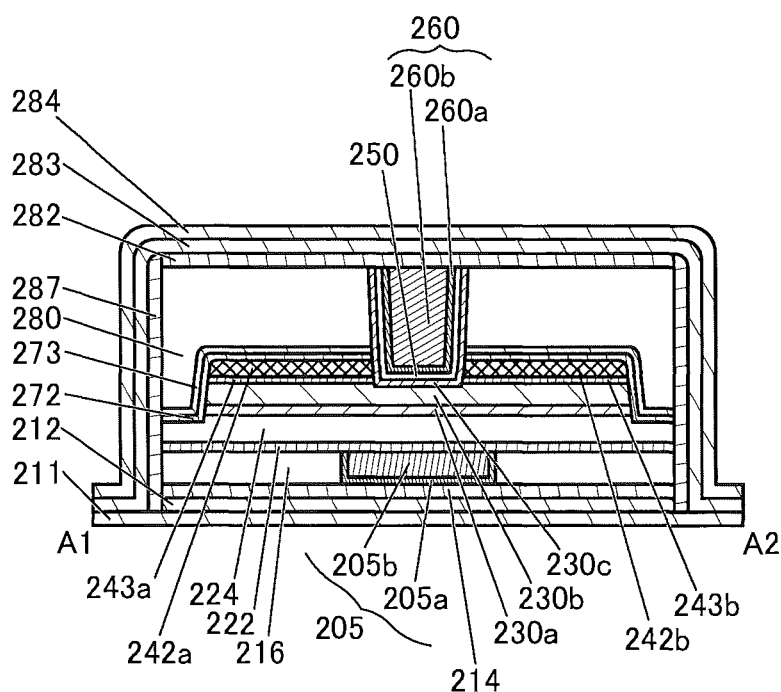
Figure 20D:
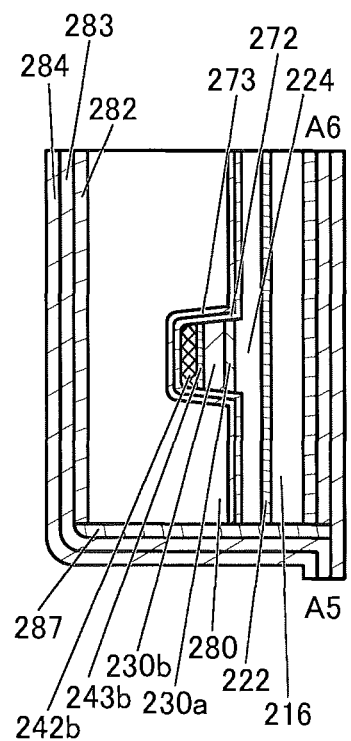
Figure 21A:
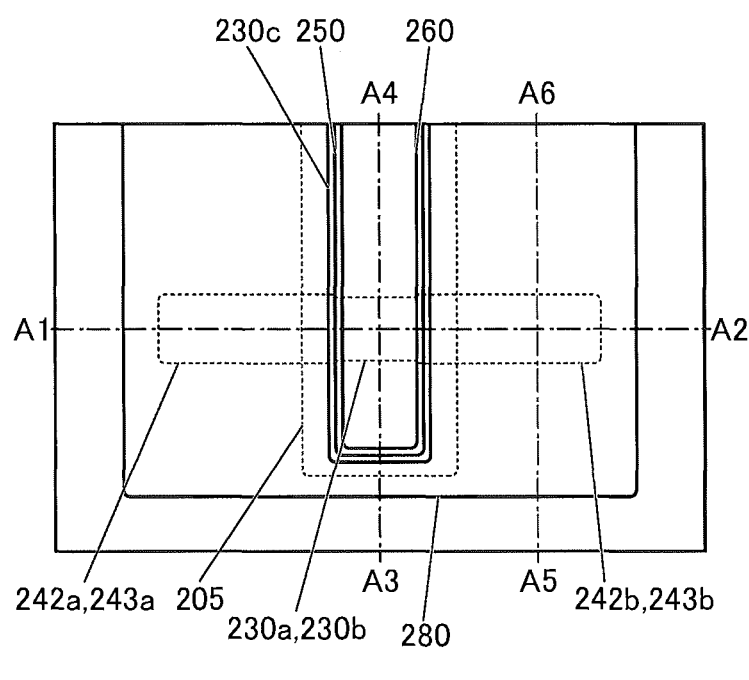
FIG. 21A is a top view illustrating a manufacturing method of a semiconductor device and FIGS. 21B to 21D are cross-sectional views illustrating the manufacturing method of the semiconductor device.
Figure 21C:
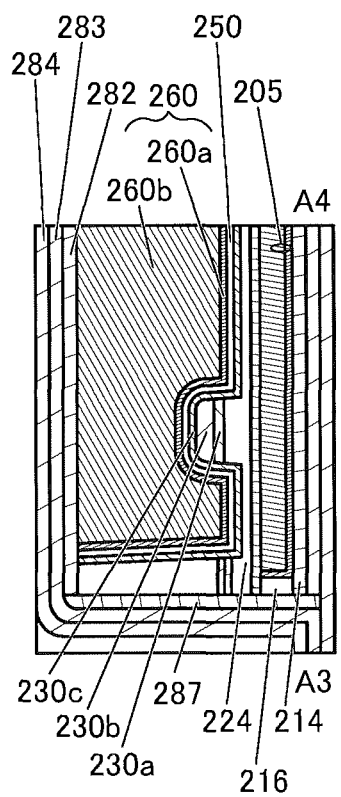
Figure 21B:
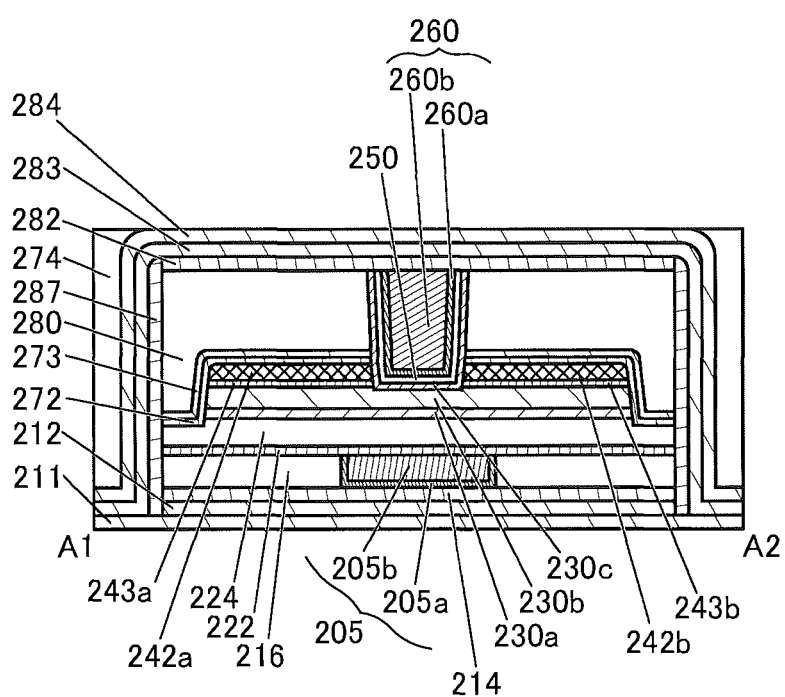
Figure 21D:
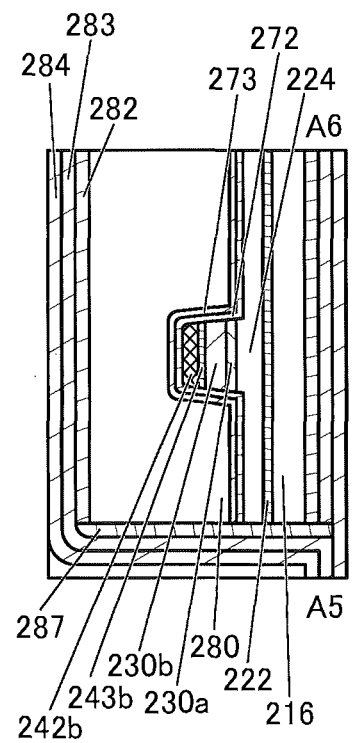
Figure 22A:
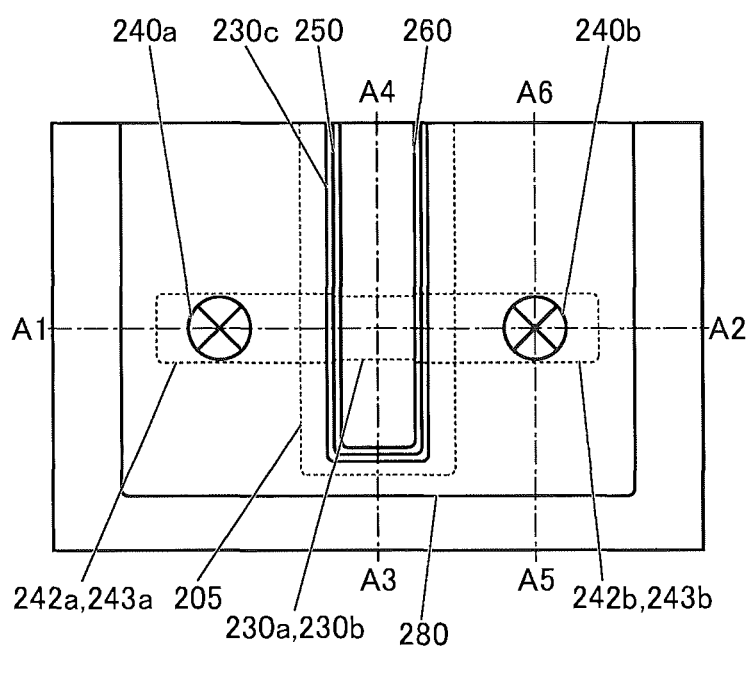
FIG. 22A is a top view illustrating a manufacturing method of a semiconductor device and FIGS. 22B to 22D are cross-sectional views illustrating the manufacturing method of the semiconductor device.
Figure 22C:
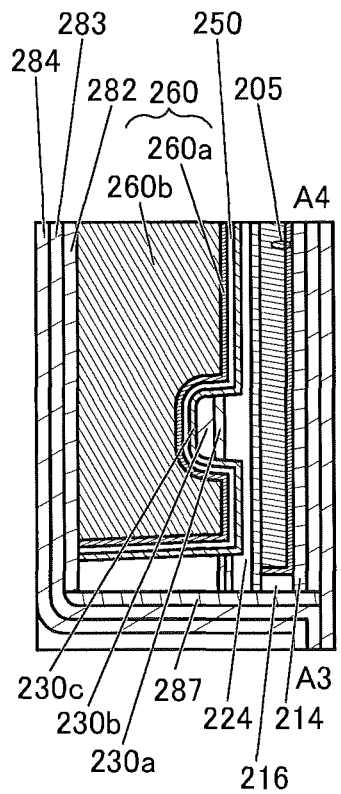
Figure 22B:
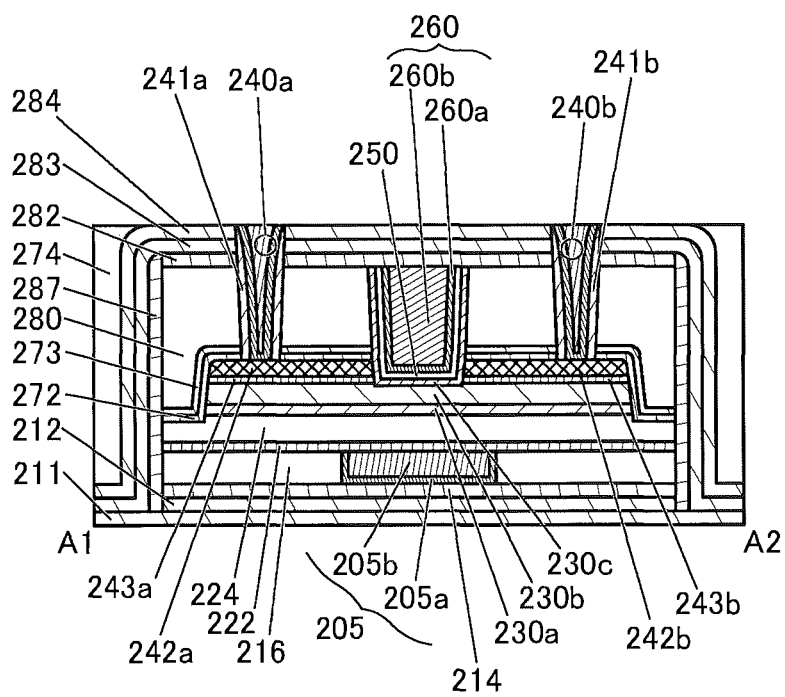
Figure 22D:
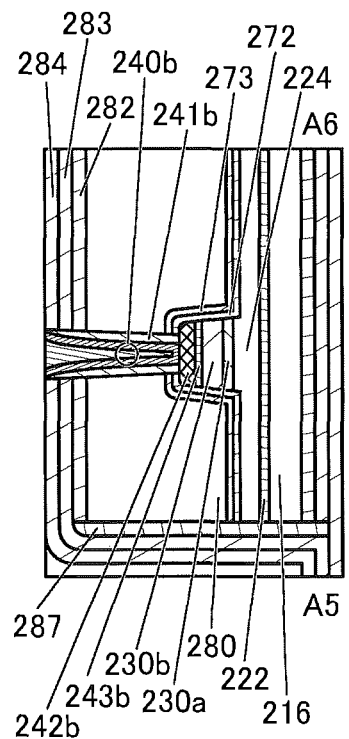
Figure 23A:
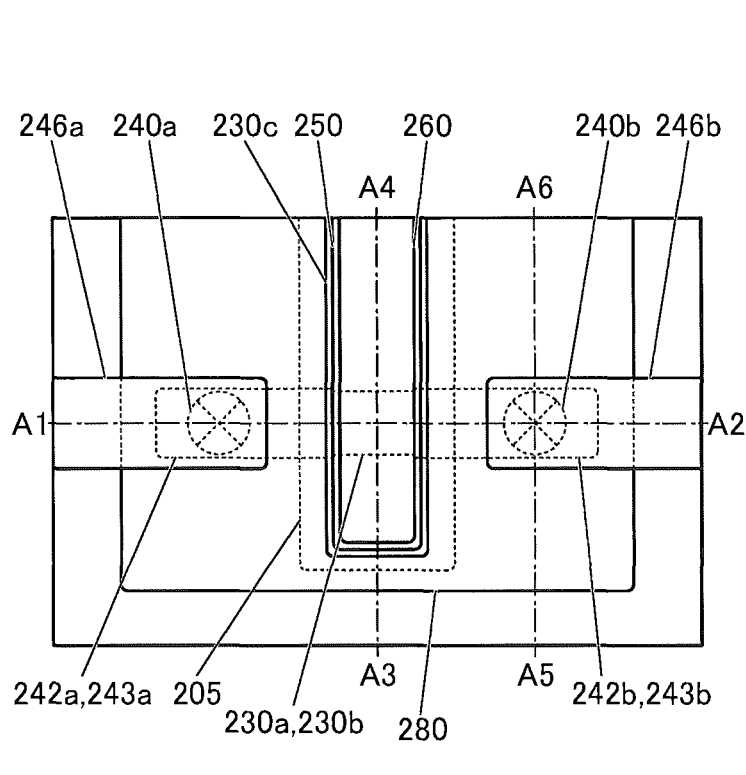
FIG. 23A is a top view illustrating a manufacturing method of a semiconductor device and FIGS. 23B to 23D are cross-sectional views illustrating the manufacturing method of the semiconductor device.
Figure 23C:
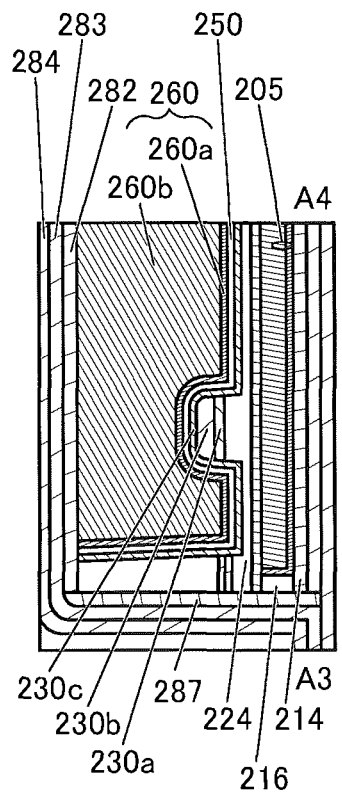
Figure 23B:
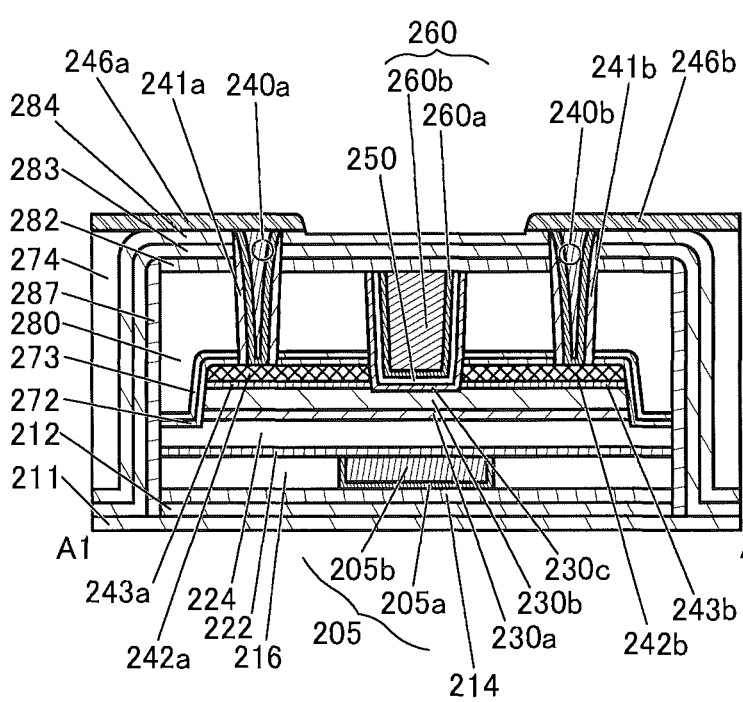
Figure 23D:
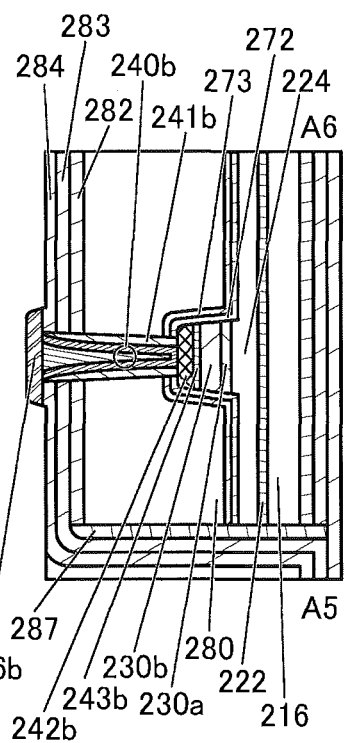

Heat treatment is preferably performed after the insulator 287 is formed (note that curves in FIG. 18B represent the heat treatment). Specifically, the heat treatment is performed at a temperature higher than or equal to 350° C., preferably higher than or equal to 400° C. in an oxygen-containing atmosphere, a nitrogen-containing atmosphere, or a mixed atmosphere of oxygen and nitrogen. The duration of the heat treatment is longer than or equal to one hour, preferably longer than or equal to four hours, further preferably longer than or equal to eight hours.

The heat treatment allows hydrogen in the oxide 230 to diffuse outward through the insulator 280, the insulator 282, and the insulator 287. In other words, hydrogen in the transistor 200 diffuses outward through the insulator 280, the insulator 282, and the insulator 287, whereby the hydrogen concentration in the transistor 200, the insulator 282, and the insulator 287 can be reduced. In other words, the absolute amount of hydrogen present in the semiconductor device can be reduced.

Next, the insulator 283 is formed to cover the insulators 282, 287, and 211 (see FIGS. 19A to 19D). The insulator 283 can be formed by a sputtering method, a CVD method, an MBE method, a PLD method, an ALD method, or the like. The insulator 283 may be a multilayer. For example, silicon nitride may be deposited by a sputtering method, and another silicon nitride may be deposited thereover by a CVD method. As illustrated in FIGS. 19A to 19D, the insulator 283 is in contact with the insulator 211 at the bottom surface of the opening. That is, the top and side surfaces of the transistor 200 are surrounded by the insulator 283 and the bottom surface of the transistor 200 is surrounded by the insulator 211. Surrounding the transistor 200 by the insulators 283 and 211 having high barrier properties inhibits entry of moisture and hydrogen from the outside.

Next, heat treatment may be performed. In this embodiment, the heat treatment is performed in a nitrogen atmosphere at 400° C. for one hour. Through the heat treatment, oxygen added at the time of the formation of the insulator 282 can be diffused into the insulator 280 and then can be supplied to the oxides 230a and 230b through the oxide 230c. The oxygen adding treatment performed in this manner on the oxide 230 allows oxygen vacancies in the oxide 230 (the oxide 230b) to be filled with oxygen.

Furthermore, hydrogen remaining in the oxide 230 diffuses to the insulator 282 and the insulator 287 through the insulator 280 and is trapped or fixed in the insulator 287. That is, recombination of hydrogen remaining in the oxide 230 with oxygen vacancies and formation of VoH can be inhibited. Note that the heat treatment is not necessarily performed after the formation of the insulator 283 and may be performed after the formation of the insulator 282.

Furthermore, the insulator 284 may be formed over the insulator 283 (see FIGS. 20A to 20D). Note that the insulator 284 is preferably formed by a film formation method that enables high coverage. For example, the insulator 284 can be formed by a sputtering method, a CVD method, an MBE method, a PLD method, an ALD method, or the like. The insulator 284 is preferably formed using the same material as those for the insulator 212 and the insulator 283.

Specifically, silicon nitride is preferably deposited by a CVD method. It is particularly preferable that the insulator 284 be formed by a CVD method using a compound gas containing no hydrogen atom or having a low hydrogen atom content.

The insulator 284 is formed by a deposition method using a gas in which the number of hydrogen atoms is reduced or hydrogen atoms are removed, whereby the amount of hydrogen in the insulator 284 can be reduced. In other words, the hydrogen concentration of the insulator 284 can be reduced and thus entry of hydrogen into the channel formation region of the oxide semiconductor can be inhibited Then, an insulating film to be the insulator 274 is formed over the insulator 284. The insulating film to be the insulator 274 can be formed by a sputtering method, a CVD method, an MBE method, a PLD method, an ALD method, or the like. The insulating film to be the insulator 274 is preferably formed by a deposition method using the gas in which the number of hydrogen atoms is reduced or hydrogen atoms are removed. Thus, the hydrogen concentration of the insulating film to be the insulator 274 can be reduced.

Next, the insulating film to be the insulator 274 is subjected to CMP treatment, whereby the insulator 274 having a flat top surface is formed (see FIGS. 21A to 21D).

Subsequently, openings reaching the conductor 242 are formed in the insulators 272, 273, 280, 282, 283, and 284 (see FIGS. 22A to 22D). The openings are formed by a lithography method. Note that the openings in the top view in FIG. 22A each have a circular shape; however, the shapes of the openings are not limited thereto. For example, the openings in the top view may each have an almost circular shape such as an elliptical shape, a polygonal shape such as a quadrangular shape, or a polygonal shape such as a quadrangular shape with rounded corners.

Next, an insulating film to be the insulator 241 is formed and subjected to anisotropic etching, so that the insulator 241 is formed (see FIGS. 22A to 22D). The insulating film to be the insulator 241 can be formed by a sputtering method, a CVD method, an MBE method, a PLD method, an ALD method, or the like. The insulating film to be the insulator 241 preferably has a function of inhibiting the penetration of oxygen. For example, aluminum oxide is preferably deposited by a PEALD method. Alternatively, as in the insulator 283, silicon nitride is preferably deposited by a PEALD method. Silicon nitride is preferable because of its high hydrogen blocking property.

For the anisotropic etching of the insulating film to be the insulator 241, a dry etching method may be employed, for example. Providing the insulator 241 on the sidewall portions of the openings can inhibit penetration of oxygen from the outside and oxidation of the conductors 240a and 240b formed in the next step. Furthermore, impurities such as water and hydrogen can be prevented from diffusing from the conductors 240a and 240b to the outside.

Next, a conductive film to be the conductor 240a and the conductor 240b is formed. The conductive film to be the conductor 240a and the conductor 240b preferably has a stacked-layer structure including a conductor with a function of inhibiting transmission of impurities such as water and hydrogen. For example, a stacked-layer structure of tantalum nitride, titanium nitride, or the like and tungsten, molybdenum, copper, or the like can be employed. The conductive film to be the conductor 240a and the conductor 240b can be formed by a sputtering method, a CVD method, an MBE method, a PLD method, an ALD method, or the like.

Then, the conductive film to be the conductors 240a and 240b is partly removed by CMP treatment to expose top surfaces of the insulators 284 and 274. As a result, the conductive film remains only in the openings, whereby the conductors 240a and 240b having flat top surfaces can be formed (see FIGS. 22A to 22D). Note that the top surfaces of the insulator 284 and the insulator 274 are partly removed by the CMP treatment in some cases.

Next, a conductive film to be the conductor 246 is formed. The conductive film to be the conductor 246 can be formed by a sputtering method, a CVD method, an MBE method, a PLD method, an ALD method, or the like.

Next, the conductive film to be the conductor 246 is processed by a lithography method to form the conductor 246a in contact with the top surface of the conductor 240a and the conductor 246b in contact with the top surface of the conductor 240b. At this time, the insulator 284 in a region not overlapping with the conductors 246a and 246b is sometimes partly removed (see FIGS. 23A to 23D).

Next, the insulator 286 is formed over the conductor 246 and the insulator 284 (see FIGS. 4A to 4D). The insulator 286 can be formed by a sputtering method, a CVD method, an MBE method, a PLD method, an ALD method, or the like. The insulator 286 may be a multilayer. For example, silicon nitride may be deposited by a sputtering method, and another silicon nitride may be deposited thereover by a CVD method. When the insulator 286 is formed over the conductor 246 and the insulator 284, the top and side surfaces of the conductor 246 are in contact with the insulator 286, and the bottom surface of the conductor 246 is in contact with the insulator 284. In other words, the conductor 246 can be surrounded by the insulators 284 and 286. Such a structure can inhibit penetration of oxygen from the outside and oxidation of the conductor 246. Furthermore, such a structure is preferable because impurities such as water and hydrogen can be prevented from diffusing from the conductor 246 to the outside.

Through the above process, the semiconductor device including the transistor 200 illustrated in FIGS. 4A to 4D can be manufactured. By the manufacturing method of a semiconductor device which is described in this embodiment and illustrated in FIGS. 7A to 7D to FIGS. 23A to 23D, the transistor 200 can be formed.

<Application Example of Semiconductor Device>

An example of a semiconductor device including the transistor 200 of one embodiment of the present invention which is different from the semiconductor device described in <Structure example 1 of semiconductor device> will be described below with reference to FIGS. 24A and 24B, FIG. 25, FIGS. 26A and 26B, FIGS. 27A and 27B, FIG. 28, and FIG. 29. Note that in the semiconductor device illustrated in FIGS. 24A and 24B, FIG. 25, FIGS. 26A and 26B, FIGS. 27A and 27B, FIG. 28, and FIG. 29, components having the same functions as the components in the semiconductor device described in <Structure example 1 of semiconductor device> (see FIGS. 4A to 4D) are denoted by the same reference numerals. Note that in this section, the materials described in detail in <Structure example 1 of semiconductor device> can be used as materials for the transistor 200.

Application Example 1 of Semiconductor Device

FIGS. 24A and 24B each illustrate a structure in which transistors 200_1 to 200_n (n is a natural number of three or more) are collectively sealed by the insulator 283 and the insulator 211. Note that although the transistors 200_1 to 200_n appear to be arranged in the channel length direction in FIGS. 24A and 24B, the present invention is not limited to this structure. The transistors 200_1 to 200_n may be arranged in the channel width direction or in a matrix. Depending on the design, the transistors may be arranged without regularity.

As illustrated in FIG. 24A, a portion where the insulator 283 and the insulator 211 are in contact with each other (hereinafter referred to as a sealing portion 265 in some cases) is formed outside the transistors 200_1 to 200_n. The sealing portion 265 is formed to surround the transistors 200_1 to 200_n. When such a structure is employed, the transistors 200_1 to 200_n can be surrounded by the insulator 283 and the insulator 211. As a result, a plurality of transistor groups surrounded by the sealing portion 265 are provided over a substrate.

A dicing line (also referred to as a scribe line, a dividing line, or a cutting line) may be provided to overlap with the sealing portion 265. The above substrate is divided at the dicing line, so that the transistor groups surrounded by the sealing portion 265 are taken out as one chip.

Although the transistors 200_1 to 200_n are surrounded by one sealing portion 265 in the example illustrated in FIG. 24A, the present invention is not limited to this example. As illustrated in FIG. 24B, the transistors 200_1 to 200_n may be surrounded by a plurality of sealing portions. In FIG. 24B, the transistors 200_1 to 200_n are surrounded by a sealing portion 265a and are further surrounded by an outer sealing portion 265b.

When a plurality of sealing portions surround the transistors 200_1 to 200_n in this manner, the insulator 283 and the insulator 211 are in contact with each other in more portions, improving the adhesion between the insulator 283 and the insulator 211. As a result, the transistors 200_1 to 200_n can be more reliably sealed.

In that case, a dicing line may be provided to overlap with the sealing portion 265a or the sealing portion 265b, or may be provided between the sealing portion 265a and the sealing portion 265b.

Application Example 2 of Semiconductor Device

Figure 25:
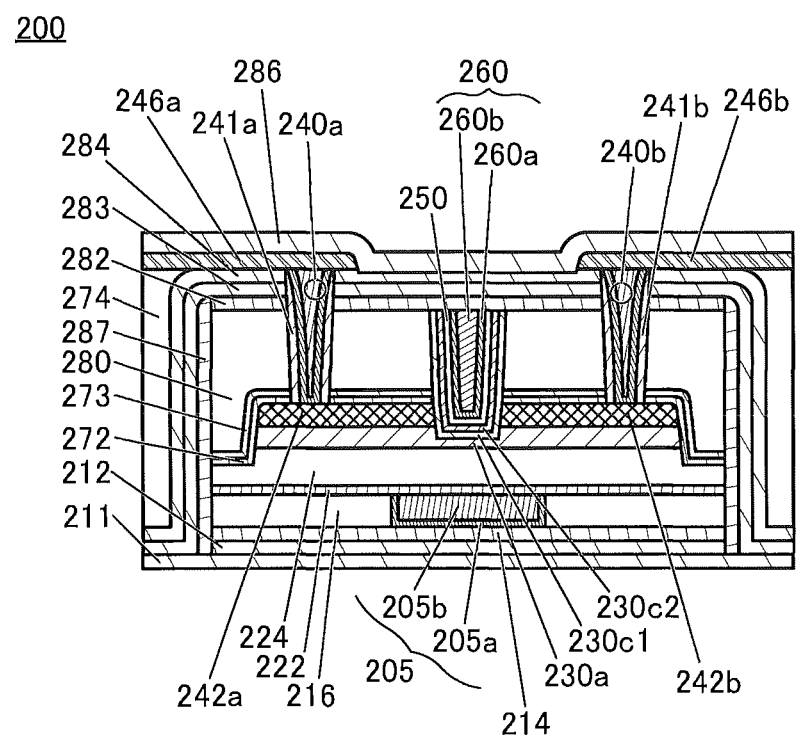
FIG. 25 is a cross-sectional view of a semiconductor device.

FIG. 25 is a cross-sectional view of the transistor 200. The transistor 200 illustrated in FIG. 25 is different from the transistor 200 illustrated in FIGS. 4A to 4D in that the oxide 230b is not provided. That is, the oxide 230 of the transistor 200 in FIG. 25 includes the oxide 230a, an oxide 230c1, and an oxide 230c2. A bottom surface of the conductor 242a and a bottom surface of the conductor 242b are in contact with the oxide 230a.

When the oxide 230 has a stacked-layer structure of the oxide 230a, the oxide 230c1, and the oxide 230c2, the following excellent effects can be achieved.

For example, when the oxide 230a has an atomic ratio of In:Ga:Zn=1:3:4, the oxide 230c1 has an atomic ratio of In:Ga:Zn=4:2:3, and the oxide 230c2 has an atomic ratio of In:Ga:Zn=1:3:4, a channel formation region can be provided in the oxide 230c1. In the case where this structure is employed, the oxide 230c1 and the oxide 230c2 are formed to have a U-shape along an opening portion formed in the insulator 280, the insulator 272, the insulator 273, the conductor 242 (the conductor 242a and the conductor 242b), and the oxide 230a. Furthermore, side surfaces of the conductor 242a and the conductor 242b can be in contact with side surfaces of the oxide 230c1. The oxide 230c2 is in contact with a top surface of the oxide 230c1, whereby the insulator 250 can be prevented from being in contact with the oxide 230c1.

In the above-described structure, the contact area between the conductor 242 (the conductor 242a and the conductor 242b) and the oxide 230c1 can be small. This small contact area between the conductor 242 and the oxide 230c1 leads to a reduced junction leakage current that might be generated between the conductor 242 and the oxide 230c1. The contact area between the conductor 242 and the oxide 230c1 can be arbitrarily adjusted by adjusting the thickness of the conductor 242.

A semiconductor device including the transistor 200 illustrated in FIG. 25 can be suitably used, for example, for a space shuttle, an artificial satellite, or the like, which are used in space. In space, cosmic radiation, or electrons and protons ejected from the sun might enter the semiconductor device to affect the semiconductor characteristics. Since the junction leakage current in the transistor 200 illustrated in FIG. 25 is reduced, the transistor 200 is resistant to cosmic radiation and the like and can be deemed to have a highly reliable structure.

Application Example 3 of Semiconductor Device

Figure 26A:
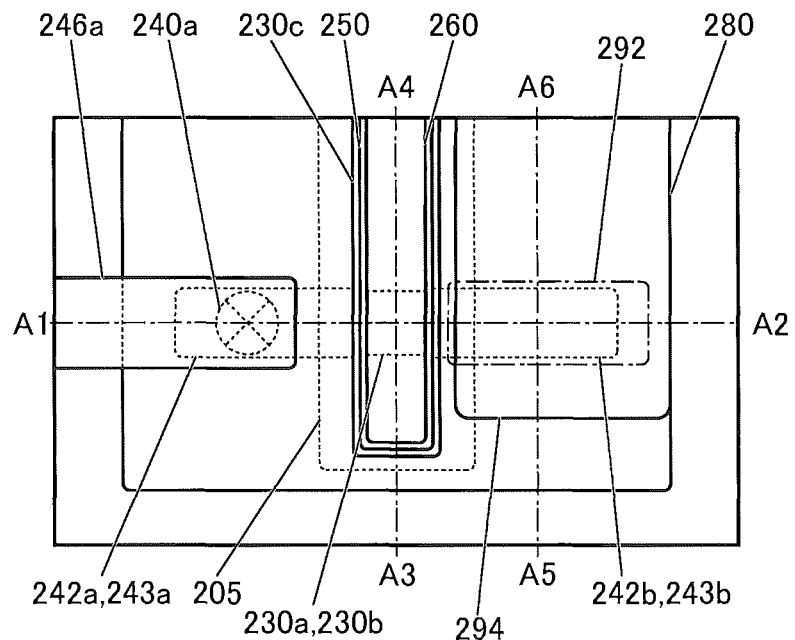
FIG. 26A is a top view of a semiconductor device and FIG. 26B is a cross-sectional view of the semiconductor device.
Figure 26B:
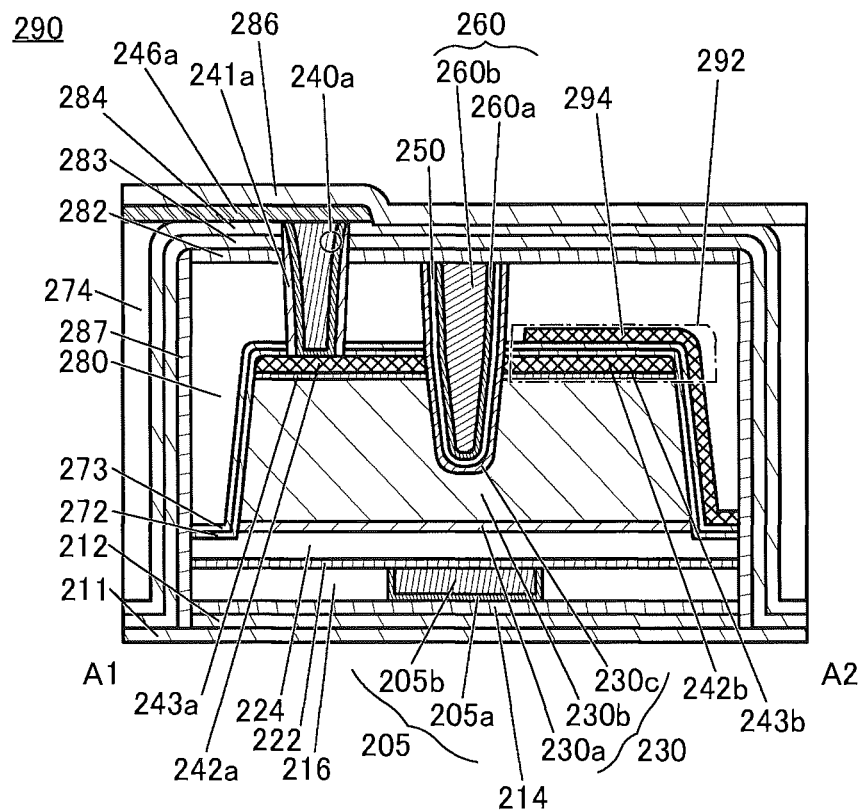

FIGS. 26A and 26B and FIGS. 27A and 27B illustrate a memory device 290. FIG. 26A is a top view of the memory device 290 and FIG. 26B is a cross-sectional view taken along dashed-dotted line A1-A2 in FIG. 26A. The cross-sectional view in FIG. 26B corresponds to a cross-sectional view illustrating a transistor in the channel length direction.

Figure 27A:
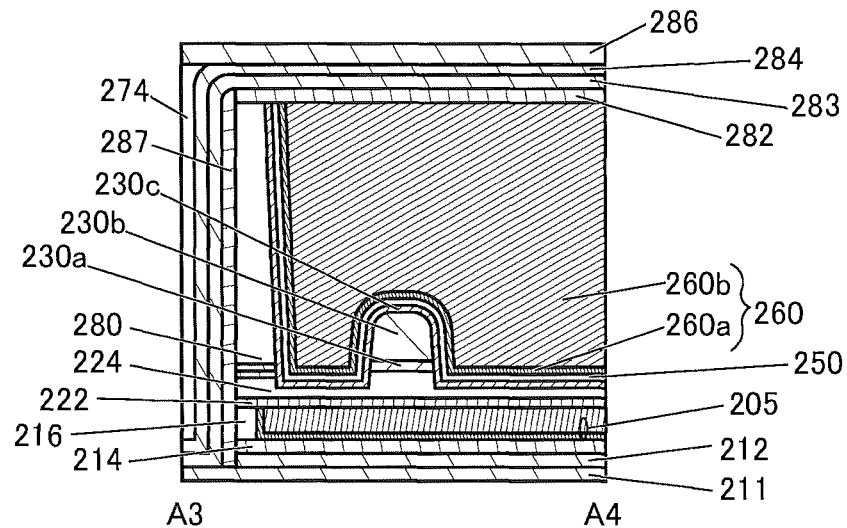
FIGS. 27A and 27B are cross-sectional views of a semiconductor device.
Figure 27B:
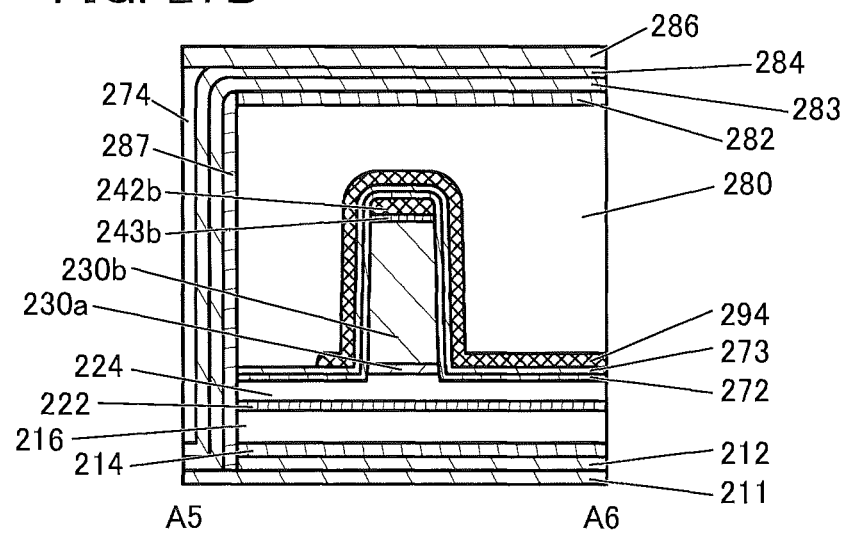

FIG. 27A is a cross-sectional view taken along dashed-dotted line A3-A4 in FIG. 26A. FIG. 27B is a cross-sectional view taken along dashed-dotted line A5-A6 in FIG. 26A. The cross-sectional view in FIG. 27A corresponds to a cross-sectional view illustrating the transistor in the channel width direction.

The memory device 290 illustrated in FIGS. 26A and 26B and FIGS. 27A and 27B includes the transistor, a capacitor device 292, and a wiring connected to the transistor. Specifically, the memory device 290 includes the insulator 211, the insulator 212 over the insulator 211, the insulator 214 over the insulator 212, the conductor 205 (the conductor 205a and the conductor 205b), the insulator 216 over the insulator 214, the insulator 222, the insulator 224, the oxide 230 (the oxide 230a, the oxide 230b, and the oxide 230c), the conductor 242 (the conductor 242a and the conductor 242b), the oxide 243 (the oxide 243a and the oxide 243b), the insulator 272, the insulator 273, the insulator 250, and the conductor 260 (the conductor 260a and the conductor 260b).

Furthermore, the insulator 280 and the insulator 282 over the insulator 280 are provided over the oxide 230. The insulator 287 is provided in contact with side surfaces of the insulator 212, the insulator 214, the insulator 216, the insulator 222, the insulator 224, the insulator 272, the insulator 273, the insulator 280, and the insulator 282. In addition, the insulator 283 and the insulator 284 over the insulator 283 are provided to cover the insulator 282.

The memory device 290 includes the conductor 240a electrically connected to the conductor 242a and functioning as the plug. Note that the insulator 241a is provided in contact with a side surface of the conductor 240a. The conductor 246a electrically connected to the conductor 240a and functioning as the wiring is provided over the insulator 284 and the conductor 240a. The insulator 286 is provided over the conductor 246a and the insulator 274.

The memory device 290 includes the capacitor device 292. The capacitor device 292 includes the conductor 242b, the insulator 272 and the insulator 273 provided over the conductor 242b, and a conductor 294 provided over the insulator 273. In other words, the capacitor device 292 forms a metal-insulator-metal (MIM) capacitor. Note that one of a pair of electrodes of the capacitor device 292, i.e., the conductor 242b, can double as the source electrode or the drain electrode of the transistor. The dielectric layer of the capacitor device 292 can double as a protective layer provided in the transistor, i.e., the insulator 272 and the insulator 273. Thus, the manufacturing process of the capacitor device 292 and that of the transistor can share some of the steps, improving the productivity of the semiconductor device.

As illustrated in FIG. 27B, the capacitor device 292 also has a region overlapping with the conductor 294 at the side surface of the conductor 242b, in the cross section of the transistor in the channel width direction. Since capacitance can be formed also in this region, the capacitance value can be high even with a small area.

The conductor 294 can be formed using, for example, any of the materials that can be used for the conductor 242.

In the memory device 290, the conductor 260 functions as the first gate of the transistor and the conductor 205 functions as the second gate of the transistor. The conductor 242a and the conductor 242b serve as the source electrode and the drain electrode of the transistor.

The oxide 230 functions as the semiconductor including the channel formation region of the transistor. The insulator 250 functions as the first gate insulator, and the insulator 222 and the insulator 224 function as the second gate insulator.

The insulator 214, the insulator 272, and the insulator 273 function as interlayer films. The insulator 214, the insulator 272, and the insulator 273 are preferably formed using a material that has a barrier property against oxygen or a material that can occlude hydrogen. When a material that can occlude hydrogen is used for the insulator 214, the insulator 272, and the insulator 273, the amount of hydrogen in the memory device 290 can be constant. For the insulator 214, the insulator 272, and the insulator 273, an Al compound, or a compound containing Al and an element Ma (the element Ma is an element with low electronegativity (an element with high reactivity) such as Mg, Zr, Si, or B) can be used.

The transistor included in the memory device 290 has a structure in which the insulator 282 and the oxide 230c are in direct contact with each other as illustrated in FIG. 26B, FIG. 27A, and FIG. 27B. Owing to this structure, diffusion of oxygen contained in the insulator 280 to the conductor 260 side can be inhibited. In addition, oxygen contained in the insulator 280 can be efficiently supplied to the oxide 230a and the oxide 230b through the oxide 230c, which can reduce oxygen vacancies in the oxide 230a and the oxide 230b and improve the electrical characteristics and reliability of the transistor.

In the transistor of the memory device 290 illustrated in FIGS. 26A and 26B, the conductor 260 is formed in a self-aligned manner in an opening portion provided in the interlayer films including the insulator 280, with the insulator 250 provided between the conductor 260 and the interlayer films. In other words, the conductor 260 is formed to fill the opening provided in the interlayer films including the insulator 280, with the insulator 250 positioned between the conductor 260 and the interlayer films; therefore, alignment of the conductor 260 in the region between the conductor 242a and the conductor 242b is not needed.

The oxide 230c is preferably provided in the opening that is provided in the interlayer films including the insulator 280. Thus, the insulator 250 and the conductor 260 include a region that overlaps with a stacked-layer structure of the oxide 230b and the oxide 230a with the oxide 230c positioned therebetween. When this structure is employed, the oxide 230c and the insulator 250 can be sequentially formed and thus, the interface between the oxide 230 and the insulator 250 can be kept clean. Accordingly, the influence of interface scattering on carrier conduction is small, and the transistor of the memory device 290 can have a high on-state current and high frequency characteristics.

In the transistor of the memory device 290 illustrated in FIGS. 26A and 26B, the channel formation region is formed mainly at the interface between the oxide 230c and the oxide 230b or the vicinity thereof. Note that the oxide 230c is formed to have a U-shape along an opening portion formed in the insulator 280, the insulator 272, the insulator 273, the conductor 242 (the conductor 242a and the conductor 242b), the oxide 243 (the oxide 243a and the oxide 243b), and the oxide 230b.

For example, in the case where the channel length of the transistor is reduced (typically greater than or equal to 5 nm and less than 60 nm, preferably greater than or equal to 10 nm and less than or equal to 30 nm), the structure of the transistor included in the memory device 290 in FIGS. 26A and 26B can make the effective channel length longer. For example, in the case where the distance between the conductor 242a and the conductor 242b is 20 nm, the effective channel length can be greater than or equal to 40 nm and less than or equal to 60 nm, i.e., twice or three times the distance between the conductor 242a and the conductor 242b or the minimum feature size. Accordingly, the memory device 290 illustrated in FIGS. 26A and 26B employs structures of a transistor and a capacitor device that are suitable for miniaturization.

Application Example 4 of Semiconductor Device

Next, application examples of the memory device 290 illustrated in FIGS. 26A and 26B and FIGS. 27A and 27B will be described with reference to FIG. 28 and FIG. 29.

Figure 28:
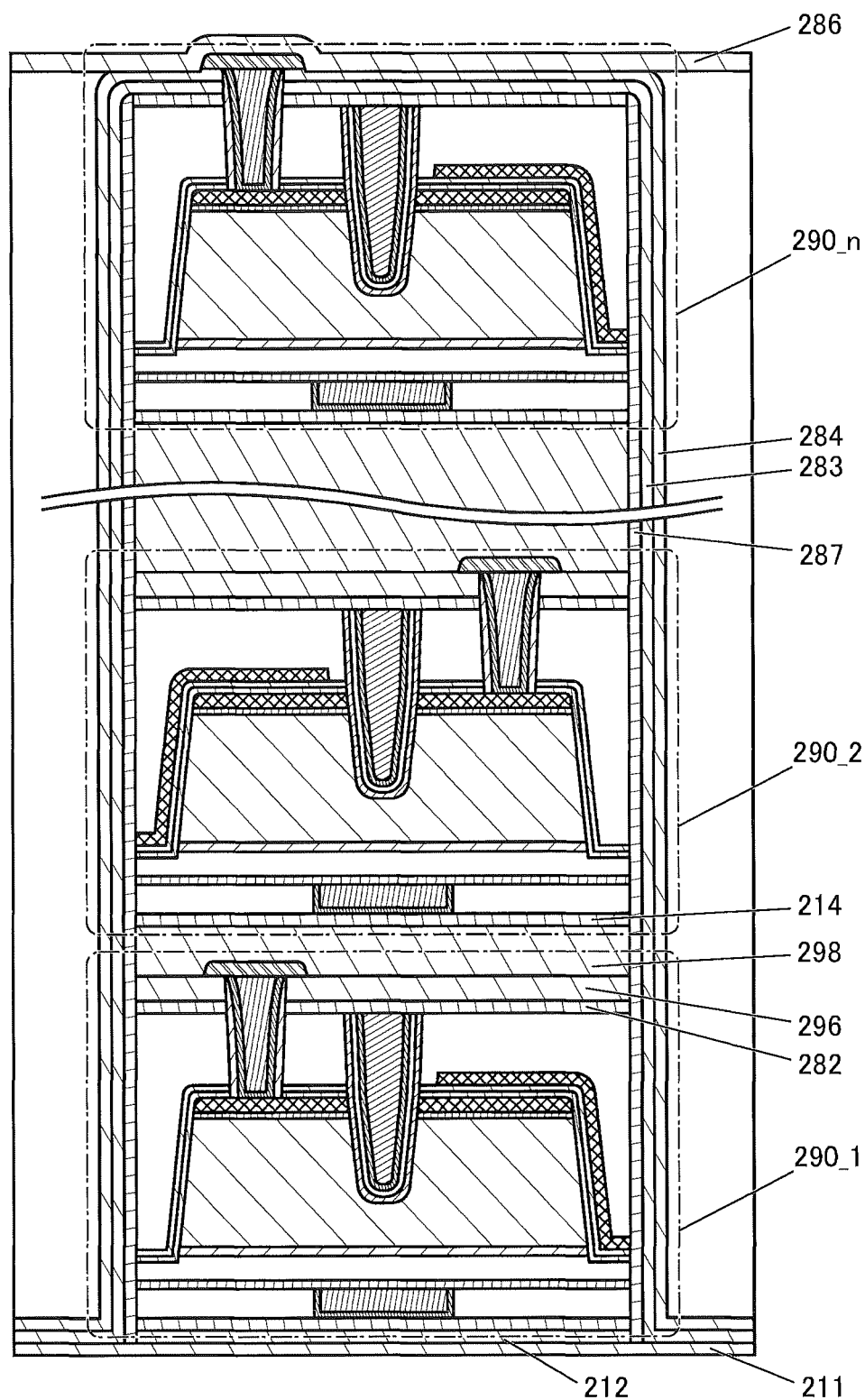
FIG. 28 is a cross-sectional view of a semiconductor device.
Figure 29:
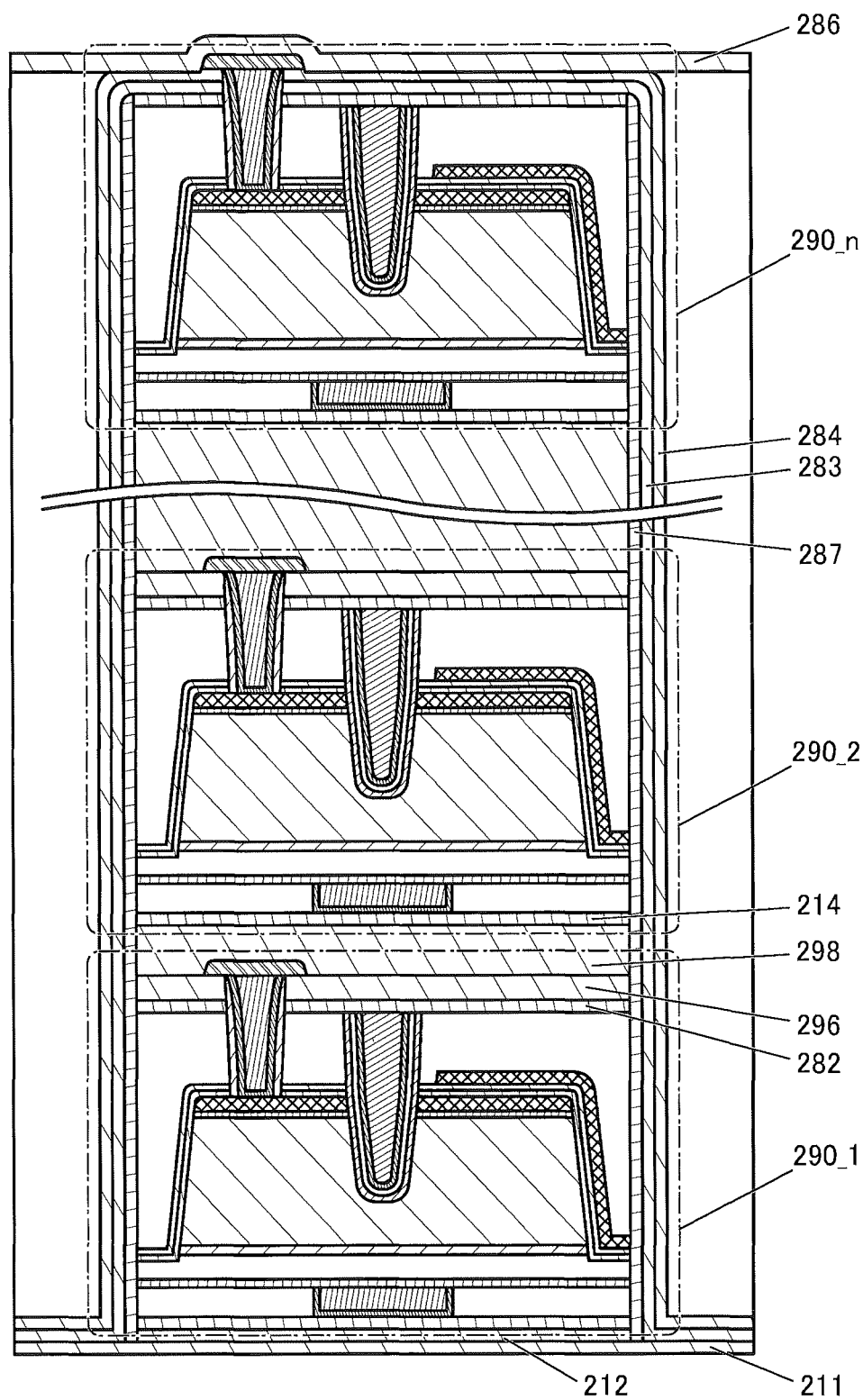
FIG. 29 is a cross-sectional view of a semiconductor device.

FIG. 28 and FIG. 29 are examples of a cross-sectional view of a memory device having a structure in which a plurality of the memory devices 290 are stacked in the vertical direction.

In the example illustrated in FIG. 28, a memory device 290_1, a memory device 290_2, and a memory device 290_n (n is a natural number of three or more) are stacked. Note that as illustrated in FIG. 28, the memory device 290_2 is different from the memory device 290_1 in the position of the conductor 240a functioning as the plug. This structure is advantageous in that parasitic capacitance between adjacent memory devices can be small or the design flexibility of a circuit can be increased. Note that although FIG. 28 illustrates the structure in which the conductors 240a functioning as the plugs are positioned in a staggered manner in an upper memory device and a lower memory device, the present invention is not limited thereto; for example, the conductors 240a functioning as the plugs and the capacitor devices 292 may be arranged as if they are rotated by a quarter around the conductor 260 in a top view.

It is also possible to employ a structure in which the conductors 240a functioning as the plugs are arranged at the same position in a cross-sectional view in the channel width direction. FIG. 29 shows an example of such a structure. In the structure illustrated in FIG. 29, for example, adjacent memory devices can share a write bit line. In other words, a plurality of the memory devices 290 can share a bit line and the like and thus, the above structure is advantageous in miniaturization. Note that although adjacent memory devices share the conductor 240a electrically connected to the bit line and functioning as the plug in FIG. 29, the present invention is not limited thereto. For example, adjacent memory devices may share a back gate electrode of the transistor.

In FIG. 28 and FIG. 29, the memory device 290_1, the memory device 290_2, and the memory device 290_n are covered with the insulator 287, the insulator 283, and the insulator 284. The insulator 283 and the insulator 211 are in contact with each other at the periphery of the memory device 290_1. In addition, the insulator 284 and the insulator 286 are in contact with each other at the upper portion of the insulator 284.

The insulator 282, an insulator 296, an insulator 298, and the insulator 214 are provided between the memory device 290_1 and the memory device 290_2.

The insulator 296 and the insulator 298 can be formed using, for example, a material similar to that of the insulator 211. The insulator 282 and the insulator 214 can be formed using aluminum oxide, and the insulator 286 and the insulator 298 can be formed using silicon nitride, for example.

While the three-layer structure of the insulator 211, the insulator 212, and the insulator 214 is formed below the conductor 205 in the transistor 200 illustrated in FIGS. 4A to 4D, one or two layers of the three-layer structure can be omitted in the transistors included in the memory devices 290_2 to 290_n illustrated in FIG. 28 and FIG. 29 because some of the layers formed above the transistor of the underlying memory device can be shared. In other words, when the upper and lower memory devices share some insulators, the productivity of the semiconductor device can be increased.

One embodiment of the present invention can provide a semiconductor device having favorable electrical characteristics. One embodiment of the present invention can provide a semiconductor device with normally-off electrical characteristics. One embodiment of the present invention can provide a highly reliable semiconductor device. One embodiment of the present invention can provide a semiconductor device with a high on-state current. One embodiment of the present invention can provide a semiconductor device with high frequency characteristics. One embodiment of the present invention can provide a semiconductor device that can be miniaturized or highly integrated. One embodiment of the present invention can provide a semiconductor device with a low off-state current. One embodiment of the present invention can provide a semiconductor device with low power consumption. One embodiment of the present invention can provide a semiconductor device that can be manufactured with high productivity.

At least part of this embodiment can be implemented in combination with any of the other embodiments and examples described in this specification as appropriate.

Embodiment 2

In this embodiment, a mode of a semiconductor device that can be applied to another embodiment of the present invention will be described. Structure examples of the semiconductor device will be described below.

Structure Example 2 of Semiconductor Device

Figure 30A:
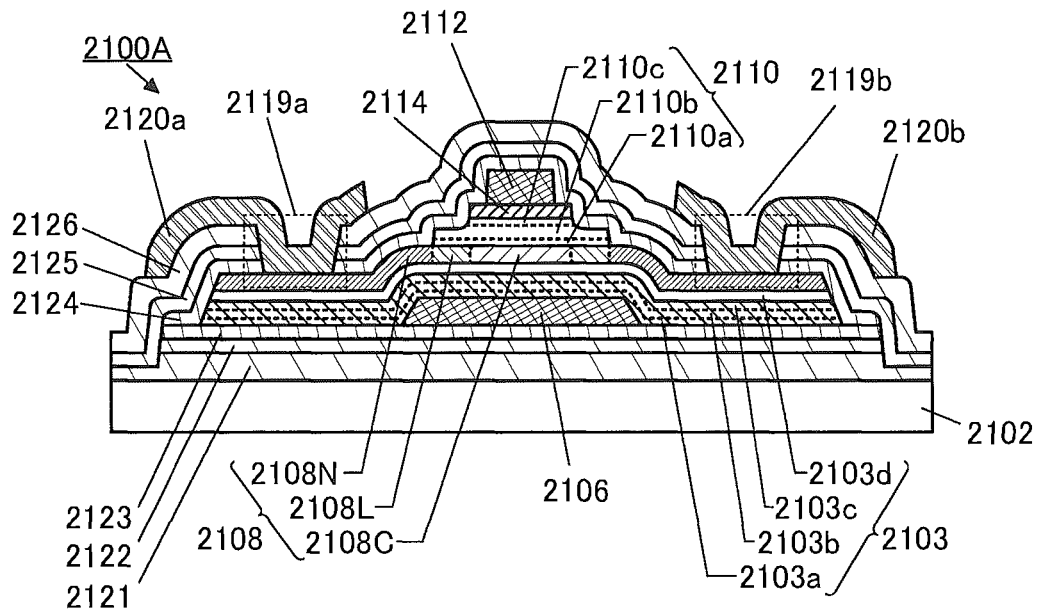
FIGS. 30A and 30B are cross-sectional views of semiconductor devices.

FIG. 30A is a cross-sectional view of a transistor 2100A in the channel length direction.

The transistor 2100A is provided over a substrate 2102 and includes an insulating layer 2121, an insulating layer 2122, an insulating layer 2123, a conductive layer 2106, an insulating layer 2103, a semiconductor layer 2108, an insulating layer 2110, a metal oxide layer 2114, a conductive layer 2112, an insulating layer 2124, an insulating layer 2125, an insulating layer 2126, and the like. The insulating layer 2121, the insulating layer 2122, and the insulating layer 2123 are sequentially provided over the substrate 2102, the conductive layer 2106 is provided over the insulating layer 2123, and the insulating layer 2103 is provided over the insulating layer 2123 and the conductive layer 2106. The semiconductor layer 2108 having an island-like shape is provided over the insulating layer 2103 and includes a region overlapping with part of the conductive layer 2106. The insulating layer 2110 is provided over the semiconductor layer 2108. The metal oxide layer 2114 and the conductive layer 2112 are stacked in this order over the insulating layer 2110 and include regions overlapping with part of the semiconductor layer 2108 and part of the conductive layer 2106.

The insulating layer 2124 includes a region in contact with part of the insulating layer 2123 and is provided over the conductive layer 2106, the insulating layer 2103, the semiconductor layer 2108, the insulating layer 2110, the metal oxide layer 2114, and the conductive layer 2112. The insulating layer 2125 includes a region in contact with part of the insulating layer 2122 and part of the insulating layer 2121 and is provided over the insulating layer 2124. The insulating layer 2126 is provided over the insulating layer 2125.

It is preferable that in the transistor 2100A, at least the semiconductor layer 2108 be provided between the insulating layer 2123 and the insulating layer 2124 and the insulating layer 2123 be in contact with the insulating layer 2124 outside the semiconductor layer 2108. The insulating layer 2123 and the insulating layer 2124 are provided between the insulating layers 2121 and 2122 and the insulating layers 2125 and 2126. Here, it is preferable that the insulating layer 2125 be in contact with at least the insulating layer 2122 and be further in contact with the insulating layer 2121.

In other words, in the transistor 2100A, the semiconductor layer 2108 is surrounded by the insulating layer 2123 and the insulating layer 2124, and the semiconductor layer 2108, the insulating layer 2123, and the insulating layer 2124 are surrounded by the insulating layer 2122 and the insulating layer 2125. Furthermore, the semiconductor layer 2108, the insulating layer 2123, the insulating layer 2124, the insulating layer 2122, and the insulating layer 2125 are provided to be sandwiched between the insulating layer 2121 and the insulating layer 2126, or in other words surrounded by the insulating layer 2121 and the insulating layer 2126.

That is, the sealing structure formed by the insulating layer 2123 and the insulating layer 2124 corresponds to the sealing structure formed by the insulator 214, the insulator 287, and the insulator 282 in the above embodiment. Thus, for the insulating layer 2123 and the insulating layer 2124, the description of the insulator 214, the insulator 287, and the insulator 282 can be referred to.

The sealing structure formed by the insulating layer 2121, the insulating layer 2122, and the insulating layer 2125 corresponds to the sealing structure formed by the insulator 211, the insulator 212, and the insulator 283 in the above embodiment. Thus, for the insulating layer 2122 and the insulating layer 2125, the description of the insulator 211, the insulator 212, and the insulator 283 can be referred to.

The insulating layer 2126 corresponds to the insulator 284 described in the above embodiment. Thus, the description of the insulator 284 can be referred to for the insulating layer 2126.

End portions of the conductive layer 2112 and the metal oxide layer 2114 are located inward from an end portion of the insulating layer 2110. In other words, the insulating layer 2110 includes a portion extending outward from the end portions of the conductive layer 2112 and the metal oxide layer 2114 over at least the semiconductor layer 2108.

The end portion of the conductive layer 2112 is preferably located inward from the end portion of the metal oxide layer 2114. The insulating layer 2124 is provided in contact with part of a top surface of the metal oxide layer 2114 and a side surface thereof.

In the transistor 2100A, the end portion of the conductive layer 2112 is located inward from the end portion of the metal oxide layer 2114. In other words, the metal oxide layer 2114 includes a portion extending outward from the end portion of the conductive layer 2112 over at least the insulating layer 2110.

Since the end portion of the conductive layer 2112 is located inward from the end portion of the metal oxide layer 2114, a step formed by the conductive layer 2112 and the metal oxide layer 2114 is small, which can improve step coverage with the layers formed over the conductive layer 2112 and the metal oxide layer 2114 (e.g., the insulating layer 2124, the insulating layer 2125, and the insulating layer 2126) and inhibit defects such as breakage of the layers or voids therein.

A wet etching method can be suitably used for formation of the conductive layer 2112 and the metal oxide layer 2114. When a material having a lower etching rate than the conductive layer 2112 is used for the metal oxide layer 2114, the end portion of the conductive layer 2112 can be formed inward from the end portion of the metal oxide layer 2114. In addition, the metal oxide layer 2114 and the conductive layer 2112 can be formed in the same step, which can increase the productivity.

Note that this embodiment is not limited by the above description. The end portion of the conductive layer 2112 may be aligned with the end portion of the metal oxide layer 2114. Alternatively, a side surface of the conductive layer 2112 and a side surface of the metal oxide layer 2114 may be on the same plane.

The semiconductor layer 2108 includes a pair of regions 2108L between which a channel formation region is sandwiched and a pair of regions 2108N outside the pair of regions 2108L. The region 2108L is a region of the semiconductor layer 2108 that overlaps with the insulating layer 2110 and does not overlap with the metal oxide layer 2114 and the conductive layer 2112.

A region 2108C functions as the channel formation region. Here, the metal oxide layer 2114 functions as part of a gate electrode when having conductivity; thus, an electric field is applied from the gate electrode to the region 2108C through the insulating layer 2110 functioning as a gate insulating layer to form a channel. However, this embodiment is not limited thereto. A channel might be formed in a portion that does not overlap with the metal oxide layer 2114 and overlaps with the conductive layer 2106 (a portion including the region 2108L and the region 2108N).

The region 2108L functions as a buffer region that relieves a drain electric field. The region 2108L does not overlap with the conductive layer 2112 and the metal oxide layer 2114 and is thus a region where a channel is hardly formed by application of gate voltage to the conductive layer 2112. The region 2108L preferably has a higher carrier concentration than the region 2108C. In that case, the region 2108L can function as an LDD region.

The region 2108L can be referred to as a region whose resistance is substantially equal to or lower than the resistance of the region 2108C, a region whose carrier concentration is substantially equal to or higher than the carrier concentration of the region 2108C, a region whose oxygen vacancy density is substantially equal to or higher than the oxygen vacancy density of the region 2108C, or a region whose impurity concentration is substantially equal to or higher than the impurity concentration of the region 2108C.

The region 2108L can be referred to as a region whose resistance is substantially equal to or higher than the resistance of the region 2108N, a region whose carrier concentration is substantially equal to or lower than the carrier concentration of the region 2108N, a region whose oxygen vacancy density is substantially equal to or lower than the oxygen vacancy density of the region 2108N, or a region whose impurity concentration is substantially equal to or lower than the impurity concentration of the region 2108N.

In this manner, the region 2108L functioning as the LDD region is provided between the region 2108C that is the channel formation region and the region 2108N that is a source region or a drain region, whereby a highly reliable transistor having both high drain withstand voltage and a high on-state current can be provided.

The region 2108N functions as the source region or the drain region and has lower resistance than any of the other regions of the semiconductor layer 2108. In other words, the region 2108N has higher carrier concentration, higher oxygen vacancy density, and higher impurity concentration than any of the other regions of the semiconductor layer 2108.

The electric resistance of the region 2108N is preferably as low as possible. For example, the sheet resistance of the region 2108N is preferably higher than or equal to 1 $\Omega$/square and less than $1 \times 10^3$ $\Omega$/square, further preferably higher than or equal to 1 $\Omega$/square and lower than or equal to $8 \times 10^2$ $\Omega$/square.

The electric resistance of the region 2108C when a channel is not formed is preferably as high as possible. For example, the sheet resistance of the region 2108C is preferably higher than or equal to $1 \times 10^9$ $\Omega$/square, further preferably higher than or equal to $5 \times 10^9$ $\Omega$/square, still further preferably higher than or equal to $1 \times 10^{10}$ $\Omega$/square.

The electric resistance of the region 2108C when a channel is not formed is preferably as high as possible and thus, its upper limit is not particularly set. If the upper limit is set, the sheet resistance of the region 2108C is preferably higher than or equal to $1 \times 10^9$ $\Omega$/square and lower than or equal to $1 \times 10^{12}$ $\Omega$/square, further preferably higher than or equal to $5 \times 10^9$ $\Omega$/square and lower than or equal to $1 \times 10^{12}$ $\Omega$/square, still further preferably higher than or equal to $1 \times 10^{10}$ $\Omega$/square and lower than or equal to $1 \times 10^{12}$ $\Omega$/square, for example.

The sheet resistance of the region 2108L can be, for example, higher than or equal to $1 \times 10^3$ $\Omega$/square and lower than or equal to $1 \times 10^9$ $\Omega$/square, preferably higher than or equal to $1 \times 10^3$ $\Omega$/square and lower than or equal to $1 \times 10^8$ $\Omega$/square, further preferably higher than or equal to $1 \times 10^3$ $\Omega$/square and lower than or equal to $1 \times 10^7$ $\Omega$/square. When the resistance is within the above range, a transistor that has favorable electrical characteristics and high reliability can be provided. Note that the sheet resistance can be calculated from a resistance value. Providing the region 2108L between the region 2108N and the region 2108C can increase the source-drain withstand voltage of the transistor 2100A.

The electric resistance of the region 2108C when a channel is not formed can be more than or equal to $1 \times 10^6$ times and less than or equal to $1 \times 10^{12}$ times that of the region 2108N, preferably more than or equal to $1 \times 10^6$ times and less than or equal to $1 \times 10^{11}$ times that of the region 2108N, further preferably more than or equal to $1 \times 10^6$ times and less than or equal to $1 \times 10^{10}$ times that of the region 2108N.

The electric resistance of the region 2108C when a channel is not formed can be more than or equal to $1 \times 10^0$ times and less than or equal to $1 \times 10^9$ times that of the region 2108L, preferably more than or equal to $1 \times 10^1$ times and less than or equal to $1 \times 10^8$ times that of the region 2108L, further preferably more than or equal to $1 \times 10^2$ times and less than or equal to $1 \times 10^7$ times that of the region 2108L.

The electric resistance of the region 2108L can be more than or equal to $1 \times 10^0$ times and less than or equal to $1 \times 10^9$ times that of the region 2108N, preferably more than or equal to $1 \times 10^1$ times and less than or equal to $1 \times 10^8$ times that of the region 2108N, further preferably more than or equal to $1 \times 10^1$ times and less than or equal to $1 \times 10^7$ times that of the region 2108N.

Providing the region 2108L having the resistance described above between the region 2108N and the channel formation region can increase the source-drain withstand voltage of the transistor 2100A.

The carrier concentration in the semiconductor layer 2108 preferably has a distribution such that the carrier concentration is increased in the following order: the region 2108C, the region 2108L, and the region 2108N. Providing the region 2108L between the region 2108C and the region 2108N can keep the carrier concentration of the region 2108C extremely low even when impurities such as hydrogen diffuse from the region 2108N during the manufacturing process.

The carrier concentration in the region 2108C functioning as the channel formation region is preferably as low as possible and preferably lower than or equal to $1 \times 10^{18}$ cm$^3$, further preferably lower than or equal to $1 \times 10^{17}$ cm$^3$, still further preferably lower than or equal to $1 \times 10^{16}$ cm$^{-3}$, yet still further preferably lower than or equal to $1 \times 10^{13}$ cm$^{-3}$, yet still further preferably lower than or equal to $1 \times 10^{12}$ cm$^{-3}$. Note that the lower limit of the carrier concentration of the region 2108C is not particularly limited and can be, for example, $1 \times 10^{-9}$ cm$^{-3}$.

Meanwhile, the carrier concentration in the region 2108N can be higher than or equal to $5 \times 10^{18}$ cm$^{-3}$, preferably higher than or equal to $1 \times 10^{19}$ cm$^{-3}$, further preferably higher than or equal to $5 \times 10^{19}$ cm$^{-3}$, for example. The upper limit of the carrier concentration of the region 2108N is not particularly limited and can be, for example, $5 \times 10^{21}$ cm$^{-3}$ or $1 \times 10^{22}$ cm$^{-3}$.

The carrier concentration of the region 2108L can lie halfway between that of the region 2108C and that of the region 2108N. For example, the carrier concentration of the region 2108L is higher than or equal to $1 \times 10^{14}$ cm$^{-3}$ and lower than $1 \times 10^{20}$ cm$^{-3}$.

Note that the carrier concentration is not necessarily uniform in the region 2108L; the region 2108L sometimes has a carrier concentration gradient that decreases from the region 2108N side to the channel formation region side. For example, one or both of the hydrogen concentration and the oxygen vacancy concentration of the region 2108L may have a gradient that decreases from the region 2108N side to the channel formation region side.

The semiconductor layer 2108 preferably contains a metal oxide. For the metal oxide that can be used for the semiconductor layer 2108, the description of the oxide 230 or the like, other embodiments, or other structure examples can be referred to. The insulating layer 2103 and the gate insulating layer 2110 that are in contact with the channel formation region of the semiconductor layer 2108 are preferably formed using oxide films. For example, an oxide film such as a silicon oxide film, a silicon oxynitride film, or an aluminum oxide film can be used. In this manner, oxygen released from the insulating layer 2103 or the insulating layer 2110 can be supplied to the channel formation region in the semiconductor layer 2108 to reduce oxygen vacancies in the semiconductor layer 2108.

Part of the end portion of the insulating layer 2110 is positioned over the semiconductor layer 2108. The insulating layer 2110 includes a portion overlapping with the conductive layer 2112 and functioning as the gate insulating layer and a portion not overlapping with the conductive layer 2112 and the metal oxide layer 2114 (i.e., a portion overlapping with the region 2108L).

The insulating layer 2110 may have a stacked-layer structure of two or more layers. FIG. 30A illustrates an example in which the insulating layer 2110 has a three-layer structure of an insulating layer 2110a, an insulating layer 2110b over the insulating layer 2110a, and an insulating layer 2110c over the insulating layer 2110b. Note that the insulating layer 2110a, the insulating layer 2110b, and the insulating layer 2110c can be formed using insulating films of the same kind of material and thus, the interfaces between the insulating layer 2110a, the insulating layer 2110b, and the insulating layer 2110c cannot be clearly observed in some cases. Therefore, in this embodiment, the interfaces between the insulating layer 2110a, the insulating layer 2110b, and the insulating layer 2110c are denoted by dashed lines in the drawing.

The insulating layer 2110a includes a region in contact with the channel formation region of the semiconductor layer 2108. The insulating layer 2110c includes a region in contact with the metal oxide layer 2114. The insulating layer 2110b is positioned between the insulating layer 2110a and the insulating layer 2110c.

Each of the insulating layers 2110a, 2110b, and 2110c is preferably an insulating film containing an oxide. In this case, it is preferable that the insulating layer 2110a, the insulating layer 2110b, and the insulating layer 2110c be successively formed in one deposition apparatus.

As each of the insulating layers 2110a, 2110b, and 2110c, for example, an insulating layer including at least one of the following films can be used: a silicon oxide film, a silicon oxynitride film, a silicon nitride oxide film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

The insulating layer 2110 in contact with the semiconductor layer 2108 preferably has a stacked-layer structure of oxide insulating films. The insulating layer 2110 further preferably includes a region containing oxygen in excess of the stoichiometric composition. In other words, the insulating layer 2110 includes an insulating film capable of releasing oxygen. For example, the insulating layer 2110 is formed in an oxygen atmosphere, the formed insulating layer 2110 is subjected to heat treatment, plasma treatment, or the like in an oxygen atmosphere, or an oxide film is formed over the insulating layer 2110 in an oxygen atmosphere, so that oxygen can be supplied to the insulating layer 2110. Specifically, the insulating layer 2110A that is in contact with the semiconductor layer 2108 preferably contains excess oxygen in a manner similar to that of the insulator 280 described in the above embodiment.

For example, each of the insulating layers 2110a, 2110b, and 2110c can be formed by any of a sputtering method, a chemical vapor deposition (CVD) method, a vacuum evaporation method, a pulsed laser deposition (PLD) method, an atomic layer deposition (ALD) method, and the like. As a CVD method, a plasma-enhanced chemical vapor deposition (PECVD) method, a thermal CVD method, or the like can be used.

In particular, the insulating layer 2110a, the insulating layer 2110b, and the insulating layer 2110c are preferably formed by a PECVD method.

Like the insulator 250, the insulating layer 2110c is preferably an extremely dense film in which defects in its surface are reduced and on which impurities included in the air, such as water, are hardly adsorbed as compared to the insulating layer 2110b.

The insulating layer 2110b is preferably formed to be thicker than the insulating layer 2110a and the insulating layer 2110c. For example, the insulating layer 2110b may be formed to be thick with the use of a deposition rate higher than that for the insulating layer 2110a and the insulating layer 2110c. In that case, the time taken for forming the insulating layer 2110 can be shortened.

Here, a boundary between the insulating layer 2110a and the insulating layer 2110b and a boundary between the insulating layer 2110b and the insulating layer 2110c are unclear in some cases; thus, the boundaries are denoted by dashed lines in FIG. 30A. Note that when the insulating layer 2110a and the insulating layer 2110b have different film densities, the boundary between the insulating layer 2110a and the insulating layer 2110b can be sometimes observed from difference in contrast in a cross-sectional image of the insulating layer 2110 obtained with a transmission electron microscope (TEM). Similarly, the boundary between the insulating layer 2110b and the insulating layer 2110c can be observed in some cases.

At the time of formation of the conductive layer 2112 and the metal oxide layer 2114, the thickness of the insulating layer 2110 might be reduced in a region not overlapping with the conductive layer 2112. In the structure illustrated in FIG. 30A, the insulating layer 2110c is removed and the insulating layer 2110a and the insulating layer 2110b remain in a region not overlapping with the metal oxide layer 2114. The insulating layer 2110b might be thinner in the region not overlapping with the metal oxide layer 2114 than in the region overlapping with the metal oxide layer 2114.

When the insulating layer 2110 has a smaller thickness in the region not overlapping with the metal oxide layer 2114, a step at the end portion of the insulating layer 2110 is small, which can improve step coverage with the layers formed over the insulating layer 2110 (e.g., the insulating layer 2124, the insulating layer 2125, and the insulating layer 2126) and inhibit defects such as breakage of the layers or voids therein.

The insulating layer 2110 may have a structure different from that illustrated in FIG. 30A; the insulating layer 2110a, the insulating layer 2110b, and the insulating layer 2110c may remain in the region not overlapping with the metal oxide layer 2114. Furthermore, the insulating layer 2110c may be thinner in the region not overlapping with the metal oxide layer 2114 than in the region overlapping with the metal oxide layer 2114. When the insulating layer 2110c remains in the region not overlapping with the metal oxide layer 2114, adsorption of water on the insulating layer 2110 can be inhibited. The thickness of the insulating layer 2110c in the region overlapping with the metal oxide layer 2114 is greater than or equal to 1 nm and less than or equal to 50 nm, preferably greater than or equal to 2 nm and less than or equal to 40 nm, further preferably greater than or equal to 3 nm and less than or equal to 30 nm.

Note that the insulating layer 2110 may have a two-layer structure of the insulating layer 2110a and the insulating layer 2110c over the insulating layer 2110a. Alternatively, the insulating layer 2110 may be a single layer. Any of the above insulating layers 2110a, 2110b, and 2110c can be selected as the insulating layer 2110 appropriately in accordance with the purpose.

The insulating layer 2103 can have a stacked-layer structure. The insulating layer 2103 has a structure in which an insulating layer 2103a, an insulating layer 2103b, an insulating layer 2103c, and an insulating layer 2103d are stacked in this order from the conductive layer 2106 side in the example illustrated in FIG. 30A. The insulating layer 2103a is in contact with the conductive layer 2106. The insulating layer 2103d is in contact with the semiconductor layer 2108.

The insulating layer 2103 preferably satisfies at least one of the following characteristics, further preferably satisfies all of the following characteristics: high withstand voltage, low stress, unlikeliness of releasing hydrogen and water, a small number of defects, and prevention of diffusion of metal elements contained in the conductive layer 2106.

Among the four insulating layers included in the insulating layer 2103, the insulating layers 2103a, 2103b, and 2103c positioned on the conductive layer 2106 side are each preferably formed using an insulating film containing nitrogen. In contrast, the insulating layer 2103d in contact with the semiconductor layer 2108 is preferably formed using an insulating film containing oxygen. The four insulating layers included in the insulating layer 2103 are preferably formed successively without exposure to the air with a plasma CVD apparatus.

As each of the insulating layers 2103a, 2103b, and 2103c, an insulating film containing nitrogen, such as a silicon nitride film, a silicon nitride oxide film, an aluminum nitride film, or a hafnium nitride film can be favorably used, for example. Furthermore, as the insulating layer 2103d, an insulating film that can be used as the insulating layer 2110 can also be used.

The insulating layer 2103a and the insulating layer 2103c are preferably dense films that can prevent diffusion of impurities from the layers therebelow. It is preferable that the insulating layer 2103a be able to block a metal element contained in the conductive layer 2106 and that the insulating layer 2103c be able to block hydrogen and water contained in the insulating layer 2103b. Thus, an insulating film that is formed at a lower deposition rate than the insulating layer 2103b can be used as each of the insulating layer 2103a and the insulating layer 2103c.

In contrast, it is preferable that the insulating layer 2103b be formed using an insulating film having low stress and being formed at a high deposition rate. The insulating layer 2103b is preferably thicker than the insulating layer 2103a and the insulating layer 2103c.

For example, even in the case where silicon nitride films formed by a PECVD method are used as the insulating layers 2103a, 2103b, and 2103c, the film density of the insulating layer 2103b is smaller than the film densities of the other two insulating layers. Thus, in a transmission electron microscope image of a cross section of the insulating layer 2103, difference in contrast can be observed in some cases. Since a boundary between the insulating layer 2103a and the insulating layer 2103b and a boundary between the insulating layer 2103b and the insulating layer 2103c are unclear in some cases, the boundaries are denoted by dashed lines in FIG. 30A.

As the insulating layer 2103d in contact with the semiconductor layer 2108, it is preferable to use a dense insulating film on a surface of which an impurity such as water is less likely to be adsorbed. In addition, it is preferable to use an insulating film which includes as few defects as possible and in which impurities such as water and hydrogen are reduced. For example, an insulating film similar to the insulating layer 2110c included in the insulating layer 2110 can be used as the insulating layer 2103d.

In the case where a metal film or an alloy film whose constituent element is less likely to be diffused into the insulating layer 2103 is used as the conductive layer 2106, for example, a structure may be employed in which the insulating layer 2103a is not provided and the three insulating layers of the insulating layer 2103b, the insulating layer 2103c, and the insulating layer 2103d are stacked.

With the insulating layer 2103 having such a stacked-layer structure, the transistor can have extremely high reliability.

For the insulating layer 2123 and the insulating layer 2124, a material that absorbs impurities such as hydrogen contained in the semiconductor layer 2108, the insulating layer 2103, the insulating layer 2110, and the like is preferably used. For example, a material containing aluminum oxide can be used for the insulating layer 2123 and the insulating layer 2124. In that case, the insulating layer 2123 and the insulating layer 2124 function as gettering layers for impurities such as hydrogen. Note that hydrogen here can refer to, for example, a hydrogen atom, a hydrogen molecule, hydrogen bonded to oxygen or the like, or any of these that is ionized.

It is further preferable that the material used for the insulating layer 2123 and the insulating layer 2124 have an effect of inhibiting passage of oxygen.

As illustrated in FIG. 30A, in the channel length direction, the insulating layer 2124 is provided to cover a top surface and the side surface of the conductive layer 2112, the top surface and the side surface of the metal oxide layer 2114, a top surface and a side surface of the insulating layer 2110, a top surface and a side surface of the semiconductor layer 2108, and a side surface of the insulating layer 2103. The insulating layer 2124 is in contact with the insulating layer 2123 outside the insulating layer 2103. Here, an end portion of the insulating layer 2103 is substantially aligned with an end portion of the semiconductor layer 2108. Alternatively, a side surface of the insulating layer 2103 and a side surface of the semiconductor layer 2108 may be on the same plane.

Although not illustrated, in the channel width direction, the insulating layer 2123 is preferably provided in contact with the insulating layer 2124 in the region not overlapping with the insulating layer 2110.

With the above-described structure, impurities such as hydrogen contained in the semiconductor layer 2108, the insulating layer 2103, the insulating layer 2110, and the like can be efficiently absorbed in the insulating layer 2123 and the insulating layer 2124, which enables gettering of impurities such as hydrogen. In addition, oxygen contained in the semiconductor layer 2108, the insulating layer 2103, the insulating layer 2110, and the like can be inhibited from diffusing to the outside of the insulating layer 2123 and the insulating layer 2124.

The insulating layer 2121, the insulating layer 2122, the insulating layer 2125, and the insulating layer 2126 are preferably formed using a material inhibiting passage of hydrogen. The insulating layer 2121, the insulating layer 2122, the insulating layer 2125, and the insulating layer 2126 can be formed using, for example, a material that contains a nitride of silicon or silicon oxide containing nitrogen. As such a material, silicon nitride is preferably used. Here, the insulating layer 2121, the insulating layer 2122, the insulating layer 2125, and the insulating layer 2126 function as protective layers against impurities such as hydrogen. Note that hydrogen here can refer to, for example, a hydrogen atom, a hydrogen molecule, hydrogen bonded to oxygen or the like, or any of these that is ionized.

The insulating layer 2125 is provided to cover the insulating layer 2124. The insulating layer 2125 is preferably in contact with the insulating layer 2122 to surround the insulating layer 2123 and the insulating layer 2124. Furthermore, the insulating layer 2125 is preferably in contact with the insulating layer 2121 outside the insulating layer 2123 and the insulating layer 2124. The insulating layer 2126 is provided over the insulating layer 2125.

The above structure can inhibit impurities such as hydrogen from entering the semiconductor layer 2108 from the outside of the insulating layer 2121, the insulating layer 2122, the insulating layer 2125, and the insulating layer 2126. In other words, entry of impurity elements such as hydrogen from the outside can be inhibited when at least the semiconductor layer 2108 is surrounded by the insulating layer 2121, the insulating layer 2122, the insulating layer 2125, and the insulating layer 2126 in the transistor 2100A.

Note that although the case where a stacked-layer structure of the insulating layer 2125 and the insulating layer 2126 is provided as the protective layer is described here, one of the insulating layer 2125 and the insulating layer 2126 may be omitted if not needed. Furthermore, the insulating layer 2125 may have a stacked-layer structure of two or more layers. In a similar manner, although the case where a stacked-layer structure of the insulating layer 2121 and the insulating layer 2122 is provided as the protective layer is described, one of the insulating layer 2121 and the insulating layer 2122 may be omitted if not needed. Furthermore, the insulating layer 2122 may have a stacked-layer structure of two or more layers.

The end portion of the insulating layer 2110, that of the metal oxide layer 2114, and that of the conductive layer 2112 each preferably have a tapered shape. In addition, the end portion of the metal oxide layer 2114 preferably has a smaller taper angle than that of the insulating layer 2110, and the end portion of the conductive layer 2112 preferably has a smaller taper angle than that of the metal oxide layer 2114. This structure can improve the coverage with the layers formed over the insulating layer 2110, the metal oxide layer 2114, and the conductive layer 2112 (e.g., the insulating layer 2124, the insulating layer 2125, and the insulating layer 2126) and inhibit defects such as breakage of the layers or voids therein.

In this specification and the like, the taper angle refers to an inclination angle formed by a side surface and a bottom surface of a specific layer when the layer is observed from the direction perpendicular to the cross section of the layer (e.g., the plane perpendicular to the surface of the substrate).

Part of the conductive layer 2106 serves as a first gate electrode (also referred to as bottom gate electrode), and part of the conductive layer 2112 serves as a second gate electrode (also referred to as top gate electrode). Part of the insulating layer 2103 functions as a first gate insulating layer, and part of the insulating layer 2110 functions as a second gate insulating layer.

The conductive layer 2106 may be electrically connected to the conductive layer 2112. In that case, the conductive layer 2106 and the conductive layer 2112 can be supplied with the same potential.

Although not shown, the conductive layer 2112 and the conductive layer 2106 preferably extend beyond an end portion of the semiconductor layer 2108 in the channel width direction. In that case, the semiconductor layer 2108 in the channel width direction is wholly covered with the conductive layer 2112 and the conductive layer 2106 with the insulating layer 2110 between the semiconductor layer 2108 and the conductive layer 2112 and with the insulating layer 2103 between the semiconductor layer 2108 and the conductive layer 2106.

In such a structure, the semiconductor layer 2108 can be electrically surrounded by electric fields generated by the pair of gate electrodes. At this time, it is particularly preferable to supply the same potential to the conductive layer 2106 and the conductive layer 2112. In that case, electric fields for inducing a channel can be effectively applied to the semiconductor layer 2108, whereby the on-state current of the transistor 2100A can be increased. Thus, the transistor 2100A can be miniaturized.

Note that the conductive layer 2112 is not necessarily connected to the conductive layer 2106. In that case, a constant potential may be supplied to one of the pair of gate electrodes, and a signal for driving the transistor 2100A may be supplied to the other. At this time, the potential supplied to the one of the electrodes can control the threshold voltage at the time of driving the transistor 2100A with the other electrode.

As illustrated in FIG. 30A, the transistor 2100A may include a conductive layer 2120a and a conductive layer 2120b over the insulating layer 2126. The conductive layers 2120a and 2120b function as a source electrode and a drain electrode. The conductive layers 2120a and 2120b are electrically connected to the regions 2108N to be described later through opening portions 2119a and 2119b provided in the insulating layer 2124, the insulating layer 2125, and the insulating layer 2126.

The semiconductor layer 2108 can be formed using an oxide such as the metal oxide that can be used for the oxide 230 described in other embodiments or other structure examples. For example, the semiconductor layer 2108 preferably contains indium, M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc. Specifically, M is preferably one or more of aluminum, gallium, yttrium, and tin.

It is particularly preferable to use an oxide containing indium, gallium, and zin for the semiconductor layer 2108.

The semiconductor layer 2108 may have a structure in which layers with different compositions are stacked, a structure in which layers with different crystallinities are stacked, or a structure in which layers with different impurity concentrations are stacked.

The conductive layer 2112 is preferably formed using a low-resistance material. The use of a low-resistance material for the conductive layer 2112 can reduce parasitic resistance and enable the transistor to have a high on-state current, whereby a semiconductor device with a high on-state current can be provided. In addition, in a large-sized or high-resolution display device, wiring resistance can be reduced, which inhibits signal delay and enables high-speed operation. Since the conductive layer 2112 has a function of the gate electrode, the conductive layer 2112 can be formed using any of the conductive materials that can be used for the gate electrodes such as the conductor 260 and the conductor 205 in other embodiments or other structure examples. For example, the conductive layer 2112 can be formed using copper, silver, gold, aluminum, or the like. Copper is particularly preferable since it has low resistance and allows for excellent mass productivity.

The conductive layer 2112 may have a stacked-layer structure. In the case where the conductive layer 2112 has a stacked-layer structure, a second conductive layer is provided over and/or under a first conductive layer having low resistance. For the second conductive layer, a conductive material that is less likely to be oxidized (that has higher oxidation resistance) than the first conductive layer is preferably used. For the second conductive layer, a material that inhibits diffusion of components of the first conductive layer is preferably used. For the second conductive layer, for example, a metal oxide such as indium oxide, indium zinc oxide, indium tin oxide (ITO), indium tin oxide containing silicon (ITSO), or zinc oxide, or a metal nitride such as titanium nitride, tantalum nitride, molybdenum nitride, or tungsten nitride can be suitably used.

The metal oxide layer 2114 positioned between the insulating layer 2110 and the conductive layer 2112 functions as a barrier film that prevents diffusion of oxygen contained in the insulating layer 2110 into the conductive layer 2112 side. Furthermore, the metal oxide layer 2114 also functions as a barrier film that prevents diffusion of hydrogen and water contained in the conductive layer 2112 into the insulating layer 2110 side. The metal oxide layer 2114 can be formed using a material that is less permeable to oxygen and hydrogen than at least the insulating layer 2110, for example.

Even in the case where a metal material that is likely to absorb oxygen, such as aluminum or copper, is used for the conductive layer 2112, the metal oxide layer 2114 can prevent diffusion of oxygen from the insulating layer 2110 to the conductive layer 2112. Furthermore, even in the case where the conductive layer 2112 contains hydrogen, diffusion of hydrogen from the conductive layer 2112 to the semiconductor layer 2108 through the insulating layer 2110 can be prevented. Consequently, the carrier concentration of the channel formation region of the semiconductor layer 2108 can be extremely low.

The metal oxide layer 2114 can be formed using an insulating material or a conductive material. When the metal oxide layer 2114 has an insulating property, the metal oxide layer 2114 functions as part of the gate insulating layer. In contrast, when the metal oxide layer 2114 has conductivity, the metal oxide layer 2114 functions as part of the gate electrode.

The metal oxide layer 2114 is preferably formed using an insulating material having a higher dielectric constant than silicon oxide. It is particularly preferable to use an aluminum oxide film, a hafnium oxide film, a hafnium aluminate film, or the like, in which case the driving voltage can be reduced.

A metal oxide can be used for the metal oxide layer 2114. For example, an oxide containing indium, such as indium oxide, indium zinc oxide, indium tin oxide (ITO), or indium tin oxide containing silicon (ITSO), can be used. A conductive oxide containing indium is preferable because of its high conductivity. ITSO is not easily crystallized since it contains silicon, and it has high planarity; thus, adhesion with a film formed over ITSO is high. The metal oxide layer 2114 can be formed using a metal oxide such as zinc oxide or zinc oxide containing gallium. Alternatively, the metal oxide layer 2114 may have a structure in which any of these materials are stacked.

An oxide material containing one or more kinds of elements contained in the semiconductor layer 2108 is preferably used for the metal oxide layer 2114. In particular, an oxide semiconductor material that can be used for the semiconductor layer 2108 is preferably used. At this time, a metal oxide film formed using the same sputtering target as the semiconductor layer 2108 is preferably used as the metal oxide layer 2114, in which case the same apparatus can be used.

Alternatively, when both the semiconductor layer 2108 and the metal oxide layer 2114 are formed using a metal oxide material containing indium and gallium, a material whose proportion (content ratio) of gallium is higher than that in the semiconductor layer 2108 is preferably used, in which case the blocking property against oxygen can be further increased. Here, when the semiconductor layer 2108 is formed using a material whose proportion of indium is higher than that in the metal oxide layer 2114, the field-effect mobility of the transistor 2100A can be increased.

The metal oxide layer 2114 is preferably formed using a sputtering apparatus. For example, when an oxide film is formed using a sputtering apparatus, film formation in an atmosphere containing an oxygen gas enables oxygen to be added into the insulating layer 2110 and the semiconductor layer 2108 in a favorable manner The conductive layer 2106 can be formed using a material similar to that used for the conductive layer 2112, the conductive layer 2120*a*, or the conductive layer 2120*b*. It is particularly preferable to use a material containing copper for the conductive layer 2106 because wiring resistance can be reduced. When the conductive layer 2106 is formed using a material containing a high-melting-point metal such as tungsten or molybdenum, treatment in a later step can be performed at high temperatures.

The regions 2108N contain an impurity element (a first element). Examples of the impurity element include hydrogen, boron, carbon, nitrogen, fluorine, phosphorus, sulfur, arsenic, aluminum, magnesium, and a rare gas. Typical examples of the rare gas include helium, neon, argon, krypton, and xenon. In particular, boron, phosphorus, magnesium, or aluminum is preferably contained. Two or more of these elements may be contained.

An ion implantation method, an ion doping method, or the like can be used for the addition of the above-described impurity element. The impurity element may be added to the regions 2108N by formation of the insulating layer 2124 that is in contact with the regions 2108N.

Treatment for adding the impurity element to the regions 2108N can be performed with the use of the insulating layer 2110 as a mask. In that case, the regions 2108N can be formed in a self-aligned manner It is preferable that the regions 2108N each include a region having an impurity concentration of higher than or equal to $1\times10^{19}$ atoms/cm$^3$ and lower than or equal to $1\times10^{23}$ atoms/cm$^3$, preferably higher than or equal to $5\times10^{19}$ atoms/cm$^3$ and lower than or equal to $5\times10^{22}$ atoms/cm$^3$, further preferably higher than or equal to $1\times10^{20}$ atoms/cm$^3$ and lower than or equal to $1\times10^{22}$ atoms/cm$^3$.

The concentration of an impurity contained in the regions 2108N can be measured by an analysis method such as secondary ion mass spectrometry (SIMS) or X-ray photoelectron spectroscopy (XPS). In the case of using XPS analysis, ion sputtering from the top surface side or the back surface side is combined with XPS analysis, whereby the concentration distribution in the depth direction can be found.

Furthermore, an impurity element is preferably oxidized in the regions 2108N. For example, it is preferable to use an element that is easily oxidized, such as boron, phosphorus, magnesium, aluminum, or silicon, as the impurity element. Since such an element that is easily oxidized can exist stably in a state of being bonded to oxygen in the semiconductor layer 2108 to be oxidized, the element can be inhibited from being released even when a high temperature (e.g., higher than or equal to 400° C., higher than or equal to 600° C., or higher than or equal to 800° C.) is applied in a later step. Furthermore, the impurity element deprives the semiconductor layer 2108 of oxygen, whereby many oxygen vacancies are generated in the regions 2108N. The oxygen vacancies are bonded to hydrogen in the film to serve as carrier supply sources; thus, the low-resistance regions 2108N are in an extremely low-resistance state.

Note that an increase in resistance might be caused if much oxygen is supplied from the outside or a film near the regions 2108N to the regions 2108N at the time of high-temperature treatment in a later step. Thus, in the case where high-temperature treatment is performed, it is preferably performed with the semiconductor layer 2108 covered with the insulating layer 2124 that has a high barrier property against oxygen.

The insulating layer 2124 is provided in contact with the regions 2108N of the semiconductor layer 2108.

As the insulating layer 2124, an insulating film containing aluminum oxide can be used, for example.

The regions 2108N include many oxygen vacancies since the impurity element is added thereto, as described above.

With such a structure, the transistor 2100A that has excellent electrical characteristics and high reliability can be provided.

Structure Example 3 of Semiconductor Device

Figure 30B:
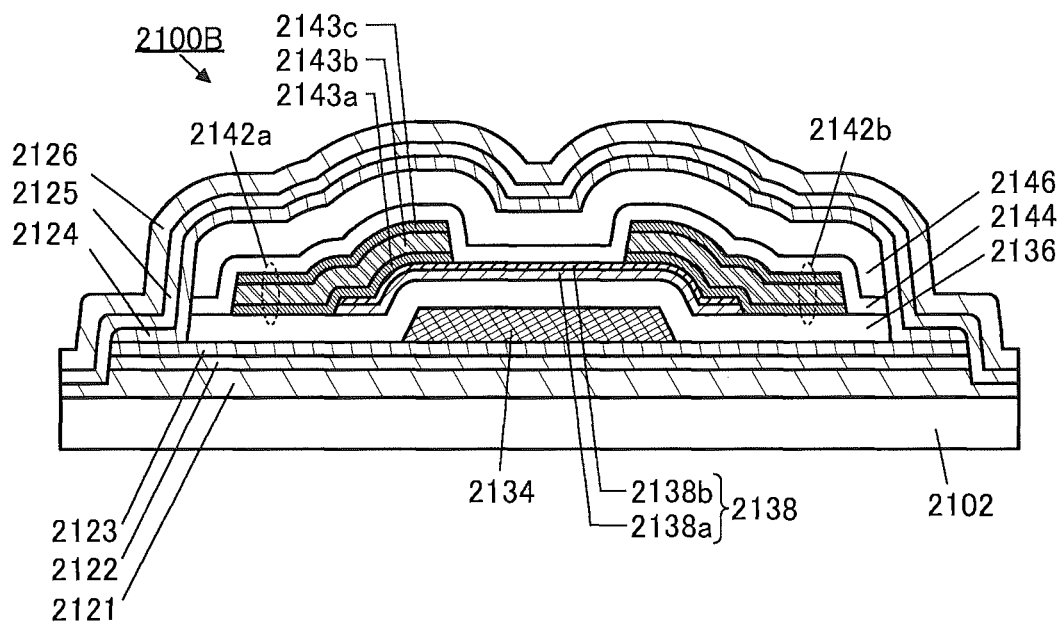

FIG. 30B is a cross-sectional view of a transistor 2100B in the channel length direction.

The transistor 2100B is provided over the substrate 2102 and includes the insulating layer 2121, the insulating layer 2122, the insulating layer 2123, a conductive layer 2134, an insulating layer 2136, a semiconductor layer 2138, a conductive layer 2142a, a conductive layer 2142b, an insulating layer 2144, an insulating layer 2146, the insulating layer 2124, the insulating layer 2125, the insulating layer 2126, and the like. The insulating layer 2121, the insulating layer 2122, and the insulating layer 2123 are sequentially provided over the substrate 2102, and the conductive layer 2134 is provided over the insulating layer 2123. The insulating layer 2136 is provided to cover the conductive layer 2134. The semiconductor layer 2138 has an island-like shape and is provided over the insulating layer 2136. The conductive layer 2142a and the conductive layer 2142b are in contact with a top surface of the semiconductor layer 2138 and are apart from each other over the semiconductor layer 2138. The insulating layer 2144 is provided to cover the insulating layer 2136, the conductive layer 2142a, the conductive layer 2142b, and the semiconductor layer 2138, and the insulating layer 2146 is provided over the insulating layer 2144. The insulating layer 2124 is provided over the insulating layer 2146 and includes a region in contact with part of the insulating layer 2123. The insulating layer 2125 includes a region in contact with part of the insulating layer 2122 and the insulating layer 2121 and is provided over the insulating layer 2124. The insulating layer 2126 is provided over the insulating layer 2125.

It is preferable that in the transistor 2100B, at least the semiconductor layer 2138 be provided between the insulating layer 2123 and the insulating layer 2124 and the insulating layer 2123 be in contact with the insulating layer 2124 outside the semiconductor layer 2108. The insulating layer 2123 and the insulating layer 2124 are provided between the insulating layers 2121 and 2122 and the insulating layers 2125 and 2126. Here, it is preferable that the insulating layer 2125 be in contact with at least the insulating layer 2122 and be further in contact with the insulating layer 2121. In other words, in the transistor 2100B, the semiconductor layer 2138 is surrounded by the insulating layer 2123 and the insulating layer 2124, and the semiconductor layer 2108, the insulating layer 2123, and the insulating layer 2124 are surrounded by the insulating layer 2122 and the insulating layer 2125. Furthermore, the semiconductor layer 2138, the insulating layer 2123, the insulating layer 2124, the insulating layer 2122, and the insulating layer 2125 are provided to be sandwiched between the insulating layer 2121 and the insulating layer 2126, or in other words surrounded by the insulating layer 2121 and the insulating layer 2126.

The conductive layer 2134 serves as a gate electrode. Part of the insulating layer 2136 serves as a gate insulating layer. The conductive layer 2142a serves as one of a source electrode and a drain electrode, and the conductive layer 2142b serves as the other. A region of the semiconductor layer 2138 overlapping with the conductive layer 2134 functions as a channel formation region. The transistor 2100B is what is called a bottom-gate transistor, in which the gate electrode is provided closer to a formation surface side (the substrate 2102 side) than the semiconductor layer 2138 is. Here, a side of the semiconductor layer 2138 opposite to the conductive layer 2134 side is sometimes referred to as a back channel side. The transistor 2100B has what is called a channel-etched structure in which no protective layer is provided between the back channel side of the semiconductor layer 2138 and the source and drain electrodes.

The semiconductor layer 2138 has a structure in which a semiconductor layer 2138a and a semiconductor layer 2138b are stacked in this order from the formation surface side. Each of the semiconductor layer 2138a and the semiconductor layer 2138b preferably contains a metal oxide. The semiconductor layer 2138b, which is positioned on the back channel side, preferably has higher crystallinity than the semiconductor layer 2138a, which is positioned on the conductive layer 2134 side. With this structure, the semiconductor layer 2138 can be inhibited from being partly etched and lost at the time of processing of the conductive layer 2142a and the conductive layer 2142b.

The semiconductor layer 2138 can be formed using an oxide such as the metal oxide of the oxide 230 or the like in other embodiments or other structure examples. For example, the semiconductor layer 2138 preferably contains indium, M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc. Specifically, M is preferably one or more of aluminum, gallium, yttrium, and tin.

It is particularly preferable to use an oxide containing indium, gallium, and zin for the semiconductor layer 2138.

For the semiconductor layer 2138a and the semiconductor layer 2138b, layers with different compositions, layers with different crystallinities, or layers with different impurity concentrations may be used. A stacked-layer structure of three or more layers may be employed.

The conductive layer 2142a and the conductive layer 2142b each have a stacked-layer structure in which a conductive layer 2143a, a conductive layer 2143b, and a conductive layer 2143c are stacked in this order from the formation surface side.

The conductive layer 2143b is preferably formed using a low-resistance conductive material containing copper, silver, gold, aluminum, or the like. It is particularly preferable that the conductive layer 2143b contain copper or aluminum. For the conductive layer 2143b, a conductive material having lower resistance than the conductive layer 2143a and the conductive layer 2143c is preferably used. In that case, the conductive layer 2142a and the conductive layer 2142b can have extremely low resistance.

The conductive layer 2143a and the conductive layer 2143c can be independently formed using any of conductive materials different from that of the conductive layer 2143b. For example, the conductive layer 2143a and the conductive layer 2143c can be independently formed using any of conductive materials containing titanium, tungsten, molybdenum, chromium, tantalum, zinc, indium, platinum, ruthenium, or the like.

When the conductive layer 2143b containing copper, aluminum, or the like is interposed between the conductive layer 2143a and the conductive layer 2143c as described above, it is possible to inhibit oxidation of a surface of the conductive layer 2143b and diffusion of an element contained in the conductive layer 2143b to neighboring layers. Specifically, providing the conductive layer 2143a between the semiconductor layer 2138 and the conductive layer 2143b can prevent diffusion of a metal element contained in the conductive layer 2143b into the semiconductor layer 2138, thereby enabling the transistor 2100B to have high reliability.

The insulating layer 2144 is provided in contact with an end portion of the conductive layer 2143b.

Note that the conductive layer 2142a and the conductive layer 2142b do not necessarily have a three-layer structure and may have a two-layer structure or a four-layer structure including a conductive layer containing copper, silver, gold, or aluminum. For example, the conductive layer 2142a and the conductive layer 2142b may each have a two-layer structure in which the conductive layer 2143a and the conductive layer 2143b are stacked or a two-layer structure in which the conductive layer 2143b and the conductive layer 2143c are stacked.

For the conductive layer 2134, any of the above conductive materials that can be used for the conductive layer 2143a, the conductive layer 2143b, and the conductive layer 2143c can be appropriately used. It is particularly preferable to use a conductive material containing copper.

The insulating layer 2136 and the insulating layer 2144 that are in contact with the semiconductor layer 2138 are preferably formed using an insulating material containing an oxide. In the case where the insulating layer 2136 or the insulating layer 2144 has a stacked-layer structure, a layer in contact with the semiconductor layer 2138 is formed using an insulating material containing an oxide.

For the insulating layer 2136, a nitride insulating film of silicon nitride, aluminum nitride, or the like may be used. In the case of using an insulating material containing no oxide, treatment for adding oxygen to an upper portion of the insulating layer 2136 is preferably performed to form an oxygen-containing region. Examples of the treatment for adding oxygen include heat treatment, plasma treatment, and ion doping treatment in an oxygen-containing atmosphere.

The insulating layer 2146 functions as a protective layer protecting the transistor 2100B. For the insulating layer 2146, an inorganic insulating material such as silicon nitride, silicon nitride oxide, silicon oxide, silicon oxynitride, aluminum oxide, or aluminum nitride can be used. It is particularly preferable that the insulating layer 2146 be formed using a material less likely to diffuse oxygen, such as silicon nitride or aluminum oxide, to prevent release of oxygen from the semiconductor layer 2138 or the insulating layer 2144 to the outside through the insulating layer 2146 due to heat applied during the manufacturing process or the like.

For the insulating layer 2146, an organic insulating material functioning as a planarization film may be used. Alternatively, a stacked-layer film that includes a film containing an inorganic insulating material and a film containing an organic insulating material may be used for the insulating layer 2146.

In the semiconductor layer 2138, a pair of low-resistance regions that are positioned in portions in contact with the conductive layer 2142a and the conductive layer 2142b and the vicinity of the portions and that function as source and drain regions may be formed. The regions are parts of the semiconductor layer 2138 and have resistance lower than that of the channel formation region. The low-resistance regions can also be referred to as regions with high carrier density or n-type regions, for example. Furthermore, in the semiconductor layer 2138, a region which is sandwiched between the pair of low-resistance regions and which overlaps with the conductive layer 2134 functions as the channel formation region.

For the insulating layer 2123 and the insulating layer 2124, any of the materials described in the above structure examples can be used.

As illustrated in FIG. 30B, in the channel length direction, the insulating layer 2136, the insulating layer 2144, and the insulating layer 2146 are partly removed outside the conductive layer 2134, the semiconductor layer 2138, the conductive layer 2142a, and the conductive layer 2142b. Here, an end portion of the insulating layer 2136, an end portion of the insulating layer 2144, and an end portion of the insulating layer 2146 may be substantially aligned with each other. A side surface of the insulating layer 2136, a side surface of the insulating layer 2144, and a side surface of the insulating layer 2146 may be on the same plane. Thus, the insulating layer 2136, the insulating layer 2144, and the insulating layer 2146 have a region not overlapping with the insulating layer 2123.

The insulating layer 2124 is provided to cover the top surface and the side surface of the insulating layer 2146, the side surface of the insulating layer 2144, and the side surface of the insulating layer 2136, and includes a region that is in contact with part of the insulating layer 2123.

Although not illustrated, also in the channel width direction, the insulating layer 2123 is preferably provided in contact with the insulating layer 2124 in the region not overlapping with the insulating layer 2136, the insulating layer 2144, and the insulating layer 2146.

With the above-described structure, impurities such as hydrogen contained in the semiconductor layer 2138, the insulating layer 2136, the insulating layer 2144, the insulating layer 2146, and the like can be efficiently absorbed in the insulating layer 2123 and the insulating layer 2124, which enables gettering of impurities such as hydrogen. In addition, oxygen contained in the semiconductor layer 2138, the insulating layer 2136, the insulating layer 2144, the insulating layer 2146, and the like can be inhibited from diffusing to the outside of the insulating layer 2123 and the insulating layer 2124.

For the insulating layer 2121, the insulating layer 2122, the insulating layer 2125, and the insulating layer 2126, any of the materials described in the above structure examples can be used.

The insulating layer 2125 is provided to cover the insulating layer 2124. The insulating layer 2125 is preferably in contact with the insulating layer 2122 to surround the insulating layer 2123 and the insulating layer 2124. Furthermore, the insulating layer 2125 is preferably in contact with the insulating layer 2121 outside the insulating layer 2123 and the insulating layer 2124. The insulating layer 2126 is provided over the insulating layer 2125.

The above structure can inhibit impurities such as hydrogen from entering the semiconductor layer 2138 from the outside of the insulating layer 2121, the insulating layer 2122, the insulating layer 2125, and the insulating layer 2126. In other words, entry of impurity elements such as hydrogen from the outside can be inhibited when at least the semiconductor layer 2138 is surrounded by the insulating layer 2121, the insulating layer 2122, the insulating layer 2125, and the insulating layer 2126 in the transistor 2100B.

Note that although the case where a stacked-layer structure of the insulating layer 2125 and the insulating layer 2126 is provided as the protective layer is described here, one of the insulating layer 2125 and the insulating layer 2126 may be omitted if not needed. Furthermore, the insulating layer 2125 may have a stacked-layer structure of two or more layers. In a similar manner, although the case where a stacked-layer structure of the insulating layer 2121 and the insulating layer 2122 is provided as the protective layer is described, one of the insulating layer 2121 and the insulating layer 2122 may be omitted if not needed. Furthermore, the insulating layer 2122 may have a stacked-layer structure of two or more layers.

With such a structure, the transistor 2100B that has excellent electrical characteristics and high reliability can be provided.

At least part of this embodiment can be implemented in combination with any of the other embodiments and examples described in this specification as appropriate.

Embodiment 3

In this embodiment, one embodiment of a semiconductor device is described with reference to FIGS. 32 to 35.

[Storage Device 1]

Figure 32:
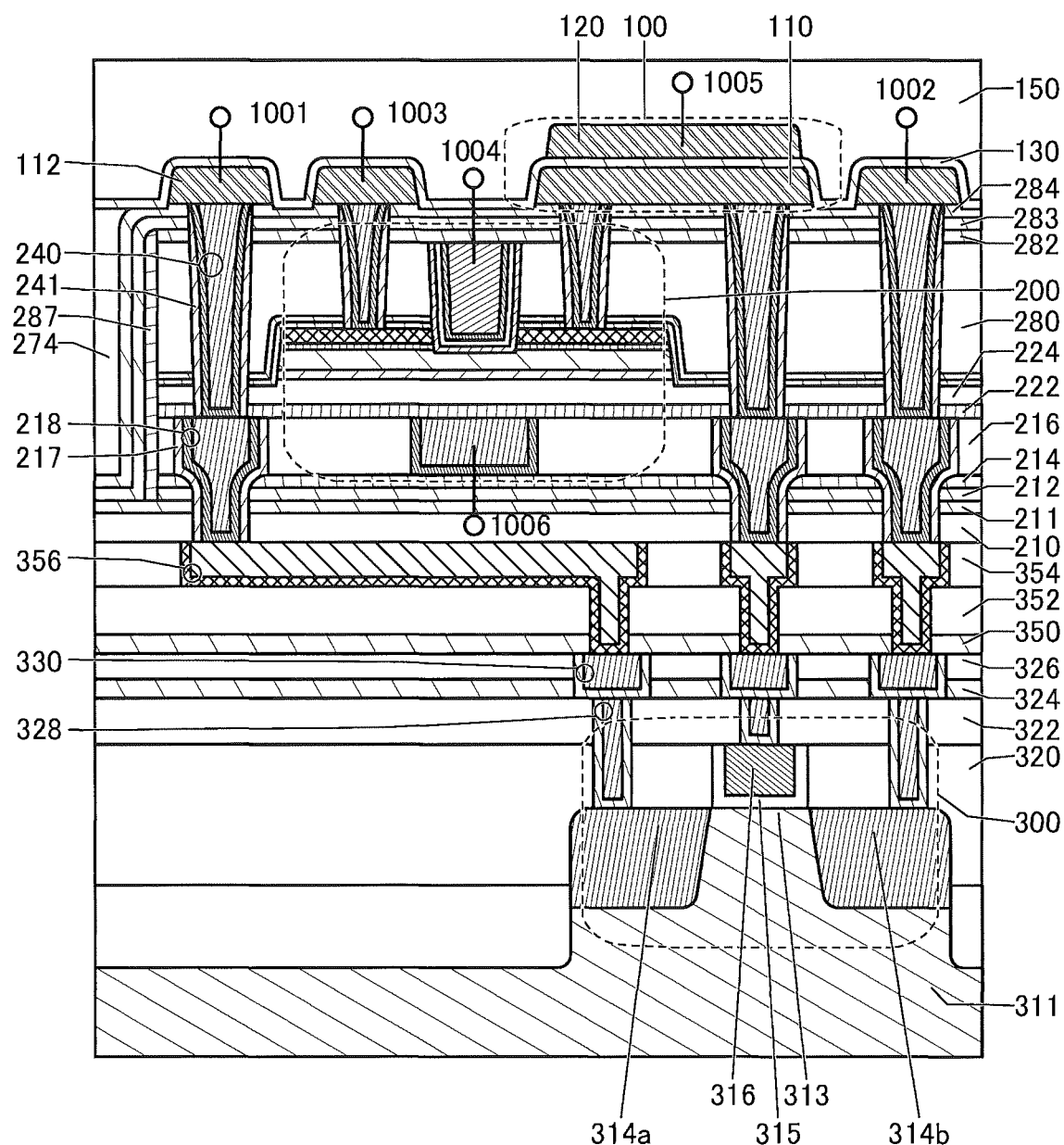
FIG. 32 is a cross-sectional view illustrating a structure of a storage device.

FIG. 32 illustrates an example of a semiconductor device (storage device) of one embodiment of the present invention. In the semiconductor device of one embodiment of the present invention, the transistor 200 is provided above a transistor 300, and a capacitor 100 is provided above the transistor 300 and the transistor 200. The transistor 200 described in the above embodiment can be used as the transistor 200. The transistor 2100A or the transistor 2100B described in the above embodiment may be used as the transistor 200. The transistor and the capacitor device 292 of the memory device 290 described in the above embodiment with reference to FIGS. 26A and 26B and FIGS. 27A and 27B may be provided as the transistor 200 and the capacitor 100, respectively.

The transistor 200 is a transistor whose channel is formed in a semiconductor layer containing an oxide semiconductor. Since the transistor 200 has a low off-state current, a storage device including the transistor 200 can retain stored data for a long time. In other words, such a memory device does not require refresh operation or has an extremely low frequency of the refresh operation, which leads to a sufficient reduction in power consumption of the storage device.

In the semiconductor device illustrated in FIG. 32, a wiring 1001 is electrically connected to a source of the transistor 300, and a wiring 1002 is electrically connected to a drain of the transistor 300. A wiring 1003 is electrically connected to one of the source and the drain of the transistor 200. A wiring 1004 is electrically connected to a first gate of the transistor 200. A wiring 1006 is electrically connected to a second gate of the transistor 200. A gate of the transistor 300 and the other of the source and the drain of the transistor 200 are electrically connected to one electrode of the capacitor 100. A wiring 1005 is electrically connected to the other electrode of the capacitor 100.

By arranging the storage devices illustrated in FIG. 32 in a matrix, a memory cell array can be formed.

<Transistor 300>

The transistor 300 is provided in and on a substrate 311 and includes a conductor 316 functioning as a gate, an insulator 315 functioning as a gate insulator, a semiconductor region 313 that is a part of the substrate 311, and a low-resistance region 314a and a low-resistance region 314b functioning as a source region and a drain region. The transistor 300 may be a p-channel transistor or an n-channel transistor.

In the transistor 300 illustrated in FIG. 32, the semiconductor region 313 (part of the substrate 311) in which a channel is formed has a projecting portion. Furthermore, the conductor 316 is provided to cover the top and side surfaces of the semiconductor region 313 with the insulator 315 positioned therebetween. Note that the conductor 316 may be formed using a material for adjusting the work function. The transistor 300 having such a structure is also referred to as a FIN transistor because the projecting portion of the semiconductor substrate is utilized. An insulator functioning as a mask for forming the projecting portion may be provided in contact with the top surface of the projecting portion. Although the case where the projecting portion is formed by processing part of the semiconductor substrate is described here, a semiconductor film having a projecting shape may be formed by processing an SOI substrate.

Note that the transistor 300 illustrated in FIG. 32 is just an example and the structure of the transistor 300 is not limited to that illustrated therein; an appropriate transistor may be used in accordance with a circuit configuration or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric. Here, the insulator 130 is preferably formed using the insulator that can be used for the insulator 286 described in the above embodiment.

For example, a conductor 112 and the conductor 110 over the conductor 240 can be formed at the same time. Note that the conductor 112 functions as a plug or a wiring that is electrically connected to the capacitor 100, the transistor 200, or the transistor 300.

The conductor 112 and the conductor 110 each have a single-layer structure in FIG. 32; however, one embodiment of the present invention is not limited thereto, and a stacked-layer structure of two or more layers may be used. For example, between a conductor having a barrier property and a conductor having high conductivity, a conductor which is highly adhesive to the conductor having a barrier property and the conductor having high conductivity may be formed.

The insulator 130 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, the insulator 130 preferably has a stacked-layer structure using a material with high dielectric strength such as silicon oxynitride and a high dielectric constant (high-k) material. In the capacitor 100 having such a structure, a sufficient capacitance can be provided owing to the high dielectric constant (high-k) insulator, and the dielectric strength can be increased owing to the insulator with high dielectric strength, so that the electrostatic breakdown of the capacitor 100 can be prevented.

As the insulator using a high dielectric constant (high-k) material (a material having a high dielectric constant), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

As the material having a high dielectric strength (a material having a low dielectric constant), silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

<Wiring Layer>

Wiring layers provided with an interlayer film, a wiring, a plug, and the like may be provided between the structure bodies. A plurality of wiring layers can be provided in accordance with the design. Note that a plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases and part of a conductor functions as a plug in other cases.

For example, an insulator 320, an insulator 322, an insulator 324, and an insulator 326 are stacked over the transistor 300 in this order as interlayer films. A conductor 328, a conductor 330, and the like that are electrically connected to the capacitor 100 or the transistor 200 are provided in the insulators 320, 322, 324, and 326. Note that the conductor 328 and the conductor 330 each function as a plug or a wiring.

The insulator functioning as an interlayer film may function as a planarization film that covers a roughness thereunder. For example, the top surface of the insulator 322 may be planarized by planarization treatment using a chemical mechanical polishing (CMP) method or the like to improve planarity.

A wiring layer may be provided over the insulator 326 and the conductor 330. For example, in FIG. 32, an insulator 350, an insulator 352, and an insulator 354 are stacked in this order. Furthermore, a conductor 356 is formed in the insulators 350, 352, and 354. The conductor 356 functions as a plug or a wiring.

Similarly, a conductor 218, a conductor (the conductor 205) included in the transistor 200, and the like are provided in the insulators 210, 211, 212, 214, and 216. Note that the conductor 218 functions as a plug or a wiring that is electrically connected to the capacitor 100 or the transistor 300. In addition, an insulator 150 is provided over the conductor 120 and the insulator 130.

Here, like the insulator 241 described in the above embodiment, an insulator 217 is provided in contact with the side surface of the conductor 218 functioning as a plug. The insulator 217 is provided in contact with the inner wall of the opening formed in the insulators 210, 211, 212, 214, and 216. That is, the insulator 217 is provided between the conductor 218 and the insulators 210, 211, 212, 214, and 216. Note that the conductors 205 and 218 can be formed in parallel; thus, the insulator 217 is sometimes formed in contact with the side surface of the conductor 205.

As the insulator 217, for example, an insulator such as silicon nitride, aluminum oxide, or silicon nitride oxide can be used. The insulator 217 is provided in contact with the insulators 211, 212, 214, and 222; thus, impurities such as water and hydrogen can be inhibited from entering the oxide 230 from the insulator 210, the insulator 216, or the like through the conductor 218. Silicon nitride is particularly preferable because of its high hydrogen blocking property. Furthermore, oxygen contained in the insulator 210 or the insulator 216 can be prevented from being absorbed by the conductor 218.

The insulator 217 can be formed by a method similar to the method for forming the insulator 241. For example, silicon nitride is deposited by a PEALD method and an opening reaching the conductor 356 is formed by anisotropic etching.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material having a low dielectric constant is used for the insulator functioning as an interlayer film, the parasitic capacitance between wirings can be reduced. Accordingly, a material is preferably selected in accordance with the function of an insulator.

For example, the insulators 150, 210, 352, and 354 and the like preferably include an insulator having a low dielectric constant. For example, the insulator preferably includes silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Because silicon oxide and silicon oxynitride have thermal stability, a combination of silicon oxide or silicon oxynitride with a resin allows the stacked-layer structure to be thermally stable and have a low dielectric constant. Examples of the resin include polyester, polyolefin, polyamide (e.g., nylon and aramid), polyimide, polycarbonate, and acrylic.

Note that when the transistor including an oxide semiconductor is surrounded by an insulator having a function of inhibiting the passage of oxygen and impurities such as hydrogen, the electrical characteristics of the transistor can be stabilized. Thus, the insulator having a function of inhibiting the passage of oxygen and impurities such as hydrogen is preferably used for the insulator 214, the insulator 211, the insulator 212, the insulator 350, and the like.

The insulator having a function of inhibiting the passage of oxygen and impurities such as hydrogen can have, for example, a single-layer structure or a stacked-layer structure of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

The conductors that can be used for wirings or plugs can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having a high electric conductivity typified by polycrystalline silicon containing an impurity element such as phosphorus, or silicide such as nickel silicide may be used.

For example, the conductors 328, 330, 356, 218, and 112 and the like may have a single-layer structure or a stacked-layer structure using a conductive material such as a metal material, an alloy material, a metal nitride material, or a metal oxide material which is formed using the above materials. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<Wiring or Plug in Layer Including Oxide Semiconductor>

In the case where an oxide semiconductor is used in the transistor 200, an insulator including an excess oxygen region is provided in the vicinity of the oxide semiconductor in some cases. In that case, an insulator having a barrier property is preferably provided between the insulator including the excess oxygen region and the conductor provided in the insulator including the excess oxygen region.

For example, in FIG. 32, the insulator 241 is preferably provided between the conductor 240 and the insulators 224 and 280 containing excess oxygen. Since the insulator 241 is provided in contact with the insulator 222, the insulator 272, the insulator 273, the insulator 282, the insulator 283, and the insulator 284, the insulator 224 and the transistor 200 can be sealed by the insulators having a barrier property.

That is, the insulator 241 can inhibit excess oxygen contained in the insulator 224 and the insulator 280 from being absorbed by the conductor 240. In addition, the insulator 241 can inhibit diffusion of hydrogen, which is an impurity, into the transistor 200 through the conductor 240.

Note that the insulator 241 is preferably formed using an insulating material having a function of inhibiting diffusion of oxygen and impurities such as water or hydrogen. For example, silicon nitride, silicon nitride oxide, aluminum oxide, hafnium oxide, or the like is preferably used. Silicon nitride is particularly preferable because of its high hydrogen blocking property. Alternatively, for example, a metal oxide such as magnesium oxide, gallium oxide, germanium oxide, yttrium oxide, zirconium oxide, lanthanum oxide, neodymium oxide, or tantalum oxide can be used.

As in the above embodiment, the transistor 200 is preferably sealed with the insulators 211, 212, 214, 287, 282, 283, and 284. Such a structure can inhibit entry of hydrogen contained in the insulator 274, the insulator 150, or the like into the insulator 280 or the like.

Note that the conductor 240 penetrates the insulators 284, 283, and 282, and the conductor 218 penetrates the insulators 214, 212, and 211; however, as described above, the insulator 241 is provided in contact with the conductor 240, and the insulator 217 is provided in contact with the conductor 218. This can reduce the amount of hydrogen entering the inside of the insulators 211, 212, 214, 287, 282, 283, and 284 through the conductors 240 and 218. In this manner, the transistor 200 is sealed more surely with the insulators 211, 212, 214, 287, 282, 283, 284, 241, and 217, so that impurities such as hydrogen contained in the insulator 274 or the like can be inhibited from entering from the outside.

As described in the above embodiment, the insulators 216, 224, 280, 250, and 274 are preferably formed by a deposition method using the gas in which the number of hydrogen atoms is reduced or hydrogen atoms are removed. This can reduce the hydrogen concentration of the insulators 216, 224, 280, 250, and 274.

In this manner, the hydrogen concentration of silicon-based insulating films near the transistor 200 can be reduced; thus, the hydrogen concentration of the oxide 230 can be reduced.

<Dicing Line>

Here, a dicing line (also referred to as a scribe line, a dividing line, or a cutting line) that is provided when a large-sized substrate is divided into semiconductor elements so that a plurality of semiconductor devices are each formed in a chip form will be described below. In an example of a dividing method, for example, a groove (a dicing line) for separating the semiconductor elements is formed on the substrate, and then the substrate is cut along the dicing line so that a plurality of semiconductor devices that are separated are obtained.

Here, for example, as illustrated in FIG. 32, a region where the insulator 283 is in contact with the insulator 211 preferably overlaps with the dicing line. That is, an opening is formed in the insulators 282, 280, 273, 272, 224, 222, 216, 214, and 212 in the vicinity of a region to be the dicing line that is provided on the outer edge of a memory cell including the transistors 200.

That is, in the opening provided in the insulator 282, the insulator 280, the insulator 273, the insulator 272, the insulator 224, the insulator 222, the insulator 216, the insulator 214, and the insulator 212, the insulator 211 is in contact with the insulator 283. Alternatively, an opening may be provided in the insulator 282, the insulator 280, the insulator 273, the insulator 272, the insulator 224, the insulator 222, the insulator 216, and the insulator 214, and the insulator 212 and the insulator 283 may be in contact with each other in the opening. For example, the insulator 212 and the insulator 283 may be formed using the same material and the same method. When the insulator 212 and the insulator 283 are formed using the same material and the same method, the adhesion therebetween can be increased. For example, silicon nitride is preferably used.

With such a structure, the transistor 200 can be enclosed with the insulators 211, 212, 214, 287, 282, 283, and 284. At least one of the insulators 211, 212, 214, 287, 282, 283, and 284 has a function of inhibiting diffusion of oxygen, hydrogen, and water; thus, even when the substrate is divided into circuit regions each of which is provided with the semiconductor elements in this embodiment to form a plurality of chips, the entry and diffusion of impurities such as hydrogen or water from the direction of a side surface of the divided substrate to the transistor 200 can be inhibited.

Furthermore, in the structure, excess oxygen in the insulator 280 and the insulator 224 can be inhibited from being diffused to the outside. Accordingly, excess oxygen in the insulator 280 and the insulator 224 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, the transistor 200 can have a small variation in the electrical characteristics and higher reliability.

Figure 33:
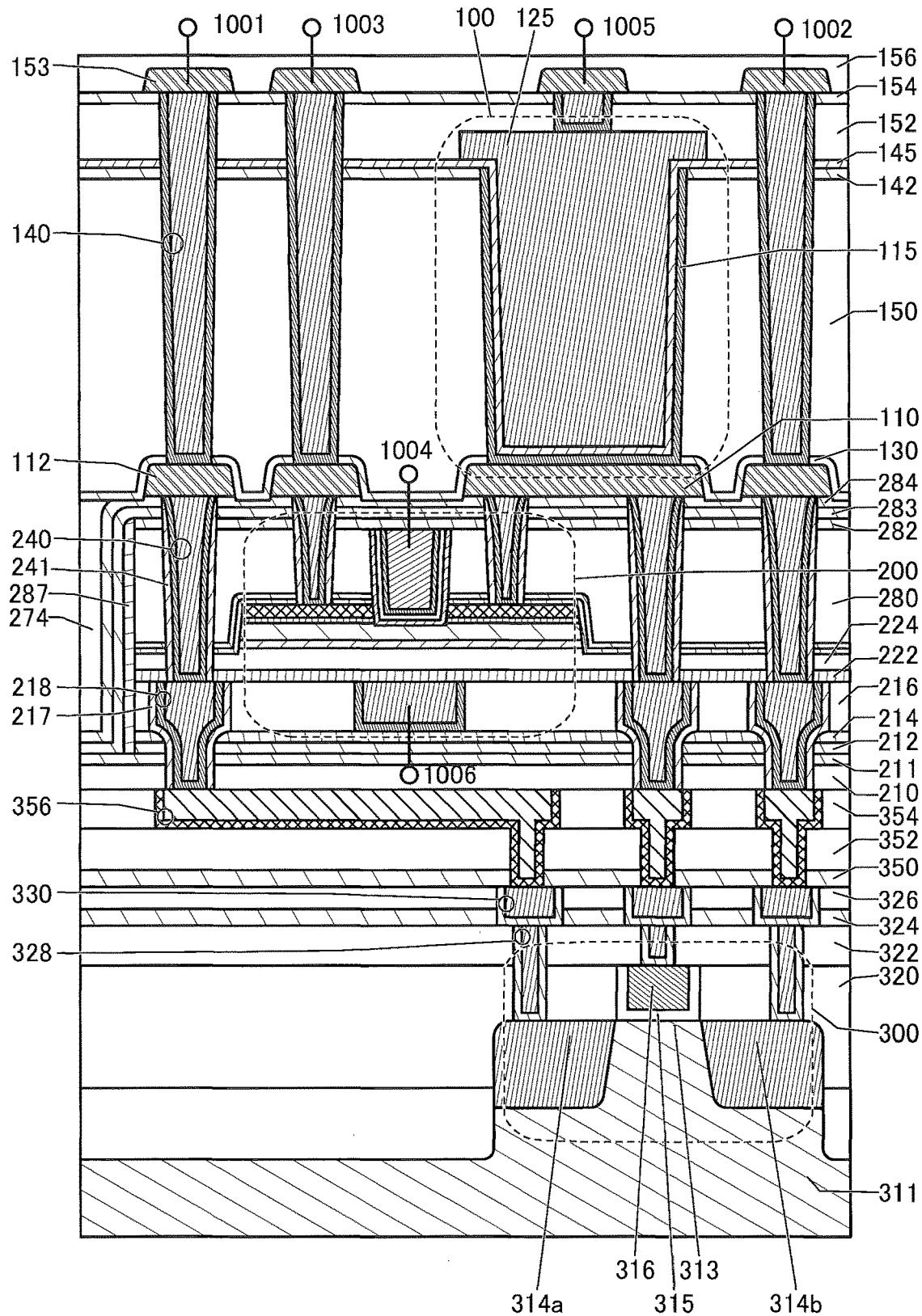
FIG. 33 is a cross-sectional view illustrating a structure of a storage device.

Note that although the capacitor 100 of the storage device illustrated in FIG. 32 is a planar capacitor, the capacitor 100 of the storage device described in this embodiment is not limited thereto. For example, the capacitor 100 may be a cylindrical capacitor as illustrated in FIG. 33. Note that the structure below and including the insulator 150 of a storage device illustrated in FIG. 33 is similar to that of the semiconductor device illustrated in FIG. 32.

The capacitor 100 illustrated in FIG. 33 includes the insulator 150 over the insulator 130, an insulator 142 over the insulator 150, a conductor 115 in an opening formed in the insulators 150 and 142, an insulator 145 over the conductor 115 and the insulator 142, a conductor 125 over the insulator 145, and an insulator 152 over the conductor 125 and the insulator 145. Here, at least part of the conductor 115, the insulator 145, and the conductor 125 is provided in the opening formed in the insulators 150 and 142.

The conductor 115 functions as a lower electrode of the capacitor 100, the conductor 125 functions as an upper electrode of the capacitor 100, and the insulator 145 functions as a dielectric of the capacitor 100. The upper electrode and the lower electrode of the capacitor 100 face each other with the dielectric positioned therebetween, along the side surface as well as the bottom surface of the opening in the insulators 150 and 142; thus, the capacitance per unit area can be increased. Accordingly, the deeper the opening is, the larger the capacitance of the capacitor 100 can be. Increasing the capacitance per unit area of the capacitor 100 in this manner enhances miniaturization and integration of the semiconductor device.

An insulator that can be used as the insulator 280 may be used as the insulator 152. The insulator 142 preferably functions as an etching stopper at the time of forming the opening in the insulator 150 and is formed using an insulator that can be used for the insulator 214.

The shape of the opening formed in the insulators 150 and 142 when seen from above may be a quadrangular shape, a polygonal shape other than a quadrangular shape, a polygonal shape with rounded corners, or a circular shape such as an elliptical shape. Here, the area where the opening and the transistor 200 overlap with each other is preferably larger in the top view. Such a structure can reduce the area occupied by the semiconductor device including the capacitor 100 and the transistor 200.

The conductor 115 is provided in contact with the opening formed in the insulators 142 and 150. It is preferable that a top surface of the conductor 115 be substantially aligned with a top surface of the insulator 142. Furthermore, a bottom surface of the conductor 115 is in contact with the conductor 110 in an opening formed in the insulator 130.

The conductor 115 is preferably formed by an ALD method, a CVD method, or the like and is formed using a conductor that can be used for the conductor 205, for example.

The insulator 145 is positioned to cover the conductor 115 and the insulator 142. The insulator 145 is preferably formed by an ALD method or a CVD method, for example. The insulator 145 can be formed to have a single-layer structure or a stacked-layer structure using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, hafnium nitride, or the like. As the insulator 145, an insulating film in which zirconium oxide, aluminum oxide, and zirconium oxide are stacked in this order can be used, for instance.

The insulator 145 is preferably formed using a material with high dielectric strength, such as silicon oxynitride, or a high dielectric constant (high-k) material. The insulator 145 may have a stacked-layer structure using a material with high dielectric strength and a high dielectric (high-k) material.

As the insulator using a high dielectric constant (high-k) material (a material having a high dielectric constant), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given. The use of such a high-k material enables sufficient capacitance of the capacitor 100 to be ensured even if the insulator 145 has a large thickness. The insulator 145 having a large thickness can inhibit leakage current generated between the conductor 115 and the conductor 125.

Examples of a material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride ($SiN_x$) deposited by an ALD method, silicon oxide ($SiO_x$) deposited by a PEALD method, and silicon nitride ($SiN_x$) deposited by an ALD method are stacked in this order. The use of such an insulator having high dielectric strength can increase the dielectric strength of the capacitor 100 and inhibit electrostatic breakdown of the capacitor 100.

The conductor 125 is provided to fill the opening formed in the insulators 142 and 150. The conductor 125 is electrically connected to the wiring 1005 through a conductor 140 and a conductor 153. The conductor 125 is preferably formed by an ALD method, a CVD method, or the like and is formed using a conductor that can be used as the conductor 205, for example.

The conductor 153 is provided over an insulator 154 and is covered with an insulator 156. The conductor 153 is formed using a conductor that can be used for the conductor 112, and the insulator 156 is formed using an insulator that can be used for the insulator 152. Here, the conductor 153 is in contact with a top surface of the conductor 140 and functions as a terminal of the capacitor 100, the transistor 200, or the transistor 300.

Although one layer of the transistor 200 is stacked over the transistor 300 in the structures illustrated in FIG. 32 and FIG. 33, this embodiment is not limited thereto. For example, the memory device 290 as illustrated in FIGS. 26A and 26B and FIGS. 27A and 27B or a plurality of the memory devices 290 stacked in the vertical direction as illustrated in FIG. 28 and FIG. 29 may be provided over the transistor 300.

Figure 34A:
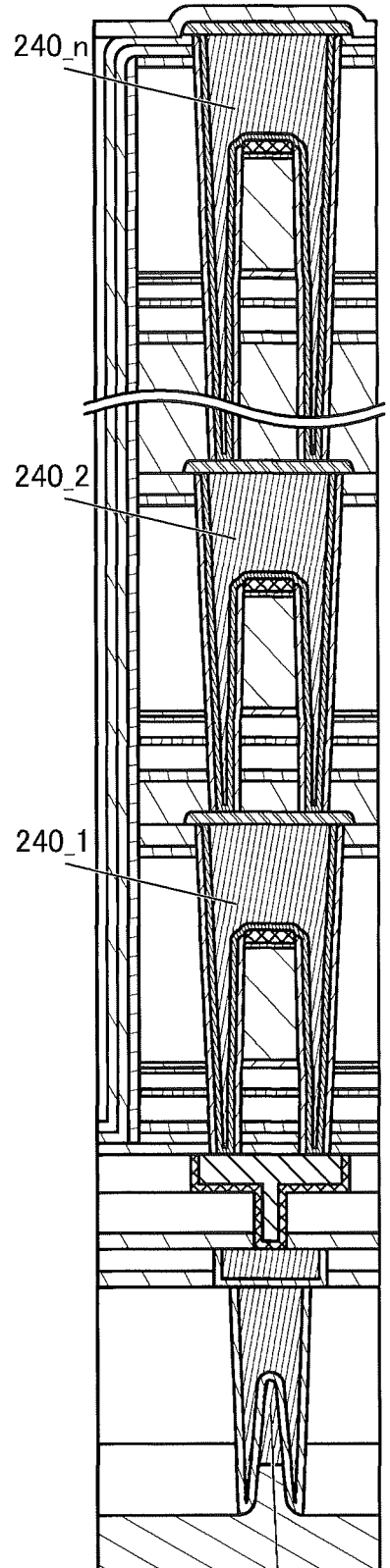
FIGS. 34A and 34B are cross-sectional views illustrating a structure of a storage device.
Figure 34B:
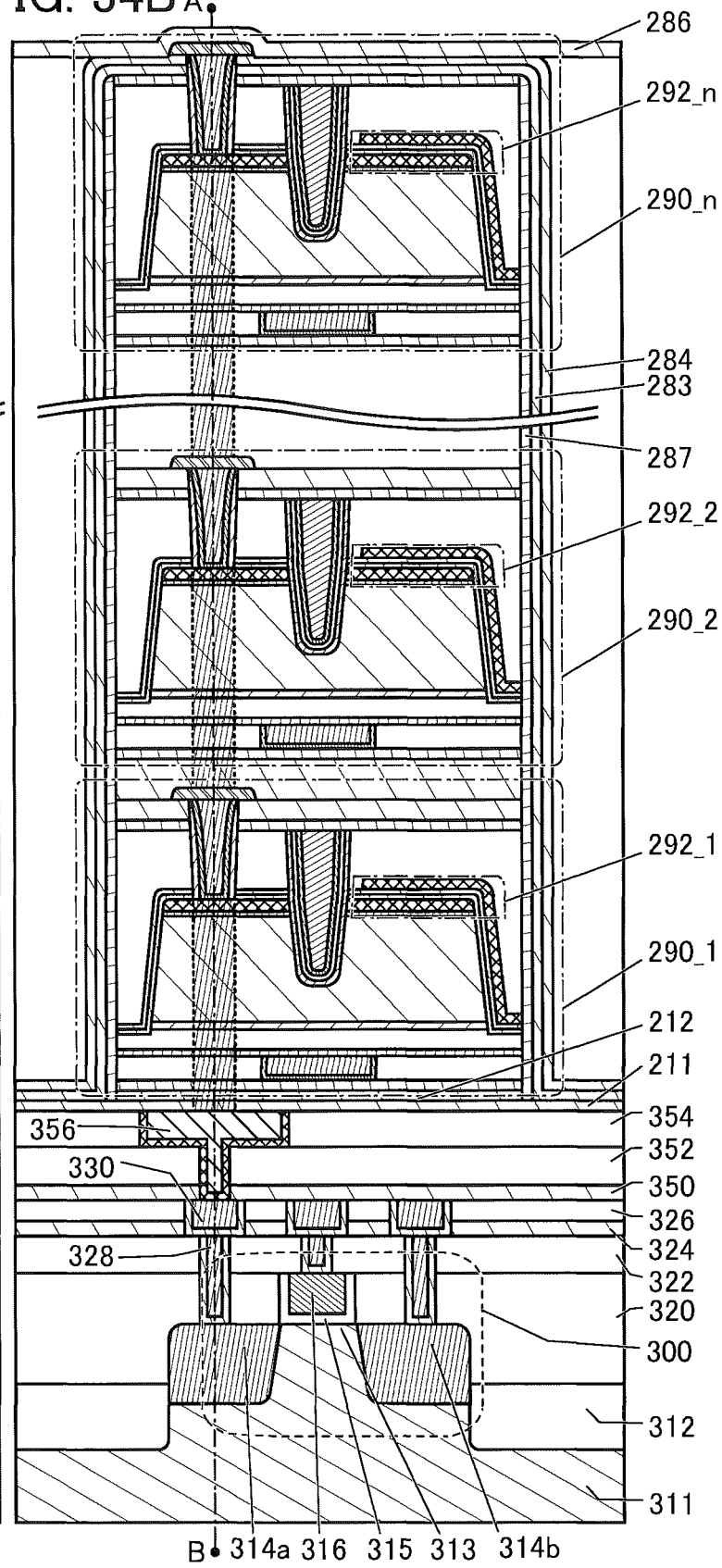

FIGS. 34A and 34B illustrate an example of a storage device in which the memory devices 290_1 to 290_n (n is a natural number of two or more) are stacked. Note that although the memory device 290_n is provided in this embodiment, one embodiment of the present invention is not limited thereto. For example, a structure without the memory device 290_n may be employed. Although not particularly limited, n is greater than or equal to 2 and less than or equal to 200, preferably greater than or equal to 2 and less than or equal to 100, further preferably greater than or equal to 2 and less than or equal to 10. FIG. 34B is a cross-sectional view of the transistors included in the memory device 290 in the channel length direction. FIG. 34A is a cross-sectional view of the transistors in the channel width direction which is taken along dashed-dotted line A-B in FIG. 34B. The structure below and including the insulator 354 of the storage device illustrated in FIGS. 34A and 34B is similar to that of the storage device illustrated in FIG. 32.

As illustrated in FIGS. 34A and 34B, the memory devices 290_1 to 290_n are stacked over the insulator 354. In each layer including the memory device 290, the capacitor device 292 and the conductor 240 are provided. The memory device 290 in each layer is electrically connected to, through the conductor 240 in that layer, the conductor 240 in the adjacent layer, and is also electrically connected to the transistor 300. Note that portions of conductors 240_1 to 240_n that cannot be seen from the channel width direction in FIG. 34B are denoted with dotted lines.

The memory device 290 illustrated in FIGS. 34A and 34B has a structure different from that of the memory device 290 illustrated in FIGS. 26A and 26B. In the memory device 290 illustrated in FIGS. 34A and 34B, the conductor 240 is formed to be astride the oxide 230b and the like, and the insulator 241 is formed on the side surface of the conductor 240. Since the insulator 241 is not formed at a bottom surface of the conductor 240, the bottom surface of the conductor 240 in each layer is in contact with the conductor 242a in that layer and the conductor 246a in one layer below. In this manner, the memory device 290 in each layer can be electrically connected to the conductor 246a in one layer below.

Note that the structure of the storage device in this embodiment is not limited to the structure illustrated in FIGS. 34A and 34B. For example, the oxide 230b or the like may penetrate between the conductor 246a in an upper layer and the conductor 246a in a lower layer. Alternatively, one through electrode may be formed as the conductors 240_1 to 240_n, for example.

Since the capacitor device 292 in each layer is a planar capacitor, the height of each layer can be inhibited from being excessively large. Accordingly, the number of the layers in each of which the memory device 290 is provided can be increased relatively easily. For example, the number of the layers in each of which the memory device 290 is provided may be approximately 100.

The above is the description of the structure example. With the use of the structure, a semiconductor device using a transistor including an oxide semiconductor can have a small variation in electrical characteristics and higher reliability. Alternatively, a transistor including an oxide semiconductor with a high on-state current can be provided. Alternatively, a transistor including an oxide semiconductor with a low off-state current can be provided. Alternatively, a semiconductor device with low power consumption can be provided.

[Storage Device 2]

Figure 35:
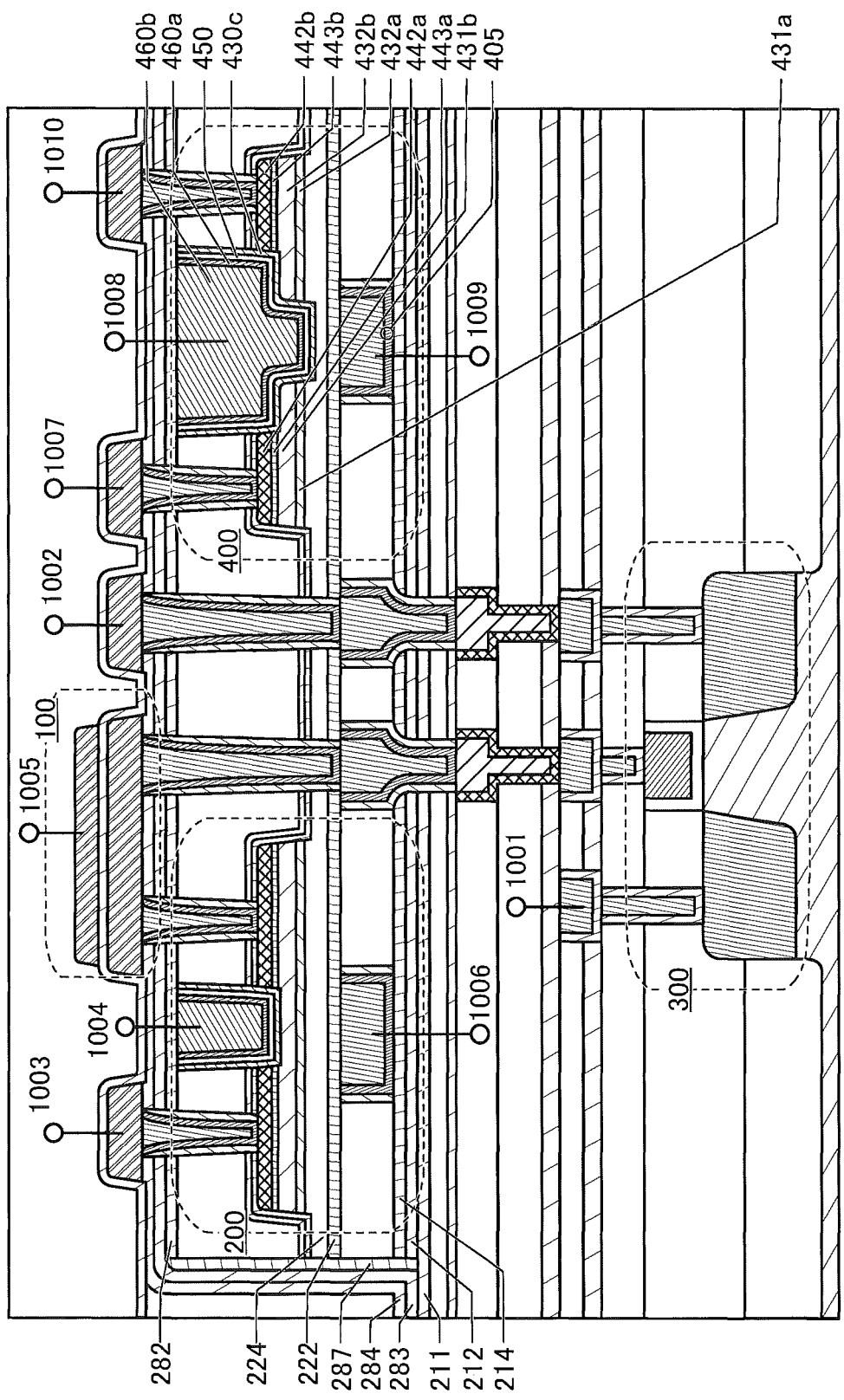
FIG. 35 is a cross-sectional view illustrating a structure of a storage device.

FIG. 35 illustrates an example of a storage device using the semiconductor device of one embodiment of the present invention. The storage device illustrated in FIG. 35 includes a transistor 400 in addition to the semiconductor device that includes the transistor 200, the transistor 300, and the capacitor 100 in FIG. 32.

The transistor 400 can control a second gate voltage of the transistor 200. For example, a first gate and a second gate of the transistor 400 are diode-connected to a source of the transistor 400, and the source thereof is connected to the second gate of the transistor 200. When a negative potential of the second gate of the transistor 200 is held in this structure, a first gate-source voltage and a second gate-source voltage of the transistor 400 are 0 V. In the transistor 400, a drain current when the second gate voltage and the first gate voltage are 0 V is extremely low; thus, the negative potential of the second gate of the transistor 200 can be held for a long time even without power supply to the transistors 200 and 400. Accordingly, the storage device including the transistors 200 and 400 can retain stored data for a long time.

In FIG. 35, the wiring 1001 is electrically connected to the source of the transistor 300. The wiring 1002 is electrically connected to the drain of the transistor 300. The wiring 1003 is electrically connected to one of the source and the drain of the transistor 200. The wiring 1004 is electrically connected to the gate of the transistor 200. The wiring 1006 is electrically connected to a back gate of the transistor 200. The gate of the transistor 300 and the other of the source and the drain of the transistor 200 are electrically connected to one electrode of the capacitor 100. The wiring 1005 is electrically connected to the other electrode of the capacitor 100. A wiring 1007 is electrically connected to the source of the transistor 400. A wiring 1008 is electrically connected to a gate of the transistor 400. A wiring 1009 is electrically connected to a back gate of the transistor 400. A wiring 1010 is electrically connected to the drain of the transistor 400. The wiring 1006, the wiring 1007, the wiring 1008, and the wiring 1009 are electrically connected to each other.

When the storage devices in FIG. 35 are arranged in a matrix like the storage devices illustrated in FIG. 32, a memory cell array can be formed. Note that one transistor 400 can control second gate voltages of the transistors 200. For this reason, the number of the transistors 400 is preferably smaller than the number of the transistors 200. As in the storage device illustrated in FIG. 32, the transistor 200 and the transistor 400 in the storage device illustrated in FIG. 35 can be sealed with the insulator 211, the insulator 212, the insulator 214, the insulator 287, the insulator 282, the insulator 283, and the insulator 284.

<Transistor 400>

The transistor 400 and the transistors 200 are formed in the same layer and thus can be fabricated in parallel. The transistor 400 includes a conductor 460 (a conductor 460a and a conductor 460b) functioning as a first gate, a conductor 405 functioning as a second gate, the insulator 222, the insulator 224, and an insulator 450 functioning as gate insulating layers, an oxide 430c including a channel formation region, a conductor 442a, an oxide 443a, an oxide 431a, and an oxide 431b functioning as a source, and a conductor 442b, an oxide 443b, an oxide 432a, and an oxide 432b functioning as a drain. As in the transistor 200, conductors serving as plugs are provided in contact with the conductor 442a and the conductor 442b.

In the transistor 400, the conductor 405 is in the same layer as the conductor 205. The oxides 431a and 432a are in the same layer as the oxide 230a, and the oxides 431b and 432b are in the same layer as the oxide 230b. The conductor 442 is in the same layer as the conductor 242. The oxide 443 is in the same layer as the oxide 243. The oxide 430c is in the same layer as the oxide 230c. The insulator 450 is in the same layer as the insulator 250. The conductor 460 is in the same layer as the conductor 260.

Note that the structure bodies in the same layer can be formed at the same time. For example, the oxide 430c can be formed by processing an oxide film to be the oxide 230c.

In the oxide 430c functioning as an active layer of the transistor 400, oxygen vacancies and impurities such as hydrogen or water are reduced, as in the oxide 230 or the like. Accordingly, the threshold voltage of the transistor 400 can be higher than 0 V, an off-state current can be reduced, and the drain current when the second gate voltage and the first gate voltage are 0 V can be extremely low.

The structures, methods, and the like described in this embodiment can be appropriately combined with structures, methods, and the like of other embodiments and examples.

Embodiment 4

In this embodiment, a storage device of one embodiment of the present invention including a transistor in which an oxide is used for a semiconductor (hereinafter referred to as an OS transistor in some cases) and a capacitor (hereinafter, such a storage device is also referred to as an OS memory device in some cases), is described with reference to FIGS. 37A and 37B and FIGS. 38A to 38H. The OS memory device is a storage device that includes at least a capacitor and an OS transistor that controls the charging and discharging of the capacitor. Since the OS transistor has an extremely low off-state current, the OS memory device has excellent retention characteristics and thus can function as a nonvolatile memory.

Figure 36:
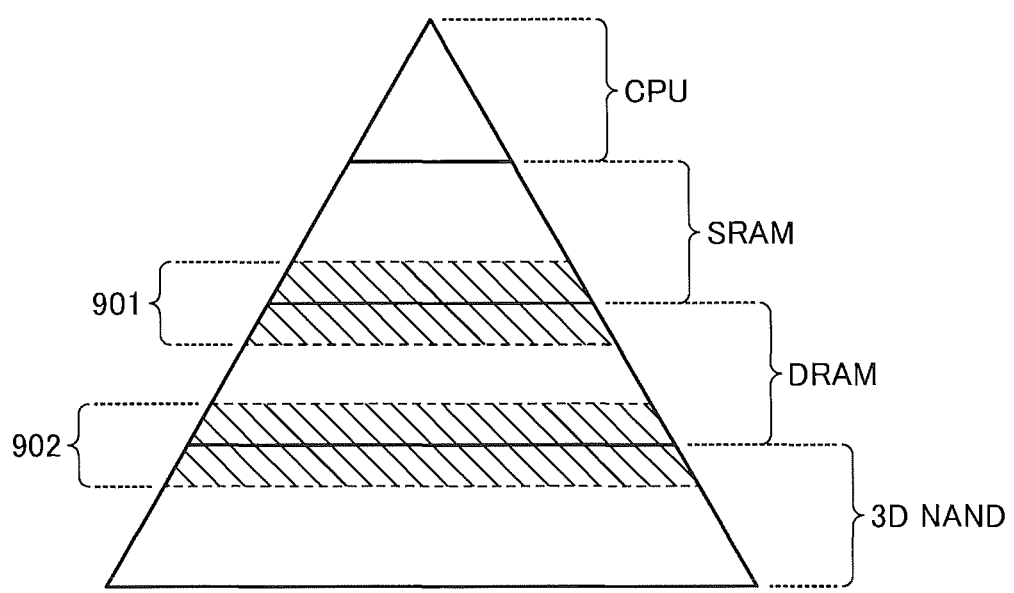
FIG. 36 shows a hierarchy of storage devices.

In general, a variety of storage devices (memories) are used in semiconductor devices such as computers in accordance with the intended use. FIG. 36 shows a hierarchy of storage devices. The storage devices at upper levels require higher access speed and those at lower levels require larger memory capacity and higher store density. In FIG. 36, sequentially from the top level, a memory combined as a register in an arithmetic processing device such as a CPU, a static random access memory (SRAM), a dynamic random access memory (DRAM), and a 3D NAND memory are shown.

A memory combined as a register in an arithmetic processing device such as a CPU is used for temporary storage of arithmetic operation results, for example, and thus is very frequently accessed by the arithmetic processing device. Accordingly, high operation speed is required rather than memory capacity. In addition, the register also has a function of retaining settings of the arithmetic processing device, for example.

An SRAM is used for a cache, for example. A cache has a function of duplicating and retaining part of information retained in a main memory. When the frequently used data is duplicated and retained in the cache, the access speed to the data can be increased.

A DRAM is used for a main memory, for example. A main memory has a function of retaining a program or data read from a storage. A DRAM has a recording density of approximately 0.1 Gbit/mm² to 0.3 Gbit/mm².

A 3D NAND memory is used for a storage, for example. A storage has a function of retaining data that needs to be retained for a long time or a variety of programs used in an arithmetic processing device, for example. Therefore, a storage needs to have high memory capacity and a high recording density rather than operation speed. A storage device used for a storage has a recording density of approximately 0.6 Gbit/mm² to 6.0 Gbit/mm².

The storage device of one embodiment of the present invention has a high operation speed and can retain data for a long time. The storage device of one embodiment of the present invention can be suitably used as a storage device in a boundary region 901 that includes both the level to which a cache belongs and the level to which a main memory belongs. The storage device of one embodiment of the present invention can be suitably used as a storage device in a boundary region 902 that includes both the level to which the main memory belongs and the level to which a storage belongs.

<Structure Example of Storage Device>

Figure 37A:
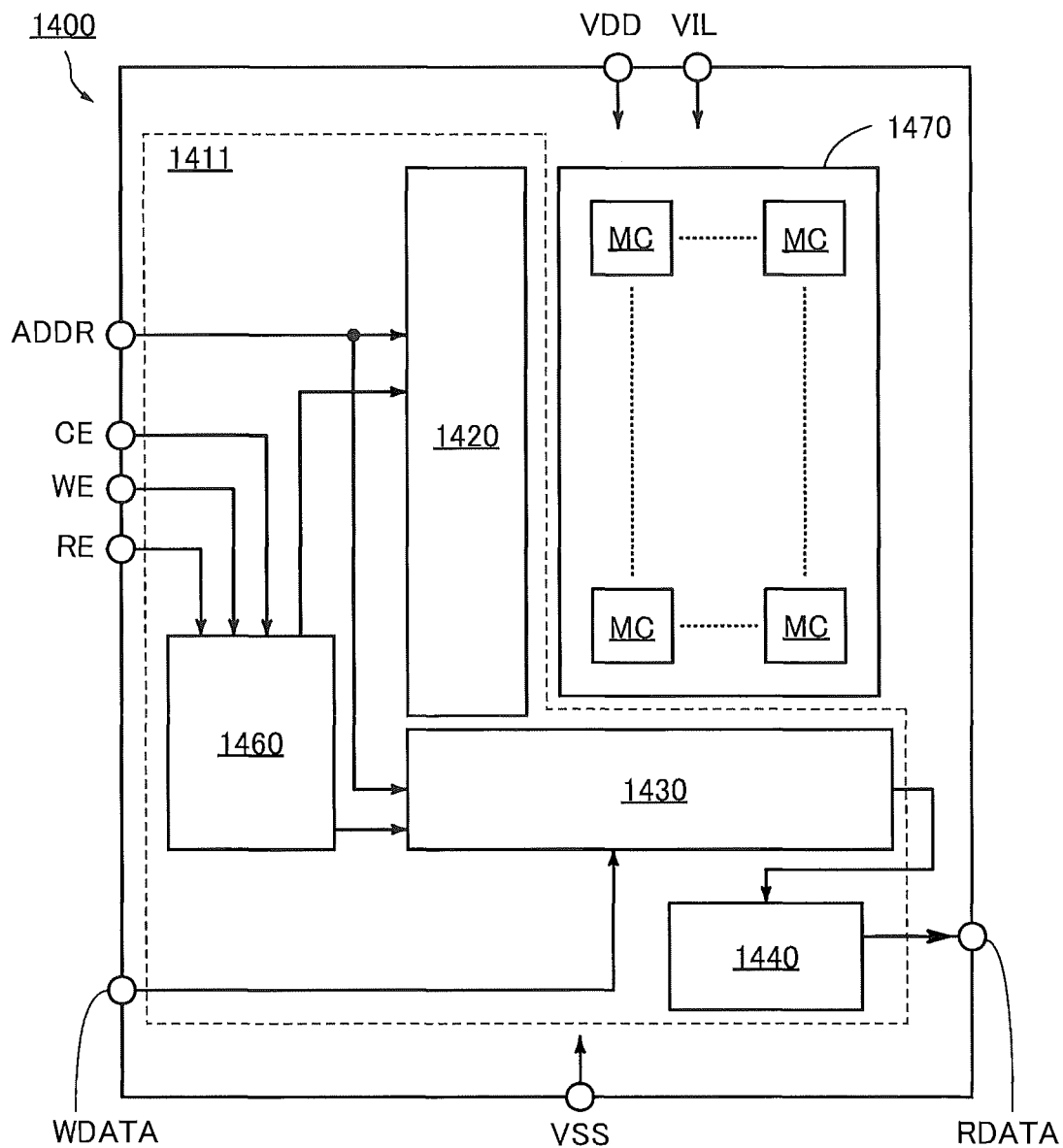
FIGS. 37A and 37B are a block diagram and a perspective view illustrating a structure example of a storage device.

FIG. 37A illustrates a structure example of the OS memory device. A storage device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and will be described later in detail. The amplified data signal is output as a data signal RDATA to the outside of the storage device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the storage device 1400. Control signals (CE, WE, and RE), an address signal ADDR, and a data signal WDATA are also input to the storage device 1400 from the outside. The address signal ADDR is input to the row decoder and the column decoder, and the data signal WDATA is input to the write circuit.

The control logic circuit 1460 processes the signals (CE, WE, and RE) input from the outside, and generates control signals for the row decoder and the column decoder. The signal CE is a chip enable signal, the signal WE is a write enable signal, and the signal RE is a read enable signal. Signals processed by the control logic circuit 1460 are not limited thereto, and other control signals may be input as necessary.

The memory cell array 1470 includes a plurality of memory cells MC and a plurality of wirings arranged in a matrix. Note that the number of the wirings that connect the memory cell array 1470 to the row circuit 1420 depends on the configuration of the memory cell MC, the number of the memory cells MC in a column, and the like. The number of the wirings that connect the memory cell array 1470 to the column circuit 1430 depends on the configuration of the memory cell MC, the number of the memory cells MC in a row, and the like.

Figure 37B:
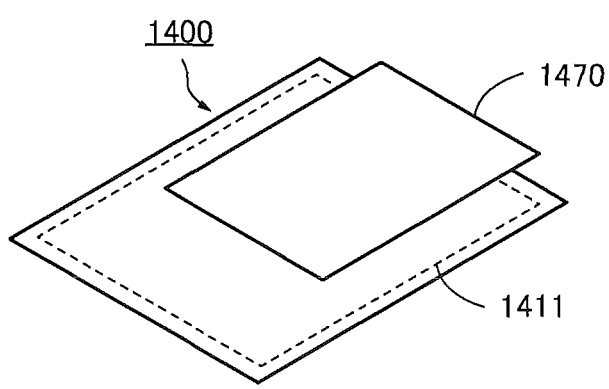

Note that FIG. 37A illustrates an example in which the peripheral circuit 1411 and the memory cell array 1470 are formed on the same plane; however, this embodiment is not limited thereto. For example, as illustrated in FIG. 37B, the memory cell array 1470 may be provided over the peripheral circuit 1411 to partly overlap with the peripheral circuit 1411. For example, the sense amplifier may be provided below the memory cell array 1470 so that they overlap with each other.

FIGS. 38A to 38H each illustrate a configuration example of a memory cell applicable to the memory cell MC.

[DOSRAM]

Figure 38A:
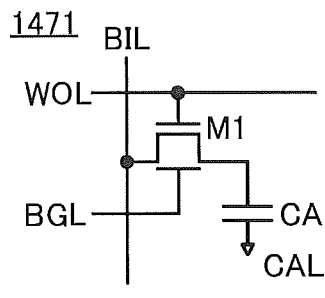
FIGS. 38A to 38H are circuit diagrams illustrating structure examples of a storage device.
Figure 38B:
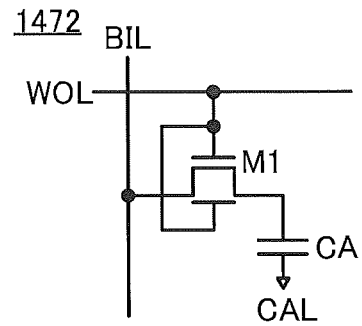
Figure 38C:
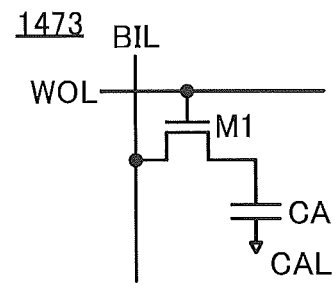
Figure 38D:
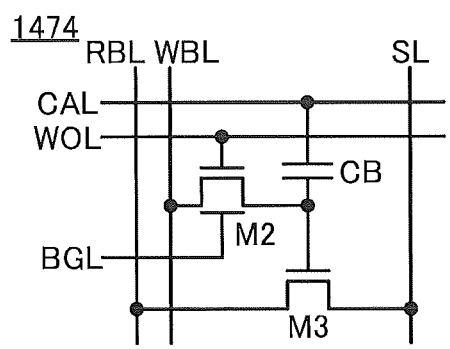
Figure 38E:
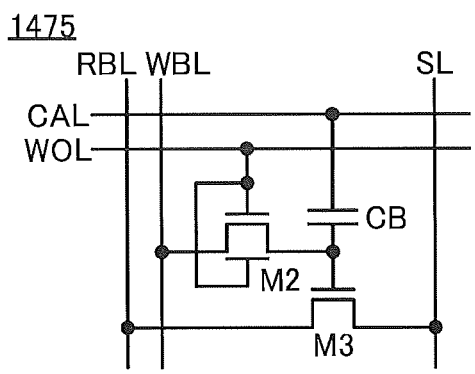
Figure 38F:
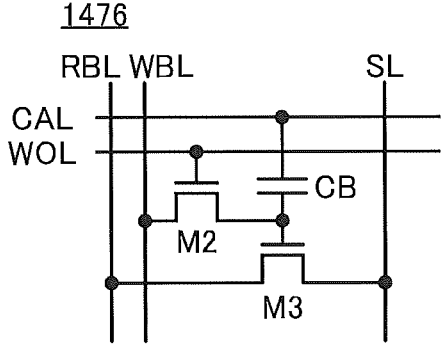
Figure 38G:
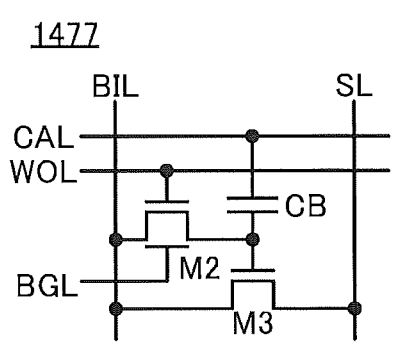

FIGS. 38A to 38C each illustrate a circuit configuration example of a memory cell of a DRAM. In this specification and the like, a DRAM using a memory cell including one OS transistor and one capacitor is referred to as a dynamic oxide semiconductor random access memory (DOSRAM) in some cases. A memory cell 1471 illustrated in FIG. 38A includes a transistor M1 and a capacitor CA. Note that the transistor M1 includes a gate (also referred to as a front gate in some cases) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. When a given potential is applied to the wiring BGL, the threshold voltage of the transistor M1 can be changed.

The circuit configuration of the memory cell MC is not limited to that of the memory cell 1471, and the circuit configuration can be changed. For example, as in a memory cell 1472 illustrated in FIG. 38B, the back gate of the transistor M1 may be connected not to the wiring BGL but to the wiring WOL in the memory cell MC. Alternatively, for example, the transistor M1 may be a single-gate transistor, that is, a transistor without a back gate in the memory cell MC as in a memory cell 1473 illustrated in FIG. 38C.

In the case where the semiconductor device described in any of the above embodiments is used in the memory cell 1471 and the like, the transistor 200 can be used as the transistor M1, and the capacitor 100 can be used as the capacitor CA. The transistor and the capacitor device 292 of the memory device 290 described in the above embodiment with reference to FIGS. 26A and 26B and FIGS. 27A and 27B may be provided as the transistor M1 and the capacitor CA, respectively. When an OS transistor is used as the transistor M1, the leakage current of the transistor M1 can be extremely low. That is, with the use of the transistor M1, written data can be retained for a long time, and thus the frequency of the refresh operation for the memory cell can be decreased. In addition, refresh operation for the memory cell can be omitted. In addition, since the transistor M1 has an extremely low leakage current, multi-level data or analog data can be retained in the memory cells 1471, 1472, and 1473.

In the DOSRAM, when the sense amplifier is provided below the memory cell array 1470 so that they overlap with each other as described above, the bit line can be shortened.

A shorter bit line results in smaller bit line capacitance, which allows the storage capacitance of the memory cell to be reduced.

Figure 39A:
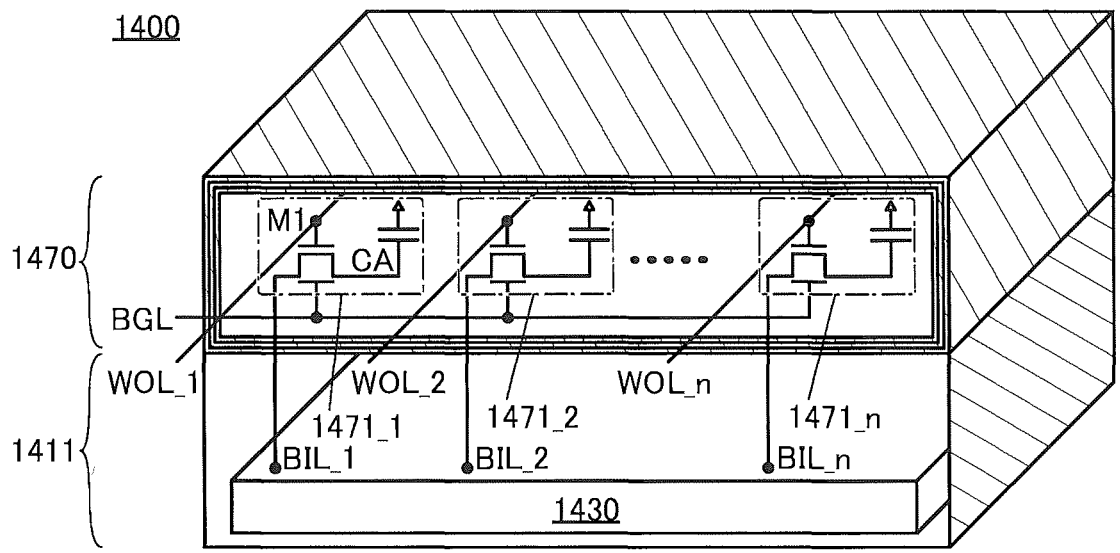
FIGS. 39A and 39B are circuit diagrams illustrating structure examples of a storage device.

Here, FIG. 39A illustrates an example of the storage device 1400 in which the memory cell array 1470 is provided over the peripheral circuit 1411 and a plurality of the memory cells 1471 are provided in the memory cell array 1470.

In the memory cell array 1470, the plurality of memory cells 1471 are arranged in rows and columns, and the wiring WOL, the wiring BGL, and the like also extend in the row direction and the column direction. The wiring BIL is connected to the column circuit 1430 provided in the peripheral circuit 1411, and the memory cell array 1470 is electrically connected to a sense amplifier or the like through the wiring BIL.

The memory cell array 1470 includes OS transistors, and is preferably sealed by the insulator 211, the insulator 212, the insulator 214, the insulator 287, the insulator 282, the insulator 283, and the insulator 284 as described in the above embodiment. For example, as illustrated in FIGS. 24A and 24B, a top surface, a side surface, and a bottom surface of the memory cell array 1470 are preferably sealed by the insulator 211, the insulator 212, the insulator 214, the insulator 287, the insulator 282, the insulator 283, and the insulator 284.

Figure 39B:
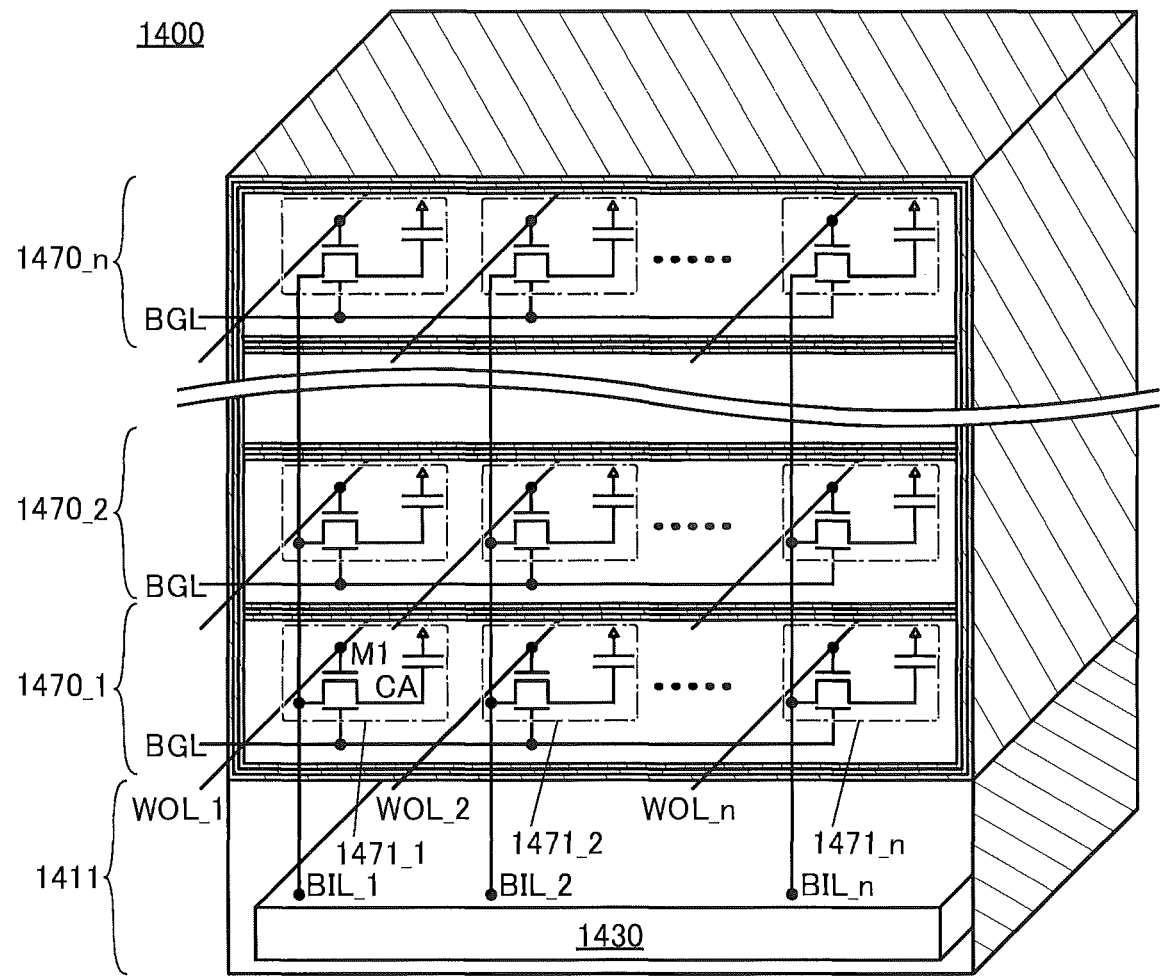

As illustrated in FIG. 39B, memory cell arrays 1470_1 to 1470_n (n is a natural number of two or more) may be stacked. The structure of each memory cell array 1470 is almost the same as that illustrated in FIG. 38A, except that the wirings BIL connect the column circuit 1430 to the memory cells 1471 of the memory cell arrays 1470. In addition, the wiring BIL may be one or more conductors 240 penetrating the memory cell arrays 1470_1 to 1470_n as illustrated in FIGS. 34A and 34B.

The plurality of memory cell arrays 1470 include OS transistors, and are preferably collectively sealed by the insulator 211, the insulator 212, the insulator 214, the insulator 287, the insulator 282, the insulator 283, and the insulator 284 as described in the above embodiment. For example, as illustrated in FIG. 28, FIG. 29, or FIG. 33, top surfaces, side surfaces, and bottom surfaces of the plurality of memory cell arrays 1470 are preferably sealed by the insulator 211, the insulator 212, the insulator 214, the insulator 287, the insulator 282, the insulator 283, and the insulator 284. Furthermore, as illustrated in FIG. 28 and FIG. 29, the insulator 282, the insulator 296, the insulator 298, and the insulator 214 are preferably stacked at the boundaries between the memory cell arrays 1470.

[NOSRAM]

FIGS. 38D to 38H each illustrate a circuit configuration example of a gain-cell memory cell including two transistors and one capacitor. A memory cell 1474 illustrated in FIG. 38D includes a transistor M2, a transistor M3, and a capacitor CB. Note that the transistor M2 includes a front gate (simply referred to as a gate in some cases) and a back gate. In this specification and the like, a storage device including a gain-cell memory cell using an OS transistor as the transistor M2 is referred to as a nonvolatile oxide semiconductor RAM (NOSRAM) in some cases.

A first terminal of the transistor M2 is connected to a first terminal of the capacitor CB. A second terminal of the transistor M2 is connected to a wiring WBL. A gate of the transistor M2 is connected to the wiring WOL. A back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retaining, and data reading, a low-level potential is preferably applied to the wiring CAL. The wiring BGL functions as a wiring for applying a predetermined potential to the back gate of the transistor M2. The threshold voltage of the transistor M2 can be increased or decreased by supplying a given potential to the wiring BGL.

The circuit configuration of the memory cell MC is not limited to that of the memory cell 1474, and the circuit configuration can be changed as appropriate. For example, as in a memory cell 1475 illustrated in FIG. 38E, the back gate of the transistor M2 may be connected not to the wiring BGL but to the wiring WOL in the memory cell MC. Alternatively, for example, the transistor M2 may be a single-gate transistor, that is, a transistor without a back gate in the memory cell MC as in a memory cell 1476 illustrated in FIG. 38F. For example, the memory cell MC may have a structure in which the wirings WBL and RBL are combined into one wiring BIL as in a memory cell 1477 illustrated in FIG. 38G.

In the case where the semiconductor device described in any of the above embodiments is used in the memory cell 1474 and the like, the transistor 200 can be used as the transistor M2, the transistor 300 can be used as the transistor M3, and the capacitor 100 can be used as the capacitor CB. The transistor and the capacitor device 292 of the memory device 290 described in the above embodiment with reference to FIGS. 26A and 26B and FIGS. 27A and 27B may be provided as the transistor M2 and the capacitor CB, respectively. When an OS transistor is used as the transistor M2, the leakage current of the transistor M2 can be extremely low. That is, with the use of the transistor M2, written data can be retained for a long time, and thus the frequency of the refresh operation for the memory cell can be decreased. In addition, refresh operation for the memory cell can be omitted. In addition, since the transistor M2 has an extremely low leakage current, multi-level data and analog data can be retained in the memory cell 1474. The same applies to the memory cells 1475 to 1477.

Note that the transistor M3 may be a transistor containing silicon in a channel formation region (hereinafter, also referred to as a Si transistor in some cases). The Si transistor may be either an n-channel transistor or a p-channel transistor. The Si transistor has higher field-effect mobility than the OS transistor in some cases. Therefore, a Si transistor may be used as the transistor M3 functioning as a reading transistor. Furthermore, the transistor M2 can be formed over the transistor M3 when a Si transistor is used as the transistor M3, in which case the area of the memory cell can be reduced, leading to high integration of the storage device.

Alternatively, the transistor M3 may be an OS transistor. When an OS transistor is used as each of the transistors M2 and M3, the memory cell array 1470 can be formed using only n-channel transistors.

Figure 38H:
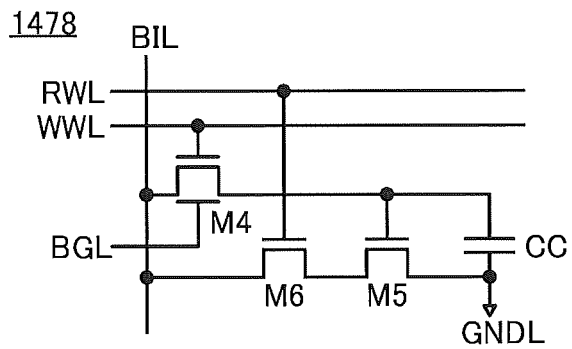

FIG. 38H illustrates an example of a gain-cell memory cell including three transistors and one capacitor. A memory cell 1478 illustrated in FIG. 38H includes transistors M4 to M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wirings RBL and WBL instead of the wiring BIL.

The transistor M4 is an OS transistor with a back gate that is electrically connected to the wiring BGL. Note that the back gate and the gate of the transistor M4 may be electrically connected to each other. Alternatively, the transistor M4 may not include the back gate.

Note that each of the transistors M5 and M6 may be an n-channel Si transistor or a p-channel Si transistor. Alternatively, the transistors M4 to M6 may be OS transistors, in which case the memory cell array 1470 can be formed using only n-channel transistors.

In the case where the semiconductor device described in any of the above embodiments is used in the memory cell 1478, the transistor 200 can be used as the transistor M4, the transistor 300 can be used as the transistors M5 and M6, and the capacitor 100 can be used as the capacitor CC. When an OS transistor is used as the transistor M4, the leakage current of the transistor M4 can be extremely low. The transistor and the capacitor device 292 of the memory device 290 described in the above embodiment with reference to FIGS. 26A and 26B and FIGS. 27A and 27B may be provided as the transistor M4 and the capacitor CC, respectively.

Note that the configurations of the peripheral circuit 1411, the memory cell array 1470, and the like described in this embodiment are not limited to those described above. The arrangement and functions of these circuits and the wirings, circuit components, and the like connected to the circuits can be changed, removed, or added as needed.

The structures, methods, and the like described in this embodiment can be appropriately combined with structures, methods, and the like of other embodiments and examples.

Embodiment 5

In this embodiment, an example of a chip 1200 on which the semiconductor device of the present invention is mounted is described with reference to FIGS. 40A and 40B. A plurality of circuits (systems) are mounted on the chip 1200. The technique for integrating a plurality of circuits (systems) on one chip is referred to as system on chip (SoC) in some cases.

Figure 40A:
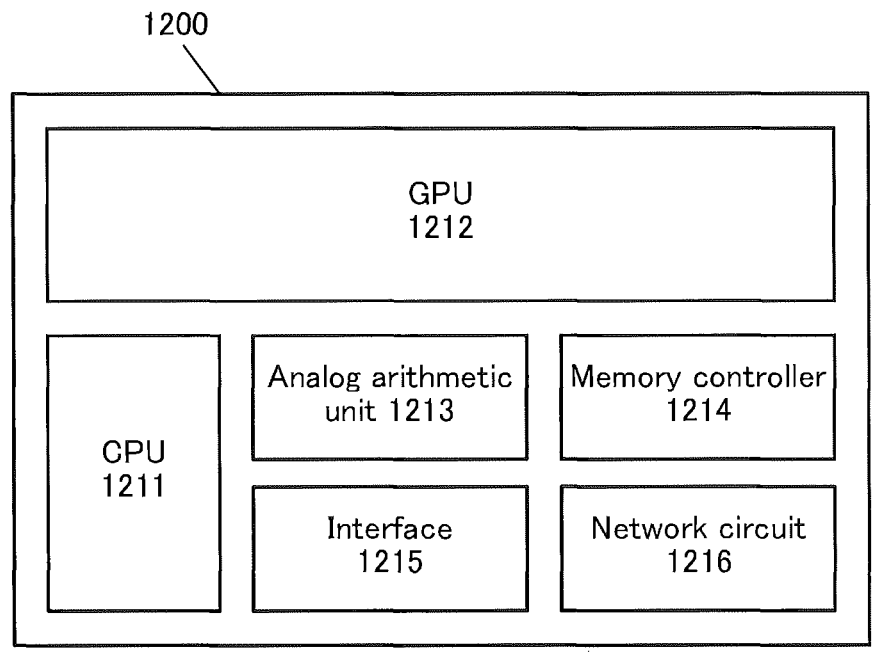
FIGS. 40A and 40B are schematic views of a semiconductor device.

As illustrated in FIG. 40A, the chip 1200 includes a central processing unit (CPU) 1211, a graphics processing unit (GPU) 1212, one or more of analog arithmetic units 1213, one or more of memory controllers 1214, one or more of interfaces 1215, one or more of network circuits 1216, and the like.

Figure 40B:
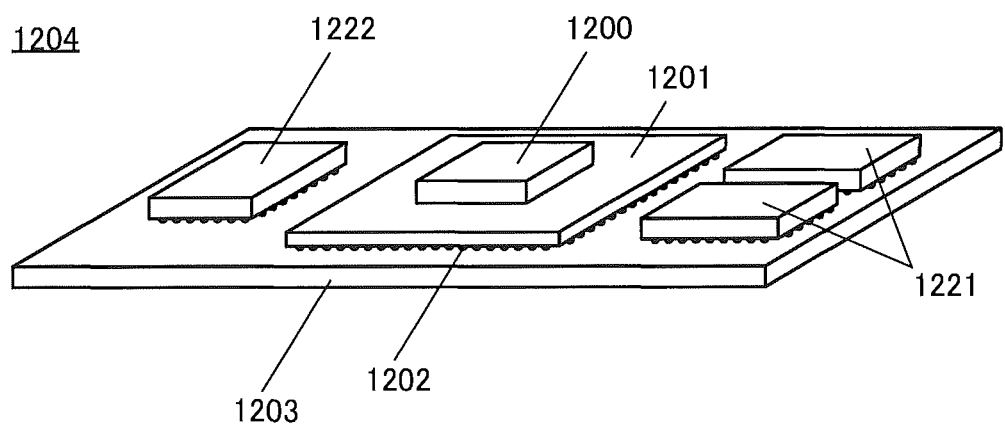

A bump (not illustrated) is provided on the chip 1200, and as illustrated in FIG. 40B, the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A storage device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily.

Alternatively, a common memory for the CPU 1211 and the GPU 1212 may be provided in the chip 1200. The NOSRAM or the DOSRAM described above can be used as the common memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an analog/digital (A/D) converter circuit and a digital/analog (D/A) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for connection with an external connection device such as a display device, a speaker, a microphone, a camera, or a controller. Examples of the controller include a mouse, a keyboard, and a game controller. As such an interface, universal serial bus (USB), high-definition multimedia interface (HDMI) (registered trademark), or the like can be used.

The network circuit 1216 includes a network circuit such as a local-area network (LAN). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can implement the arithmetic operation in a deep neural network (DNN), a convolutional neural network (CNN), a recurrent neural network (RNN), an autoencorder, a deep Boltzmann machine (DBM), a deep belief network (DBN), or the like; thus, the chip 1200 can be used as an AI chip or the GPU module 1204 can be used as an AI system module.

The structures, methods, and the like described in this embodiment can be appropriately combined with structures, methods, and the like of other embodiments and examples.

Embodiment 6

In this embodiment, application examples of the storage device using the semiconductor device described in the above embodiment will be described. The semiconductor device described in the above embodiment can be applied to, for example, storage devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable storage devices such as memory cards (e.g., SD cards), USB memories, and solid state drives (SSD). FIGS. 41A to 41E schematically illustrate some structural examples of removable storage devices. A packaged memory chip including the semiconductor device described in the above embodiment is used in a variety of memory devices and removable memories, for example.

Figure 41A:
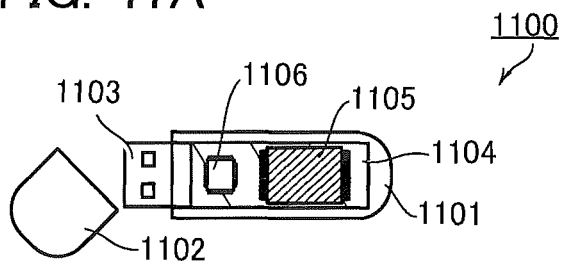
FIGS. 41A to 41E are schematic views of storage devices.

FIG. 41A is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like on the substrate 1104.

Figure 41B:
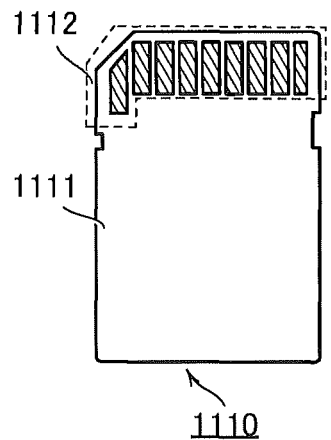
Figure 41C:
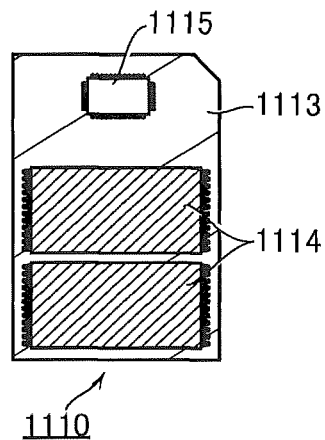

FIG. 41B is a schematic external view of an SD card, and FIG. 41C is a schematic view illustrating the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear side of the substrate 1113, the capacity of the SD card 1110 can be increased. In addition, a wireless chip with a radio communication function may be provided on the substrate 1113. With such a wireless chip, data can be read from and written in the memory chip 1114 by radio communication between the host device and the SD card 1110. The semiconductor device described in the above embodiment can be incorporated in the memory chip 1114 or the like on the substrate 1113.

Figure 41D:
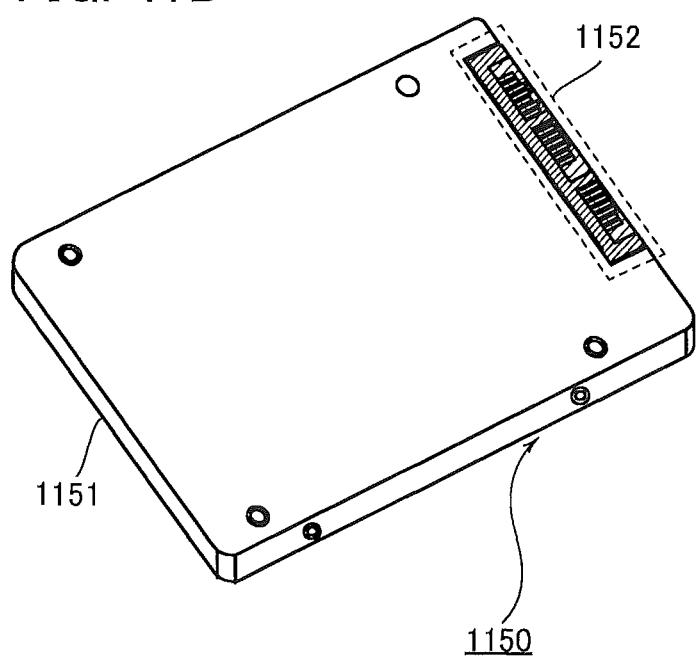
Figure 41E:
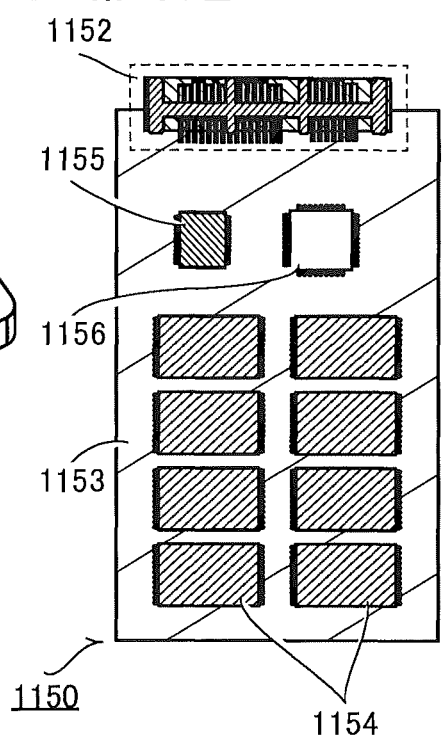

FIG. 41D is a schematic external view of an SSD, and FIG. 41E is a schematic view illustrating the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear side of the substrate 1153, the capacity of the SSD 1150 can be increased. The semiconductor device described in the above embodiment can be incorporated in the memory chip 1154 or the like on the substrate 1153.

The structures, methods, and the like described in this embodiment can be appropriately combined with structures, methods, and the like of other embodiments and examples.

Embodiment 7

In this embodiment, a field-programmable gate array (FPGA) will be described as an example of a semiconductor device of one embodiment of the present invention in which an OS transistor and a capacitor are included, with reference to FIGS. 42A to 42C, FIGS. 43A to 43C, FIG. 44, and FIGS.

45A and 45B. In the FPGA of this embodiment, an OS memory is used for a configuration memory and a register. Here, such an FPGA is referred to as an "OS-FPGA".

<<OS-FPGA>>

Figure 42A:
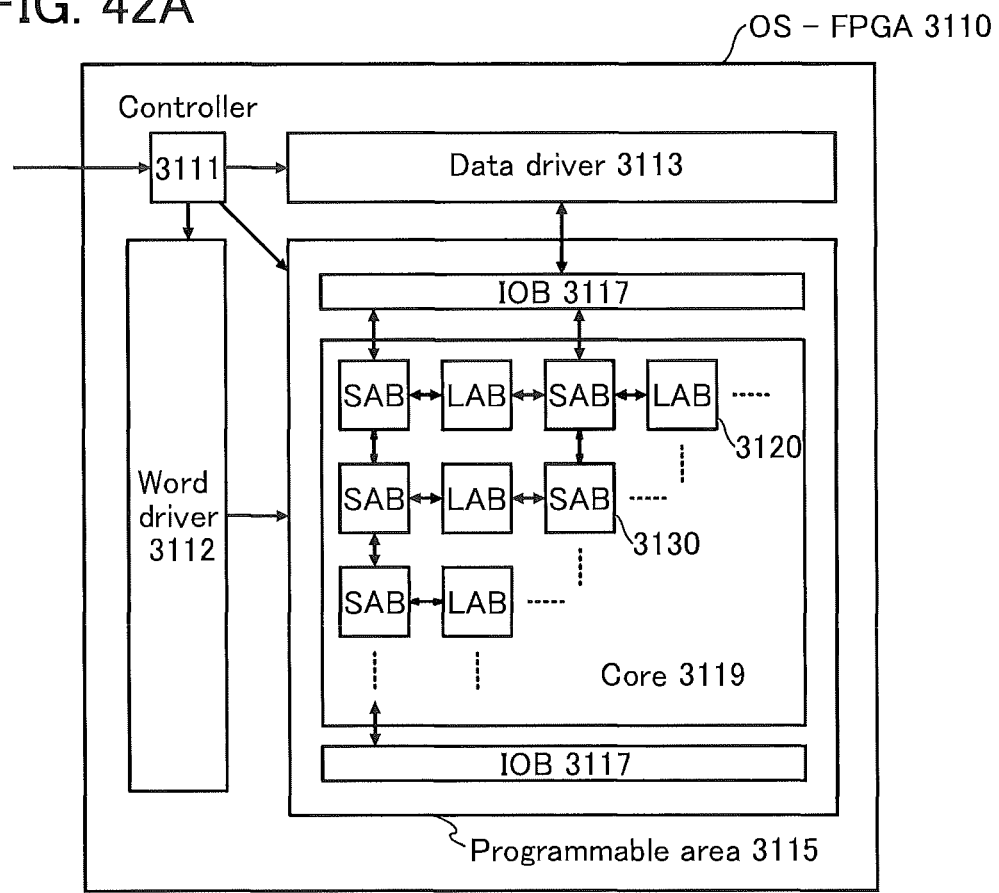
FIGS. 42A to 42C are block diagrams illustrating a structure example of a semiconductor device.

FIG. 42A illustrates a configuration example of an OS-FPGA. An OS-FPGA 3110 illustrated in FIG. 42A is capable of normally-off (NOFF) computing for context switching by a multi-context configuration and fine-grained power gating in each PLE. The OS-FPGA 3110 includes a controller 3111, a word driver 3112, a data driver 3113, and a programmable area 3115.

Figure 42B:
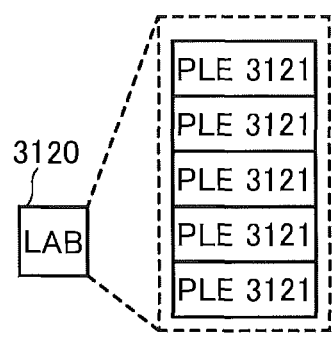
Figure 42C:
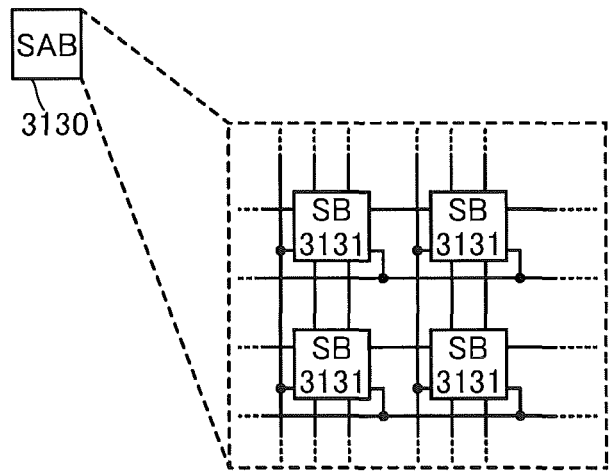

The programmable area 3115 includes two input/output blocks (IOBs) 3117 and a core 3119. The IOB 3117 includes a plurality of programmable input/output circuits. The core 3119 includes a plurality of logic array blocks (LABs) 3120 and a plurality of switch array blocks (SABs) 3130. The LAB 3120 includes a plurality of PLEs 3121. FIG. 42B illustrates an example in which the LAB 3120 includes five PLEs 3121. As illustrated in FIG. 42C, the SAB 3130 includes a plurality of switch blocks (SBs) 3131 arranged in an array. The LAB 3120 is connected to the LABs 3120 in four directions (on the left, right, top, and bottom sides) through its input terminals and the SABs 3130.

Figure 43A:
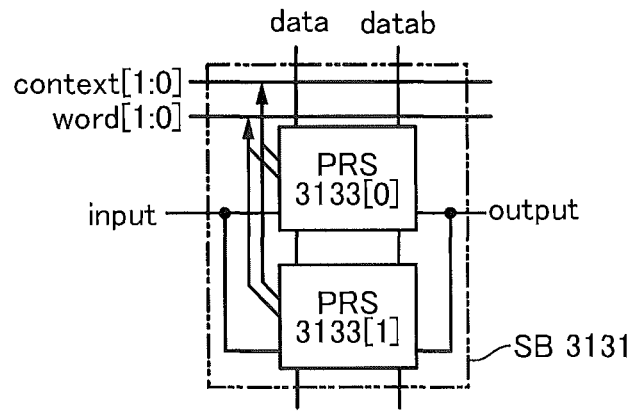
FIG. 43A is a block diagram illustrating a structure example of a semiconductor device.

The SB 3131 is described with reference to FIGS. 43A to 43C. To the SB 3131 in FIG. 43A, data, datab, signals context[1:0], and signals word[1:0] are input. The data and the datab are configuration data, and the logics of the data and the datab are complementary to each other. The number of contexts in the OS-FPGA 3110 is two, and the signals context[1:0] are context selection signals. The signals word [1:0] are word line selection signals, and wirings to which the signals word[1:0] are input are each a word line. Note that "input" shown in FIG. 43A corresponds to an input terminal of the SB 3131, and "output" shown in FIG. 43A corresponds to an output terminal of the SB 3131.

The SB 3131 includes a programmable routing switch (PRS) 3133[0] and a PRS 3133[1]. The PRS 3133[0] and the PRS 3133[1] each include a configuration memory (CM) that can store complementary data. Note that in the case where the PRS 3133[0] and the PRS 3133[1] are not distinguished from each other, they are each referred to as a PRS 3133. The same applies to other elements.

Figure 43B:
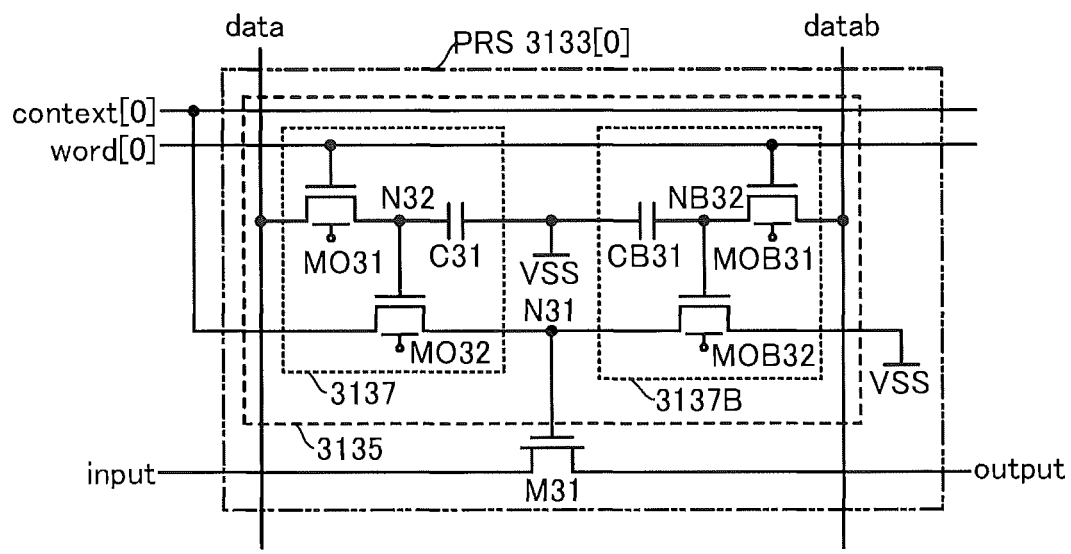
FIG. 43B is a circuit diagram illustrating a structure example of the semiconductor device.
Figure 43C:
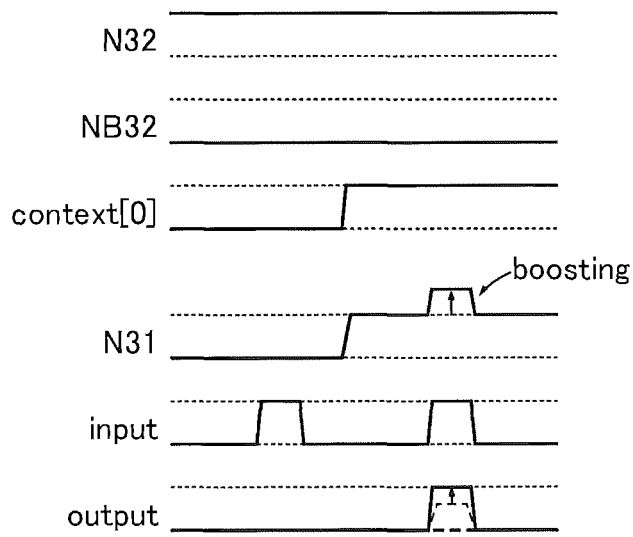
FIG. 43C is a timing chart illustrating an operation example of the semiconductor device.

FIG. 43B illustrates a circuit configuration example of the PRS 3133[0]. The PRS 3133[0] and the PRS 3133[1] have the same circuit configuration. The PRS 3133[0] and the PRS 3133[1] are different from each other in a context selection signal and a word line selection signal that are input. The signal context[0] and the signal word[0] are input to the PRS 3133[0], and the signal context[1] and the signal word[1] are input to the PRS 3133[1]. For example, in the SB 3131, when the signal context[0] is set to "H", the PRS 3133[0] is activated.

The PRS 3133[0] includes a CM 3135 and a Si transistor M31. The Si transistor M31 is a pass transistor that is controlled by the CM 3135. The CM 3135 includes a memory circuit 3137 and a memory circuit 3137B. The memory circuit 3137 and the memory circuit 3137B have the same circuit configuration. The memory circuit 3137 includes a capacitor C31, an OS transistor MO31, and an OS transistor MO32. The memory circuit 3137B includes a capacitor CB31, an OS transistor MOB31, and an OS transistor MOB32.

In the case where the semiconductor device described in any of the above embodiments is used in the SAB 3130, the transistor described in the above embodiment can be used as each of the OS transistors MO31 and MOB31.

Accordingly, the off-state current of the OS transistors MO31 and MOB31 can be reduced; thus, configuration data can be retained for a long time. Moreover, the area occupied by each set consisting of one transistor and one capacitor in the top view can be reduced; accordingly, the semiconductor device of this embodiment can be highly integrated.

The OS transistors MO31, MO32, MOB31, and MOB32 each include a back gate, and each of these back gates is electrically connected to a power supply line that supplies a fixed voltage.

A gate of the Si transistor M31, a gate of the OS transistor MO32, and a gate of the OS transistor MOB32 correspond to a node N31, a node N32, and a node NB32, respectively. The node N32 and the node NB32 are each a charge retention node of the CM 3135. The OS transistor MO32 controls the conduction state between the node N31 and a signal line for the signal context[0]. The OS transistor MOB32 controls the conduction state between the node N31 and a low-potential power supply line VSS.

A logic of data that the memory circuit 3137 retains and a logic of data that the memory circuit 3137B retains are complementary to each other. Thus, either the OS transistor MO32 or the OS transistor MOB32 is turned on.

The operation example of the PRS 3133[0] is described with reference to FIG. 43C. In the PRS 3133[0], in which configuration data has already been written, the node N32 is at "H", whereas the node NB32 is at "L".

The PRS 3133[0] is inactivated while the signal context [0] is at "L". During this period, even when an input terminal of the PRS 3133[0] is transferred to "H", the gate of the Si transistor M31 is kept at "L" and an output terminal of the PRS 3133[0] is also kept at "L".

The PRS 3133[0] is activated while the signal context[0] is at "H". When the signal context[0] is transferred to "H", the gate of the Si transistor M31 is transferred to "H" by the configuration data stored in the CM 3135.

While the PRS 3133[0] is active, when the potential of the input terminal is changed to "H", the gate voltage of the Si transistor M31 is increased by boosting because the OS transistor MO32 of the memory circuit 3137 is a source follower. As a result, the OS transistor MO32 of the memory circuit 3137 loses the driving capability, and the gate of the Si transistor M31 is brought into a floating state.

In the PRS 3133 with a multi-context function, the CM 3135 also functions as a multiplexer.

Figure 44:
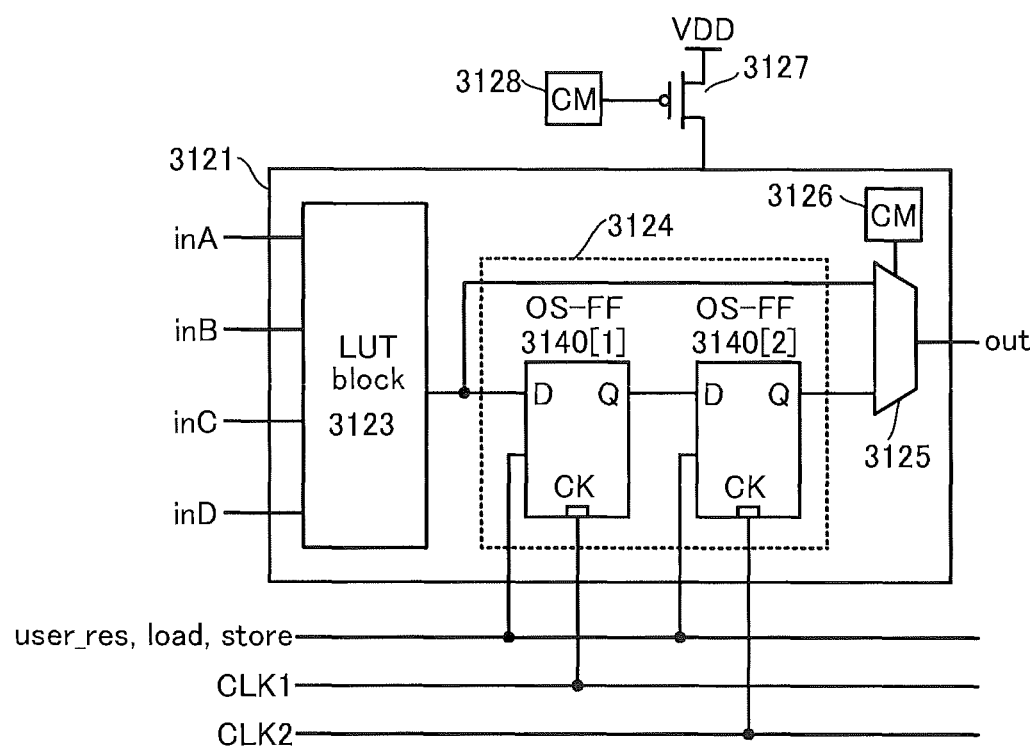
FIG. 44 is a block diagram illustrating a structure example of a semiconductor device.

FIG. 44 illustrates a configuration example of the PLE 3121. The PLE 3121 includes a lookup table (LUT) block 3123, a register block 3124, a selector 3125, and a CM 3126. The LUT block 3123 is configured to select and output data in the LUT block in accordance with inputs inA to inD. The selector 3125 selects an output of the LUT block 3123 or an output of the register block 3124 in accordance with the configuration data stored in the CM 3126.

The PLE 3121 is electrically connected to a power supply line for a voltage VDD through a power switch 3127. Whether the power switch 3127 is turned on or off is determined in accordance with configuration data stored in a CM 3128. Fine-grained power gating can be performed by providing the power switch 3127 for each PLE 3121. The PLE 3121 that is not used after context switching can be power gated owing to the fine-grained power gating function; thus, standby power can be effectively reduced.

The register block 3124 is formed by nonvolatile registers to achieve NOFF computing. The nonvolatile registers in the PLE 3121 are each a flip-flop provided with an OS memory (hereinafter referred to as OS-FF).

Figure 45A:
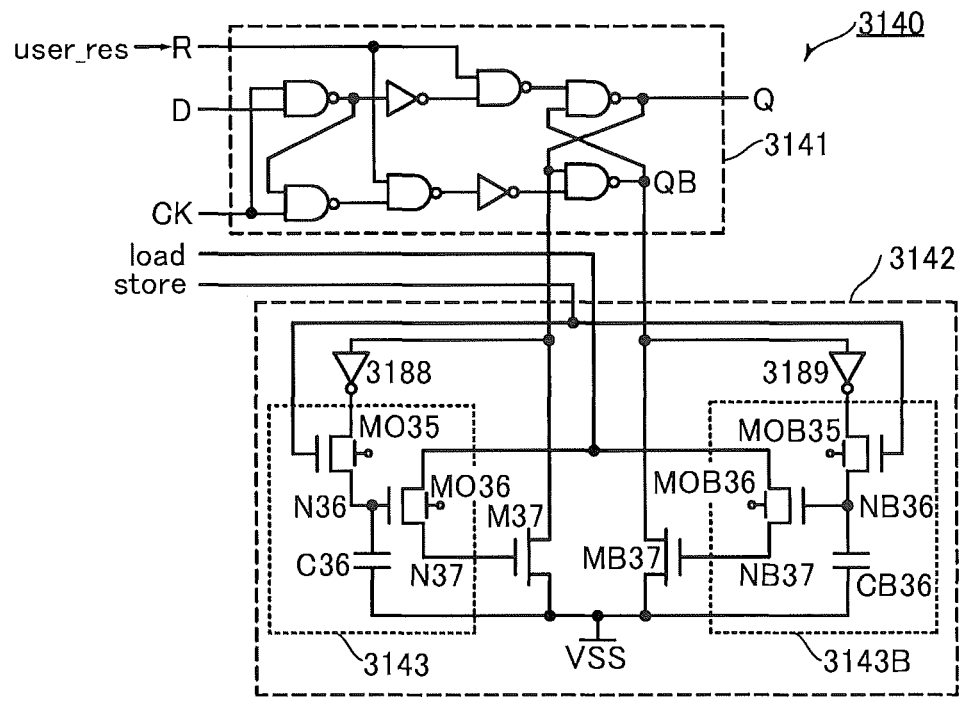
FIG. 45A is a circuit diagram illustrating a structure example of a semiconductor device.

The register block 3124 includes an OS-FF 3140[1] and an OS-FF 3140[2]. A signal user_res, a signal load, and a signal store are input to the OS-FFs 3140[1] and 3140[2]. A clock signal CLK1 is input to the OS-FF 3140[1] and a clock signal CLK2 is input to the OS-FF 3140[2]. FIG. 45A illustrates a configuration example of the OS-FF 3140.

The OS-FF 3140 includes an FF 3141 and a shadow register 3142. The FF 3141 includes a node CK, a node R, a node D, a node Q, and a node QB. A clock signal is input to the node CK. The signal user_res is input to the node R. The signal user_res is a reset signal. The node D is a data input node, and the node Q is a data output node. The logics of the node Q and the node QB are complementary to each other.

The shadow register 3142 can function as a backup circuit of the FF 3141. The shadow register 3142 backs up data of the node Q and data of the node QB in response to the signal store and writes back the backed up data to the node Q and the node QB in response to the signal load.

The shadow register 3142 includes an inverter circuit 3188, an inverter circuit 3189, a Si transistor M37, a Si transistor MB37, a memory circuit 3143, and a memory circuit 3143B. The memory circuit 3143 and the memory circuit 3143B each have the same circuit configuration as the memory circuit 3137 of the PRS 3133. The memory circuit 3143 includes a capacitor C36, an OS transistor MO35, and an OS transistor MO36. The memory circuit 3143B includes a capacitor CB36, an OS transistor MOB35, and an OS transistor MOB36. A node N36 and a node NB36 correspond to a gate of the OS transistor MO36 and a gate of the OS transistor MOB36, respectively, and are each a charge retention node. A node N37 and a node NB37 correspond to a gate of the Si transistor M37 and a gate of the Si transistor MB37, respectively.

In the case where the semiconductor device described in any of the above embodiments is used in the LAB 3120, the transistor described in the above embodiment can be used as each of the OS transistors MO35 and MOB35. Accordingly, the off-state current of the OS transistors MO35 and MOB35 can be reduced; thus, backed up data in the OS-FF can be retained for a long time. Moreover, the area occupied by each set consisting of one transistor and one capacitor in the top view can be reduced; accordingly, the semiconductor device of this embodiment can be highly integrated.

The OS transistors MO35, MO36, MOB35, and MOB36 each include a back gate, and each of these back gates is electrically connected to a power supply line that supplies a fixed voltage.

Figure 45B:
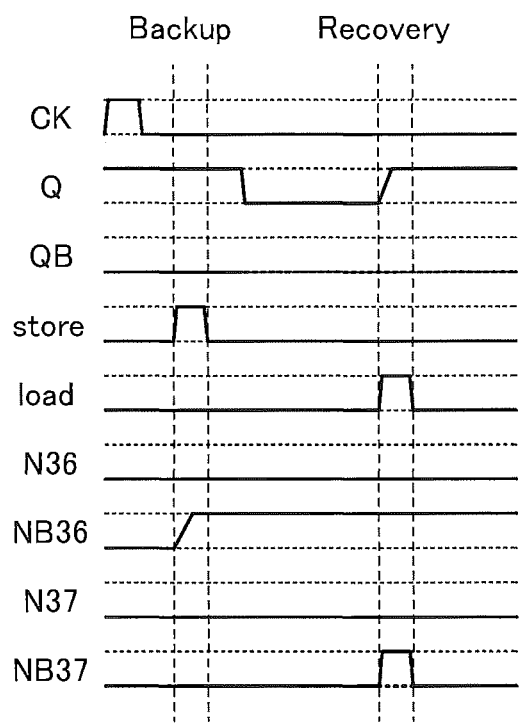
FIG. 45B is a timing chart illustrating an operation example of the semiconductor device.

An example of an operation method of the OS-FF 3140 is described with reference to FIG. 45B.

(Backup)

When the signal store at "H" is input to the OS-FF 3140, the shadow register 3142 backs up data of the FF 3141. The node N36 becomes "L" when the data of the node Q is written thereto, and the node NB36 becomes "H" when the data of the node QB is written thereto. After that, power gating is performed and the power switch 3127 is turned off. Although the data of the node Q and the data of the node QB of the FF 3141 are lost, the shadow register 3142 retains the backed up data even when power supply is stopped.

(Recovery)

The power switch 3127 is turned on to supply power to the PLE 3121. After that, when the signal load at "H" is input to the OS-FF 3140, the shadow register 3142 writes back the backed up data to the FF 3141. The node N37 is kept at "L" because the node N36 is at "L", and the node NB37 becomes "H" because the node NB36 is at "H". Thus, the node Q becomes "H" and the node QB becomes "L". That is, the OS-FF 3140 is restored to a state at the backup operation.

A combination of the fine-grained power gating and backup/recovery operation of the OS-FF 3140 allows power consumption of the OS-FPGA 3110 to be effectively reduced.

A possible error in a memory circuit is a soft error due to the entry of radiation. The soft error is a phenomenon in which a malfunction such as inversion of data retained in a memory is caused by electron-hole pair generation when a transistor is irradiated with a rays emitted from a material of a memory or a package or the like, secondary cosmic ray neutrons generated by nuclear reaction of primary cosmic rays entering the Earth's atmosphere from outer space with nuclei of atoms existing in the atmosphere, or the like. An OS memory including an OS transistor has a high soft-error tolerance. Therefore, the OS-FPGA 3110 including an OS memory can have high reliability.

The configuration described in this embodiment can be used in an appropriate combination with any of the other configurations described in the other embodiments.

Embodiment 8

In this embodiment, an example of a CPU including the semiconductor device of one embodiment of the present invention, such as the above-described storage device, is described.

<Configuration of CPU>

Figure 46:
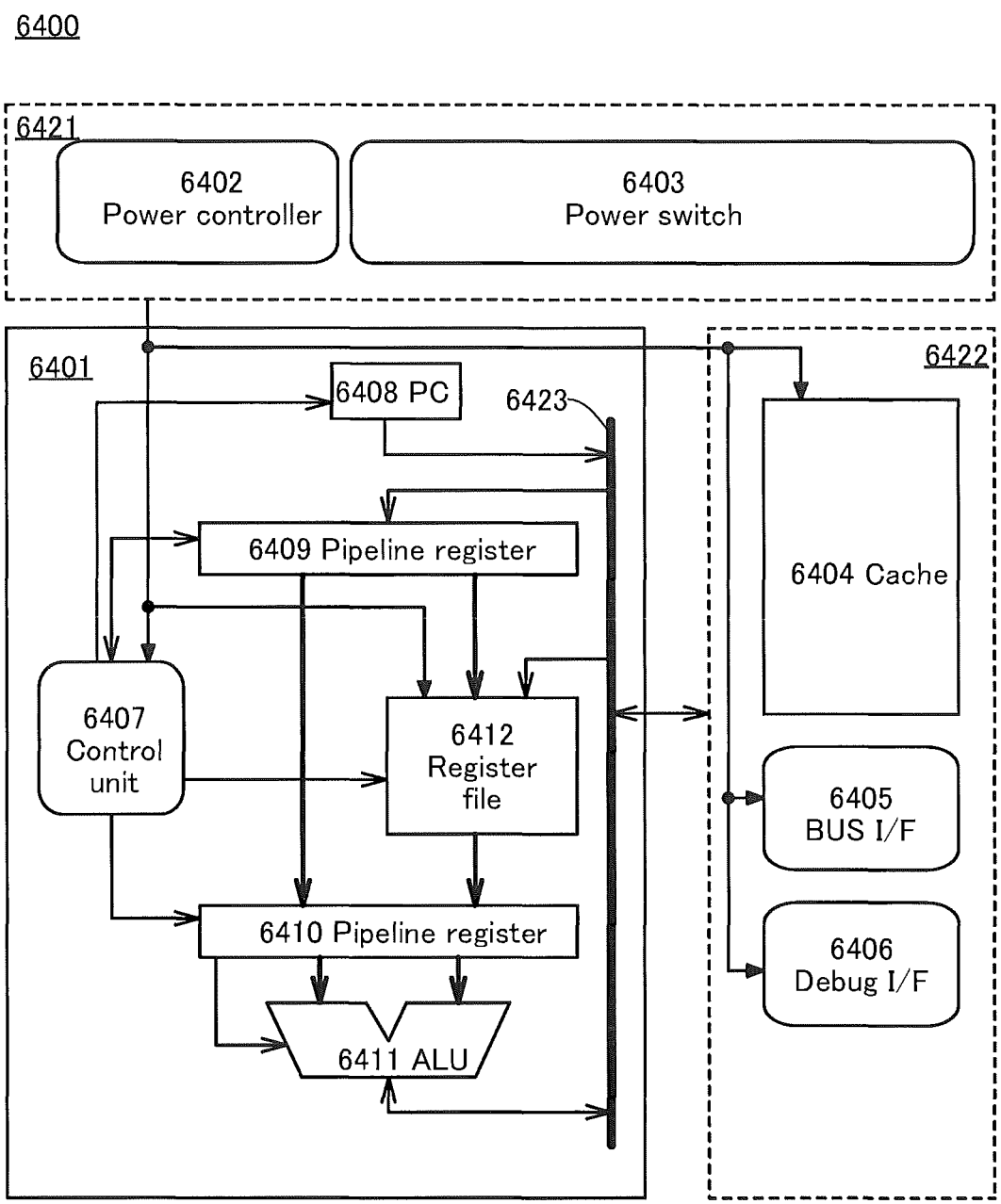
FIG. 46 is a block diagram illustrating a semiconductor device.

A semiconductor device 6400 shown in FIG. 46 includes a CPU core 6401, a power management unit 6421, and a peripheral circuit 6422. The power management unit 6421 includes a power controller 6402 and a power switch 6403. The peripheral circuit 6422 includes a cache 6404 including cache memory, a bus interface (BUS I/F) 6405, and a debug interface (Debug I/F) 6406. The CPU core 6401 includes a data bus 6423, a control unit 6407, a program counter (PC) 6408, a pipeline register 6409, a pipeline register 6410, an arithmetic logic unit (ALU) 6411, and a register file 6412. Data is transmitted between the CPU core 6401 and the peripheral circuit 6422 such as the cache 6404 via the data bus 6423.

The semiconductor device described in any of the above embodiments can be used for many logic circuits typified by the power controller 6402 and the control unit 6407. Accordingly, the semiconductor device 6400 can have reduced power consumption. The semiconductor device 6400 can have a higher operating speed. The semiconductor device 6400 can have a smaller power supply voltage variation.

The semiconductor device 6400 preferably includes a p-channel Si transistor and a transistor including the oxide semiconductor described in the above embodiment in a channel formation region. Accordingly, the semiconductor device 6400 can be small. The semiconductor device 6400 can have reduced power consumption. The semiconductor device 6400 can have a higher operating speed. Particularly when the Si transistors are only p-channel ones, the manufacturing costs of the semiconductor device can be reduced.

The control unit 6407 has functions of decoding and executing instructions contained in a program such as input applications by controlling the overall operations of the PC 6408, the pipeline registers 6409 and 6410, the ALU 6411, the register file 6412, the cache 6404, the bus interface 6405, the debug interface 6406, and the power controller 6402.

The ALU 6411 has a function of performing a variety of arithmetic operations such as four arithmetic operations and logic operations.

The cache 6404 has a function of temporarily storing frequently used data. The PC 6408 is a register having a function of storing an address of an instruction to be executed next. Note that although not shown in FIG. 46, the cache 6404 is provided with a cache controller for controlling the operation of the cache memory.

The pipeline register 6409 has a function of temporarily storing instruction data.

The register file 6412 includes a plurality of registers including a general-purpose register and can store data that is read from the main memory, data obtained as a result of arithmetic operations in the ALU 6411, or the like.

The pipeline register 6410 has a function of temporarily storing data used for arithmetic operations in the ALU 6411, data obtained as a result of arithmetic operations in the ALU 6411, or the like.

The bus interface 6405 functions as a path for data between the semiconductor device 6400 and various devices outside the semiconductor device 6400. The debug interface 6406 functions as a path of a signal for inputting an instruction to control debugging to the semiconductor device 6400.

The power switch 6403 has a function of controlling supply of a power supply voltage to various circuits included in the semiconductor device 6400 other than the power controller 6402. The above various circuits belong to several different power domains. The power switch 6403 controls whether the power supply voltage is supplied to the various circuits in the same power domain. In addition, the power controller 6402 has a function of controlling the operation of the power switch 6403.

The semiconductor device 6400 having the above structure can perform power gating. An example of the power gating operation sequence will be described.

First, by the CPU core 6401, timing for stopping the supply of the power supply voltage is set in a register of the power controller 6402. Then, an instruction of starting power gating is sent from the CPU core 6401 to the power controller 6402. Then, various registers and the cache 6404 included in the semiconductor device 6400 start data saving. Then, the power switch 6403 stops the supply of the power supply voltage to the various circuits included in the semiconductor device 6400 other than the power controller 6402. Then, an interrupt signal is input to the power controller 6402, whereby the supply of the power supply voltage to the various circuits included in the semiconductor device 6400 is started. Note that a counter may be provided in the power controller 6402 to be used to determine the timing of starting the supply of the power supply voltage regardless of input of an interrupt signal. Next, the various registers and the cache 6404 start data restoration. Then, execution of an instruction is resumed in the control unit 6407.

Such power gating can be performed in the whole processor or one or a plurality of logic circuits included in the processor. Furthermore, power supply can be stopped even for a short time. Consequently, power consumption can be reduced at a fine spatial or temporal granularity.

In performing power gating, data retained by the CPU core 6401 or the peripheral circuit 6422 is preferably saved in a short time. In that case, the power can be turned on or off in a short time, and an effect of saving power becomes significant.

In order that the data retained by the CPU core 6401 or the peripheral circuit 6422 be saved in a short time, the data is preferably saved in a flip-flop circuit itself (referred to as a flip-flop circuit capable of backup operation). Furthermore, the data is preferably saved in an SRAM circuit itself (referred to as an SRAM circuit capable of backup operation). The flip-flop circuit and SRAM circuit that are capable of backup operation preferably include transistors including an oxide semiconductor (preferably an oxide containing In, Ga, and Zn) in a channel formation region. Consequently, the transistor has a low off-state current; thus, the flip-flop circuit and SRAM circuit that are capable of backup operation can retain data for a long time without power supply. When the transistor has a high switching speed, the flip-flop circuit and SRAM circuit that are capable of backup operation can save and restore data in a short time in some cases.

An example of the flip-flop circuit capable of backup operation is described with reference to FIG. 47.

Figure 47:
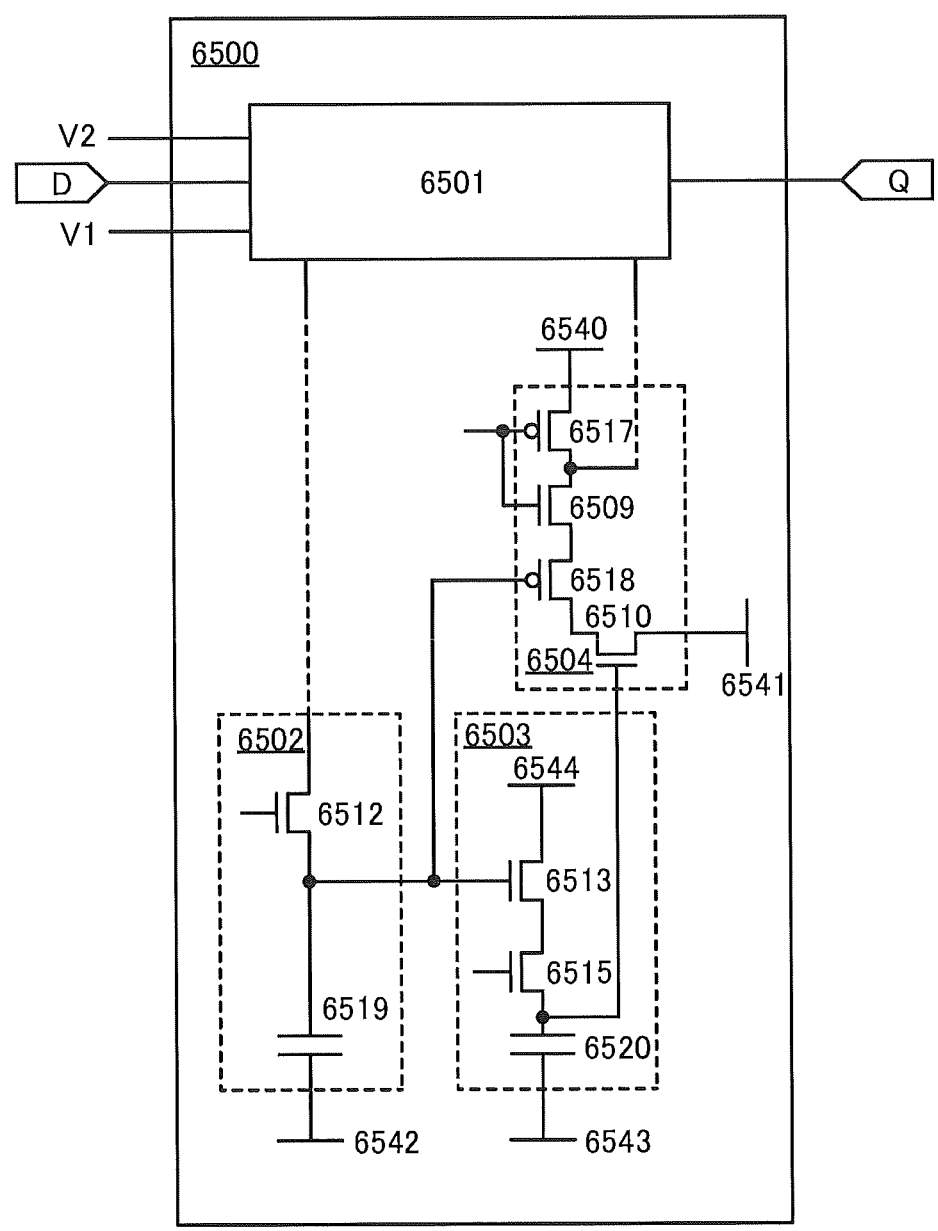
FIG. 47 is a circuit diagram illustrating a semiconductor device.

A semiconductor device 6500 shown in FIG. 47 is an example of the flip-flop circuit capable of backup operation. The semiconductor device 6500 includes a first memory circuit 6501, a second memory circuit 6502, a third memory circuit 6503, and a read circuit 6504. As a power supply voltage, a potential difference between a potential V1 and a potential V2 is supplied to the semiconductor device 6500. One of the potential V1 and the potential V2 is at a high level, and the other is at a low level. An example of the structure of the semiconductor device 6500 when the potential V1 is at a low level and the potential V2 is at a high level is described below.

The first memory circuit 6501 has a function of retaining data when a signal D including the data is input in a period during which the power supply voltage is supplied to the semiconductor device 6500. Furthermore, the first memory circuit 6501 outputs a signal Q including the retained data in the period during which the power supply voltage is supplied to the semiconductor device 6500. On the other hand, the first memory circuit 6501 cannot retain data in a period during which the power supply voltage is not supplied to the semiconductor device 6500. That is, the first memory circuit 6501 can be referred to as a volatile memory circuit.

The second memory circuit 6502 has a function of reading the data retained in the first memory circuit 6501 to store (or save) it. The third memory circuit 6503 has a function of reading the data retained in the second memory circuit 6502 to store (or save) it. The read circuit 6504 has a function of reading the data retained in the second memory circuit 6502 or the third memory circuit 6503 to store (or restore) it in the first memory circuit 6501.

In particular, the third memory circuit 6503 has a function of reading the data retained in the second memory circuit 6502 to store (or save) it even in the period during which the power supply voltage is not supplied to the semiconductor device 6500.

As shown in FIG. 47, the second memory circuit 6502 includes a transistor 6512 and a capacitor 6519. The third memory circuit 6503 includes a transistor 6513, a transistor 6515, and a capacitor 6520. The read circuit 6504 includes a transistor 6510, a transistor 6518, a transistor 6509, and a transistor 6517.

The transistor 6512 has a function of charging and discharging the capacitor 6519 in accordance with data retained in the first memory circuit 6501. The transistor 6512 is desirably capable of charging and discharging the capacitor 6519 at a high speed in accordance with data retained in the first memory circuit 6501. Specifically, the transistor 6512 desirably contains crystalline silicon (preferably polycrystalline silicon, further preferably single crystal silicon) in a channel formation region.

The conduction state or the non-conduction state of the transistor 6513 is determined in accordance with the charge retained in the capacitor 6519. The transistor 6515 has a function of charging and discharging the capacitor 6520 in accordance with the potential of a wiring 6544 when the transistor 6513 is in a conduction state. It is desirable that the off-state current of the transistor 6515 be extremely low. Specifically, the transistor 6515 desirably contains an oxide semiconductor (preferably an oxide containing In, Ga, and Zn) in a channel formation region.

Specific connection relations between the elements are described. One of a source and a drain of the transistor 6512 is connected to the first memory circuit 6501. The other of the source and the drain of the transistor 6512 is connected to one electrode of the capacitor 6519, a gate of the transistor 6513, and a gate of the transistor 6518. The other electrode of the capacitor 6519 is connected to a wiring 6542. One of a source and a drain of the transistor 6513 is connected to the wiring 6544. The other of the source and the drain of the transistor 6513 is connected to one of a source and a drain of the transistor 6515. The other of the source and the drain of the transistor 6515 is connected to one electrode of the capacitor 6520 and a gate of the transistor 6510. The other electrode of the capacitor 6520 is connected to a wiring 6543. One of a source and a drain of the transistor 6510 is connected to a wiring 6541. The other of the source and the drain of the transistor 6510 is connected to one of a source and a drain of the transistor 6518. The other of the source and the drain of the transistor 6518 is connected to one of a source and a drain of the transistor 6509. The other of the source and the drain of the transistor 6509 is connected to one of a source and a drain of the transistor 6517 and the first memory circuit 6501. The other of the source and the drain of the transistor 6517 is connected to a wiring 6540. Although a gate of the transistor 6509 is connected to a gate of the transistor 6517 in FIG. 47, the gate of the transistor 6509 is not necessarily connected to the gate of the transistor 6517.

The transistor described in the above embodiment as an example can be used as the transistor 6515. Because of the low off-state current of the transistor 6515, the semiconductor device 6500 can retain data for a long time without power supply. The favorable switching characteristics of the transistor 6515 allow the semiconductor device 6500 to perform high-speed backup and recovery.

The structure described in this embodiment can be used in appropriate combination with any of the structures described in the other embodiments.

Embodiment 9

In this embodiment, examples of an electronic component and an electronic device that include the storage device of the above embodiments and the like are described.
<Electronic Component>

First, examples of an electronic component including a storage device 7100 are described with reference to FIGS. 48A and 48B.

Figure 48A:
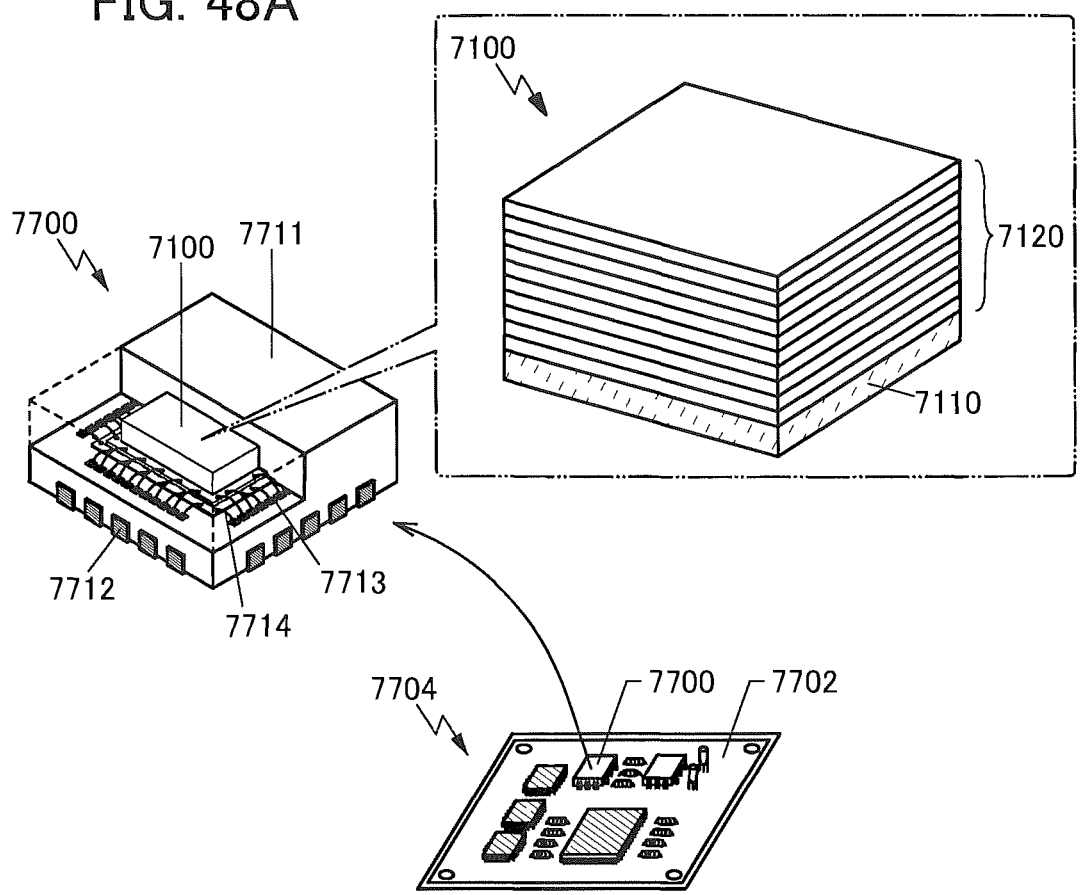
FIGS. 48A and 48B are schematic views illustrating examples of electronic components.

FIG. 48A is a perspective view of an electronic component 7700 and a substrate (circuit board 7704) on which the electronic component 7700 is mounted. In the electronic component 7700 illustrated in FIG. 48A, the storage device 7100 is provided in a mold 7711. To illustrate the inside of the electronic component 7700, some portions are omitted in FIG. 48A. In the electronic component 7700, a land 7712 is provided on the outer side of the mold 7711. The land 7712 is electrically connected to an electrode pad 7713, and the electrode pad 7713 is electrically connected to the storage device 7100 through a wire 7714. The electronic component 7700 is mounted on a printed circuit board 7702, for example. A plurality of such electronic components are combined and electrically connected to each other on the printed circuit board 7702; thus, the circuit board 7704 is formed.

Figure 48B:
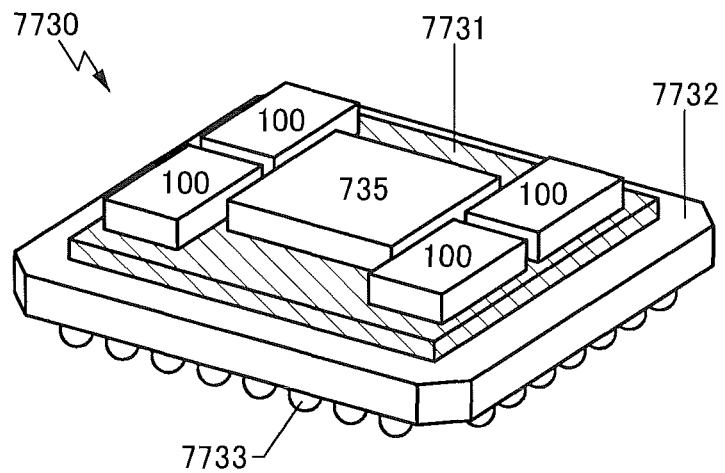

FIG. 48B is a perspective view of an electronic component 7730. The electronic component 7730 is an example of a system in package (SiP) or a multi-chip module (MCM). In the electronic component 7730, an interposer 7731 is provided over a package substrate 7732 (printed circuit board) and a semiconductor device 7735 and a plurality of storage devices 7100 are provided over the interposer 7731.

The electronic component 7730 using the storage device 7100 as a high bandwidth memory (HBM) is illustrated as an example. As the semiconductor device 7735, an integrated circuit (semiconductor device) such as a CPU, a GPU, or an FPGA can be used.

As the package substrate 7732, a ceramic substrate, a plastic substrate, a glass epoxy substrate, or the like can be used. As the interposer 7731, a silicon interposer, a resin interposer, or the like can be used.

The interposer 7731 includes a plurality of wirings and has a function of electrically connecting the plurality of integrated circuits with different terminal pitches. The plurality of wirings are provided to have a single-layer structure or a layered structure. The interposer 7731 has a function of electrically connecting an integrated circuit provided on the interposer 7731 to an electrode provided on the package substrate 7732. Accordingly, the interposer is referred to as a rewiring substrate or an intermediate substrate in some cases. A through electrode may be provided in the interposer 7731 and used for electrically connecting the integrated circuit and the package substrate 7732. In the case of using a silicon interposer, a through-silicon via (TSV) can also be used as the through electrode.

A silicon interposer is preferably used as the interposer 7731. The silicon interposer can be manufactured at lower cost than an integrated circuit because the silicon interposer is not necessarily provided with an active element. Moreover, since the wirings of the silicon interposer can be formed through a semiconductor process, formation of minute wirings that is difficult in a resin interposer is easily achieved.

In order to achieve a wide memory bandwidth, many wirings need to be connected to an HBM. Therefore, minute wirings are required to be formed densely on an interposer on which an HBM is mounted. For this reason, it is preferable that a silicon interposer be used as the interposer on which an HBM is mounted.

In an SiP, an MCM, or the like using a silicon interposer, a decrease in reliability due to a difference in expansion coefficient between an integrated circuit and the interposer does not easily occur. Furthermore, the surface of a silicon interposer has high planarity, so that a poor connection between the silicon interposer and an integrated circuit provided thereon does not easily occur. It is particularly preferable to use a silicon interposer for a 2.5D package (2.5D mounting) in which a plurality of integrated circuits are arranged side by side on an interposer.

A heat sink (radiator plate) may be provided to overlap with the electronic component 7730. In this case, the heights of integrated circuits provided on the interposer 7731 are preferably equal to each other. In the electronic component 7730 of this embodiment, the heights of the storage device 7100 and the semiconductor device 7735 are preferably equal to each other, for example.

An electrode 7733 for mounting the electronic component 7730 on another substrate may be provided on the bottom portion of the package substrate 7732. FIG. 48B illustrates an example in which the electrode 7733 is formed of a solder ball. Solder balls are provided in a matrix on the bottom portion of the package substrate 7732, whereby a ball grid array (BGA) can be achieved. Alternatively, the electrode 7733 may be formed of a conductive pin. Conductive pins are provided in a matrix on the bottom portion of the package substrate 7732, whereby a pin grid array (PGA) can be achieved.

The electronic component 7730 can be mounted on another substrate in various manners, not limited to the BGA and the PGA. For example, a staggered pin grid array (SPGA), a land grid array (LGA), a quad flat package (QFP), a quad flat J-leaded package (QFJ), or a quad flat non-leaded package (QFN) can be employed.

This embodiment can be implemented in an appropriate combination with any of the structures described in the other embodiments and the like.

Embodiment 10

In this embodiment, specific examples of electronic devices that can be used for the semiconductor device of one embodiment of the present invention are described with reference to FIGS. 49A, 49B, 49C, 49D, 49E1, 49E2, and 49F.

More specifically, the semiconductor device of one embodiment of the present invention can be used for processors (e.g., a CPU and a GPU) and chips. FIGS. 49A, 49B, 49C, 49D, 49E1, 49E2, and 49F illustrate specific examples of electronic devices including a processor (e.g., a CPU or a GPU) or a chip of one embodiment of the present invention.

<Electronic Device and System>

The GPU or the chip of one embodiment of the present invention can be mounted on a variety of electronic devices. Examples of electronic devices include electronic devices with relatively large screens, such as a television device, a desktop or laptop personal computer, a monitor of a computer or the like, digital signage, and a large game machine (e.g., a pachinko machine); cameras such as a digital camera and a digital video camera; a digital photo frame; a mobile phone; a portable game machine; a portable information terminal; and an audio reproducing device. When the GPU or the chip of one embodiment of the present invention is provided in an electronic device, the electronic device can include artificial intelligence.

The electronic device of one embodiment of the present invention may include an antenna. With the antenna receiving a signal, the electronic device can display an image, data, or the like on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium. FIGS. 49A, 49B, 49C, 49D, 49E1, 49E2, and 49F illustrate examples of electronic devices.

[Mobile Phone]

FIG. 49A illustrates a mobile phone (smartphone), which is a type of information terminal. An information terminal 5500 includes a housing 5510 and a display portion 5511. As input interfaces, a touch panel and a button are provided in the display portion 5511 and the housing 5510, respectively.

With the use of the chip of one embodiment of the present invention, the information terminal 5500 can execute an application utilizing artificial intelligence. Examples of the application utilizing artificial intelligence include an application for interpreting a conversation and displaying its content on the display portion 5511; an application for recognizing letters, figures, and the like input to the touch panel of the display portion 5511 by a user and displaying them on the display portion 5511; and an application for biometric authentication using fingerprints, voice prints, or the like.

[Information Terminal 1]

FIG. 49B illustrates a desktop information terminal 5300. The desktop information terminal 5300 includes a main body 5301 of the information terminal, a display 5302, and a keyboard 5303.

Like the information terminal 5500 described above, the desktop information terminal 5300 can execute an application utilizing artificial intelligence with the use of the chip of one embodiment of the present invention. Examples of the application utilizing artificial intelligence include design-support software, text correction software, and software for automatic menu generation. Furthermore, with the use of the desktop information terminal 5300, novel artificial intelligence can be developed.

Note that although FIGS. 49A and 49B illustrate a smartphone and a desktop information terminal as examples of electronic device, one embodiment of the present invention can also be applied to an information terminal other than a smartphone and a desktop information terminal. Examples of an information terminal other than a smartphone and a desktop information terminal include a personal digital assistant (PDA), a laptop information terminal, and a workstation.

[Household Appliance]

FIG. 49C illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu on the basis of, for example, food stored in the electric refrigerator-freezer 5800 and food expiration dates, a function of automatically adjusting the temperature to be appropriate for the food stored in the electric refrigerator-freezer 5800, and the like.

Although the electric refrigerator-freezer is described here as an example of a household appliance, other examples of a household appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

FIG. 49D illustrates a portable game machine 5200 as an example of a game machine. The portable game machine includes a housing 5201, a display portion 5202, a button 5203, and the like.

The portable game machine 5200 including the GPU or the chip of one embodiment of the present invention can have low power consumption. Furthermore, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game machine 5200, the portable game machine 5200 including artificial intelligence can be obtained.

In general, progress of a game, the actions and words of game characters, and expressions of a phenomenon in the game are programmed in the game; however, the use of artificial intelligence in the portable game machine 5200 enables expressions not limited by the game program. For example, questions posed by the player, progress of the game, time, and actions and words of game characters can be changed for various expressions.

The artificial intelligence can construct a virtual game player; thus, a game that needs a plurality of players can be played with the portable game machine 5200 by only one human game player, with the use of a virtual game player constructed by the artificial intelligence as an opponent.

Although the portable game machine is illustrated as an example of a game machine in FIG. 49D, the game machine including the GPU or the chip of one embodiment of the present invention is not limited thereto. Other examples of the game machine including the GPU or the chip of one embodiment of the present invention include a home stationary game machine, an arcade game machine installed in an entertainment facility (e.g., a game center and an amusement park), and a throwing machine for batting practice installed in sports facilities.

[Moving Vehicle]

The GPU or the chip of one embodiment of the present invention can be used in an automobile, which is a moving vehicle, and around a driver's seat in the automobile.

FIG. 49E1 illustrates an automobile 5700 as an example of a moving vehicle, and FIG. 49E2 illustrates an area around a windshield inside the automobile. FIG. 49E2 illustrates a display panel 5701, a display panel 5702, and a display panel 5703 that are attached to a dashboard and a display panel 5704 attached to a pillar.

The display panels 5701 to 5703 can provide various kinds of information by displaying a speedometer, a tachometer, a mileage, a fuel meter, a gearshift indicator, air-conditioning settings, and the like. Items displayed on the display panel, their layout, and the like can be changed as appropriate to suit the user's preferences, resulting in more sophisticated design. The display panels 5701 to 5703 can also be used as lighting devices.

The display panel 5704 can compensate for the view obstructed by the pillar (blind areas) by displaying an image taken by an imaging device (not illustrated) provided in the automobile 5700. That is, displaying an image taken by the imaging device provided on the exterior of the automobile 5700 eliminates blind areas and enhances safety. Moreover, displaying an image to compensate for the area that a driver cannot see makes it possible for the driver to confirm safety more easily and comfortably. The display panel 5704 can also be used as a lighting device.

Since the GPU or the chip of one embodiment of the present invention can be used as a component of artificial intelligence, the chip can be used for an automatic driving system of the automobile 5700, for example. The chip can also be used for a system for navigation, risk prediction, or the like. The display panels 5701 to 5704 may display information regarding navigation, risk prediction, and the like.

Although the automobile is described above as an example of a moving vehicle, a moving vehicle is not limited to the automobile. Examples of a moving vehicle include a train, a monorail train, a ship, and a flying object (a helicopter, an unmanned aircraft (a drone), an airplane, or a rocket), and these moving vehicles can include a system utilizing artificial intelligence when equipped with the chip of one embodiment of the present invention.

[Broadcasting System]

The GPU or the chip of one embodiment of the present invention can be used in a broadcasting system.

FIG. 49F schematically illustrates data transmission in a broadcasting system. Specifically, FIG. 49F illustrates a path in which a radio wave (a broadcast signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although an ultra-high frequency (UHF) antenna is illustrated as the antenna 5650 in FIG. 49F, a BS/110° CS antenna, a CS antenna, or the like can also be used.

A radio wave 5675A and a radio wave 5675B are broadcast signals for terrestrial broadcasting, and a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 49F and may be satellite broadcasting using an artificial satellite, data broadcasting using an optical line, or the like.

The above-described broadcasting system may utilize artificial intelligence by including the chip of one embodiment of the present invention. When the broadcast data is transmitted from the broadcast station 5680 to the TV 5600 of each household, the broadcast data is compressed by an encoder. The antenna 5650 receives the compressed broadcast data, and then the compressed broadcast data is decompressed by a decoder in the receiving device in the TV 5600. With the use of the artificial intelligence, for example, a display pattern included in an image can be recognized in motion compensation prediction, which is one of the compressing methods of the encoder. In addition, in-frame prediction, for example, can also be performed utilizing artificial intelligence. Furthermore, for example, when the broadcast data with low resolution is received and displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K and 8K) broadcasting, which needs a large amount of broadcast data.

As an application of artificial intelligence in the TV 5600, a recording device including artificial intelligence may be provided in the TV 5600. With such a structure, the artificial intelligence in the recording device can learn the user's preference, so that TV programs that suit for the user's preference can be recorded automatically.

The electronic device and its functions, an application example of the artificial intelligence and its effects, and the like described in this embodiment can be combined as appropriate with the description of another electronic device.

The structures, methods, and the like described in this embodiment can be appropriately combined with structures, methods, and the like of other embodiments and examples.

Example 1

In this example, insulators of embodiments of the present invention were deposited and analyzed by TDS. Note that four kinds of samples were fabricated in this example: Sample A, Sample B, Sample C, and Sample D.

<Structure and Fabrication Method of Samples>

Figure 50A:
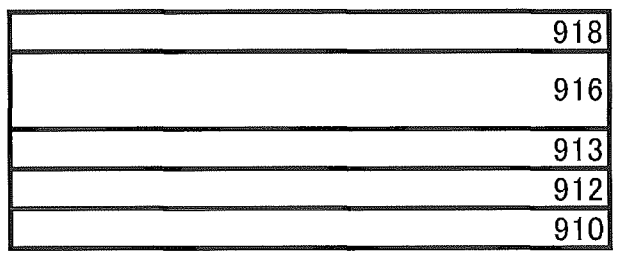
FIG. 50A is a schematic view of samples and FIG. 50B shows the TDS analysis results.

Samples A to D each of which is one embodiment of the present invention are described below. First, the structure of the samples is illustrated in FIG. 50A. Each sample includes a substrate 910, an insulator 912 over the substrate 910, an insulator 913 over the insulator 912, an insulator 916 over the insulator 913, an insulator 918 over the insulator 916.

Here, the deposition conditions of the insulator 918 are different between Samples A to D. The table below shows the flow rate ratios of the deposition gases in the deposition of the insulators 918 in Samples A to D.

TABLE 2

|  | Flow rate ratio of deposition gases in deposition of 918 |
|---|---|
| Sample A | Ar:O$_2$ = 10:0 |
| Sample B | Ar:O$_2$ = 9:1 |
| Sample C | Ar:O$_2$ = 5:5 |
| Sample D | Ar:O$_2$ = 5:5 (deposited twice) |

Next, methods for fabricating the samples will be described.

First, a silicon substrate was prepared as the substrate 910. Then, a 100-nm-thick thermal oxide film was formed as the insulator 912 over the substrate 910.

Then, aluminum oxide was deposited to a thickness of 5 nm as the insulator 913 over the insulator 912 by an ALD method.

Then, the insulator 916 was formed over the insulator 913. As the insulator 916, a 100-nm-thick silicon oxide film was formed by a plasma CVD method. Silane (SiH$_4$) at a flow rate of 5 sccm and dinitrogen monoxide (N$_2$O) at a flow rate of 1000 sccm were used in the deposition. The pressure of a reaction chamber was 133.3 Pa, the deposition temperature was 325° C., and a high-frequency (RF) power of 45 W (13.56 MHz) was applied during the deposition.

Then, aluminum oxide was deposited to a thickness of 40 nm as the insulator 918 over the insulator 916. The insulator 918 was formed by a sputtering method using an Al$_2$O$_3$ target in a mixed atmosphere of oxygen (O$_2$) and argon (Ar). The pressure of the reaction chamber was 0.4 Pa, the deposition temperature was 250° C., and the deposition power was 2.5 kW (RF) during the deposition.

Note that in Sample D, a first aluminum oxide film was formed and then removed by CMP treatment, and after that, the insulator 918 was formed under the same conditions.

Through the above process, the samples of this example were fabricated.

<TDS Measurement Results of Samples>

Figure 50B:
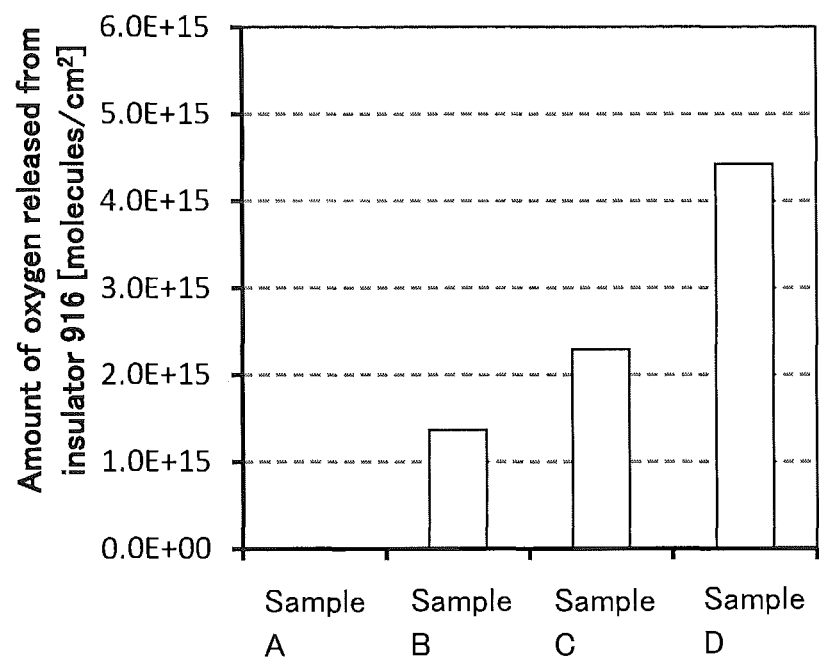

In each of Samples A to D, the insulator 918 was removed and then, the amount of oxygen released from the insulator 916 was measured. In the TDS analysis, the amount of a released gas with a mass-to-charge ratio m/z of 32, which corresponds to an oxygen molecule, was measured. The TDS analysis was conducted with TDS1200II manufactured by ESCO Ltd. at a heating rate of 30° C./min. FIG. 50B shows the measurement results.

FIG. 50B shows the amount of released oxygen (O$_2$) [molecules/cm$^2$] when the samples were heated to 600° C. Accordingly, the vertical axis in FIG. 50B represents the amount of released oxygen (O$_2$) [molecules/cm$^2$].

Note that the lowest temperature in the temperature range was the temperature at which release of the gas was observed (approximately 40° C. or higher). Thus, the amount of a released gas at the lower measurement limit or below is not included. That is, 0.0 [molecules/cm$^2$] in the graph means that the amount of release is at the lower measurement limit or below.

As shown in FIG. 50B, the amount of excess oxygen of the insulator 916 of Sample A was that at the lower measurement limit or below. The amount of excess oxygen of the insulator 916 of Sample B was 1.4×10$^{15}$ [molecules/cm$^2$]. The amount of excess oxygen of the insulator 916 of Sample C was 2.3×10$^{15}$ [molecules/cm$^2$]. The amount of excess oxygen of the insulator 916 of Sample D was 4.4×10$^{15}$ [molecules/cm$^2$].

From FIG. 50B, it is confirmed that deposition of the insulator 918 in a mixed atmosphere containing an oxygen gas can form an excess oxygen region in the insulator 916. It is also shown that the higher the oxygen flow rate ratio of the deposition gas for the insulator 918 is, the larger the amount of the excess oxygen contained in the insulator 916 is.

Comparison between Sample C and Sample D shows that the amount of excess oxygen contained in the insulator 916 is larger when a film corresponding to the insulator 918 is formed and removed and then the insulator 918 is formed. In other words, it is shown that the excess oxygen region in the insulator 916 is formed during the formation of the insulator 918. It is thus suggested that the amount of excess oxygen contained in the insulator 916 can be controlled by repeating formation of an insulating film with the use of an oxygen-containing deposition gas and removal of the insulating film multiple times.

The structure described in this example can be combined as appropriate with any of the other examples and embodiments.

Example 2

In this example, insulators of embodiments of the present invention were deposited and analyzed by SIMS. Note that 20 kinds of samples were fabricated in this example.

<Structure and Fabrication Method of Samples>

Figure 51:
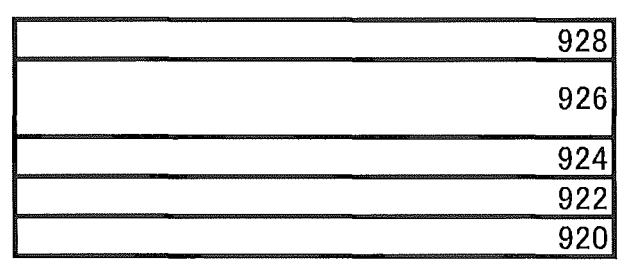

The 20 kinds of samples each of which is one embodiment of the present invention are described below. First, the structure of the samples is illustrated in FIG. 51. Each sample includes a substrate 920, an insulator 922 over the substrate 920, an oxide 924 over the insulator 922, an insulator 926 over the oxide 924, and an insulator 928 over the insulator 926.

Here, the 20 kinds of samples were fabricated by combination of the deposition conditions of the insulator 928 (four conditions) and the conditions of heat treatment following the deposition of the insulator 928 (five conditions).

Note that the samples are sorted into four groups according to the deposition conditions of the insulator 928: a Sample A group (Samples A1 to A5), a Sample B group (Samples B1 to B5), a Sample C group (Samples C1 to C5), and a Sample D group (Samples D1 to D5). Note also that the samples are sorted into five groups according to the heat treatment conditions: a Sample 1 group (Sample A1, Sample B1, Sample C1, and Sample D1), a Sample 2 group (Sample A2, Sample B2, Sample C2, and Sample D2), a Sample 3 group (Sample A3, Sample B3, Sample C3, and Sample D3), a Sample 4 group (Sample A4, Sample B4, Sample C4, and Sample D4), and a Sample 5 group (Sample A5, Sample B5, Sample C5, and Sample D5).

The table below shows the flow rate ratios of the deposition gases in the deposition of the insulator 928 and the set temperatures and the durations of the heat treatment after the deposition of the insulator 928 in the 20 kinds of samples.

TABLE 3

| | Flow rate ratio of deposition gas in deposition of 928 | Temperature and time of heat treatment |
|---|---|---|
| Sample A1 | Ar:$O_2$ = 10:0 | — |
| Sample B1 | Ar:$O_2$ = 9:1 | — |
| Sample C1 | Ar:$O_2$ = 5:5 | — |
| Sample D1 | Ar:$O_2$ = 5:5 (deposited twice) | — |
| Sample A2 | Ar:$O_2$ = 10:0 | 300° C. 1 hr |
| Sample B2 | Ar:$O_2$ = 9:1 | 300° C. 1 hr |
| Sample C2 | Ar:$O_2$ = 5:5 | 300° C. 1 hr |
| Sample D2 | Ar:$O_2$ = 5:5 (deposited twice) | 300° C. 1 hr |
| Sample A3 | Ar:$O_2$ = 10:0 | 350° C. 1 hr |
| Sample B3 | Ar:$O_2$ = 9:1 | 350° C. 1 hr |
| Sample C3 | Ar:$O_2$ = 5:5 | 350° C. 1 hr |
| Sample D3 | Ar:$O_2$ = 5:5 (deposited twice) | 350° C. 1 hr |
| Sample A4 | Ar:$O_2$ = 10:0 | 400° C. 1 hr |
| Sample B4 | Ar:$O_2$ = 9:1 | 400° C. 1 hr |
| Sample C4 | Ar:$O_2$ = 5:5 | 400° C. 1 hr |
| Sample D4 | Ar:$O_2$ = 5:5 (deposited twice) | 400° C. 1 hr |
| Sample A5 | Ar:$O_2$ = 10:0 | 400° C. 8 hr |
| Sample B5 | Ar:$O_2$ = 9:1 | 400° C. 8 hr |
| Sample C5 | Ar:$O_2$ = 5:5 | 400° C. 8 hr |
| Sample D5 | Ar:$O_2$ = 5:5 (deposited twice) | 400° C. 8 hr |

Next, methods for fabricating the samples will be described.

First, a silicon substrate was prepared as the substrate 920. Then, a 100-nm-thick thermal oxide film was formed as the insulator 922 over the substrate 920.

Then, In—Ga—Zn oxide was deposited to a thickness of 50 nm as the oxide 924 over the insulator 922. The oxide 924 was deposited by a sputtering method using a target with an atomic ratio of In:Ga:Zn=4:2:4.1 in a mixed atmosphere of oxygen ($O_2$) and argon (Ar). The pressure of the reaction chamber was 0.4 Pa, the deposition temperature was room temperature, and the deposition power was 200 W (DC) during the deposition.

Note that the mixed atmosphere used in the deposition of the oxide 924 had an oxygen ($O_2$) flow rate ratio of 33%. Here, 5% deuterium (D) was added to argon (Ar) used in the deposition gas.

Then, the insulator 926 was formed over the oxide 924. As the insulator 926, a 110-nm-thick silicon oxide film was formed by a plasma CVD method. Silane ($SiH_4$) at a flow rate of 5 sccm and dinitrogen monoxide ($N_2O$) at a flow rate of 1000 sccm were used in the deposition. The pressure of a reaction chamber was 133.3 Pa, the deposition temperature was 325° C., and a high-frequency (RF) power of 45 W (13.56 MHz) was applied during the deposition.

Then, aluminum oxide was deposited to a thickness of 40 nm as the insulator 928 over the insulator 926. The insulator 928 was formed by a sputtering method using an $Al_2O_3$ target in a mixed atmosphere of oxygen ($O_2$) and argon (Ar). The pressure of the reaction chamber was 0.4 Pa, the deposition temperature was 250° C., and the deposition power was 2.5 kW (RF) during the deposition.

Note that in the Sample D group (Sample D1, Sample D2, Sample D3, and Sample D4), a first aluminum oxide film was formed and then removed by CMP treatment, and after that, the insulator 928 was formed under the same conditions.

Next, heat treatment was performed in a nitrogen atmosphere under the conditions listed in the above table.

Through the above process, the samples of this example were fabricated.

<SIMS Measurement Results of Samples>

SIMS analysis was conducted with the insulator 928, the insulator 926, and the oxide 924 in the samples used as layers on which quantitation was performed, to measure deuterium (D) concentration. The profiles of the layers on which quantitation was performed were obtained by this measurement; FIGS. 52A and 52B, FIGS. 53A and 53B, FIG. 54, and FIGS. 55A to 55C show the superimposed profiles. The hydrogen concentration was measured with the use of a quadrupole SIMS apparatus ADEPT1010 produced by ULVAC-PHI, Inc. as an analysis apparatus.

Note that the deuterium (D) detected in this SIMS analysis is the deuterium (D) that was mixed during the deposition of the oxide 924. Therefore, the deuterium (D) detected in the insulator 926 and the insulator 928 over the oxide 924 is probably the deuterium (D) that diffused from the oxide 924.

According to the results of the above example, in the 20 kinds of samples, the descending order of the amount of excess oxygen contained in the insulator 926 is probably as follows: the Sample D group, the Sample C group, the Sample B group, and the Sample A group.

Figure 52A:
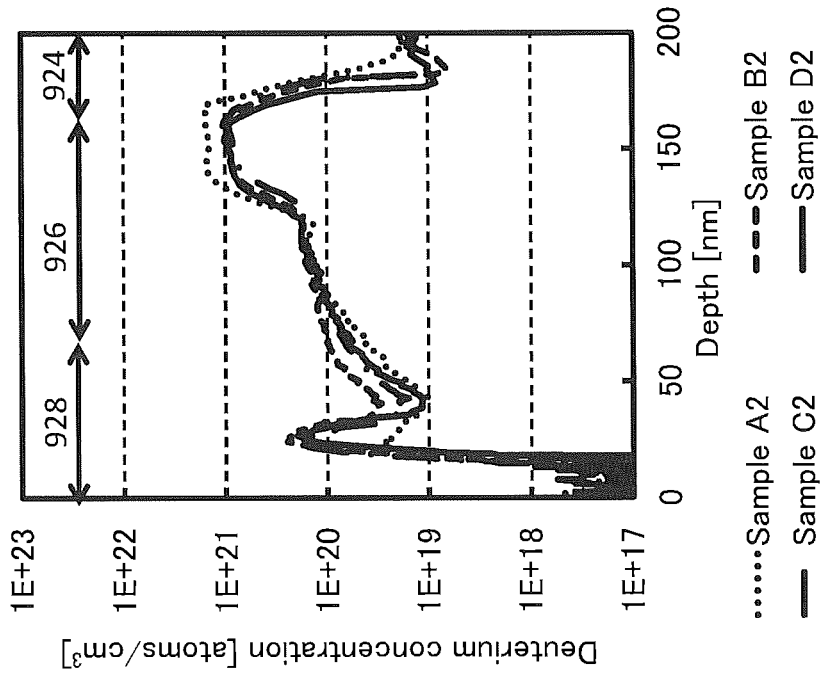
FIGS. 52A and 52B show SIMS analysis results.
Figure 52B:
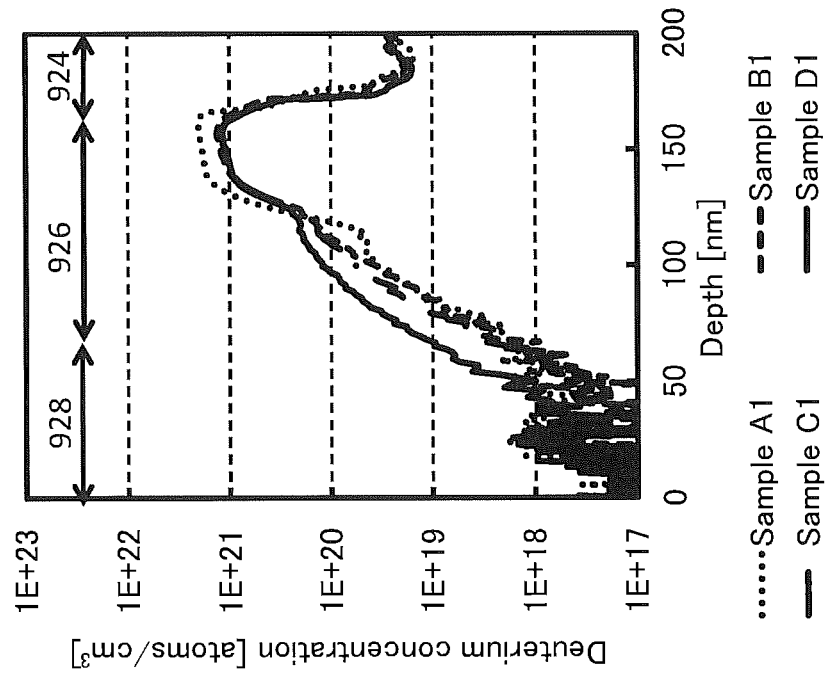
Figure 53A:
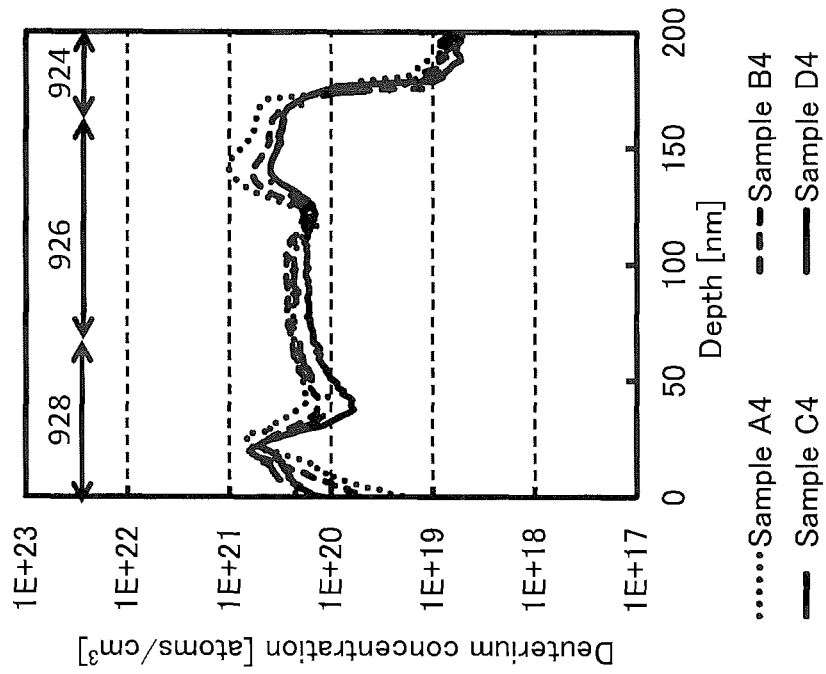
FIGS. 53A and 53B show SIMS analysis results.
Figure 53B:
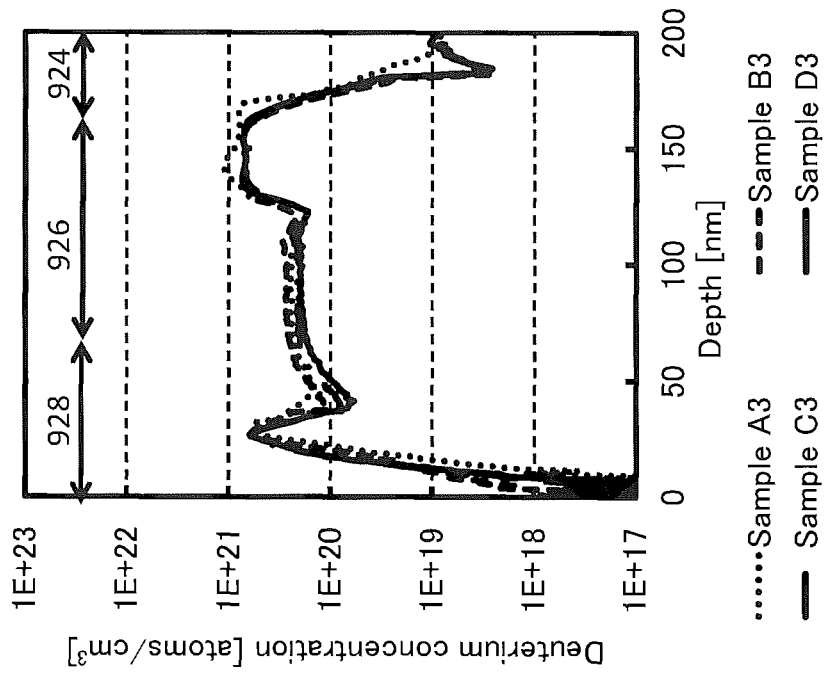
Figure 54:
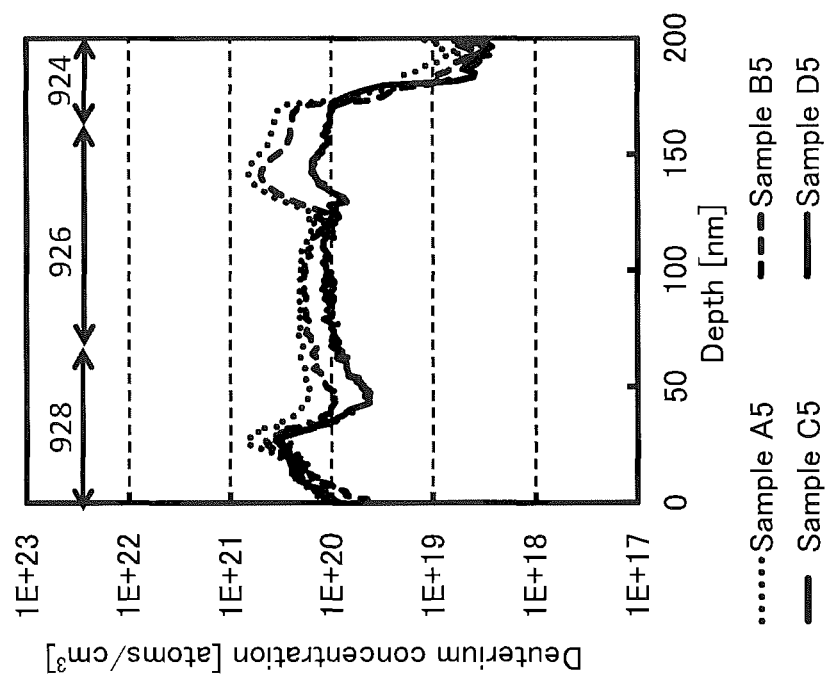
FIG. 54 shows SIMS analysis results.

FIG. 52A shows the deuterium (D) concentration profiles in the depth direction of the films of the Sample 1 group. FIG. 52B shows the deuterium (D) concentration profiles in the depth direction of the films of the Sample 2 group. FIG. 53A shows the deuterium (D) concentration profiles in the depth direction of the films of the Sample 3 group. FIG. 53B shows the deuterium (D) concentration profiles in the depth direction of the films of the Sample 4 group. FIG. 54 shows the deuterium (D) concentration profiles in the depth direction of the films of the Sample 5 group.

FIGS. 52A and 52B and FIGS. 53A and 53B show that the deuterium in the oxide 924 more easily diffuses when the insulator 926 contains a larger amount of excess oxygen. Specifically, comparison between the samples in which the oxygen flow rate ratio in the deposition of the insulator 928 is higher than or equal to 10% (the Sample B group, the Sample C group, and the Sample D group) and the samples in which the oxygen flow rate ratio is 0% (the Sample A group) clearly shows this tendency.

Comparison of FIG. 52A with FIG. 52B, and FIGS. 53A and 53B demonstrates that performing heat treatment on the samples decreases the deuterium concentration of the oxide 924 and increases the deuterium concentration of the insulator 928. In other words, it is shown that hydrogen in the oxide 924 diffuses to the insulator 928 by the heat treatment, leading to the decreased hydrogen concentration of the oxide 924.

When the oxygen flow rate ratio in the deposition of the insulator 928 is higher than or equal to 50% (the Sample C group and the Sample D group) and the heat treatment temperature is higher than or equal to 350° C., a decrease in the deuterium concentration of the oxide 924 and an increase in the deuterium concentration of the insulator 928 are significant.

Figure 55A:
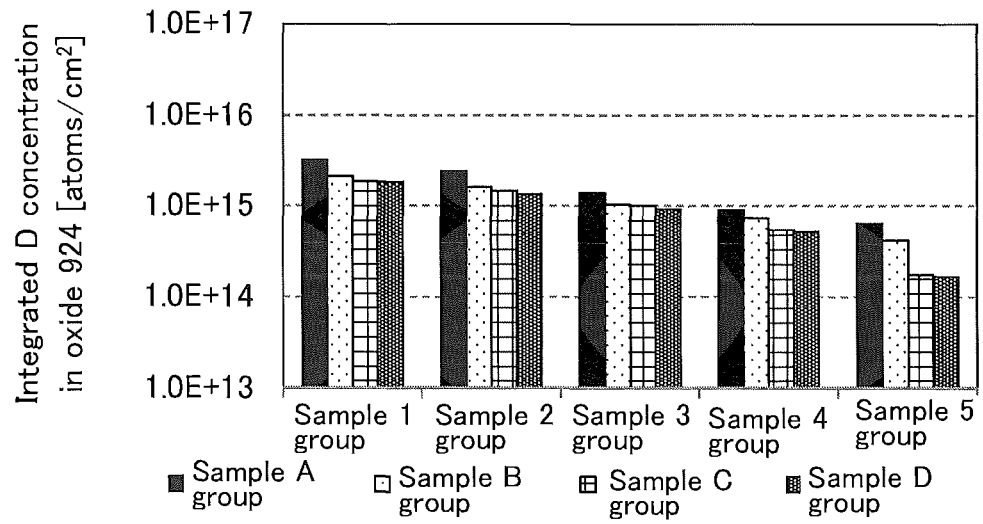
FIGS. 55A to 55C explain integral values of hydrogen concentrations of components.
Figure 55B:
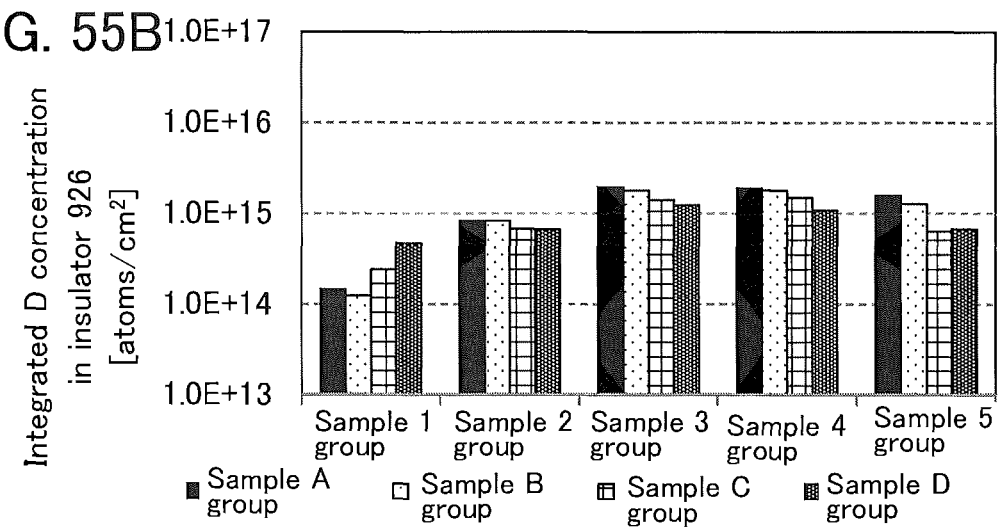
Figure 55C:
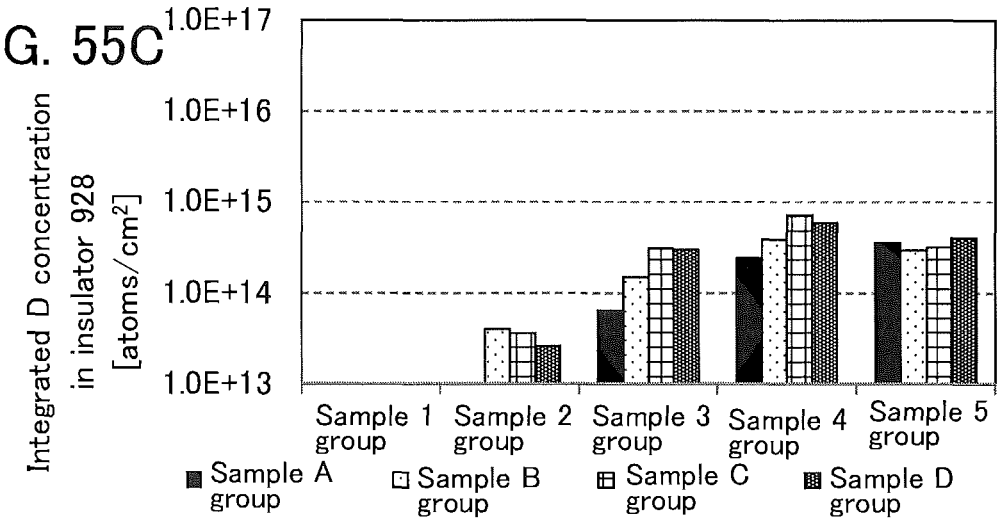

The deuterium concentrations of the oxide 924, the insulator 926, and the insulator 928 were integrated using the SIMS profiles shown in FIGS. 52A and 52B, FIGS. 53A and 53B, and FIG. 54, and the results are shown in FIGS. 55A to 55C.

FIG. 55A shows the integral values of the deuterium (D) concentrations of the oxide 924. FIG. 55B shows the integral values of the deuterium (D) concentrations of the insulator 926. FIG. 55C shows the integral values of the deuterium (D) concentrations of the insulator 928. Note that the integral values were each calculated by using a region of each structure body where the profile of the main component is stable.

FIG. 55A shows that a larger amount of excess oxygen in the insulator 926 or a higher oxygen flow rate ratio in the deposition of the insulator 928 leads to a lower deuterium (D) concentration of the oxide 924. It is also shown that a higher heat treatment temperature leads to a lower deuterium (D) concentration of the oxide 924. It is also shown that a longer heat treatment time leads to a lower deuterium (D) concentration of the oxide 924.

FIG. 55B shows that a larger amount of excess oxygen in the insulator 926 or a higher oxygen flow rate ratio in the deposition of the insulator 928 leads to a lower deuterium (D) concentration of the insulator 926. In contrast, it is also shown that a higher heat treatment temperature leads to a higher deuterium (D) concentration of the insulator 926. Specifically, it is shown that the heat treatment is preferably performed 350° C. or higher.

FIG. 55C shows that a larger amount of excess oxygen in the insulator 926 or a higher oxygen flow rate ratio in the deposition of the insulator 928 leads to a higher deuterium (D) concentration of the insulator 928. It is also shown that a higher heat treatment temperature leads to a higher deuterium (D) concentration of the insulator 928. Specifically, it is shown that the higher the heat treatment temperature, the better. At the same time, it is shown that the deuterium (D) concentration of the insulator 928 tends to be leveled at a longer heat treatment time.

From the above, it is confirmed that a larger amount of excess oxygen in the insulator 926 close to the oxide 924 or a higher oxygen flow rate ratio in the deposition of the insulator 928 leads to a lower deuterium (D) concentration of the oxide 924. It is also shown that the heat treatment decreases the deuterium (D) concentration of the oxide 924 and increases the deuterium (D) concentration of the insulator 928.

It is thus confirmed that hydrogen in the oxide 924 diffuses to the insulator 928 through the insulator 926. In other words, hydrogen in the oxide 924 is probably trapped or fixed (gettered) in the insulator 928. Moreover, it is suggested that depending on the heat treatment conditions, hydrogen in the oxide 924 can diffuse outward through the insulator 926 and the insulator 928.

The above results demonstrate that excess oxygen in the insulator 926 affects diffusion of hydrogen in the insulator 926 and the film in contact with the insulator 926. It is also shown that the hydrogen diffusion coefficient of the insulator 928 might depend on the film property of the insulator 928. In addition, it is also shown that the film property of the insulator 928 might affect the amount of hydrogen trapped or fixed. Moreover, it is shown that hydrogen in the oxide 924 might diffuse outward through the insulator 926 and the insulator 928.

This example shows that hydrogen in an oxide can be reduced by being trapped or fixed in an insulator positioned near the oxide. Furthermore, it is shown that hydrogen in the oxide can diffuse outward through the insulator close to the oxide in a later step. Thus, hydrogen in the oxide that has been mixed during a step after the treatment for the deposition of the oxide, such as deposition steps of oxides and insulators, can be removed or reduced in a later step.

That is, when an oxide semiconductor is used, a film close to the oxide semiconductor is preferably a film including an excess oxygen region. Alternatively, the oxide semiconductor is preferably provided with a film that traps or fixes hydrogen, with a film including an excess oxygen region provided between the oxide semiconductor and the film that traps or fixes hydrogen. Further alternatively, hydrogen in the oxide semiconductor is preferably made to diffuse outward through an insulator by heat treatment or the like.

Specifically, aluminum oxide or the like is preferably provided near the oxide semiconductor in a state where a silicon oxynitride film or the like including an excess oxygen region is provided between the aluminum oxide or the like and the oxide semiconductor. It is also preferable that heat treatment be performed after aluminum oxide or the like is provided near the oxide semiconductor in a state where a silicon oxynitride film or the like including an excess oxygen region is provided between the aluminum oxide or the like and the oxide semiconductor.

When the above structure is employed, a semiconductor device using an oxide with a reduced hydrogen concentration can be provided. Therefore, a highly reliable semiconductor device can be provided. One embodiment of the present invention can provide a semiconductor device with favorable electrical characteristics.

The structure described in this example can be combined as appropriate with any of the other examples and embodiments.

Example 3

In this example, insulators of embodiments of the present invention were deposited, analyzed by SIMS, and subjected to image analysis. Note that 12 kinds of samples were fabricated in this example.

<Structure and Fabrication Method of Samples>

The 12 kinds of samples each of which is one embodiment of the present invention are described below. First, the structure of the samples is illustrated in FIG. 56. Each sample includes a substrate 930, an insulator 932 over the substrate 930, an oxide 934 over the insulator 932, an insulator 936 over the oxide 934, an insulator 938 over the insulator 936, and an insulator 939 over the insulator 938.

Here, the 12 kinds of samples were fabricated by combination of the deposition conditions of the insulator 938 (three conditions), the conditions of heat treatment following the deposition of the insulator 938 (three conditions), and the presence or absence of the insulator 939 (two conditions).

Note that the samples are sorted into four groups according to the deposition conditions of the insulator 938 and the presence or absence of the insulator 939: a Sample E group (Samples 1E, 4E, and 5E), a Sample F group (Samples 1F, 4F, and 5F), a Sample G group (Samples 1G, 4G, and 5G), and a Sample H group (Samples 1H, 4H, and 5H). In addition, the samples are sorted into three groups according to the heat treatment conditions: a Sample 1 group (Samples 1E, 1F, 1G, and 1H), a Sample 4 group (Samples 4E, 4F, 4G, and 4H), and a Sample 5 group (Samples 5E, 5F, 5G, and 5H).

The table below shows the set temperatures and heating time of the heat treatment after the deposition of the insulator 938, the thicknesses of the insulator 938, and the presence or absence of the insulator 939 in the 12 kinds of samples.

TABLE 4

|  | Heat treatment | Thickness of insulator 938 | Presence or absence of insulator 939 |
| --- | --- | --- | --- |
| Sample 1E | — | 40 [nm] | Absent |
| Sample 4E | 400° C. 1 hr | 40 [nm] | Absent |
| Sample 5E | 400° C. 8 hr | 40 [nm] | Absent |
| Sample 1F | — | 40 [nm] | Present |
| Sample 4F | 400° C. 1 hr | 40 [nm] | Present |
| Sample 5F | 400° C. 8 hr | 40 [nm] | Present |
| Sample 1G | — | 20 [nm] | Present |
| Sample 4G | 400° C. 1 hr | 20 [nm] | Present |
| Sample 5G | 400° C. 8 hr | 20 [nm] | Present |
| Sample 1H | — | 80 [nm] | Present |
| Sample 4H | 400° C. 1 hr | 80 [nm] | Present |
| Sample 5H | 400° C. 8 hr | 80 [nm] | Present |

Next, methods for fabricating the samples will be described.

First, a silicon substrate was prepared as the substrate 930. Then, a 100-nm-thick thermal oxide film was formed as the insulator 932 over the substrate 930.

Then, In—Ga—Zn oxide was deposited to a thickness of 50 nm as the oxide 934 over the insulator 932. The oxide 934 was deposited by a sputtering method using a target with an atomic ratio of In:Ga:Zn=4:2:4.1 in a mixed atmosphere of oxygen ($O_2$) and argon (Ar). The pressure of the reaction chamber was 0.4 Pa, the deposition temperature was room temperature, and the deposition power was 200 W (DC) during the deposition.

Note that the mixed atmosphere used in the deposition of the oxide 934 had an oxygen ($O_2$) flow rate ratio of 33%. Here, 5% deuterium (D) was added to argon (Ar) used in the deposition gas.

Then, the insulator 936 was formed over the oxide 934. As the insulator 936, a 110-nm-thick silicon oxide film was formed by a plasma CVD method. Silane ($SiH_4$) at a flow rate of 5 sccm and dinitrogen monoxide ($N_2O$) at a flow rate of 1000 sccm were used in the deposition. The pressure of a reaction chamber was 133.3 Pa, the deposition temperature was 325° C., and a high-frequency (RF) power of 45 W (13.56 MHz) was applied during the deposition.

Then, aluminum oxide was deposited to a predetermined thickness as the insulator 938 over the insulator 936. The insulator 938 was formed by a sputtering method using an $Al_2O_3$ target in a mixed atmosphere of oxygen ($O_2$) with a flow rate ratio of 50% and argon (Ar) with a flow rate ratio of 50%. The pressure of the reaction chamber was 0.4 Pa, the deposition temperature was 250° C., and the deposition power was 2.5 kW (RF) during the deposition.

Next, heat treatment was performed in a nitrogen atmosphere under the conditions listed in the above table.

Next, a 20-nm-thick silicon nitride film was formed by a sputtering method as the insulator 939 over the insulator 938.

Through the above process, the samples of this example were fabricated.

<SIMS Measurement Results of Samples>

SIMS analysis was conducted with the insulator 939, the insulator 938, the insulator 936, and the oxide 934 in the samples used as layers on which quantitation was performed, to measure deuterium (D) concentration. The profiles of the layers on which quantitation was performed were obtained by this measurement; FIGS. 57A and 57B and FIGS. 58A and 58B show the superimposed profiles. The hydrogen concentration was measured with the use of a quadrupole SIMS apparatus ADEPT1010 produced by ULVAC-PHI, Inc. as an analysis apparatus.

Note that the deuterium (D) detected in this SIMS analysis is the deuterium (D) that was mixed during the deposition of the oxide 934. Therefore, the deuterium (D) detected in the insulator 936 and the insulator 938 over the oxide 934 is probably the deuterium (D) that diffused from the oxide 934.

Figure 57B:
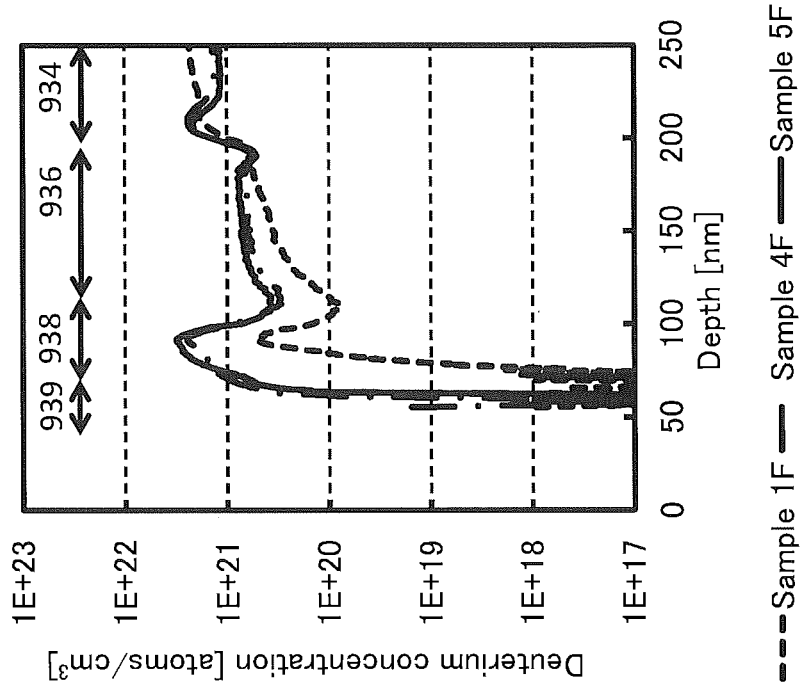
FIGS. 57A and 57B show SIMS analysis results of samples of Example.
Figure 57A:
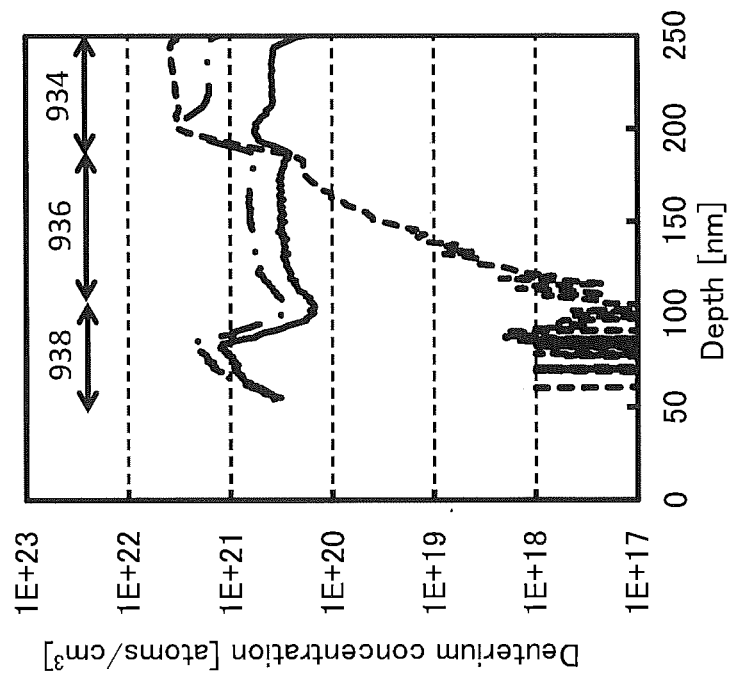

FIG. 57A shows the deuterium (D) concentration profiles in the depth direction of the films of the Sample E group. FIG. 57B shows the deuterium (D) concentration profiles in the depth direction of the films of the Sample F group. FIG. 58A shows the deuterium (D) concentration profiles in the depth direction of the films of the Sample G group.

From FIG. 57A and FIG. 57B, it is confirmed that the insulator 939 has a barrier property against hydrogen. The hydrogen concentration of the oxide 934 was not significantly changed by setting the heat treatment time longer.

In contrast, in the case where the film with a barrier property (the insulator 939) was not provided, performing the heat treatment for a longer time considerably reduced the hydrogen concentration of the oxide 934 as shown in FIG. 57A. It is thus presumable that hydrogen in the oxide 934 diffused outward through the insulator 936 and the insulator 938 (outward diffusion) and thus the total amount of hydrogen decreased in the Sample E group.

Figure 58B:
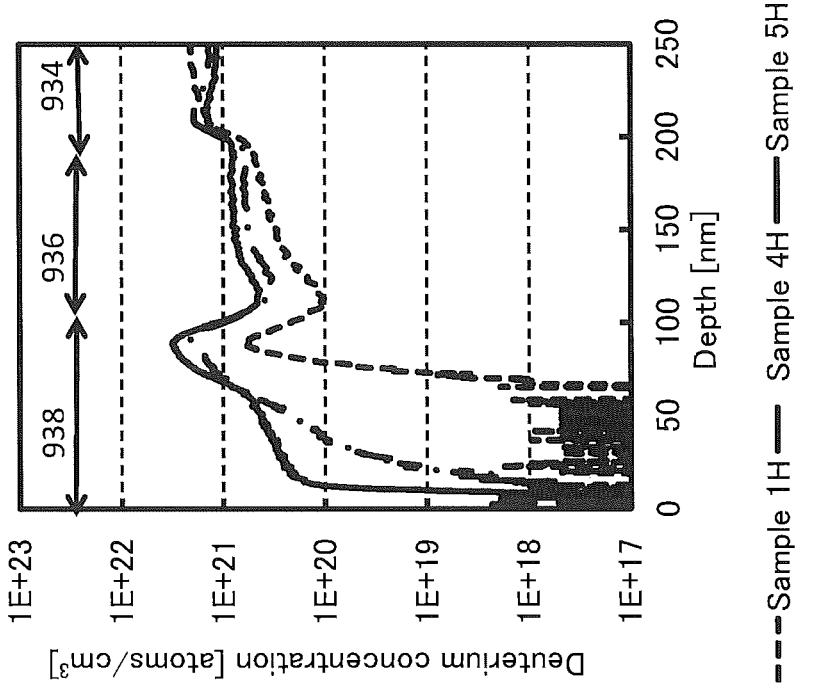
FIGS. 58A and 58B show SIMS analysis results of samples of Example.
Figure 58A:
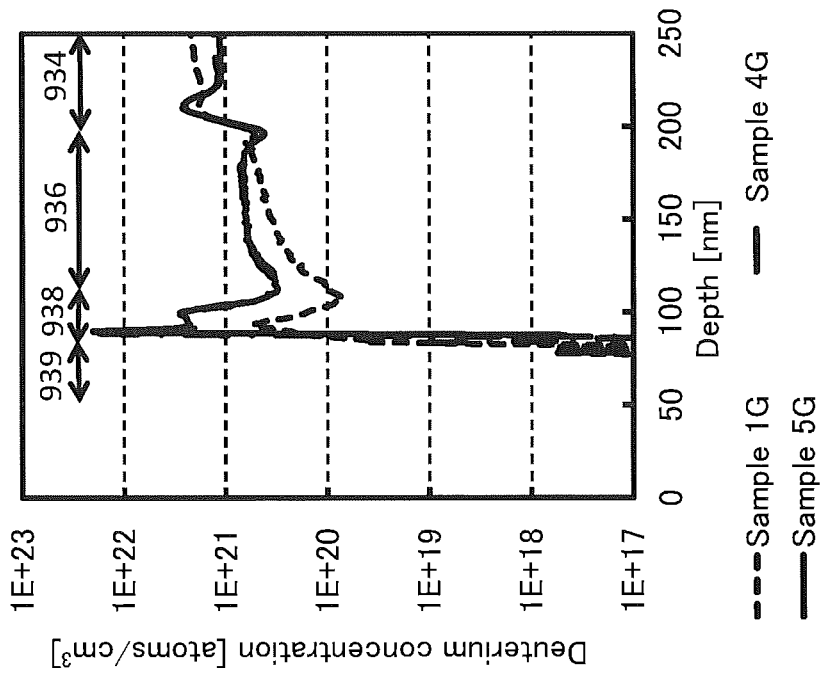

From FIG. 57B, FIG. 58A, and FIG. 58B, it is confirmed that the heat treatment causes diffusion of deuterium in the insulator 938 to the insulator 939 side.

Comparison between FIG. 57B and FIG. 58A shows that the insulators 938 have almost the same deuterium concentration. It is presumable that the deuterium concentration of the insulators 938 saturated since the insulators 938 are relatively thin (20 nm and 40 nm).

In contrast, from FIG. 58B, it can be assumed that when the insulator 938 is relatively thick, e.g., 80 nm, a longer heat treatment time promotes diffusion of deuterium in the insulator 938.

Specifically, in Sample 5H where the heat treatment time was eight hours, the deuterium concentration has a local maximum value in the insulator 938. More specifically, a region close to the insulator 936 has a relatively high deuterium concentration and a region close to the insulator 939 has a low deuterium concentration.

That is, in the insulator 938 of Sample 5H, a region with a high deuterium concentration lies on the insulator 936 side rather than the insulator 939 side.

In view of this, film structures that correspond to the Sample G group (the thickness of the insulator 938: 20 nm), the Sample F group (the thickness of the insulator 938: 40 nm), and the Sample H group (the thickness of the insulator 938: 80 nm) were formed and cross-sectional observation was performed. The cross-sectional observation was performed with a scanning transmission electron microscope (STEM). For the observation, HD-2700 manufactured by Hitachi High-Technologies Corporation was used.

As a film corresponding to the insulator 938, an aluminum oxide film with a predetermined thickness was formed. The insulator 938 was formed by a sputtering method using an Al₂O₃ target in a mixed atmosphere of oxygen (O₂) with a flow rate ratio of 50% and argon (Ar) with a flow rate ratio of 50%. The pressure of the reaction chamber was 0.4 Pa, the deposition temperature was 250° C., and the deposition power was 2.5 kW (RF) during the deposition.

Figure 59A:
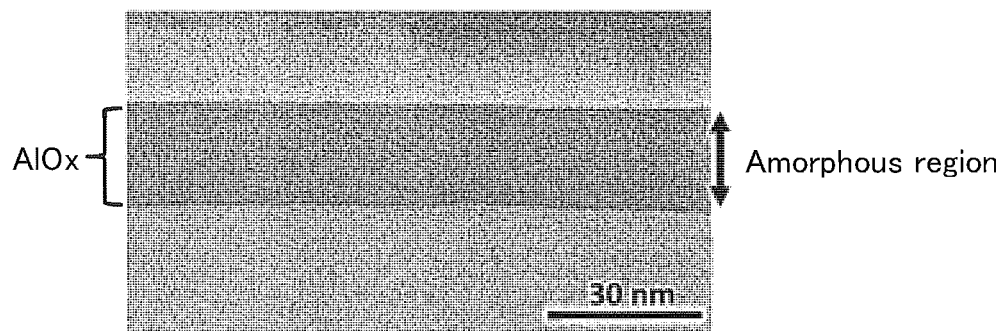
FIGS. 59A to 59C show cross sections of samples.
Figure 59B:
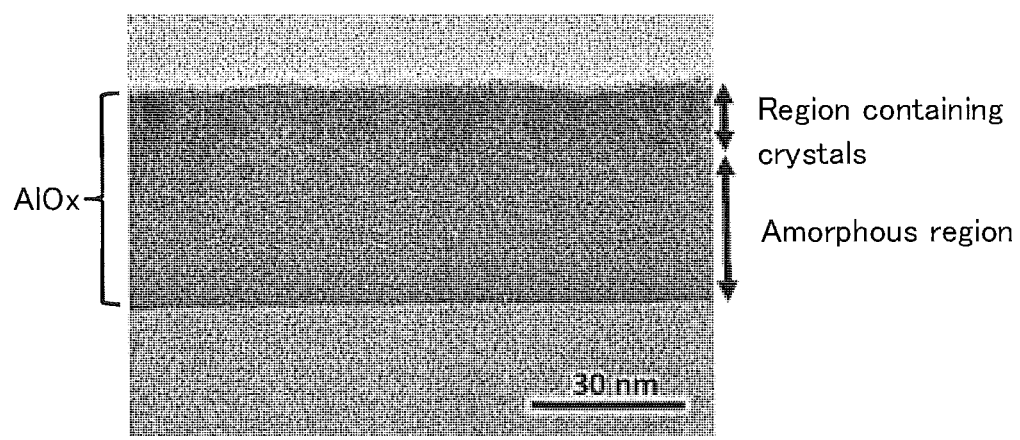
Figure 59C:
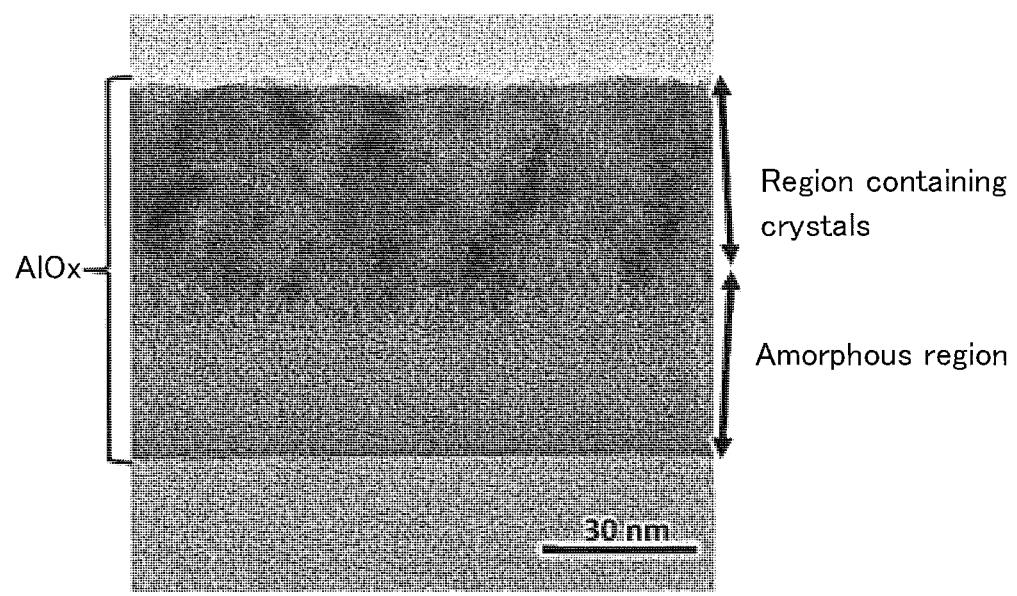

FIG. 59A shows a cross-sectional photograph of a 20-nm-thick aluminum oxide film. FIG. 59B shows a cross-sectional photograph of a 40-nm-thick aluminum oxide film. FIG. 59C shows a cross-sectional photograph of a 80-nm-thick aluminum oxide film.

As shown in FIG. 59A, only an amorphous region was observed in the 20-nm-thick aluminum oxide film (measured thickness: 20.3 nm).

Meanwhile, it is confirmed in each of FIG. 59A and FIG. 59B, that the film property of the aluminum oxide film changes in a region 25 nm or more and 30 nm or less distant from the deposition starting point. In other words, it is confirmed that the film property in a region 25-30 nm or less distant from the deposition starting point is different from the film property in a region 25-30 nm or more distant from the deposition starting point.

Specifically, as shown in FIG. 59B, a non-crystalline region lies in the lower portion of the 40-nm-thick aluminum oxide film (measured thickness: 41.9 nm), and a region containing crystals lies in the upper portion of the aluminum oxide film. In FIG. 59B, the measured thickness of the amorphous region was 28.7 nm and the measured thickness of the region containing crystals was 13.2 nm.

Furthermore, as shown in FIG. 59C, a non-crystalline region lies in the lower portion of the 80-nm-thick aluminum oxide film (measured thickness: 73.1 nm), and a region containing crystals lies in the upper portion of the aluminum oxide film. In FIG. 59C, the measured thickness of the amorphous region was 27.5 nm and the measured thickness of the region containing crystals was 45.7 nm.

Therefore, the deuterium concentration of the insulator 938 in Sample 5H had the local maximum value highly probably because an amorphous layer and a crystal layer were stacked in the insulator 938, and it is thus presumable that deuterium diffuses in amorphous aluminum oxide at a higher concentration than aluminum oxide containing crystals. In other words, amorphous aluminum oxide probably stores more hydrogen than aluminum oxide containing crystals.

It is thus confirmed that the insulator 938 stores a larger amount of hydrogen when having lower crystallinity. It is also confirmed that the insulator 938 has a higher barrier property against hydrogen when having higher crystallinity.

It is thus probable that the amorphous insulator 938 or the insulator 938 with lower crystallinity traps or fixes (or getters) a larger amount of hydrogen than the insulator 938 with higher crystallinity. On the other hand, the insulator 938 with higher crystallinity inhibits hydrogen diffusion, i.e., has a higher barrier property against hydrogen, than the amorphous insulator 938 or the insulator 938 with lower crystallinity.

This example shows that hydrogen in an oxide can be reduced by being trapped or fixed in an insulator positioned near the oxide. Furthermore, it is shown that hydrogen in the oxide can diffuse outward through the insulator close to the oxide in a later step. Thus, hydrogen in the oxide that has been mixed during a step after the treatment for the deposition of the oxide, such as deposition steps of oxides and insulators, can be removed or reduced in a later step.

That is, when an oxide semiconductor is used, a film close to the oxide semiconductor is preferably a film including an excess oxygen region. Alternatively, the oxide semiconductor is preferably provided with a film that traps or fixes hydrogen, with a film including an excess oxygen region provided between the oxide semiconductor and the film that traps or fixes hydrogen. Further alternatively, hydrogen in the oxide semiconductor is preferably made to diffuse outward through an insulator by heat treatment or the like.

Specifically, aluminum oxide or the like is preferably provided near the oxide semiconductor in a state where a silicon oxynitride film or the like including an excess oxygen region is provided between the aluminum oxide or the like and the oxide semiconductor. It is also preferable that heat treatment be performed after aluminum oxide or the like is provided near the oxide semiconductor in a state where a silicon oxynitride film or the like including an excess oxygen region is provided between the aluminum oxide or the like and the oxide semiconductor.

When the above structure is employed, a semiconductor device using an oxide with a reduced hydrogen concentration can be provided. Therefore, a highly reliable semiconductor device can be provided. One embodiment of the present invention can provide a semiconductor device with favorable electrical characteristics.

The structure described in this example can be combined as appropriate with any of the other examples and embodiments.

This application is based on Japanese Patent Application Serial No. 2018-248150 filed with Japan Patent Office on Dec. 28, 2018 and Japanese Patent Application Serial No. 2019-011158 filed with Japan Patent Office on Jan. 25, 2019, the entire contents of which are hereby incorporated by reference.

What is claimed is:

1. A semiconductor device comprising:
    a first insulator;
    a first oxide semiconductor over the first insulator;
    a source electrode and a drain electrode over the first oxide semiconductor;
    a second oxide semiconductor over the first oxide semiconductor and between the source electrode and the drain electrode;
    a gate insulator over the second oxide semiconductor and between the source electrode and the drain electrode; and
    a gate electrode over the gate insulator and between the source electrode and the drain electrode;
    a second insulator over the source electrode and the drain electrode and comprising an opening between the source electrode and the drain electrode;
    a third insulator over and in contact with the second insulator; and
    a fourth insulator over and in contact with the third insulator,
    wherein the second oxide semiconductor, the gate insulator, and the gate electrode are positioned inside the opening of the second insulator, and
    wherein the first insulator and the fourth insulator are in contact with each other in a region where the second insulator and the third insulator do not exist.

2. The semiconductor device according to claim 1,
    wherein the second insulator comprises excess oxygen,
    wherein the third insulator is configured to trap or fix hydrogen,
    wherein the fourth insulator has a barrier property against hydrogen,
    wherein hydrogen in the second oxide semiconductor is bonded to the excess oxygen, wherein the hydrogen bonded to the excess oxygen passes through the second insulator and is trapped or fixed in the third insulator, and wherein the excess oxygen bonded to the hydrogen remains in the second insulator as the excess oxygen.

3. The semiconductor device according to claim 1, wherein the second oxide semiconductor comprises indium, gallium, and zinc.

4. The semiconductor device according to claim 1, wherein the second insulator comprises silicon oxynitride, and wherein the third insulator comprises aluminum oxide.

5. The semiconductor device according to claim 1, wherein the fourth insulator comprises silicon nitride.

* * * * *